(12) United States Patent
Or-Bach et al.

(10) Patent No.: US 12,432,926 B2
(45) Date of Patent: *Sep. 30, 2025

(54) METHOD TO PRODUCE A 3D MULTILAYER SEMICONDUCTOR DEVICE AND STRUCTURE

(71) Applicant: Monolithic 3D Inc., Klamath Falls, OR (US)

(72) Inventors: Zvi Or-Bach, Haifa (IL); Jin-Woo Han, San Jose, CA (US)

(73) Assignee: Monolithic 3D Inc., Allen, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/793,939

(22) Filed: Aug. 5, 2024

(65) Prior Publication Data

US 2024/0397720 A1    Nov. 28, 2024

Related U.S. Application Data

(63) Continuation-in-part of application No. 18/622,992, filed on Mar. 31, 2024, now Pat. No. 12,100,658, which is a continuation-in-part of application No. 16/797,231, filed on Feb. 21, 2020, now Pat. No. 11,978,731, which is a continuation-in-part of application No. 16/224,674, filed on Dec. 18, 2018, now abandoned, which is a continuation-in-part of application No. 15/761,426, filed as application No. PCT/US2016/052726 on Sep. 21, 2016, now Pat. No. 10,515,981.

(60) Provisional application No. 62/221,618, filed on Sep. 21, 2015.

(51) Int. Cl.
*H10B 43/27* (2023.01)
*H10B 41/27* (2023.01)

(52) U.S. Cl.
CPC ............ *H10B 43/27* (2023.02); *H10B 41/27* (2023.02)

(58) Field of Classification Search
CPC .............................. H10B 43/27; H10B 41/27
See application file for complete search history.

(56) References Cited

U.S. PATENT DOCUMENTS 5,376,215 A * 12/1994 Ohta .................. H01L 21/3065
                                                                 156/345.24
12,100,658 B2 * 9/2024 Or-Bach ................ H10B 43/35

* cited by examiner

*Primary Examiner* — Suberr L Chi
(74) *Attorney, Agent, or Firm* — PatentPC; Bao Tran

(57) ABSTRACT

A method of making a 3D multilayer semiconductor device, including: providing a first substrate including a first level, the first level including a first single crystal silicon layer; providing a second substrate including a second level, the second level including a second single crystal silicon layer; performing an epitaxial growth of a SiGe layer on top of the second single crystal silicon layer; performing an epitaxial growth of a third single crystal silicon layer on top of the SiGe layer, the third silicon layer has an average thickness of less than 2,000 nm; forming a plurality of second transistors each including a single crystal channel; forming many metal layers interconnecting the plurality of second transistors; and then performing a bonding of the second level onto the first level, where performing the bonding includes making oxide-to-oxide bond zones; and performing removal of a majority of the second single crystal silicon layer.

20 Claims, 85 Drawing Sheets

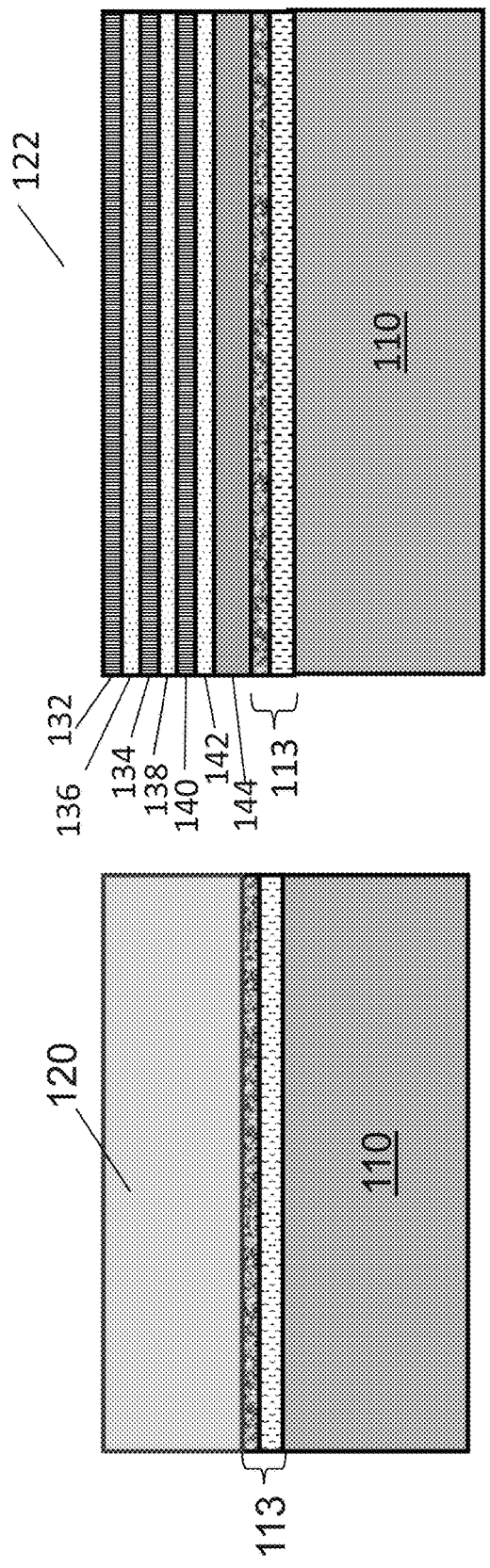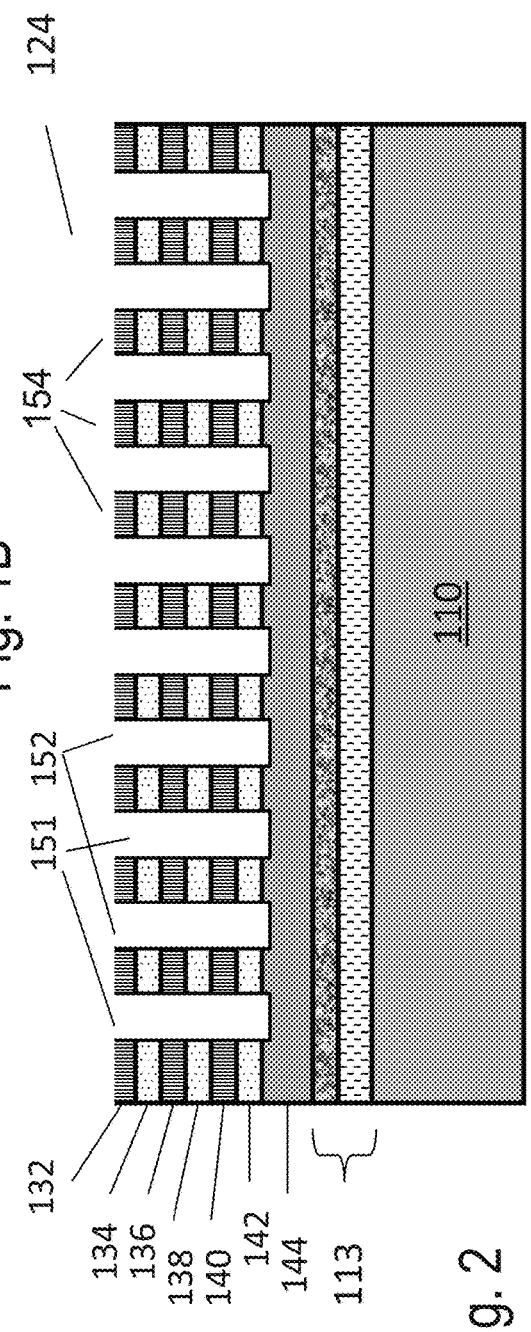

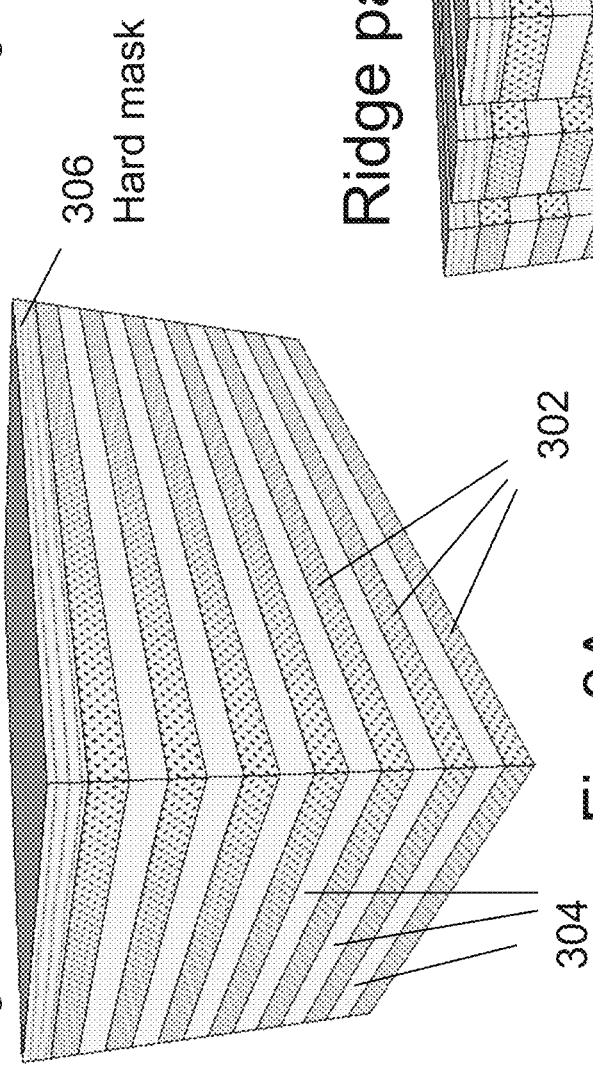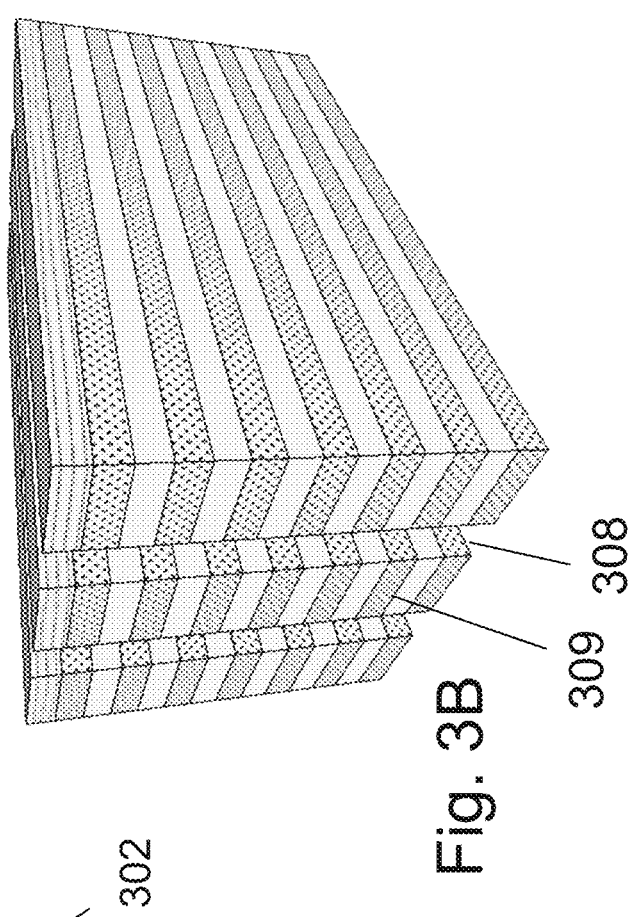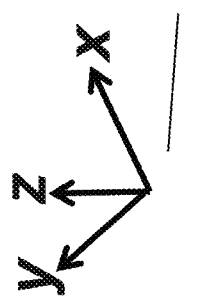

Selective etching channel (P) region to form undercut

Tunneling oxide layer, charge storage layer, control oxide layer stack deposition. Gate such as W or polysilicon deposition Anisotropic etching the gate material to form the horizontal gate Gate 314

313

318

Tunneling oxide layer, 312 charge storage layer, control oxide layer stack

310

319

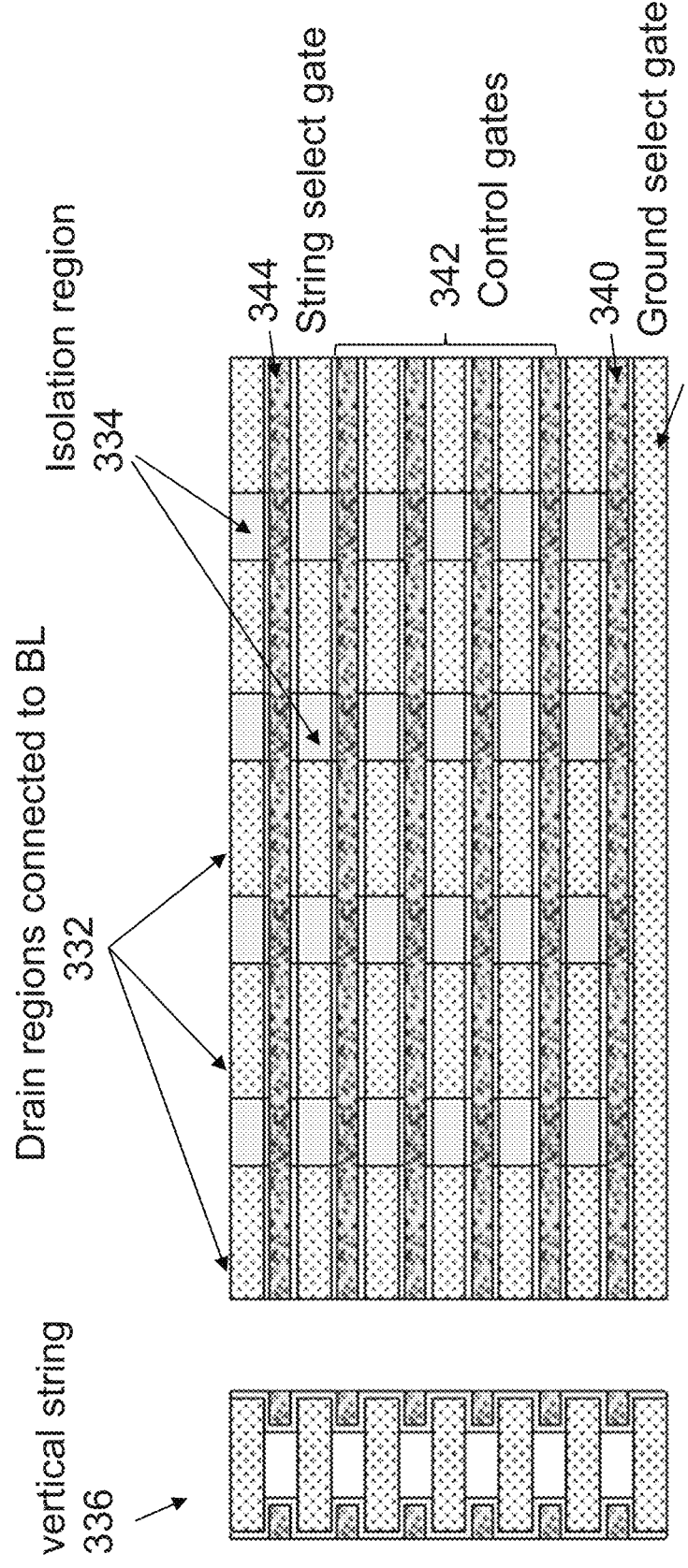

Straight polysilicon for top and bottom contact through ELTRAN process
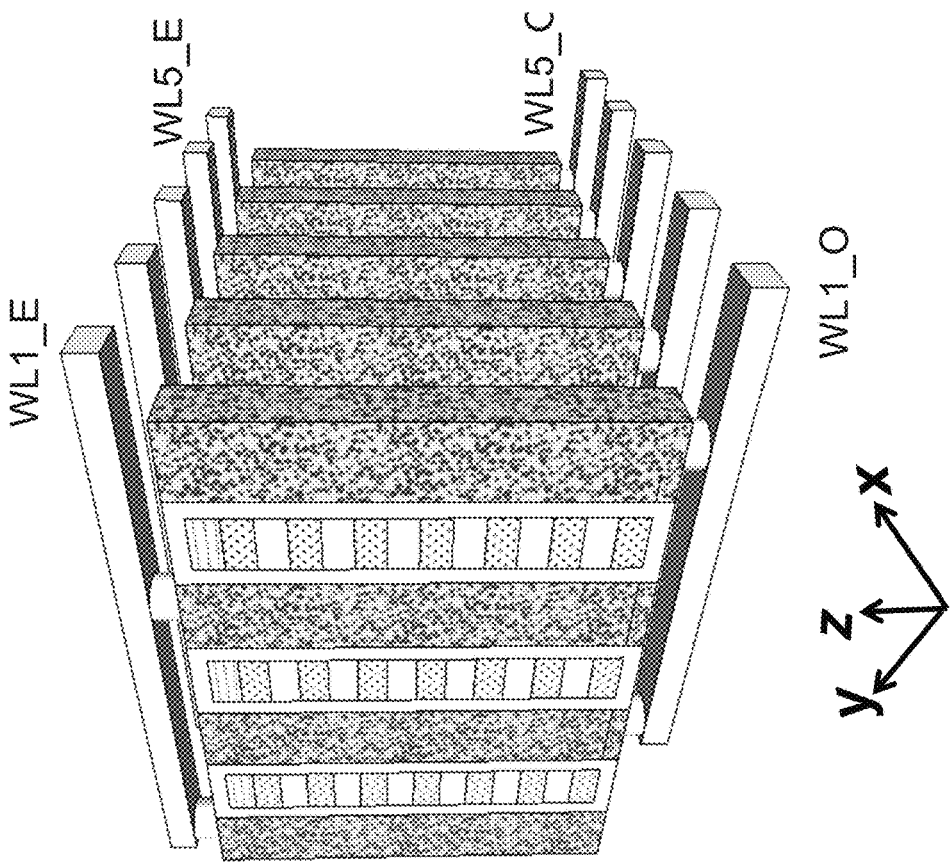
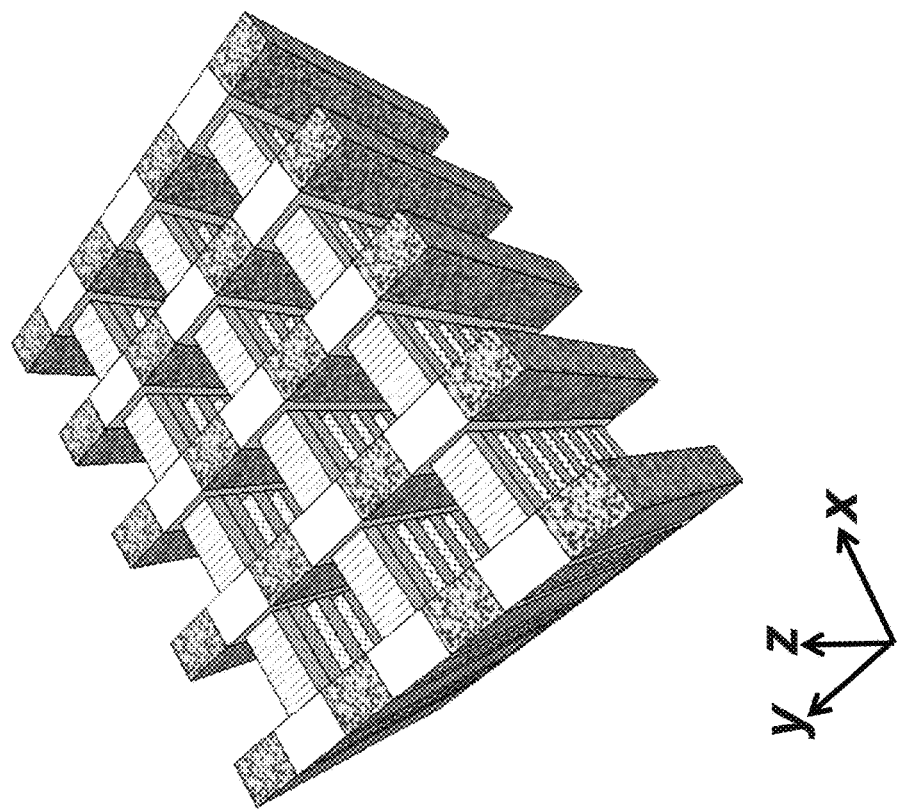
Fig. 5B CMP the polysilicon gate X-section view cut along bit line direction across in-between Ridges   Cut-View X-Z Plane

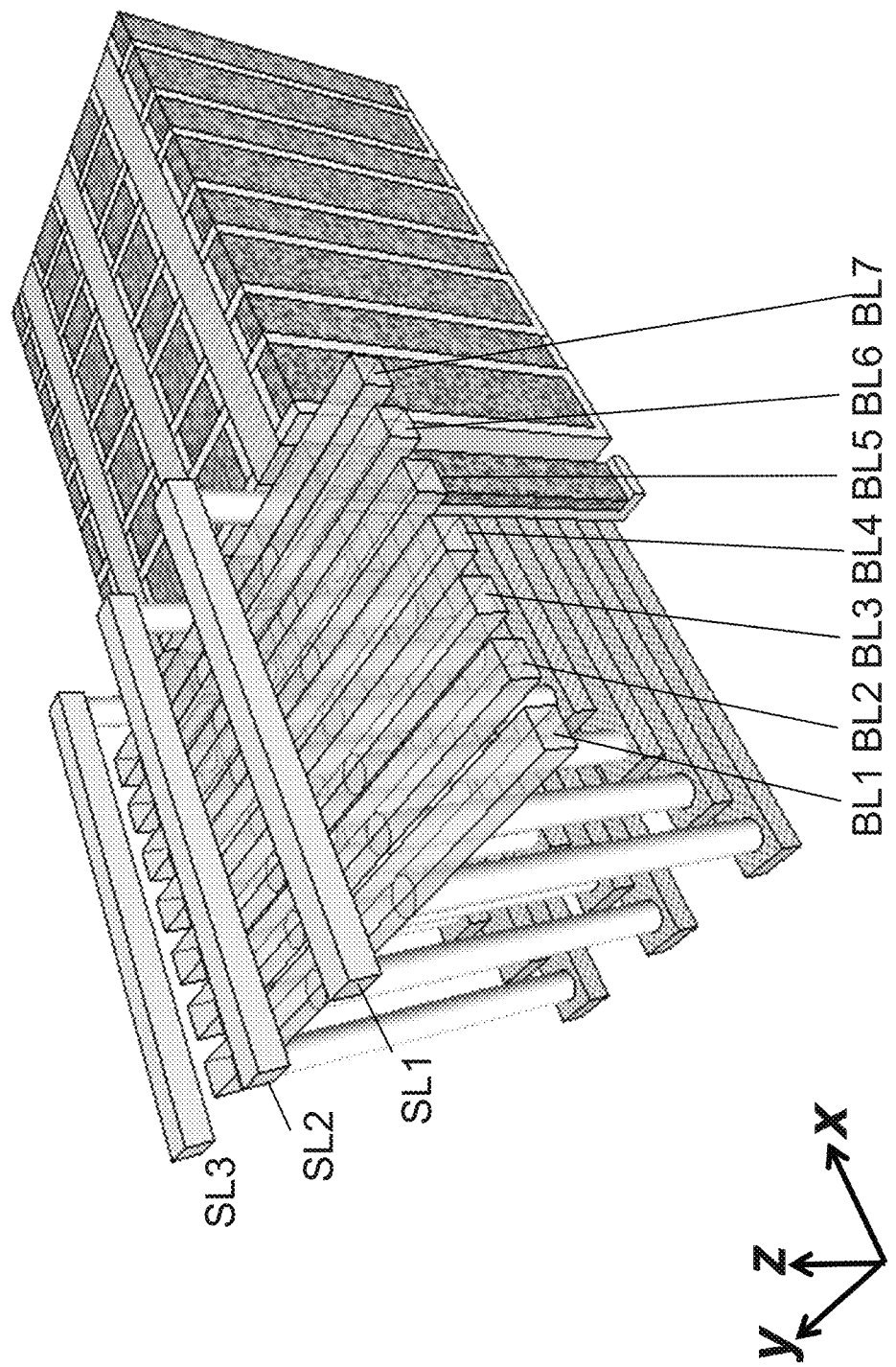

Curved Channel effective channel length becomes longer to be more distinctive charge trapping sites at given height

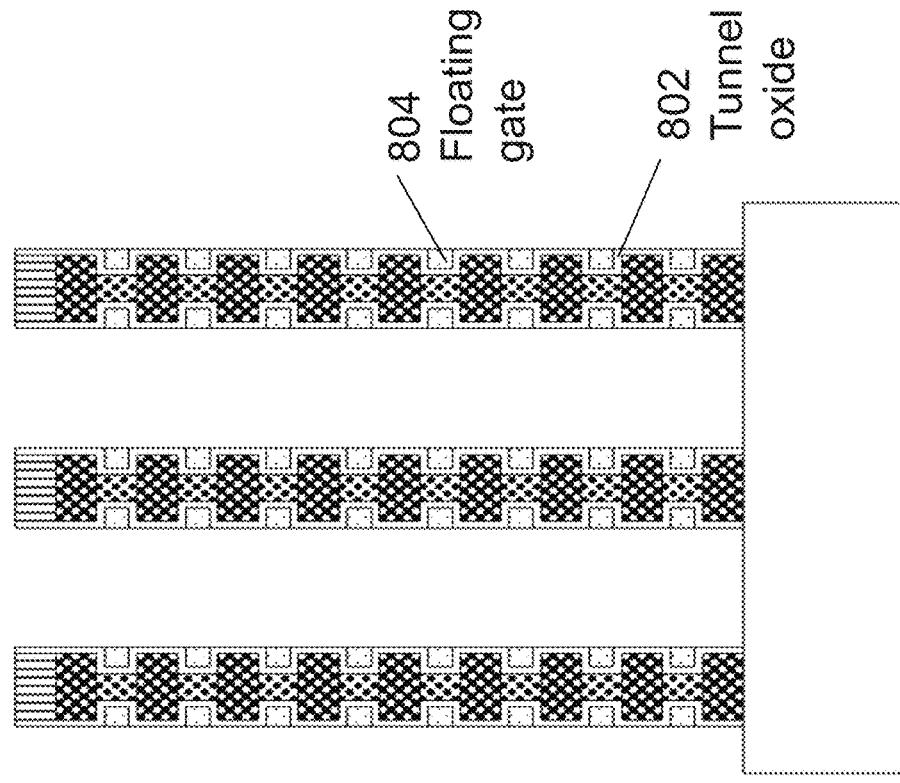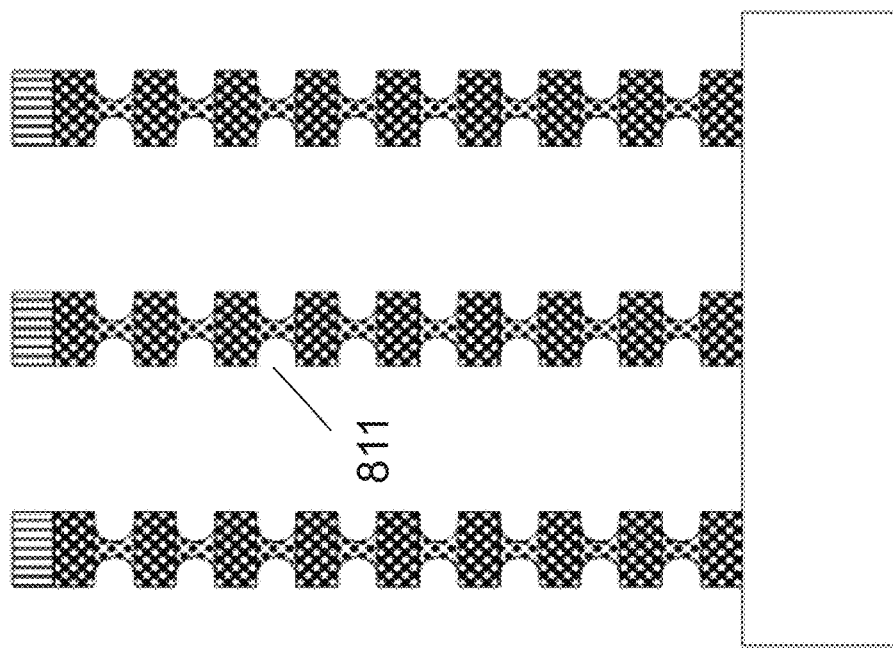

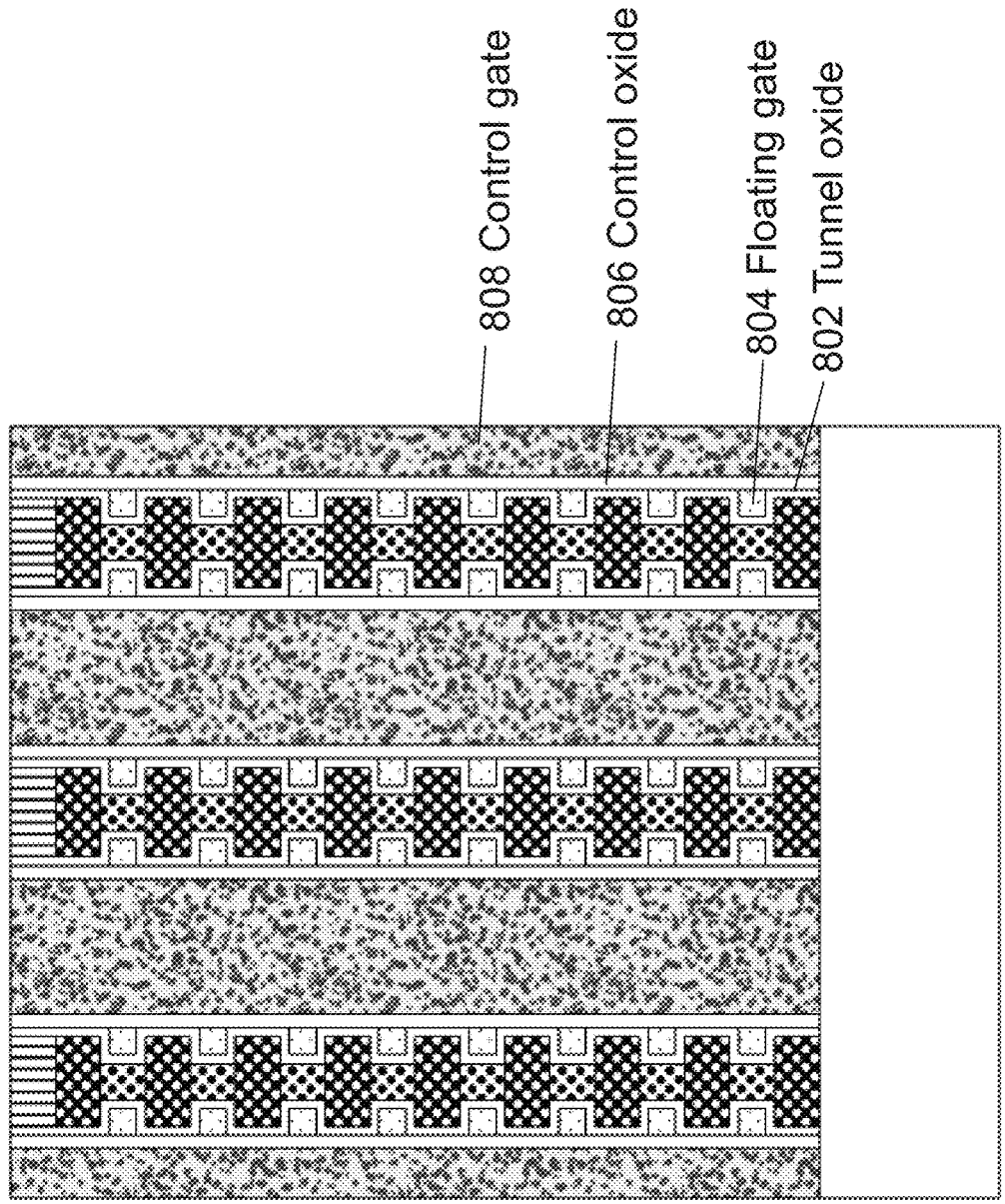
Fig. 8G  Cut-View Y-Z Plane

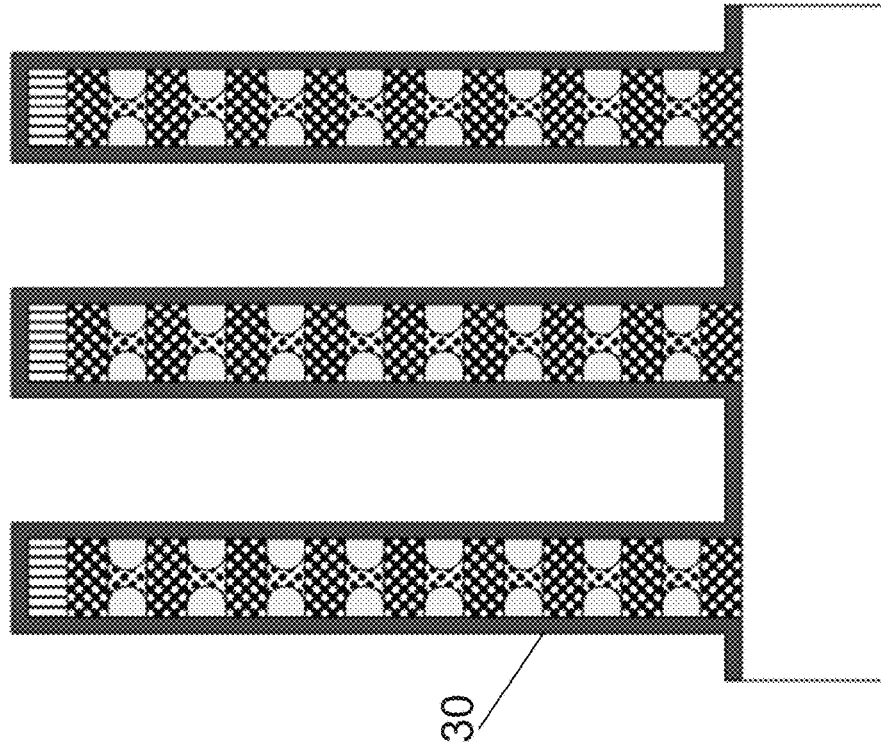
Fig. 8I  *Cut-View Y-Z Plane*
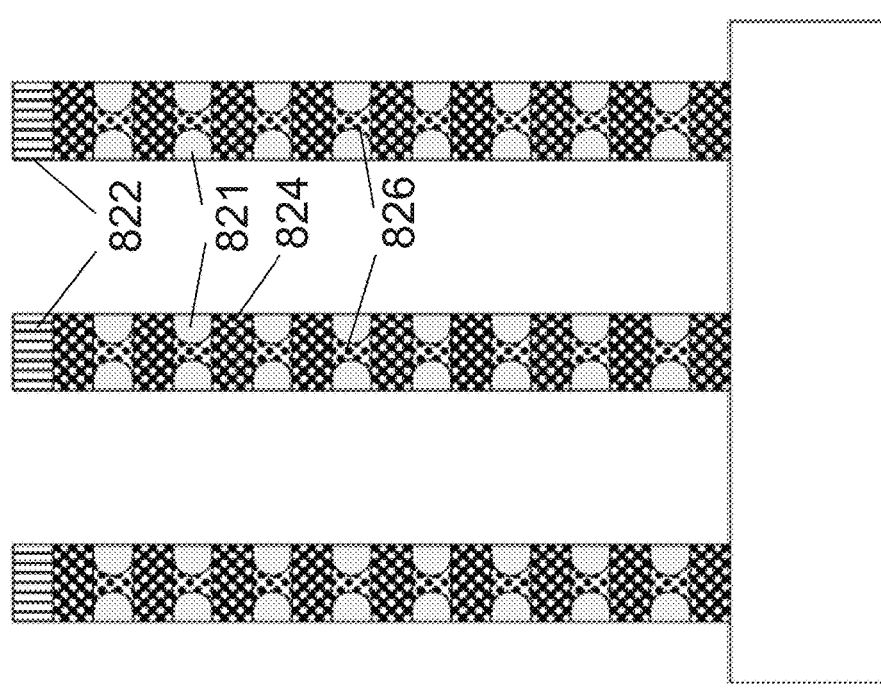
Fig. 8H  *Cut-View Y-Z Plane*

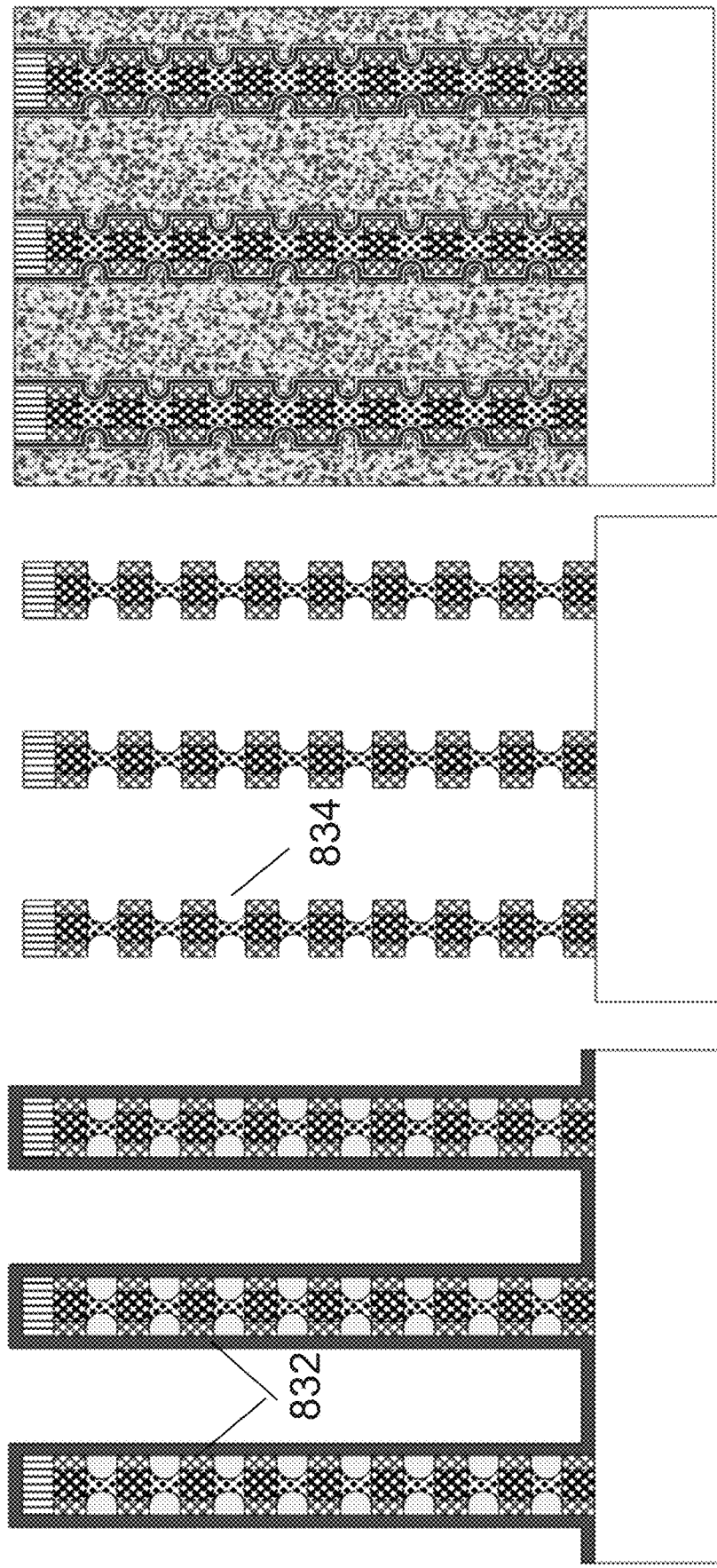

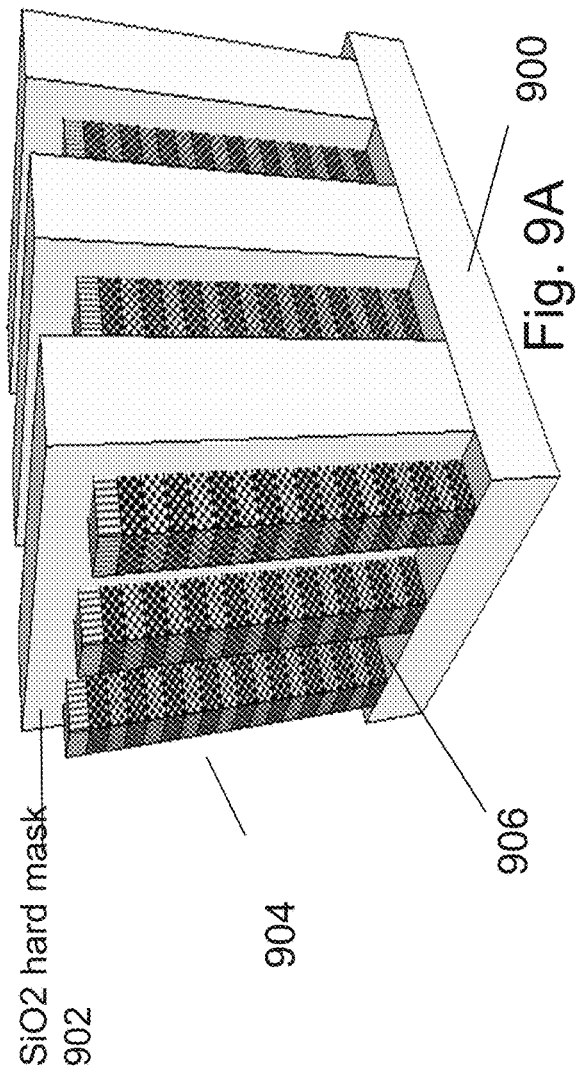
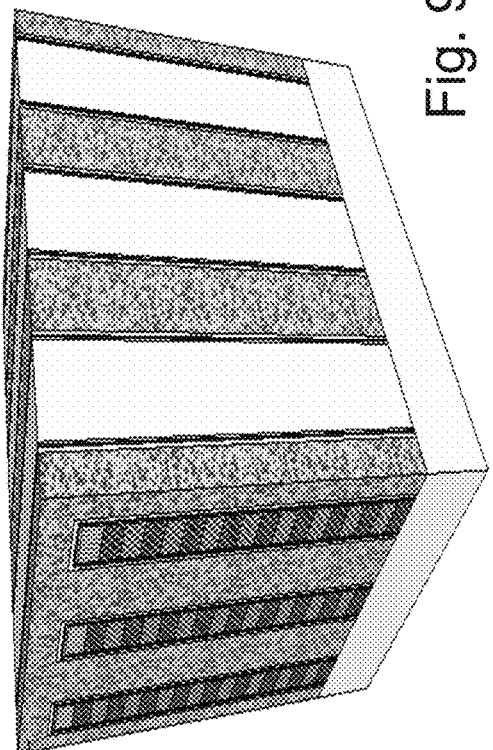
Fig. 9A  900
SiO2 hard mask 902
hard mask such as SiO2 patterning for subsequent damascene gate process
904
906
Fig. 9B
First gate stack 910
First gate stack including charge trap layer and CMP the first gate stack
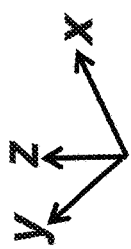

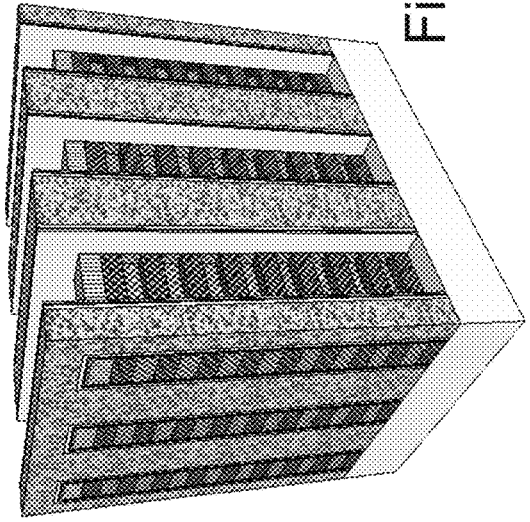
Fig. 9C
hard mask removal
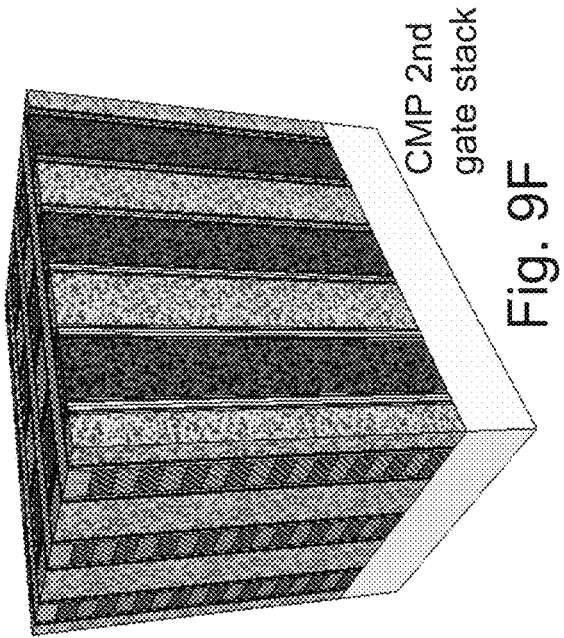
Fig. 9D
Optional: P region indentation
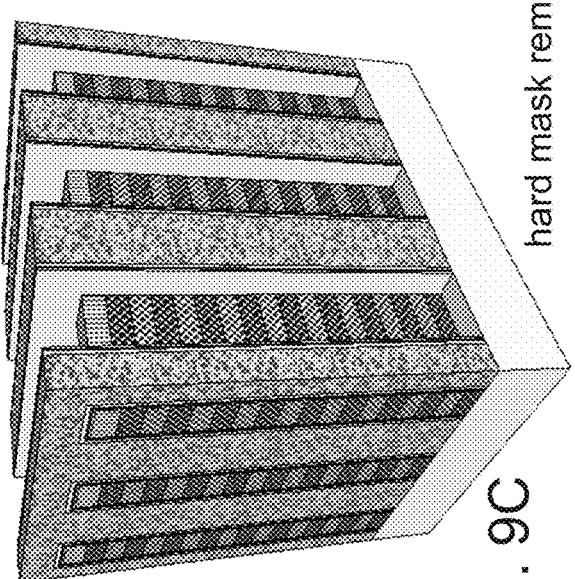
Fig. 9E
2nd gate stack with charge trap layer or normal oxide such as SiO
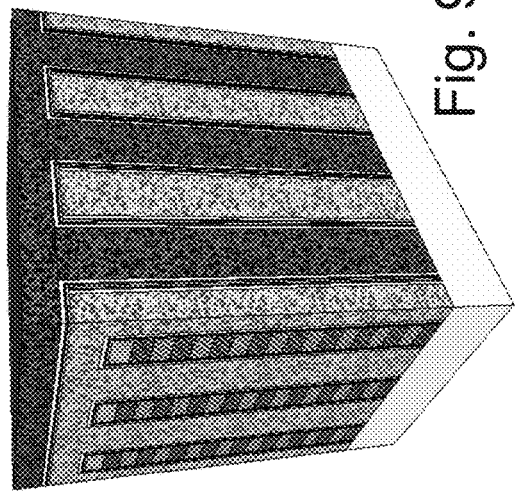
Fig. 9F
CMP 2nd gate stack
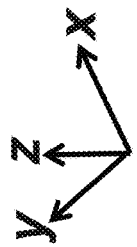

XY cut view along P layer

XY cut view along P layer with optional indentation

XY cut view along N+ layer

XY cut view along N+ layer with optional indentation

Cut-View X-Z Plane

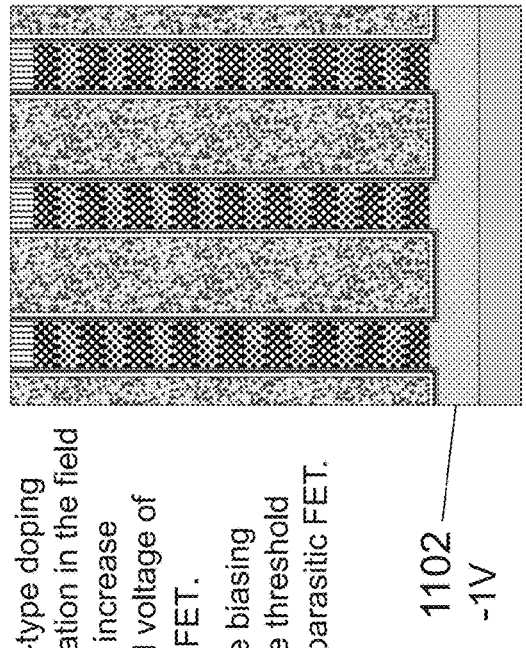

1) High p-type doping concentration in the field region to increase threshold voltage of parasitic FET.

2) Negative biasing to increase threshold voltage of parasitic FET.

3) At the beginning to use the chip, electrically program (store electrons) in the charge trap region on the field region to increase threshold voltage of parasitic FET.

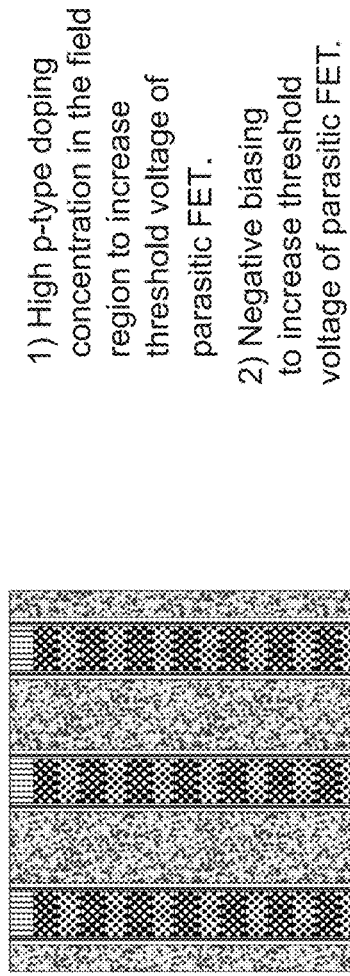

1101 Buried oxide

Fig. 11A
If the substrate is silicon on insulator (SOI) wafer, the buried oxide isolate adjacent ridge

*Cut-Views Y-Z Plane*

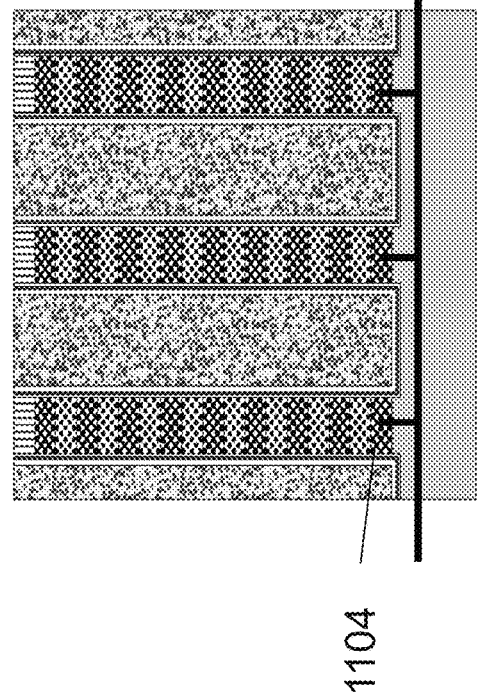

connect the most bottom N+ regions and use them as common source line

Source line

Cut-Views X-Y Plane

Type B gate connection from top view

Type A gate connection from top view (fine pitch)

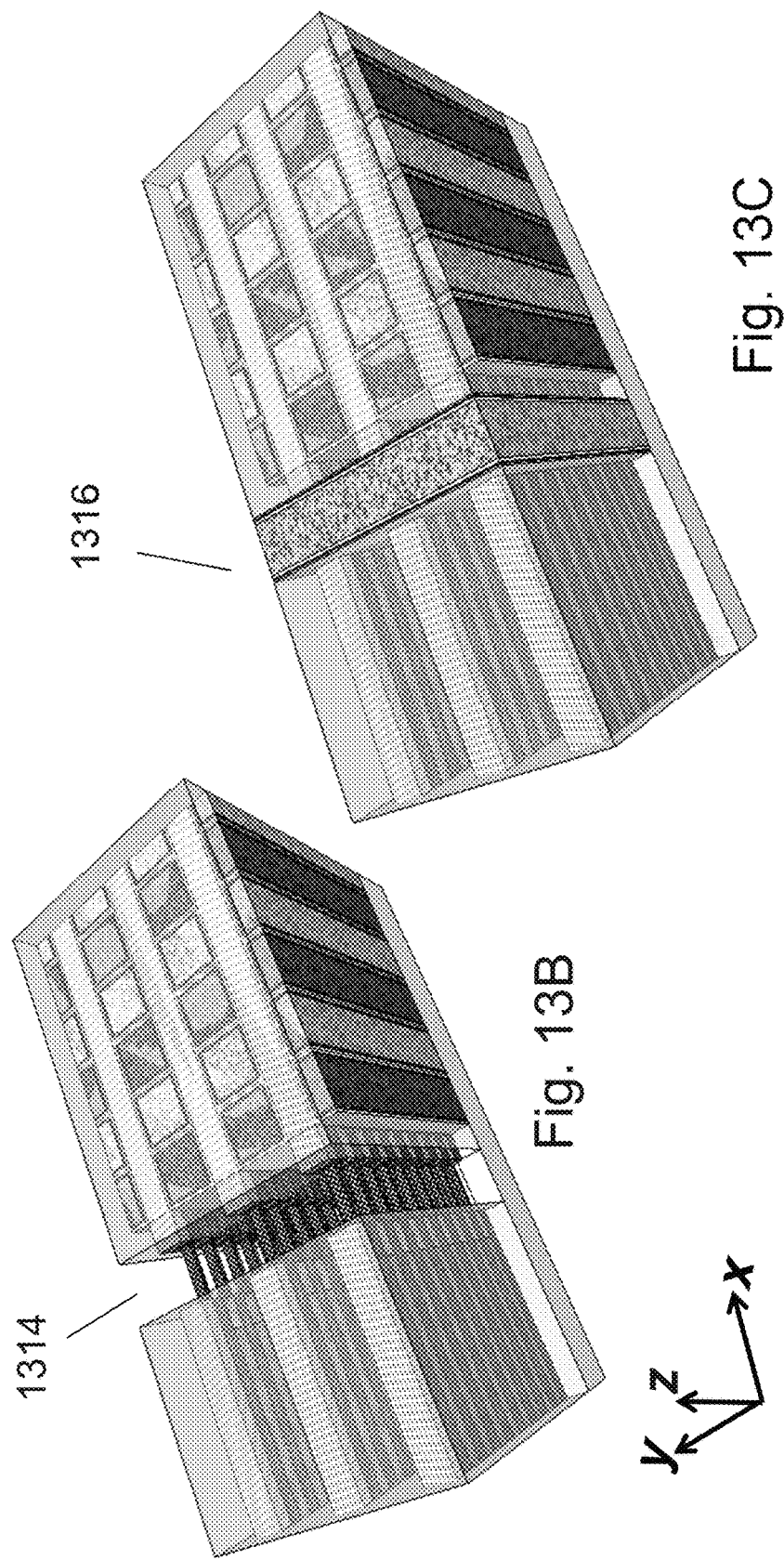

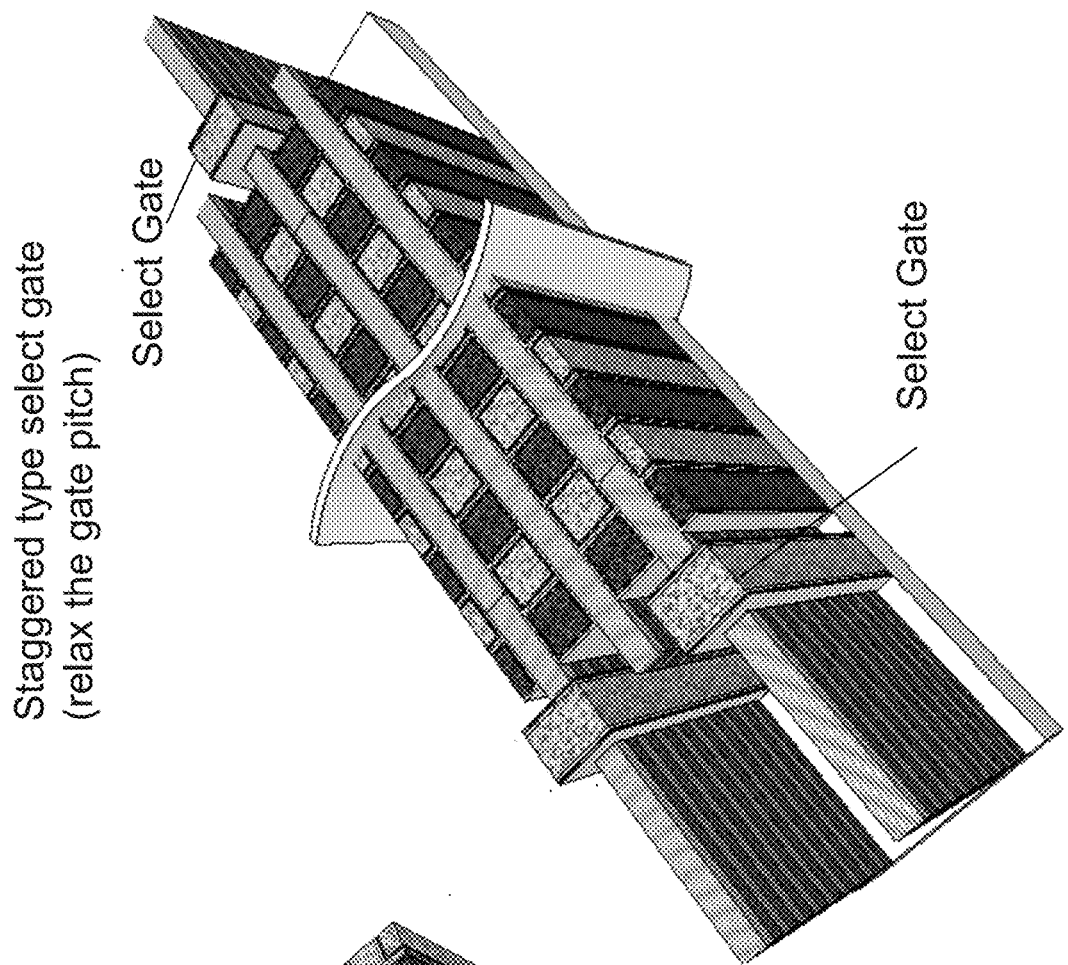
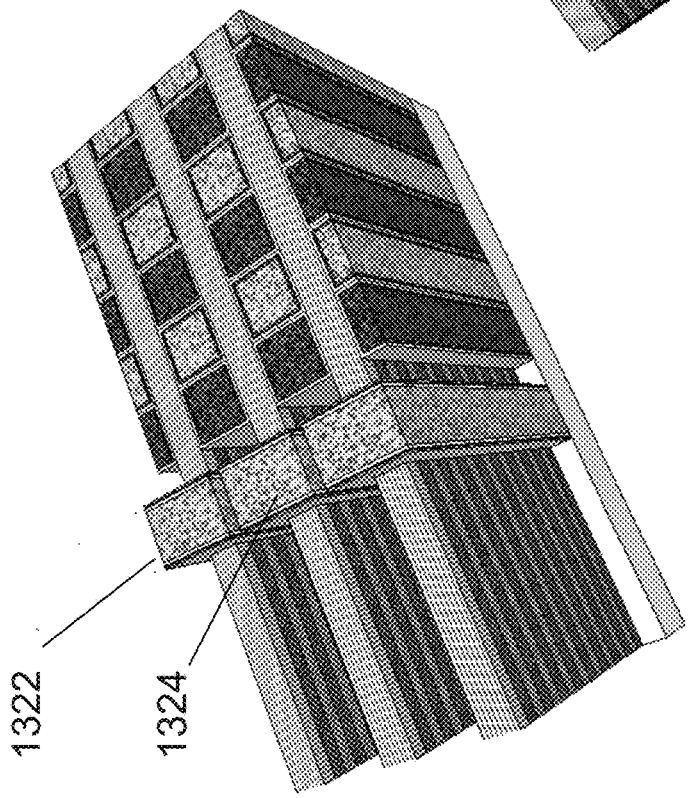
Fig. 13D
Fig. 13E

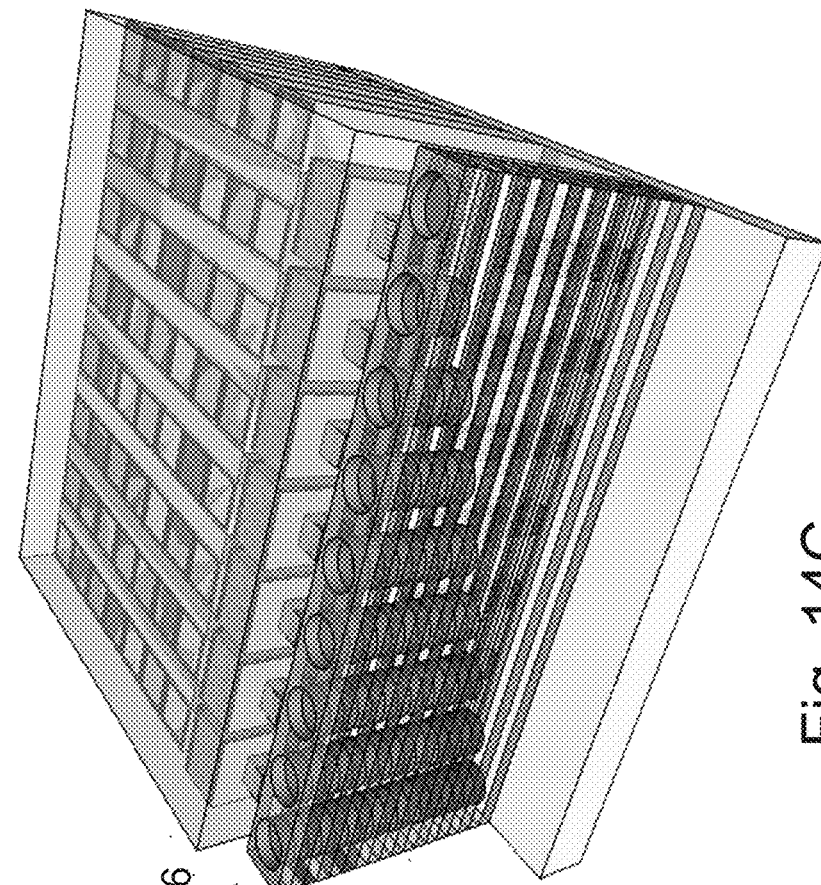
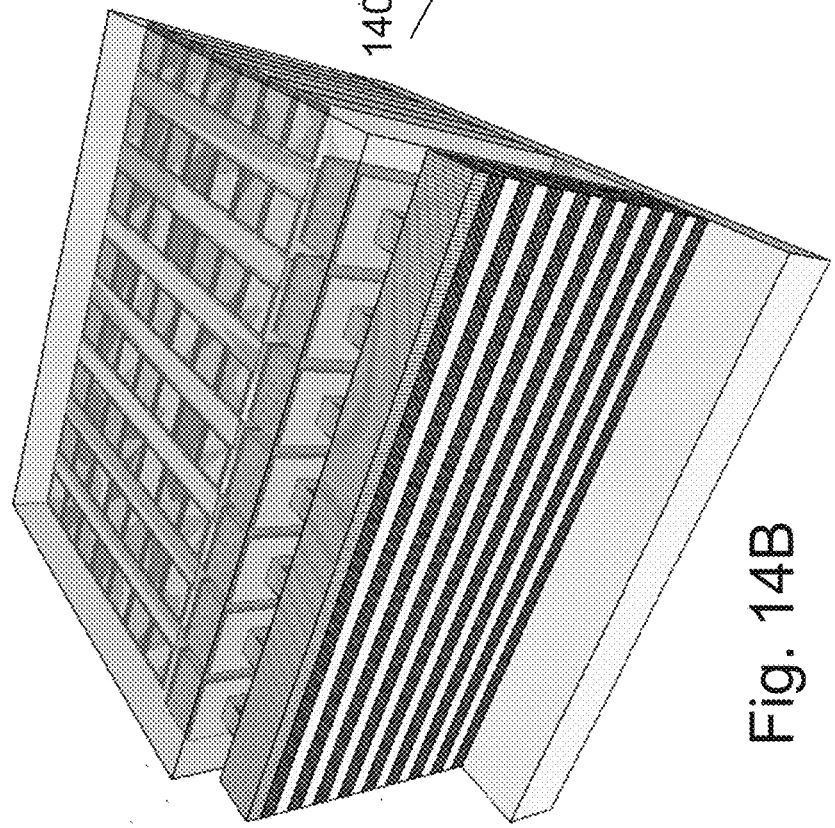
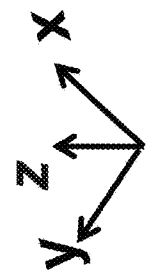

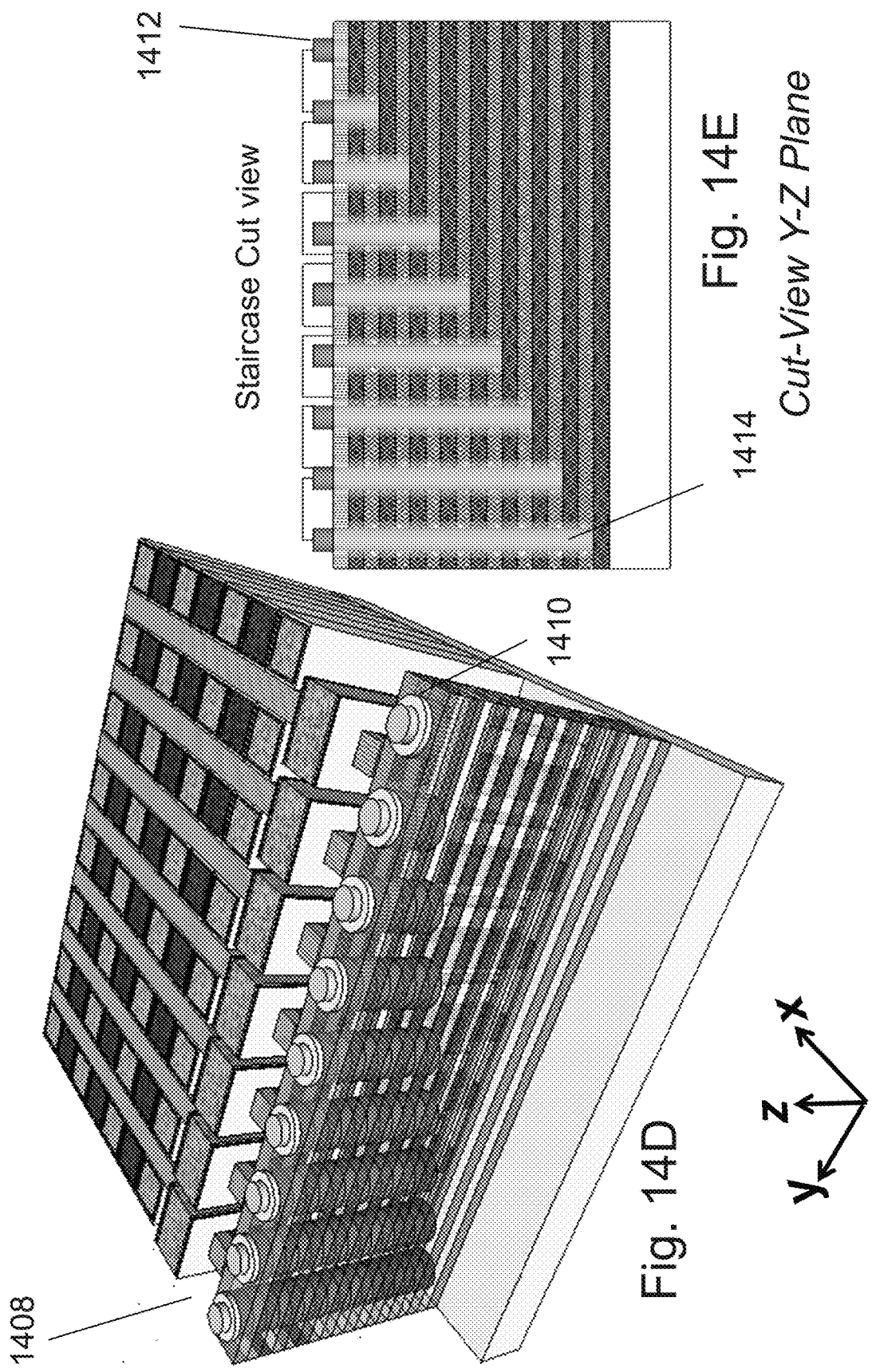

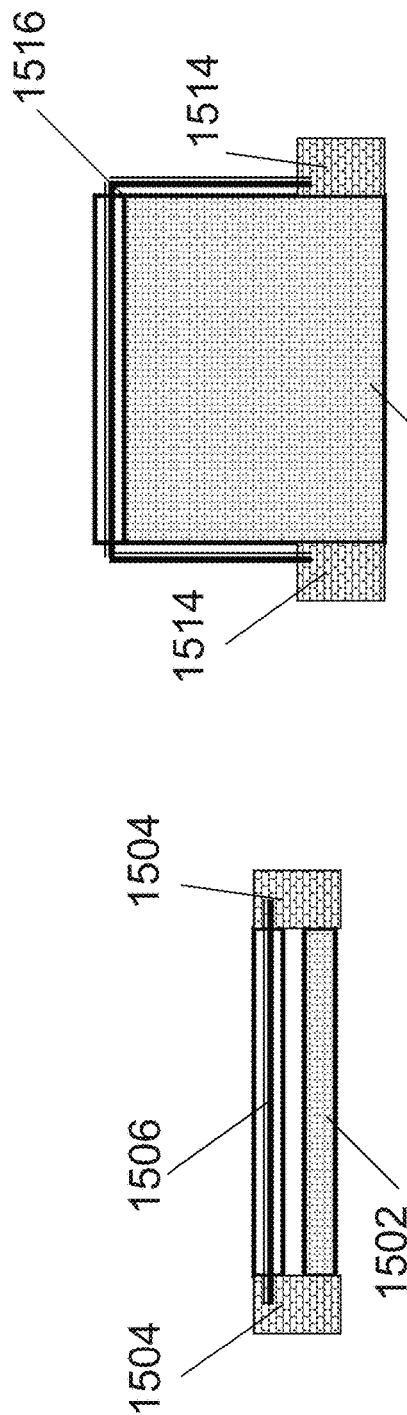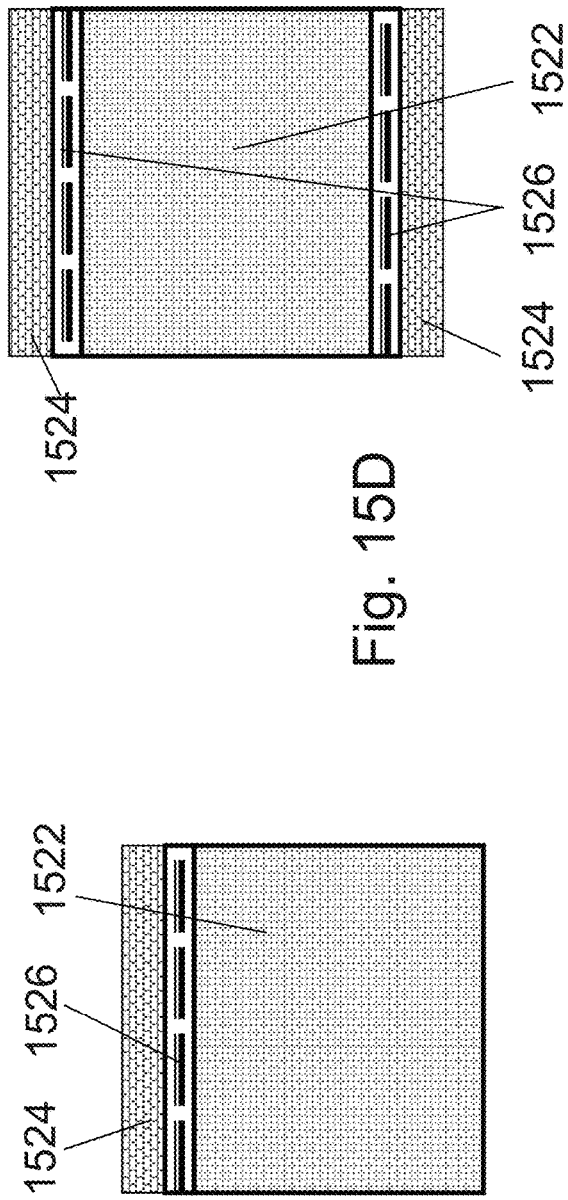
Cut-Views Y-Z Plane
Fig. 15A
Fig. 15B
Fig. 15C
Fig. 15D

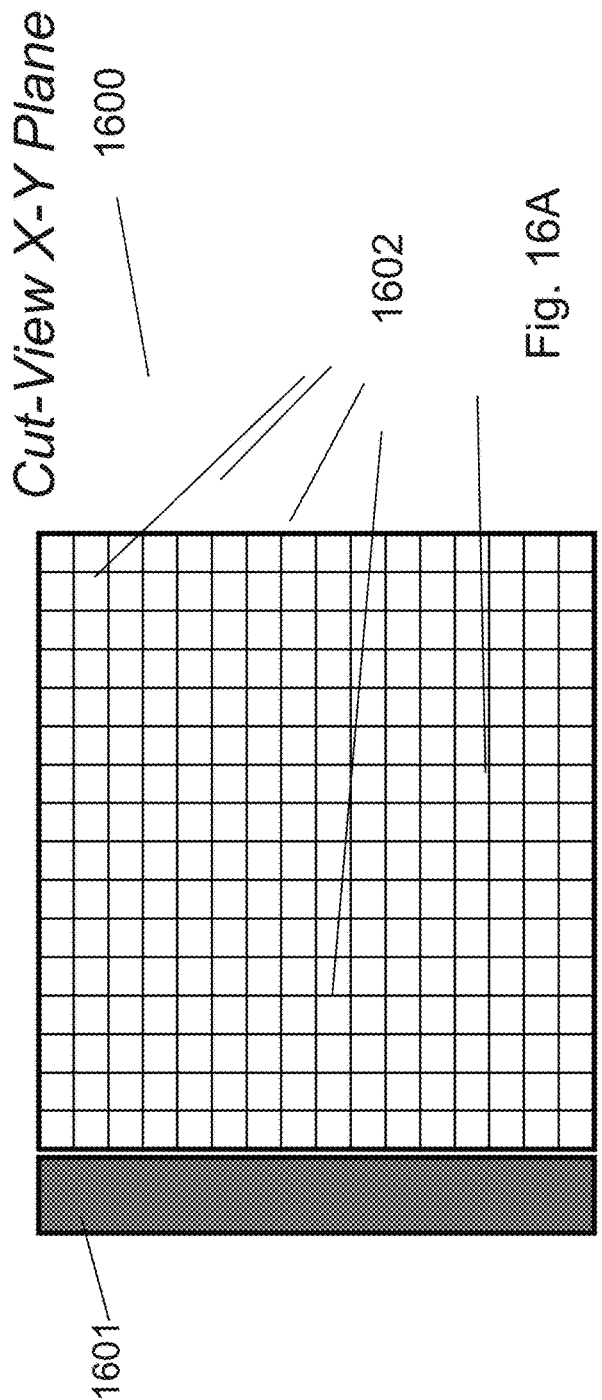
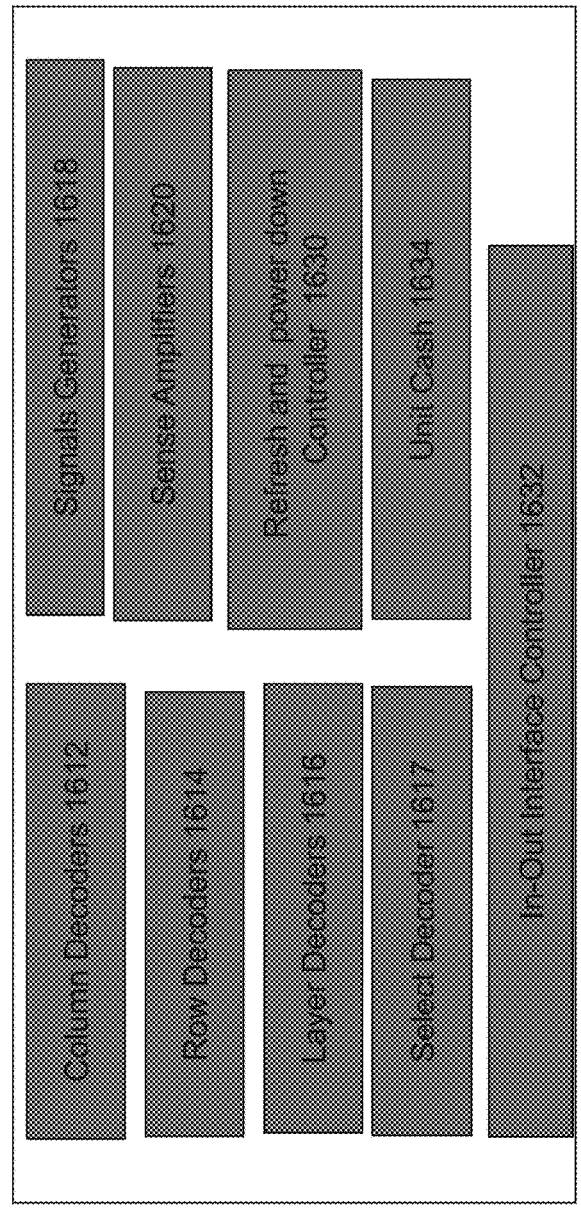

| Clt | Pt0 | Pt1 | Pt2 | Pt3 | Pt4 | Pt5 | Pt6 | Pt7 | Crt |
|---|---|---|---|---|---|---|---|---|---|
| Pl0 | | | | | | | | | Pr0 |
| Pl1 | | | | | | | | | Pr1 |
| Pl2 | | | | | | | | | Pr2 |
| Pl3 | | | | | | | | | Pr3 |
| Pl4 | | | | | | | | | Pr4 |
| Pl5 | | | | | | | | | Pr5 |
| Pl6 | | | | | | | | | Pr6 |
| Pl7 | | | | | | | | | Pr7 |
| Clb | Pb0 | Pb1 | Pb2 | Pb3 | Pb4 | Pb5 | Pb6 | Pb7 | Crb |

*Cut-View X-Y Plane*

Fig. 17

| Operation | S/D$_{bottom}$ | S/D$_{top}$ | Other S/D | C-Gate |
|---|---|---|---|---|
| Write bit 1 | 0 V | 4.0 V | Floating | 8 V |
| Write bit 2 | 4.0 V | 0 V | Floating | 8 V |
| Erase bit 1 | 0 V | 4.0 V | Floating | -8 V |
| Erase bit 2 | 4.0 V | 0 V | Floating | -8 V |
| Read on top channel (S/D$_{top}$ and S/D$_{bottom}$ swapping) | 1.0 → 0 V | 0 → 1.0 V | Floating | 4 V |

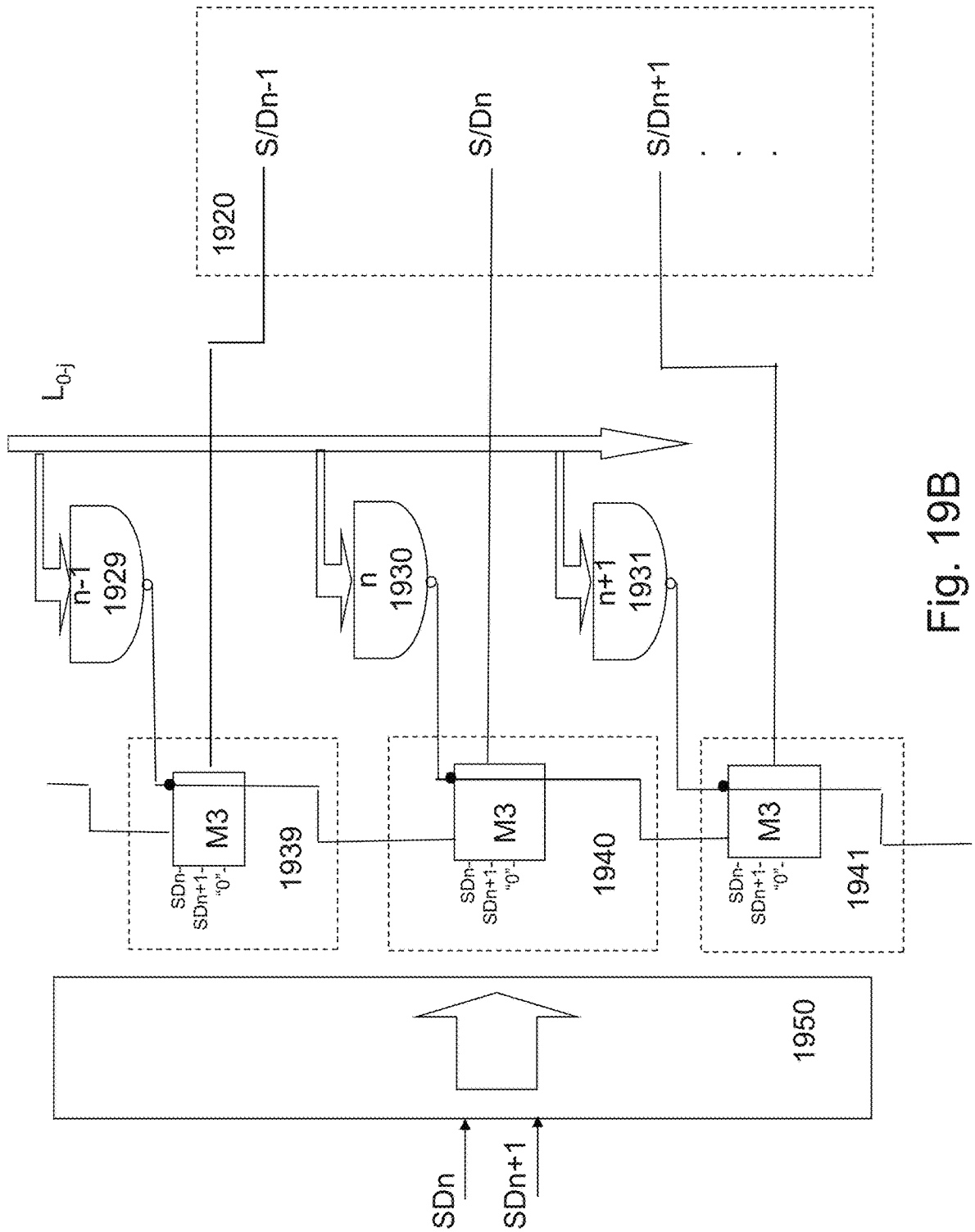

Fig. 22B

Cut-Views X-Z Plane

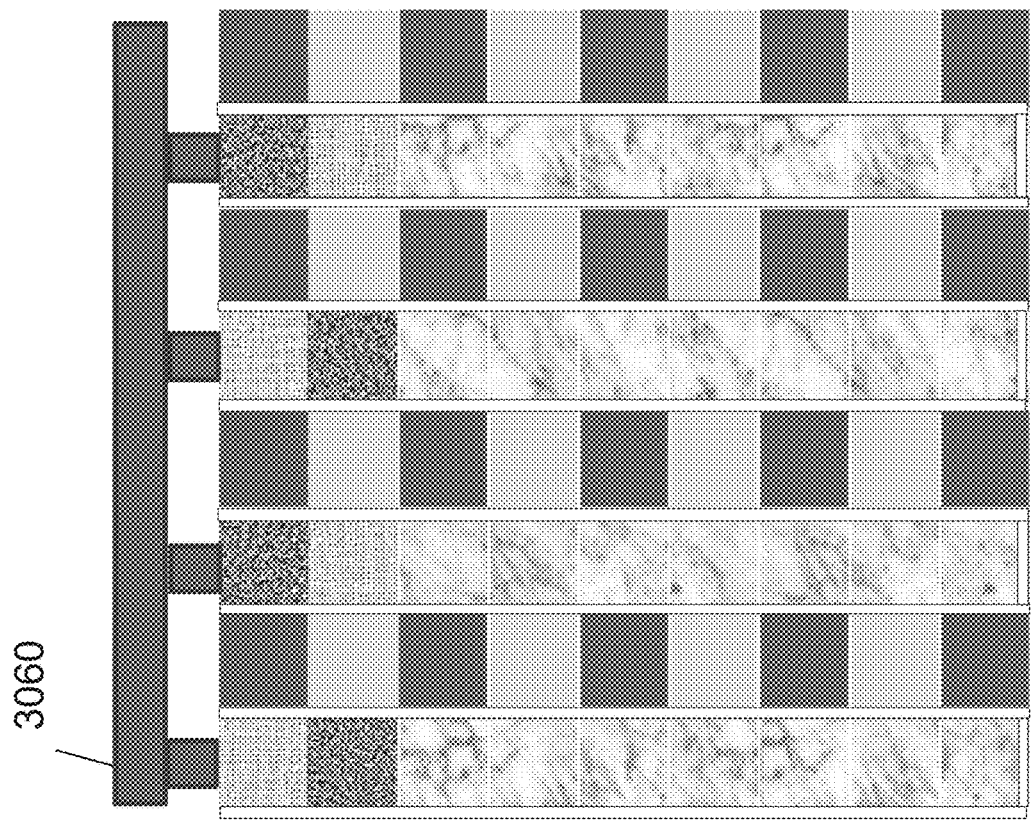
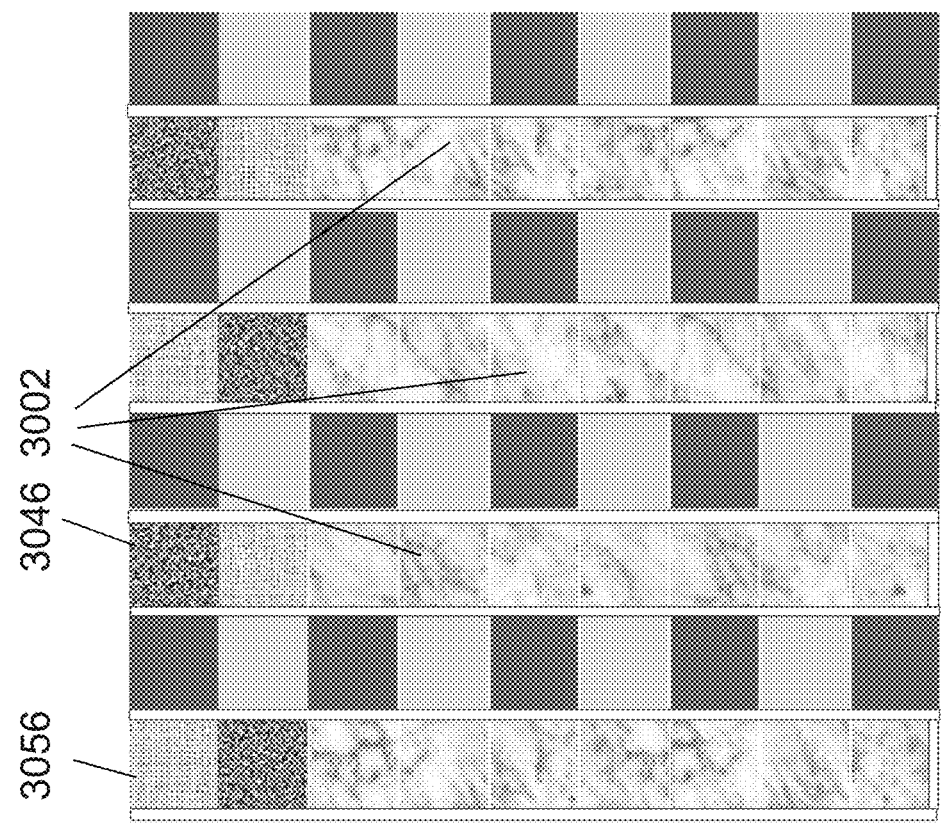
Fig. 30A
Fig. 30B

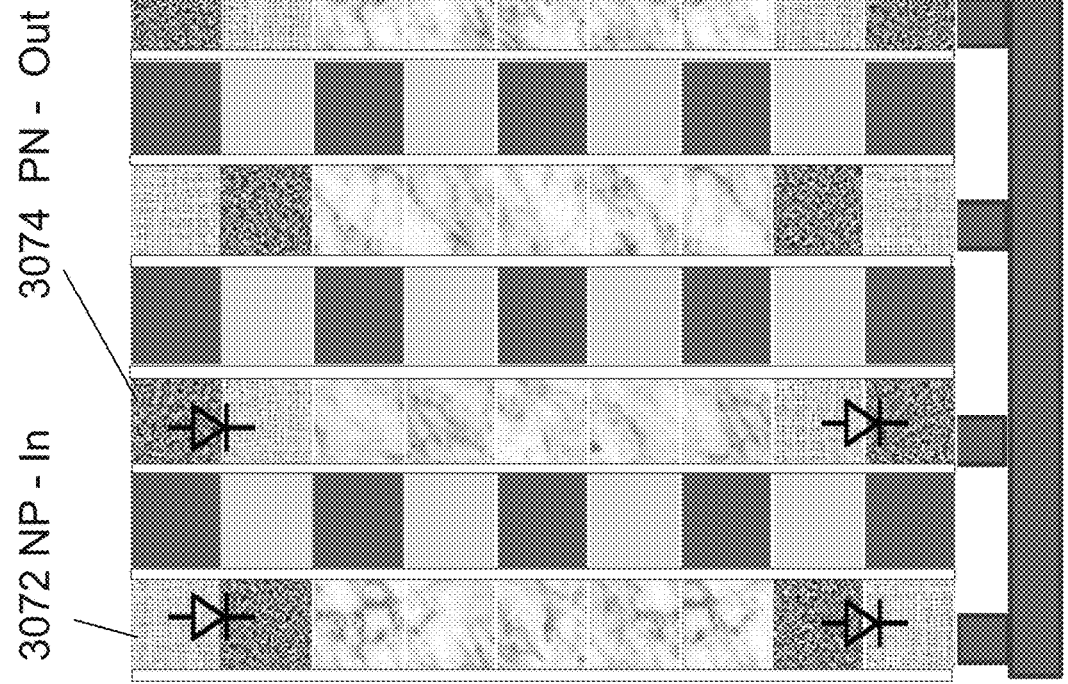
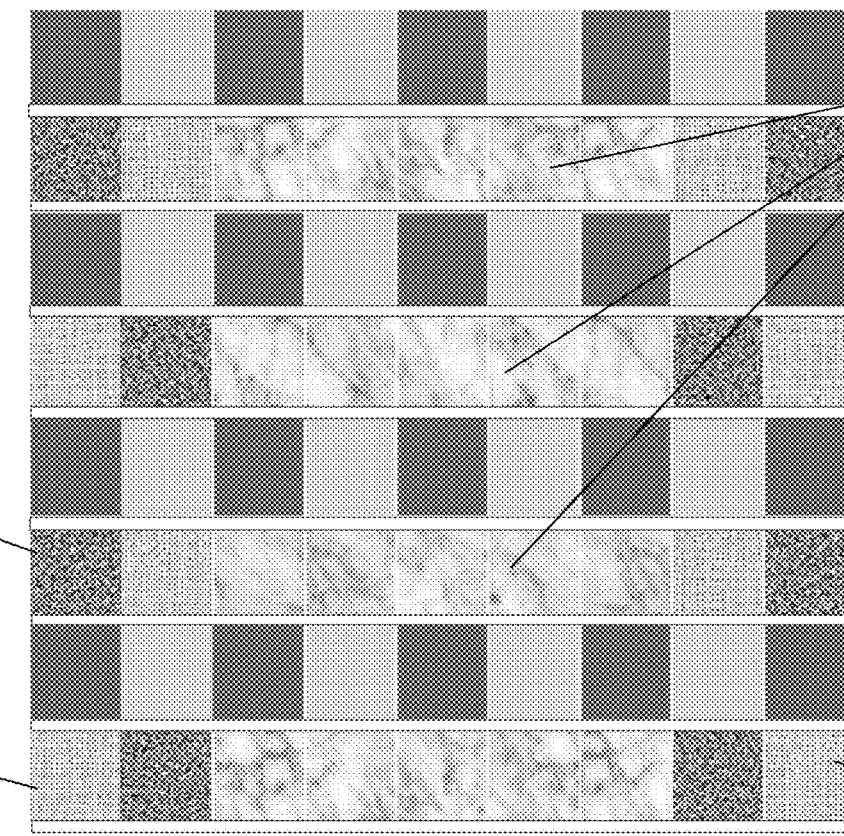
Fig. 30D
Fig. 30C

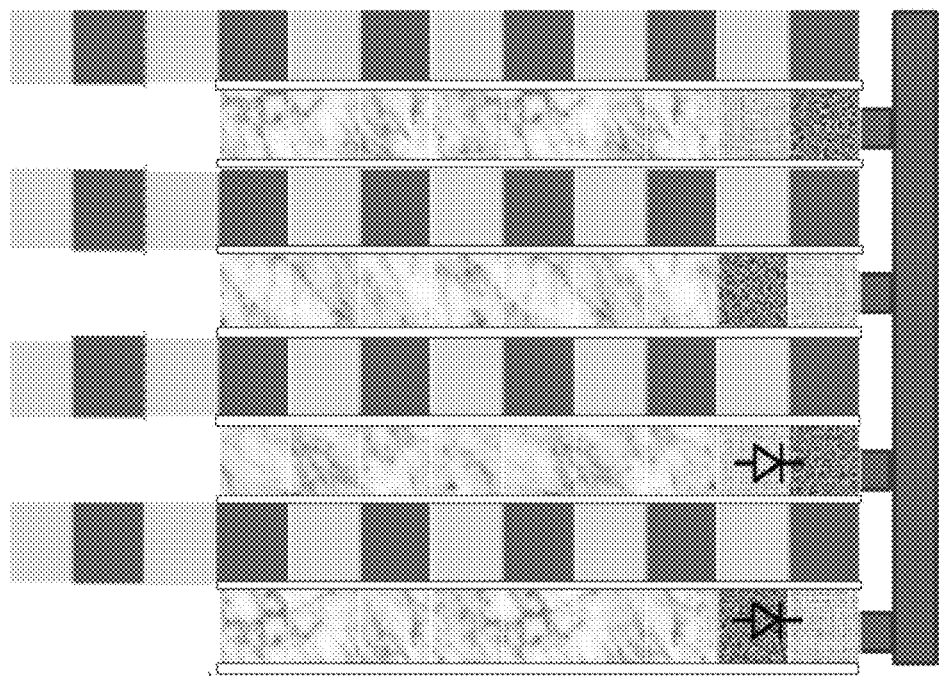
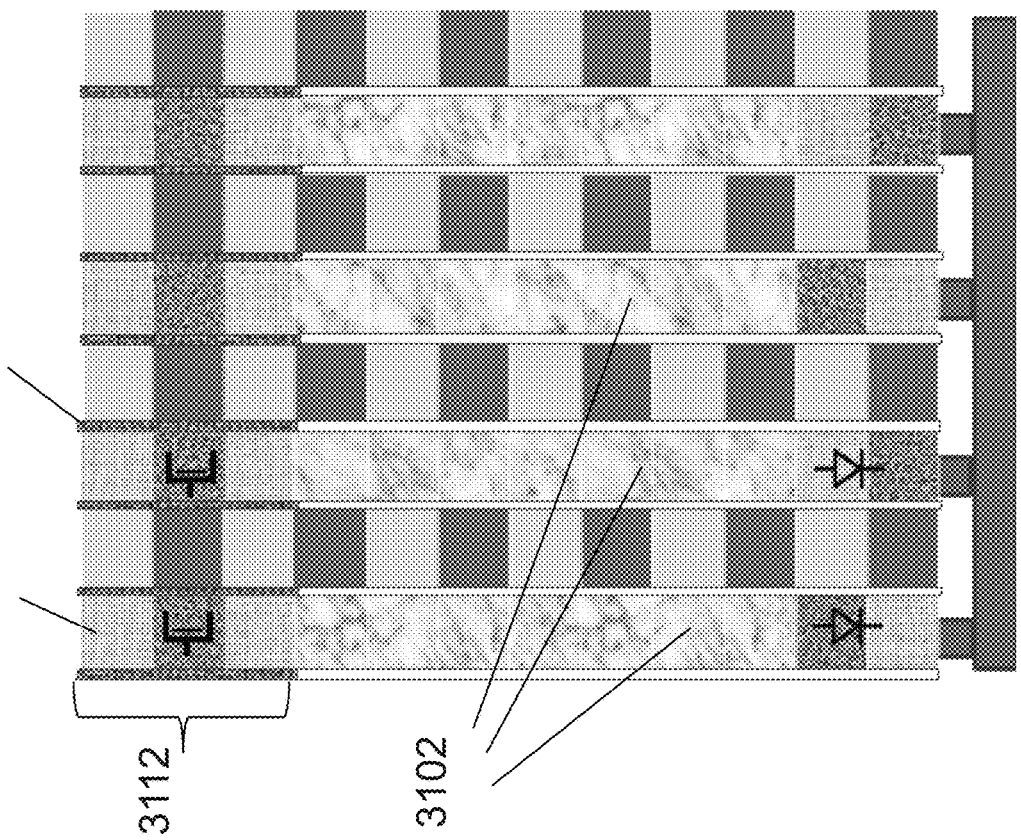
Fig. 31A
Fig. 31B

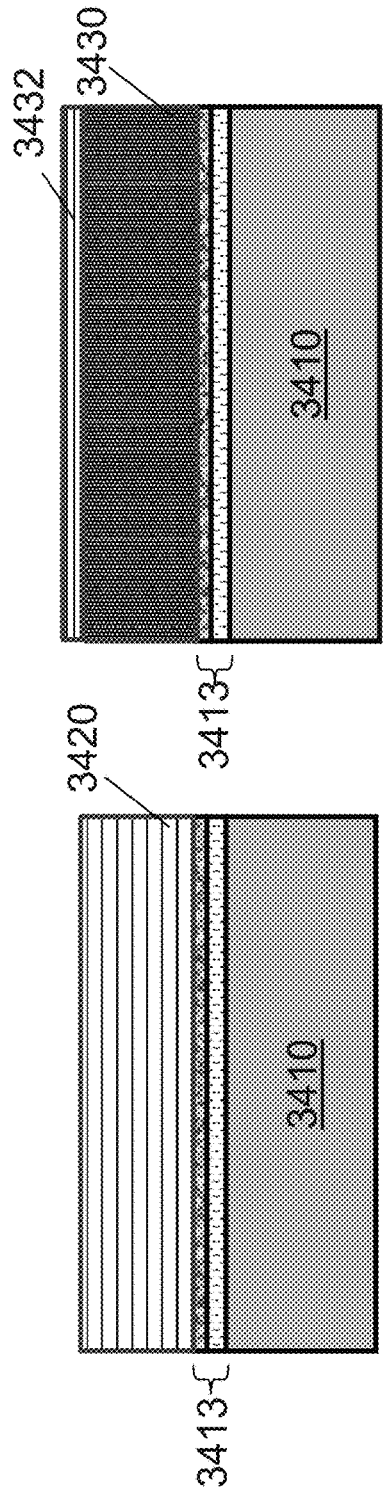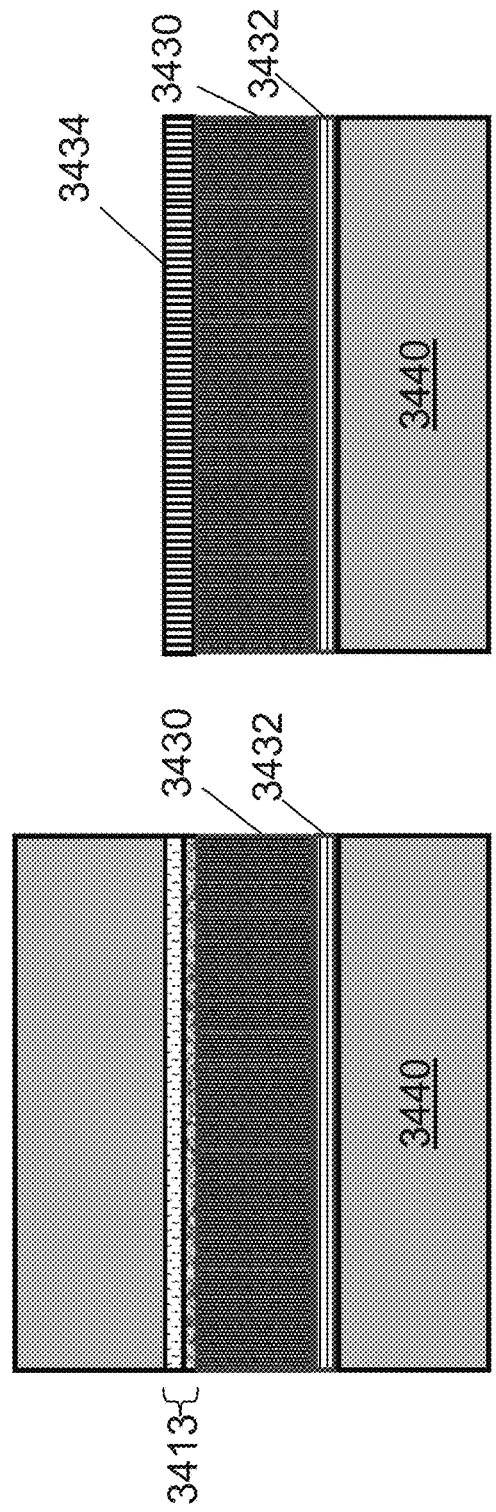
Cut-Views Y-Z Plane
Fig. 34A
Fig. 34B
Fig. 34C
Fig. 34D

Cut-Views Y-Z Plane
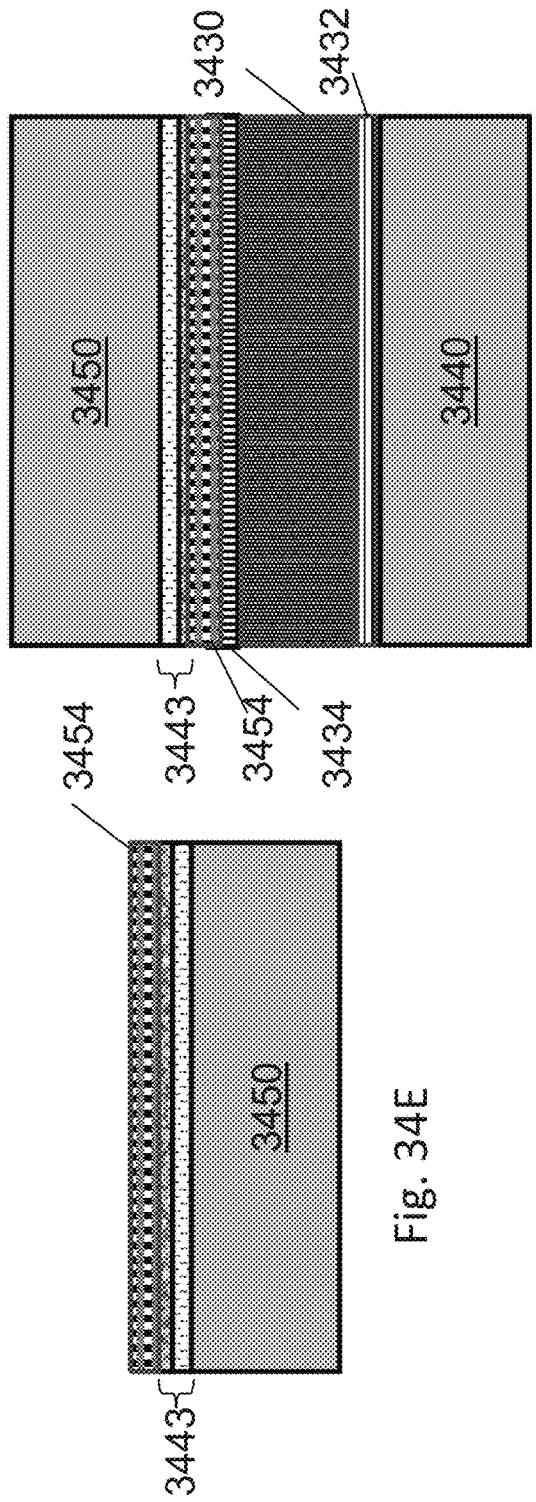
Fig. 34E
Fig. 34F
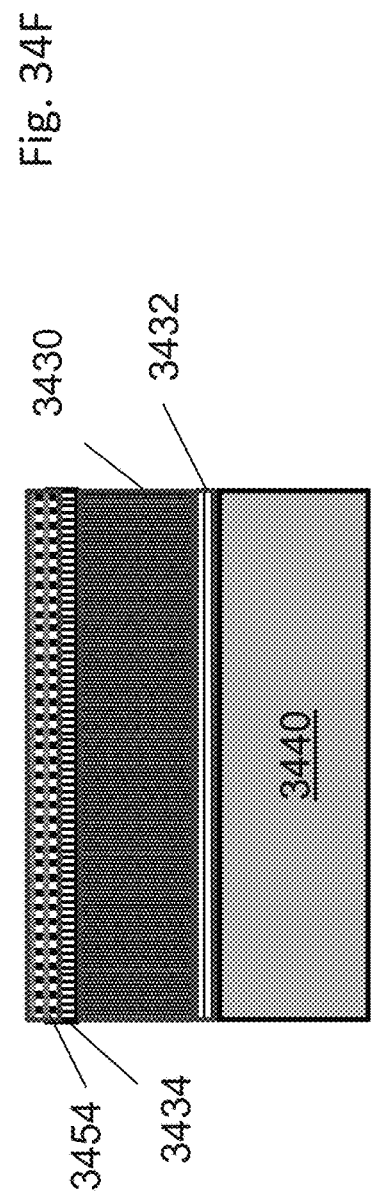
Fig. 34G

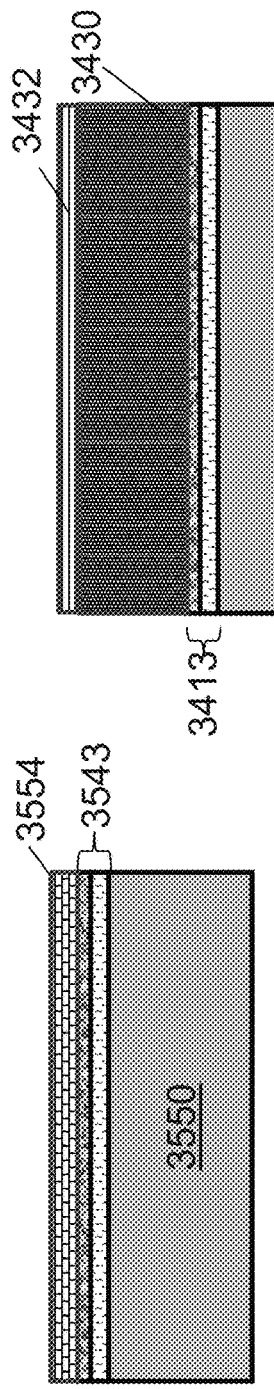
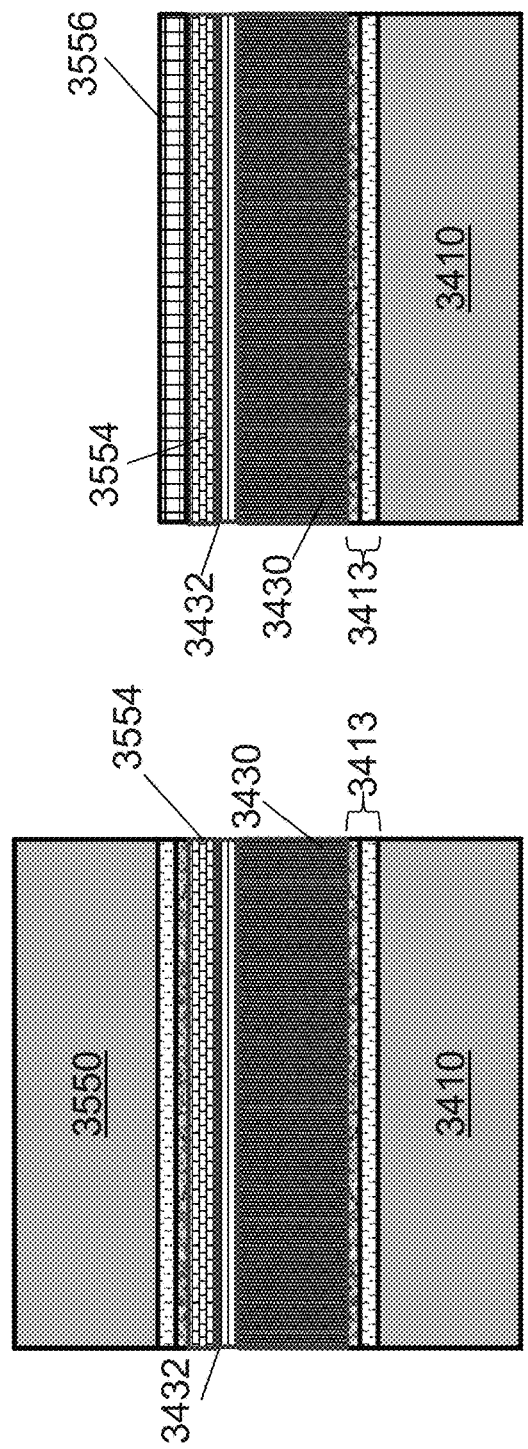
Cut-Views Y-Z Plane
Fig. 35A
Fig. 35B
Fig. 35C
Fig. 35D

| LUT2(A, AN, B, BN) | C | CN | D | DN |
|---|---|---|---|---|
| LUT 2 for C=0 & D=0 | X | T | X | T |
| LUT 2 for C=0 & D=0 | X | T | X | T |
| LUT 2 for C=0 & D=1 | X | T | T | X |
| LUT 2 for C=0 & D=1 | X | T | T | X |
| LUT 2 for C=1 & D=0 | T | X | X | T |
| LUT 2 for C=1 & D=0 | T | X | X | T |
| LUT 2 for C=1 & D=1 | T | X | T | X |
| LUT 2 for C=1 & D=1 | T | X | T | X |

Fig. 36B

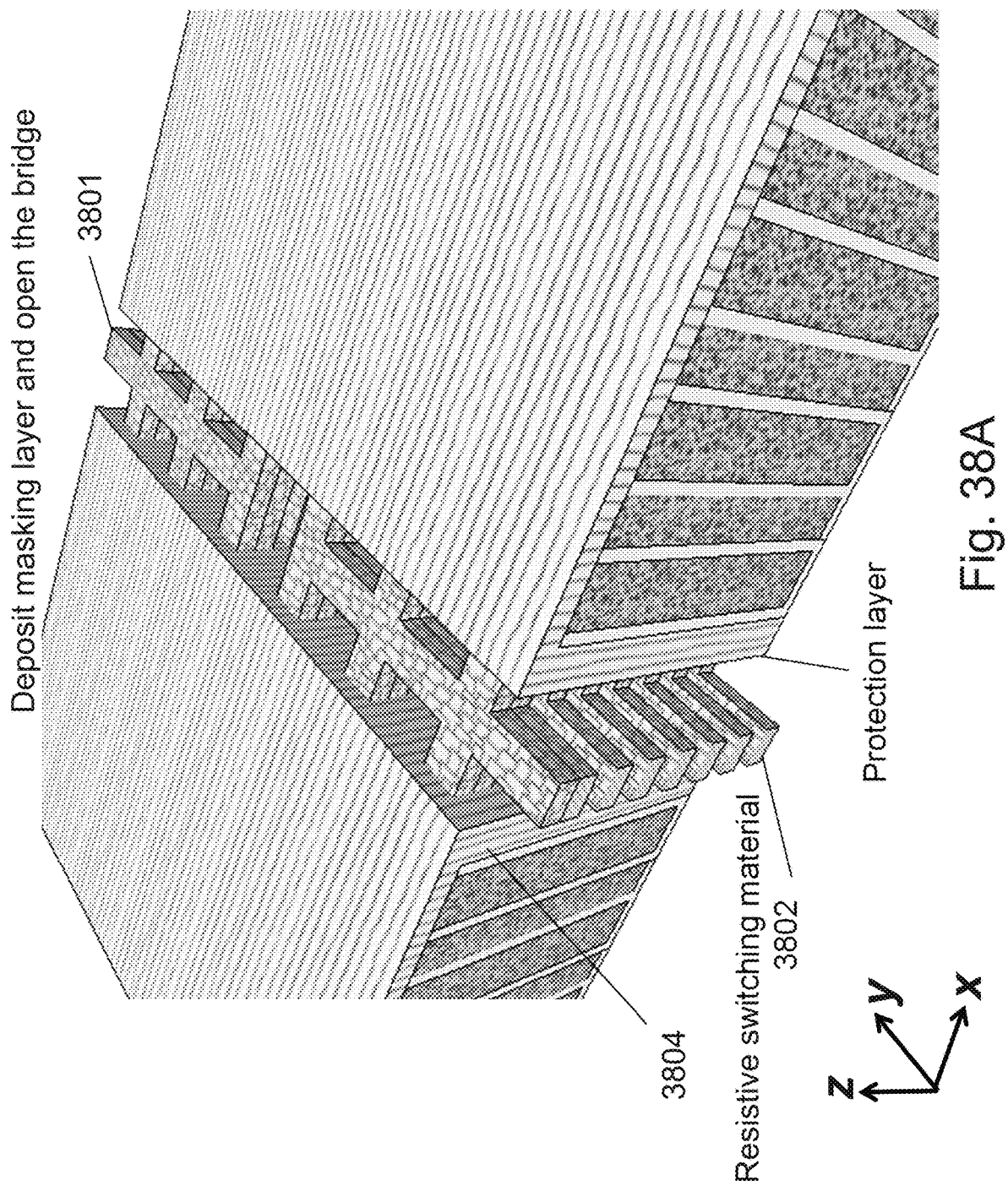

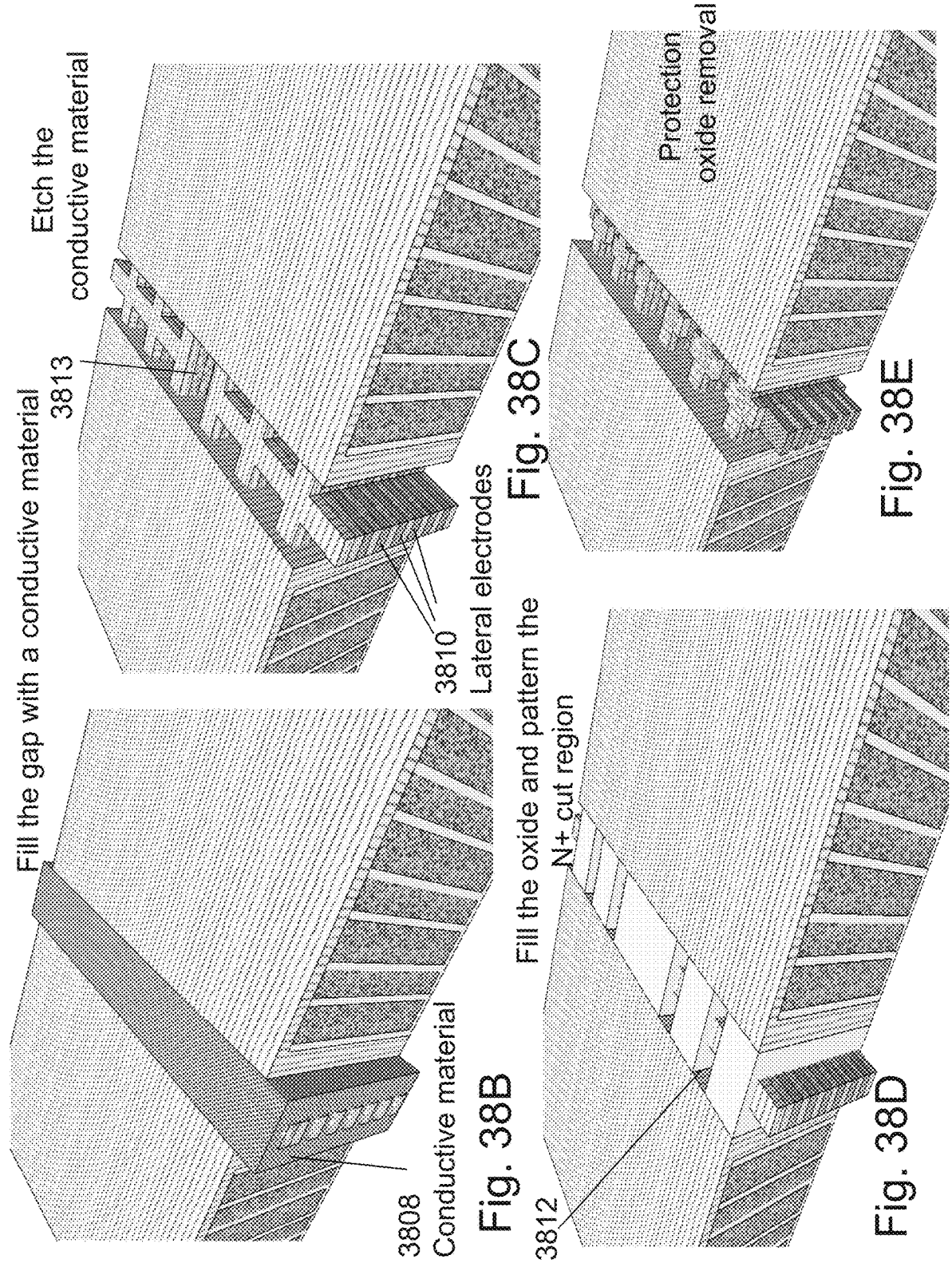

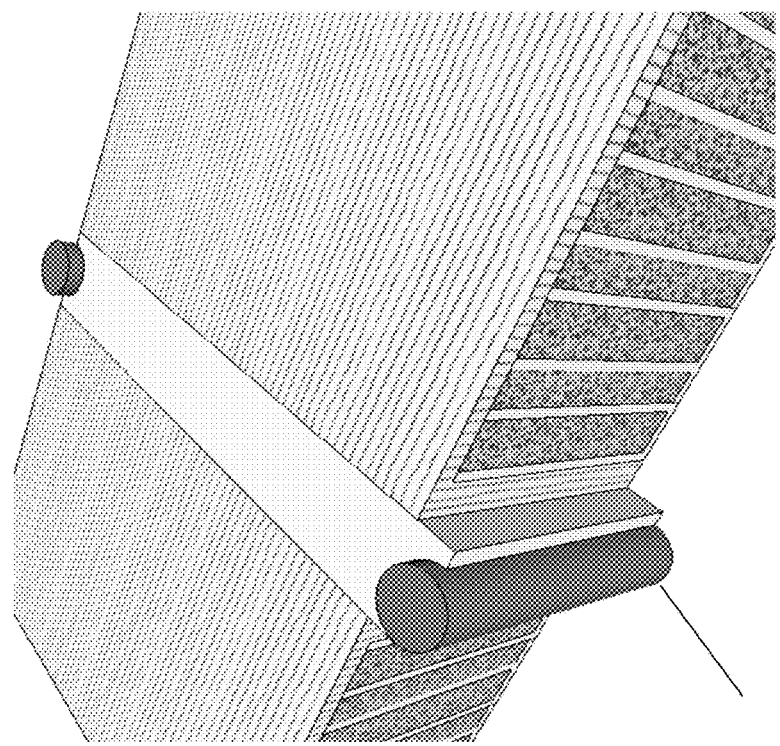
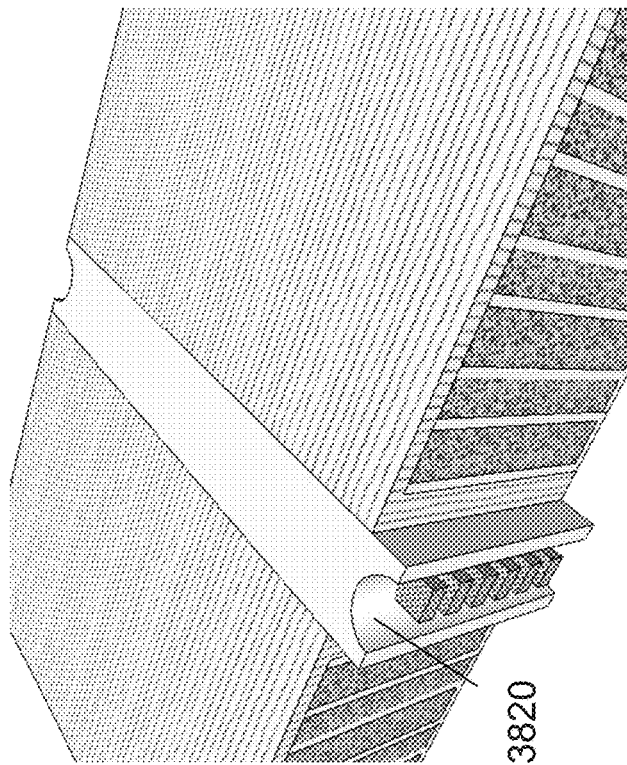
Fig. 38F
Fig. 38G

Cut-Views Y-Z Plane

Cut-Views Y-Z Plane

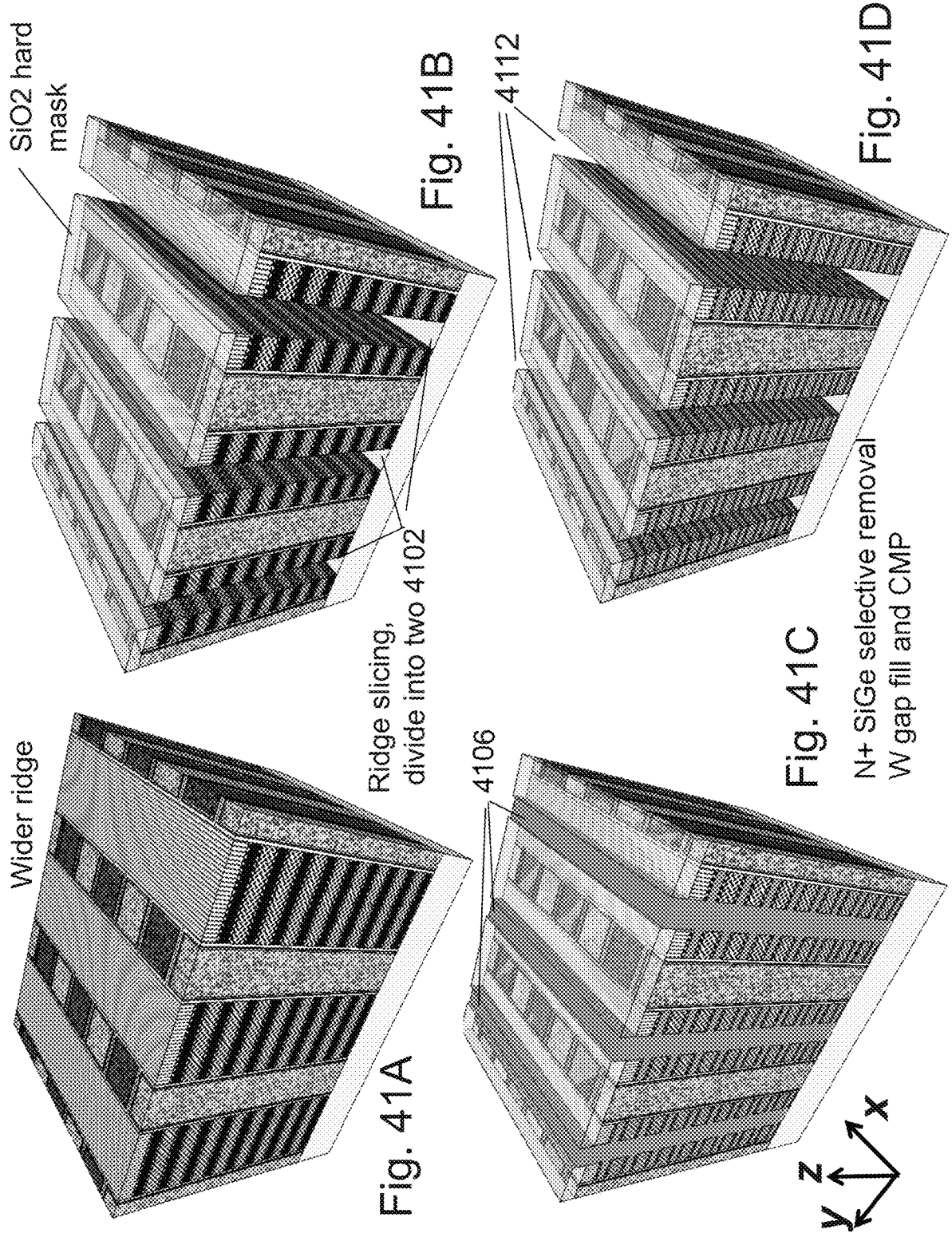

Cut-Views Y-Z Plane

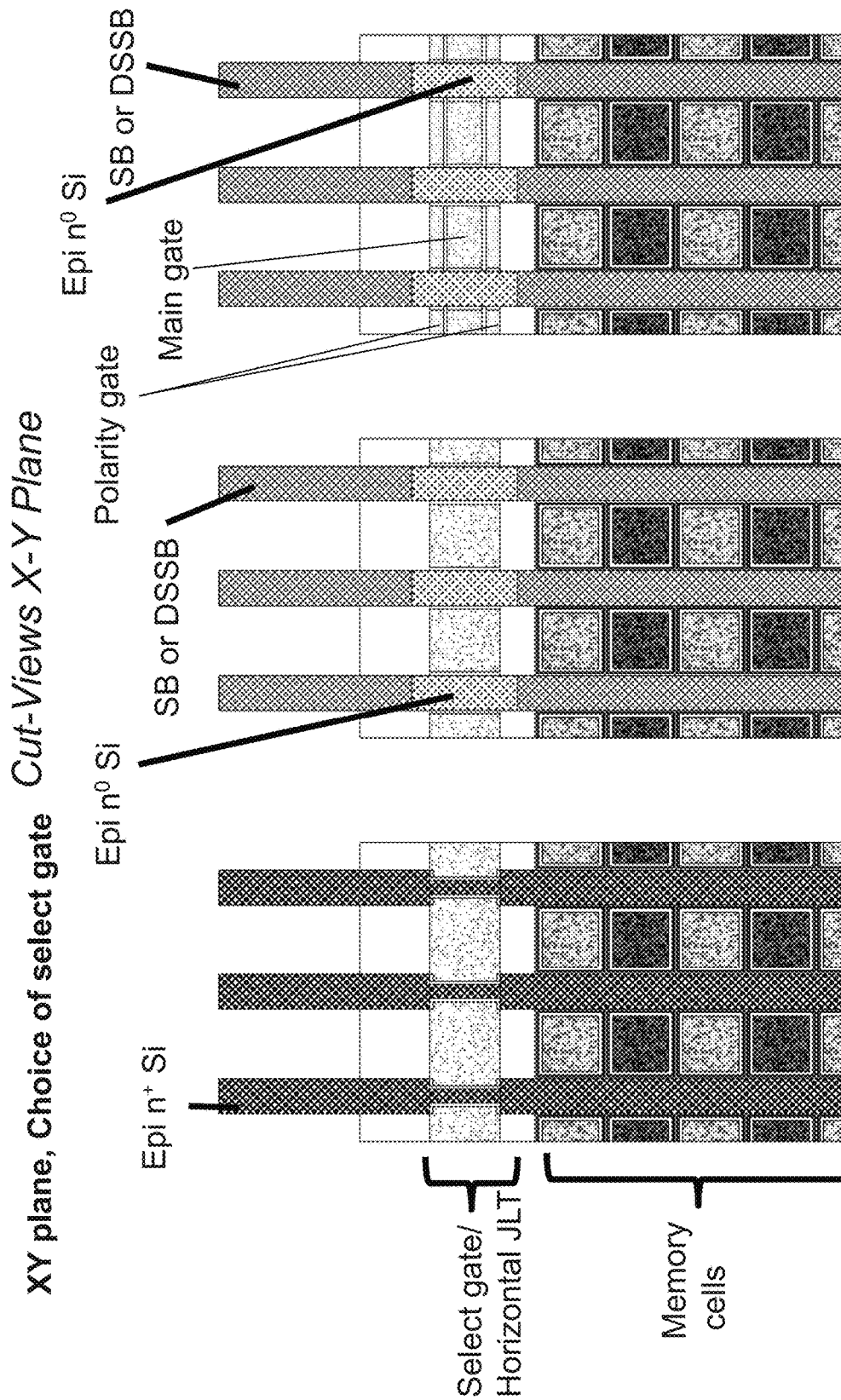

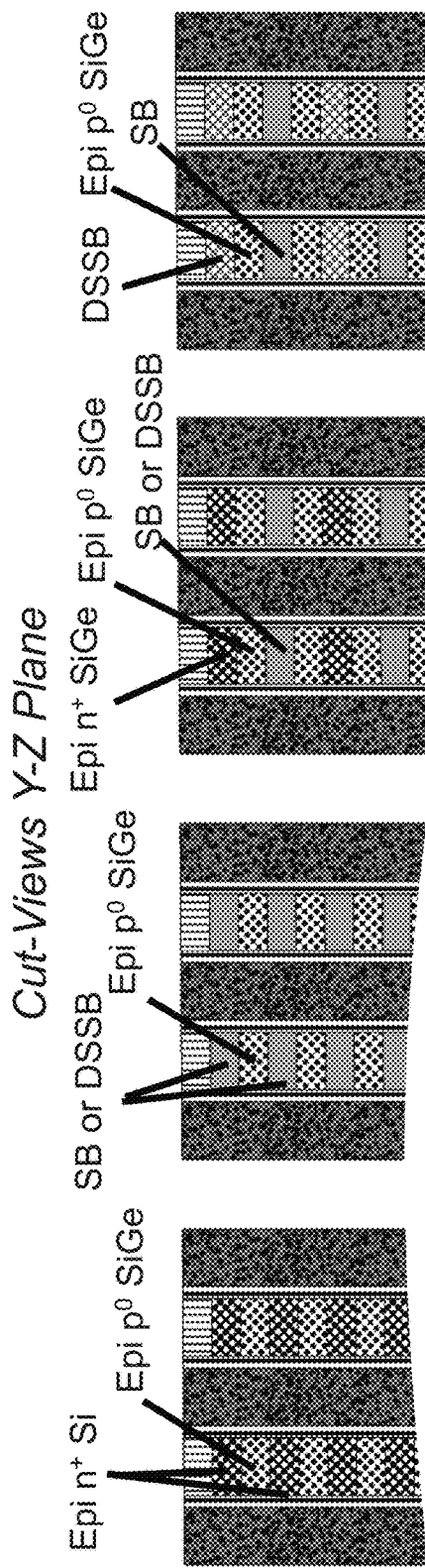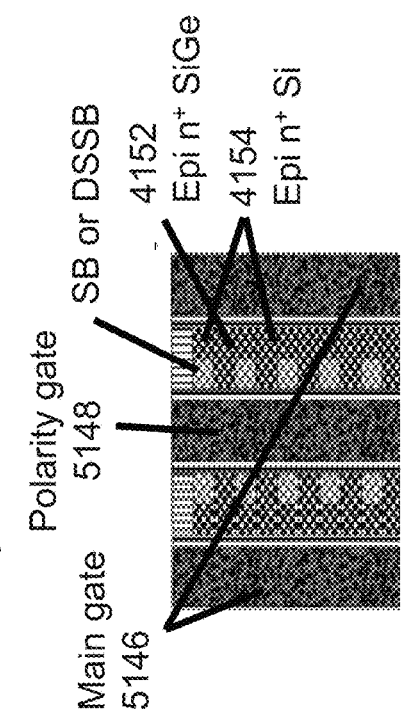

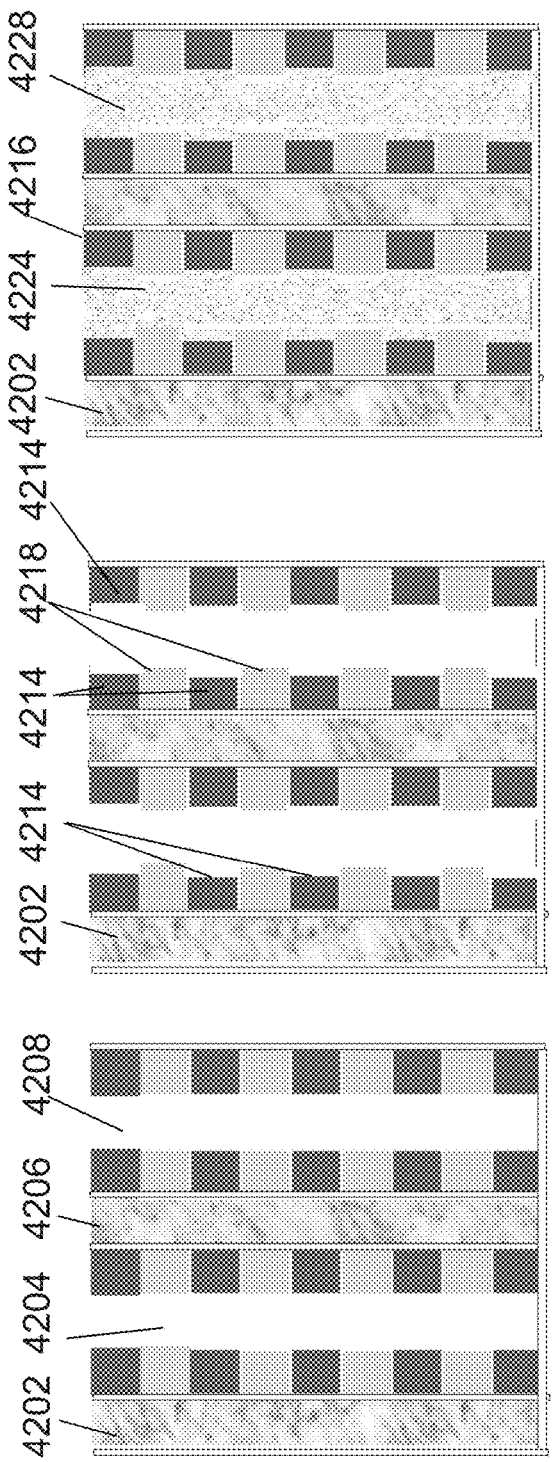
Fig. 42C
Fig. 42B
Fig. 42A
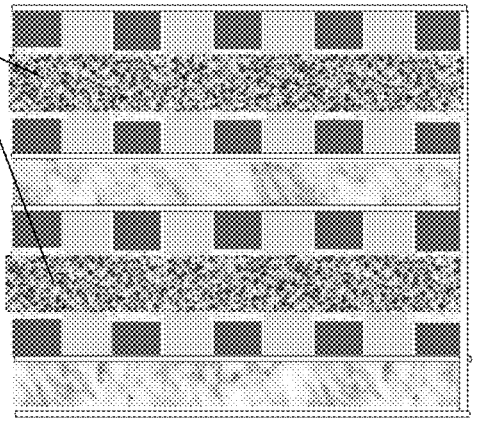
Fig. 42E
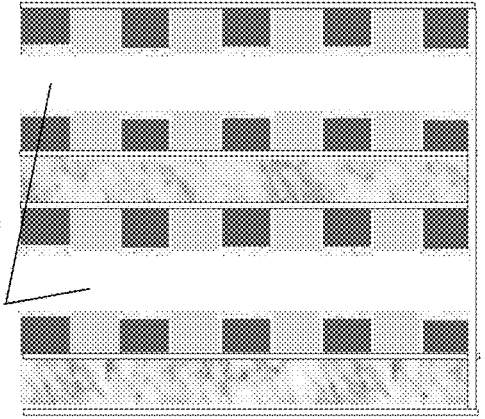
Fig. 42D
Cut-Views Y-Z Plane

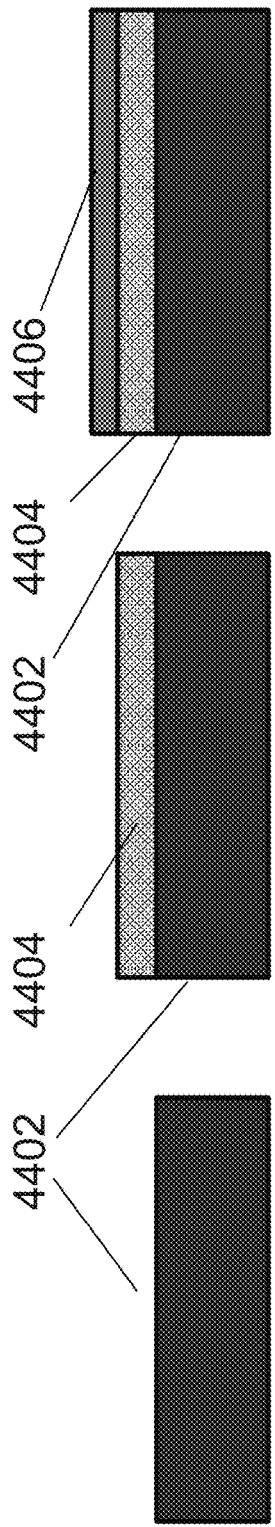
Fig. 44A, Fig. 44B, Fig. 44C
Cut-Views Y-Z Plane
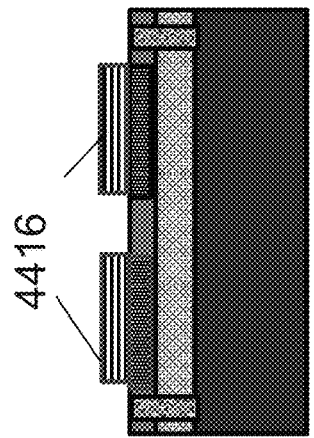
Fig. 44D, Fig. 44E, Fig. 44F
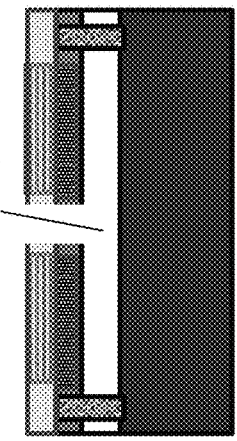
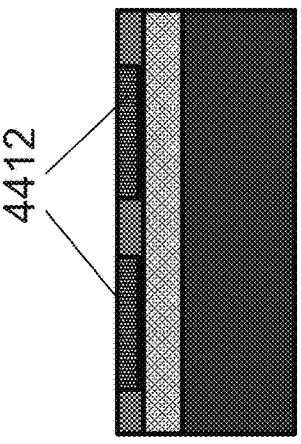
Fig. 44G, Fig. 44H, Fig. 44I
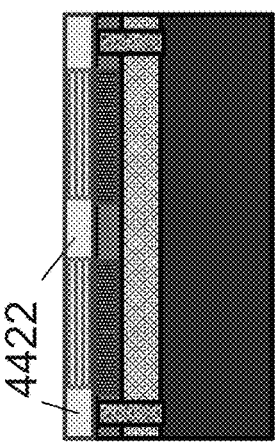

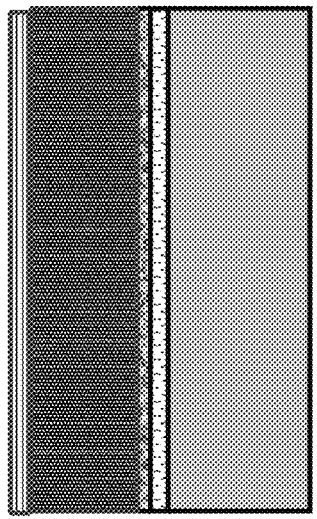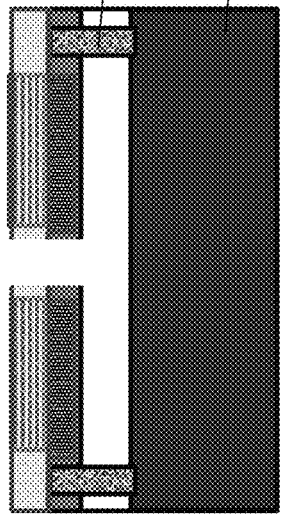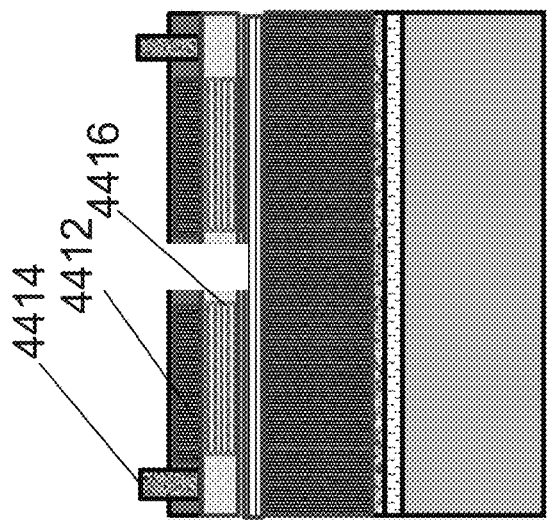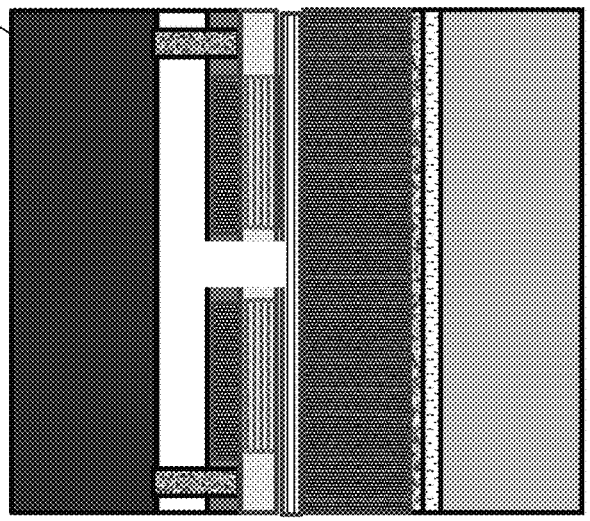
Fig. 45A
Fig. 45B
Fig. 45C
Fig. 45D
Cut-Views Y-Z Plane

METHOD TO PRODUCE A 3D MULTILAYER SEMICONDUCTOR DEVICE AND STRUCTURE

BACKGROUND OF THE INVENTION

1. Field of the Invention

This application relates to the general field of Integrated Circuit (IC) devices and fabrication methods, and more particularly to multilayer or Three Dimensional Integrated Memory Circuit (3D-Memory) and Three Dimensional Integrated Logic Circuit (3D-Logic) devices and fabrication methods.

2. Discussion of Background Art

Over the past 40 years, there has been a dramatic increase in functionality and performance of Integrated Circuits (ICs). This has largely been due to the phenomenon of "scaling"; i.e., component sizes such as lateral and vertical dimensions within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318, 10,515,981, 10,892,016, 10,991,675, 11,121,121, 11,502,095, 10,892,016, 11,270,988, 11,152,386; and pending U.S. Patent Application Publications and applications, Ser. Nos. 14/642,724, 15/150,395, 15/173,686, 62/651,722; 62/681,249, 62/713,345, 62/770,751, 62/952,222, 62/824,288, 63/075,067, 63/091,307, 63/115,000, 63/220,443; and PCT Applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), PCT/US2018/52332 (WO 2019/060798), PCT/US2021/44110, and PCT/US2022/44165. The entire contents of all of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679, 977, 10,943,934, 10,998,374, 11,063,071, and 11,133, 344. The entire contents of the foregoing patents, publications, and applications are incorporated herein by reference.

In addition, the entire contents of U.S. Pat. No. 10,515, 981, U.S. patent application publication 2019/0148286 and U.S. patent applications 62/383,463, 62/371,795, 62/359, 199, 62/349,622, and 62/323,717 are incorporated herein by reference.

In landmark papers at VLSI 2007 and IEDM 2007, Toshiba presented techniques to construct 3D memories which they called—BiCS. Many of the memory vendors followed that work by variation and alternatives mostly for non-volatile memory applications, such as now being referred to as 3D-NAND. They provide an important manufacturing advantage of being able to utilize one, usually 'critical', lithography step for the patterning of multiple layers. The vast majority of these 3D Memory schemes use poly-silicon for the active memory cell channel which suffers from higher cell to cell performance variations and lower drive than a cell with a monocrystalline channel. In our U.S. Pat. Nos. 8,026,521, 8,114,757, 8,687,399, 8,379, 458, and 8,902,663, incorporated herein by reference, we presented multiple 3D memory structures generally constructed by successive layer transfers using ion cut techniques. In this work we are presenting multiple methods and structures to construct 3D memory with monocrystalline channels constructed by alternative methods to successive layer transfers. These structures provides the cost advantage of multiple layers being processed following one lithography step with many of the benefits of a monocrystalline channel, and provides overall lower construction costs and better device performance.

SUMMARY

The invention relates to multilayer or Three Dimensional Integrated Circuit (3DIC) devices and fabrication methods.

In one aspect, a multilevel semiconductor device, including: a first level including a first array of first memory cells, where each of the first memory cells includes one first transistor; a second level including a second array of second memory cells, where each of the second memory cells includes one second transistor; a third level including a third array of third memory cells, where each of the third memory cells includes one third transistor, where the second level overlays the first level, and where the third level overlays the second level; memory control circuits connected so to individually control cells of the first memory cells, the second memory cells, and the third memory cells, where the device includes an array of units, where each of the units includes a plurality of the first memory cells, a plurality of the second memory cells, a plurality of the third memory cells, and a portion of the memory control circuits, where the array of units includes at least four rows and four columns of the units, where at least one of the first transistor is self-aligned to at least one of the third transistor, being formed following the same lithography step, where each of the units includes a memory array of at least eight rows and eight columns of second memory cells, and where the memory control is designed to control independently each of the units; and a per level connection structure for each of the units connecting the portion of the memory control circuits to the first memory cells, the second memory cells, and the third memory cells.

In another aspect, a multilevel semiconductor device, including: a first level including a first array of first memory cells, where each of the first memory cells includes one first transistor; a second level including a second array of second memory cells, where each of the second memory cells includes one second transistor; a third level including a third array of third memory cells, where each of the third memory cells includes one third transistor, where the second level overlays the first level, and where the third level overlays the second level; and memory control circuits connected so to individually control cells of the first memory cells, the second memory cells, and the third memory cells, where the device includes an array of units, where each of the units includes a plurality of the first memory cells, a plurality of the second memory cells, a plurality of the third memory cells, and a portion of the memory control circuits, where the array of units includes at least four rows and four columns of the units, where at least one of the first transistor is self-aligned to at least one of the third transistor, being formed following the same lithography step, where each of the units includes a memory array of at least eight rows and eight columns of second memory cells, and where the memory control is designed to control independently each of the units, where the memory control circuits include a plurality of single crystal transistors.

In another aspect, a multilevel semiconductor device, including: a first level including a first array of first memory cells, where each of the first memory cells includes one first transistor; a second level including a second array of second memory cells, where each of the second memory cells includes one second transistor; a third level including a third array of third memory cells, where each of the third memory cells includes one third transistor, where the second level overlays the first level, and where the third level overlays the second level; memory control circuits connected so to individually control cells of the first memory cells, the second memory cells, and the third memory cells, where the device includes an array of units, where each of the units includes a plurality of the first memory cells, a plurality of the second memory cells, a plurality of the third memory cells, and a portion of the memory control circuits, where the array of units includes at least four rows and four columns of the units, where at least one of the first transistor is self-aligned to at least one of the third transistor, being formed following the same lithography step, and where the memory control is designed to control independently each of the units, where the memory cells include a charge trap structure or a floating gate structure.

In another aspect, a method of making a 3D multilayer semiconductor device, the method including: providing a first substrate including a first level, the first level including a first single crystal silicon layer; providing a second substrate including a second level, the second level including a second single crystal silicon layer; performing an epitaxial growth of a SiGe layer on top of the second single crystal silicon layer; performing an epitaxial growth of a third single crystal silicon layer on top of the SiGe layer, where the third single crystal silicon layer has an average thickness of less than 2,000 nm; forming a plurality of second transistors each including a single crystal channel; forming a plurality of metal layers interconnecting the plurality of second transistors; and then performing a bonding of the second level onto the first level, where performing the bonding includes making oxide-to-oxide bond zones; and performing removal of a majority of the second single crystal silicon layer.

In another aspect, a method of making a 3D multilayer semiconductor device, the method including: providing a first substrate including a first level, the first level including a first single crystal silicon layer; providing a second substrate including a second level, the second level including a second single crystal silicon layer; performing an epitaxial growth of a SiGe layer on top of the second single crystal silicon layer; performing an epitaxial growth of a third single crystal silicon layer on top of the SiGe layer; forming a plurality of second transistors each including a single crystal channel; forming a plurality of metal layers interconnecting the plurality of second transistors; and then performing a bonding of the second level onto the first level, where performing the bonding includes making oxide-to-oxide bond zones; performing removal of a majority of the second single crystal silicon layer; and processing a through layer via substantially through the third single crystal silicon layer.

In another aspect, a method of making a 3D multilayer semiconductor device, the method including: providing a first substrate including a first level, the first level including a first single crystal silicon layer; providing a second substrate including a second level, the second level including a second single crystal silicon layer; performing an epitaxial growth of a SiGe layer on top of the second single crystal silicon layer; performing an epitaxial growth of a third single crystal silicon layer on top of the SiGe layer; performing etching of at least a portion of the SiGe layer; forming a plurality of second transistors each including a single crystal channel; forming a plurality of metal layers interconnecting the plurality of second transistors; and then performing a bonding of the second level onto the first level, where performing the bonding includes making oxide-to-oxide bond zones; and performing removal of a majority of the second single crystal silicon layer.

BRIEF DESCRIPTION OF THE DRAWINGS

Various embodiments of the invention will be understood and appreciated more fully from the following detailed description, taken in conjunction with the drawings in which:

FIGS. 1A and 1B are example illustrations of forming multilayer porous structures;

FIG. 2 is an example illustration of multilayer porous structures;

FIGS. 3A-3I are example illustrations of the formation and structure of vertically oriented 3D memories;

FIGS. 5A-5E are example illustrations of the formation and structure of a NOR type 3D memory;

FIGS. 8A-8L are example illustrations of the formation and structure of a NOR type 3D memory;

FIGS. 9A-9F are example illustrations of the formation and structure of a NOR type 3D memory;

FIGS. 11A-11C are example illustrations of substrate leakage suppression;

FIGS. 13A-13E are example illustrations of the formation of per ridge select of a NOR type 3D memory;

FIGS. 14A-14E are example illustrations of the formation of staircase structure of a NOR type 3D memory;

FIGS. 15A-15D are example illustrations of 3D memory arrangements;

FIGS. 16A-16B are example illustrations of the formation and structure of 3D Memory with dual functionality;

FIG. 17 is an example illustration of a architecture of a 3D-NOR array;

FIG. 18 is an example illustration of operating conditions for the cell with 2 bit per facet—mirror-bit;

FIGS. 19A-19B are additional example illustrations of block diagrams of circuit control circuits;

FIGS. 22A-22B are example illustrations a basic building block for programmable logic using the 3D NOR fabric and a corresponding programming table;

FIGS. 30A-30D are example illustrations of an alternative formation of pillar select devices;

FIGS. 31A-31F are example illustrations of alternative for the logic access to the RRAM/OTP pillars;

FIGS. 34A-34G are example illustrations of a review the system process flow;

FIGS. 35A-35D are example illustrations of stack structure variations;

FIGS. 36A-36B are example illustrations of a 3D NOR fabric for implementing a LUT-4 including a 4 to 1 selector fabric and a corresponding programming table;

FIGS. 38A-38I are example illustrations of a process flow for adding Lateral RRAM for Y direction connectivity to a 3D NOR fabric;

FIGS. 42A-42E are example illustrations of an additional alternative formation and structure of a NOR type 3D memory;

FIGS. 44A-44I are example illustrations of an alternative system process flow; and FIGS. 45A-45D are example illustrations of the structure transfer of an alternative system process flow.

DETAILED DESCRIPTION

Figure 3C:
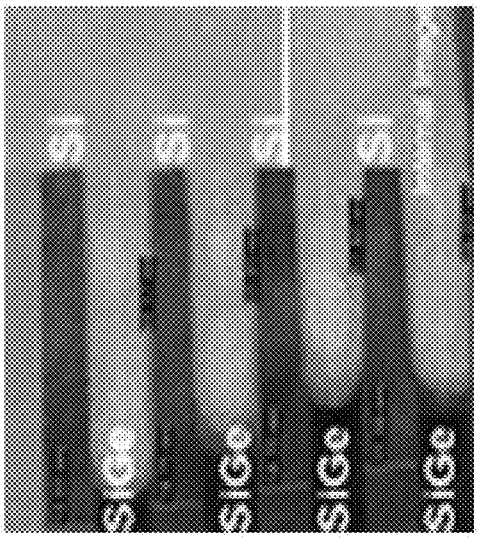

An embodiment or embodiments of the invention are now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by the appended claims.

Some drawing figures may describe process flows for fabricating devices. The process flows, which may be a sequence of steps for fabricating a device, may have many structures, numerals and labels that may be common between two or more successive steps. In such cases, some labels, numerals and structures used for a certain step's figure may have been described in the previous steps' figures.

Memory architectures include at least two important types—NAND and NOR. The NAND architecture provides higher densities as the transistors forming the memory cells are serially connected with only an external connection at the beginning and end of the cell string as is illustrated in at least U.S. Pat. No. 8,114,757, FIGS. 37A-37G. NOR architectures are less dense but provide faster access and could work sometimes when the NAND architecture cannot as individual NOR memory cells are directly accessible and in many cases both its source and drain are accessible, such as being illustrated in at least U.S. Pat. No. 8,114,757, FIGS. 30A-30M. It should be understood that NOR type architecture does not limit its use to only a non-volatile memory but NOR type refers broadly both the non-volatile memory such as Flash memory and volatile memory such as DRAM.

The memory cell could be constructed with conventional N type or P type transistors where the channel doping may be of opposite type with respect to the source and drain doping or the memory cell could utilize a junction-less transistor ('JLT') construction where the gate could significantly deplete the channel when in the off-state. For some architectures, the junction-less transistor is attractive as it may take less processing steps (or provide other device advantages such as a low leakage off-state) to form the memory array without the need to form a change in doping along the transistor.

Some 3D Memory architectures are utilizing a horizontal memory transistor, for example, such as illustrated in at least U.S. Pat. No. 8,114,757 in at least FIGS. 37A-37G and FIGS. 30A-30M. Others may use vertical memory transistors, for example, such as in the Toshiba BiCS architecture such as illustrated in at least U.S. Pat. No. 7,852,675.

Multiple methods to construct 3D memory structures using horizontal junction-less transistors for a NAND architecture, and for horizontal NAND and NOR architectures in general may be found in, for example, such as U.S. Pat. No. 8,114,757 in at least FIG. 33 and FIG. 37. The following would present multiple techniques to form a multilayer silicon over oxide start structure equivalent to, for example, such as at least FIGS. 33D and 37D (of U.S. Pat. No. 8,114,757), without the use of ion-cut layer transfer.

The starting structure could be similar to FIG. 41A of U.S. application Ser. No. 14/642,724, incorporated herein by reference, as illustrated in FIG. 1A. A base donor substrate 110 may be used to form a dual porous layer for future cut layer 113 on which an epitaxial process may be used to form relatively thick crystalline layer 120. Future cut layer 113 may include two porous layers; an upper layer of porous silicon, which may contain microscopic pores of diameter of a few nm, and below this may be formed a lower layer of porous silicon for which the pore diameter may be a few (or more) times greater (similar to FIG. 23 of U.S. application Ser. No. 14/642,724), for the future 'cut' or cleave. The epitaxial formation of relatively thick crystalline layer 120 could include successively altering the addition of dopants to further support the following steps.

Then, by utilizing anodizing processes, thick crystalline layer 120 may be converted to a multilayer of alternating low porosity over high porosity as illustrated in FIG. 1B, which is similar to FIG. 41B of Ser. No. 14/642,724. The alternating-porosity multilayer can be converted later into alternating multilayer of monocrystalline-Si over insulating $SiO_2$, as described below. Herein, the monocrystalline can be understood as single-crystalline or single crystal interchangeably. FIG. 1B illustrates relatively thick crystalline layer 120 after going through a porous formation process which forms multilayer structure 122. Multilayer structure 122 may include layer 144, layer 142, layer 140, layer 138, layer 136, layer 134 and layer 132. Multilayer structure 122 may include base donor wafer substrate 110 with porous cut layer 113 for the planned transfer of the fabricated multilayer structure over the target wafer, which could include the memory peripheral circuits prefabricated on the target wafer. Alternatively, multilayer structure 122 may not include porous cut layer 113 when the transfer to a target wafer is not intended. Layer 144 could be the portion of layer 120 which remains after the multi-layer processing. The alternating layers could have alternating porosity levels such as layers 132, 136, 140 with porosity of less than 30% or less than 40% while layers 134, 138, 142 with porosity over 50% or over 60%, or layers 132, 136, 140 with a porosity of less than 55% while layers 134, 138, 142 with porosity over 65%, or other alternating level of porosity based on the target application, process, and engineering choices. Each layer may include a varying porosity thru its thickness, or a number of sublayers of varying porosity.

The number of alternating layers included in multilayer structure 122 could be made as high as the number of layers needed for the 3D memory (for example, greater than 20, greater than 40, greater than 60, or greater than 100) or for the transferring of a subset of multilayer structures one on top of the other to form the desired final structure. The porosity modulation could be achieved, for example, by (1) alternating the anodizing current, or (2) changing the light illumination to the silicon structure while in the anodizing process, or (3) by first alternating the doping as layer 120 is being grown through epitaxial process. Below are listed few embodiments of the above method of forming a c-Si/$SiO_2$ multilayer from an alternated porosity multilayer For example, U.S. Pat. No. 7,772,096, incorporated herein by reference, teaches the formation of a multilayer structure according to (3) above, starting with alternate doping following these steps:
  i—Epitaxially grow alternating layers of p+ silicon 134, 138, 142, with dopant concentrations in the range of $1\times10^{19}$ cm$^{-3}$ to $2\times10^{20}$ cm$^{-3}$, respectively, over p-type silicon layers 132, 136, 140, with dopant concentrations in the range of $1\times10^{14}$ cm$^{-3}$ to $5\times10^{18}$ cm$^{-3}$. Layers 132, 134, 136, 138, 140, 142 could have thickness of 3 nm to 20 nm, or even thicker such as 20 nm to 100 nm.
  ii—Perform an anodization process in a hydrofluoric acid (HF) containing electrolyte solution to convert the doped layers to porous layers. The p+ layers 134, 138, 142 would convert to a high porosity layer with coarse porous structures while the p layers 132, 136, 140 will convert to a fine porous structure.
  iii—Perform an oxidization process to convert the p+ 134, 138, 142 layers to oxide.
  iv—Perform a high temperature annealing, for example, such as at 1,000° C. for a few hours, to convert the p 132, 136, 140 layers into high quality monocrystalline layers.

Alternatively, the above steps ii-iv can be carried out after valleys 151, 152 and ridges 154 are formed by masking and etch processes as shown in FIG. 2, where valleys 151 may be filled by, for example, isolation oxide or contact metal or gate stacks in subsequent processing (not shown). Valleys 151 may include regions of opening (not shown). Thus a second desired multilayer structure 124 may be formed.

The above processing may result in first desired multilayer structure 122 or second desired multilayer structure 124 for the formation of 3D memories.

In yet another embodiment of method (3), U.S. patent application Ser. No. 12/436,249, incorporated herein by reference, teaches an alternative method for the formation of the multilayer structure 122 with alternating doping. In brief, the method starts by multiple depositions of amorphous silicon with alternating doping, then performing a solid phase recrystallization to convert the stack into a stack of p-type doped single crystal Si-containing layers using a high temperature recrystallization, with recrystallization temperatures from about 550° C. to about 700° C. After recrystallization, the single crystal Si-containing layers could be subjected to anodization and so forth as presented in ii-iv above. U.S. patent application Ser. No. 12/436,249 teaches alternatives for the formation of the alternating doping layer structure which could be employed herein for the 3D memory multilayer structure formation.

In an embodiment of method (2), the epitaxial layer 120 could include alternating n doped and n+ doped layers. The porous formation of the n doped layers may be assisted by light to form the holes for the anodizing process to effectively work as had been presented in S. Frohnhoff et. al., Thin Solid Films, (1994), U.S. patent application Ser. Nos. 10/674,648, 11/038,500, 12/436,249 and U.S. Pat. No. 7,772,096, all of these incorporated herein by reference. Following the anodizing step, the structure could be oxidized and then annealed as presented in steps iii and iv above.

In an embodiment of method (1), a method to form alternating layers of coarse and fine porous layers is by alternating the anodizing current similar to the description in "Porous silicon multilayer structures: A photonic band gap analysis" by J. E. Lugo et al J. Appl. Phys. 91, 4966 (2002), U.S. Pat. No. 7,560,018, U.S. patent application Ser. No. 10/344,153, European patent EP0979994, and "Photonic band gaps analysis of Thue-Morse multilayers made of porous silicon" by L. Moretti at el, 26 Jun. 2006/Vol. 14, No. 13 OPTICS EXPRESS, all of these incorporated herein by reference. Following the anodizing step, the structure could be oxidized and then annealed as presented in steps iii and iv above.

The anodizing step could be done as a single wafer process or lot of wafers by using a batch mode as illustrated in U.S. Pat. No. 8,906,218, incorporated herein by reference and other similar patents assigned to a company called Solexel.

Figure 31D:
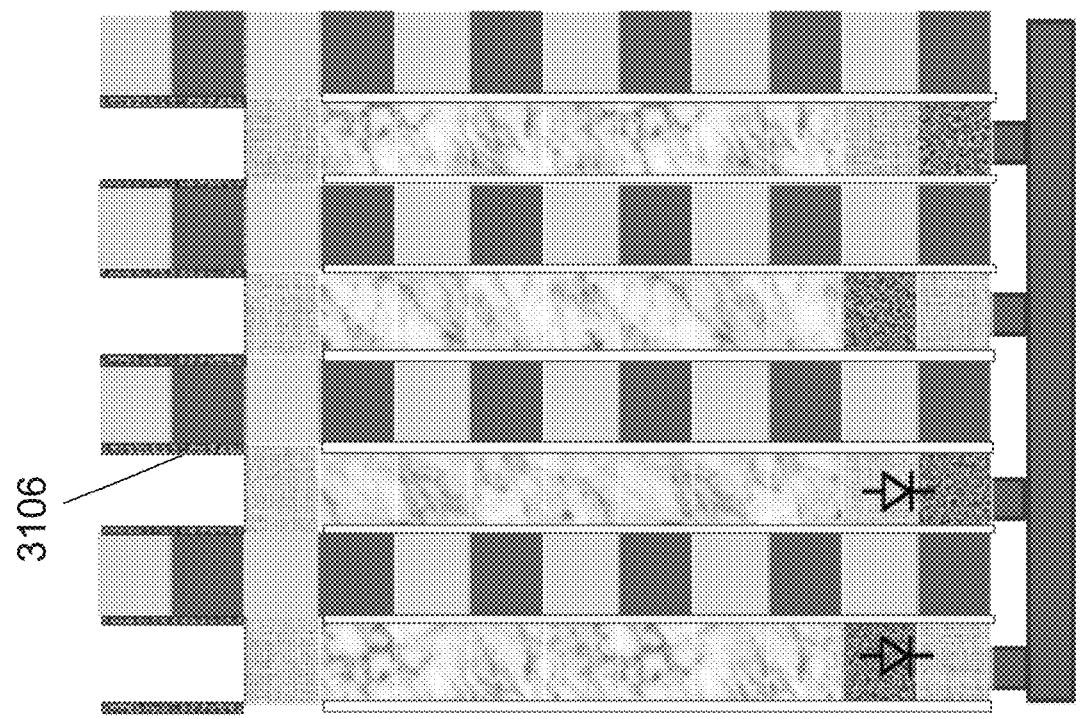

In yet another embodiment combining methods (3) and (2), the multilayer structure 122 may be formed by first forming a multilayer structure of alternating n type over p type. Such a method is illustrated in U.S. Pat. No. 8,470,689 and in "Silicon millefeuille": From a silicon wafer to multiple thin crystalline films in a single step" by D. Hernandez et al., Applied Physics Letters 102, 172102 (2013); both incorporated herein by reference. These methods leverage the fact that such n type silicon would not become porous without light while p type silicon would only need current for the anodizing process to take place. For these methods the multilayer of n over p could be first etched to form the multilayer pattern such as is illustrated in FIG. 31E or FIG. 37E of U.S. Pat. No. 8,114,757 followed by an anodizing process to convert the p type silicon to porous while leaving then type solid and un-etched. Then the step of oxidation step iii could be used to convert the porous layer to an isolation layer. The annealing step iv could be made short or skipped as the n layers might be very lightly etched or not be etched at all.

In yet another embodiment of method (3), a multilayer structure could be achieved by successive epitaxial growths of n type silicon over p+ type silicon multiple times for which the n silicon could be etched at a much higher rate than the p+ silicon. In a paper titled: "Fabrication of conducting GeSi/Si microand nanotubes and helical microcoils" by S V Golod, V Ya Prinz, V I Mashanov and A K Gutakovsky, Semicond. Sci. Technol. 16 (2001) 181-185, incorporated herein by reference, it presents that p+ silicon would be etched at a much lower rate than n silicon, quoting: "As a selective etchant, an ammonium hydroxide-water solution can be used. It was shown in [8] that the 3.7 wt. % NH4OH solution has a pp+ selectivity of approximately 8000:1 at 75° C. and boron concentration $p+=10^{20}$ $cm^{-3}$."

Another alternative is an embodiment of method (4), according to which one forms multilayers of silicon over $Si_{1-x}Ge_x$ as illustrated in "New class of Si-based superlattices: Alternating layers of crystalline Si and porous amorphous $Si_{1-x}Ge_x$ alloys" by R. W. Fathauer et al., Appl. Phys. Lett. 61 (19), 9 Nov. 1992, incorporated herein by reference. In such a multilayer structure there is high degree of selectivity in etching Si1−x Gex layers over Si layers. This may be followed by oxidation such as step iii. and anneal step iv. which could provide multilayers of silicon over oxide. In a paper titled: "Novel Three Dimensional (3D) NAND Flash Memory Array Having Tied Bit-line and Ground Select Transistor (TiGer)" by Se Hwan Park et al, IEICE Transactions on Electronics. May 2012, incorporated herein by reference, the authors present the use of multilayers of silicon over $Si_{1-x}Ge_x$ for forming a 3D NAND device.

An alternative method to the modulated-porosity method for forming c-Si/SiO2 multilayers may be to utilize the Bosch process. In a paper titled "Fabrication and Characterization of Vertically Stacked Gate-All-Around Si Nanowire FET Arrays" by Davide Sacchetto et al. at IEEE SDDR09, incorporated herein by reference, a technique used for deep hole etch has been applied to form structures of crystalline lines one on top of the other each with oxide all around. Similar techniques could be used to form the base structure for 3D memory.

Yet another alternative for forming c-Si/SiO2 multilayer structures is direct epitaxy of silicon, special oxide, and silicon again. The special oxide is a rare-earth oxide which, if deposited properly, would keep the crystal structure of the silicon to allow the growth of crystalline silicon on top of the special oxide as presented in at least U.S. patent application publication 2014/0291752, incorporated herein by reference.

The epitaxial process of multilayers of an n+ type layer over a p type layer could be done at low temperatures such as below about 400° C., 400-500° C., 500-600° C., 600-700° C. or below about 800° C. to reduce the dopant movement of the n+ layer, at the lower portion of the multilayer structure, into the p type layer as the multilayer structure is being formed, which is also referred to as 'autodoping.' There are known epitaxial processes in the art which allow good quality layers to be formed while keeping the process temperature low to avoid autodoping. For example, such has been presented in papers by D. SHAHRJERDI, titled "Low-Temperature Epitaxy of Compressively Strained Silicon Directly on Silicon Substrates" published at Journal of ELECTRONIC MATERIALS, Vol. 41, No. 3, 2012; by S. Wirths titled "Low temperature RPCVD epitaxial growth of Si1_xGex using Si2H6 and Ge2H6" published at Solid-State Electronics 83 (2013) 2-9"; and by Pere Roca I Cabarrocas titled "Low temperature plasma deposition of silicon thin films: From amorphous to crystalline" published at Journal of Non-Crystalline Solids, Elsevier, 2012, 358 (17), pp. 2000-2003; by R. Kircher et al. titled "LOW-TEMPERATURE EPITAXY AND IN-SITU DOPING OF SILICON FILMS" published in JOURNAL DE PHYSIQUE IV September 1991, and in U.S. Pat. Nos. 7,262,116, 8,778,811 and application US 2014/0045324, all of the forgoing papers and patents incorporated herein by reference.

Base wafers or substrates, or acceptor wafers or substrates, or target wafers substrates herein may be substantially comprised of a crystalline material, for example, mono-crystalline silicon ("Si") or germanium ("Ge"), or may be an engineered substrate/wafer such as, for example, an SOI (Silicon on Insulator) wafer or GeOI (Germanium on Insulator) substrate. Similarly, donor wafers herein may substantially comprise a crystalline material and may include, for example, mono-crystalline silicon or germanium, or may be an engineered substrate/wafer such as, for example, an SOI (Silicon on Insulator) wafer or GeOI (Germanium on Insulator) substrate, depending on design and process flow choices.

3D Memory may be multi-layers of 2D memory in which memory cells are placed as a matrix with rows and columns. These memory cells are controlled by memory control lines such as bit-lines, source-lines, and word-lines, usually in a perpendicular arrangement, so that by selecting a specific bit-line and specific word-line one may select a specific memory cell to write to or read from. In a 3D memory matrix, having three dimensions, selecting a specific memory cell requires the selection of a specific layer, which could be done by additional memory control lines such as select-lines. As presented herein, some of the select lines could be formed in the semiconductor layer in which the memory devices are built into (for example, in at least FIGS. 31H—SL 3134 and FIG. 50D SL 5034 of U.S. Pat. No. 8,114,757). Other select lines could be deposited or formed thru epitaxial growth. These memory control lines could therefore comprise semiconductor materials such as silicon (for example monocrystalline) or conductive metal layers such as tungsten or aluminum or copper.

A preferred embodiment of monolithic 3D memory according to the present invention is demonstrated herein and outlined below. It utilizes mono-crystalline transistors whose channels are vertically oriented so the current flows vertically through the device across each of the device layers rather than horizontally along the device layers. Yet, this structure is designed to be low cost by sharing lithography, etch and deposition of multiple layers together forming self-aligned vertically oriented transistors.

FIG. 3A illustrates the starting material structure for these vertically oriented 3D memories. On top of a substrate such as Si, Ge, SiGe, SOI, strained layered substrate, or substrate with buried cut layer, are deposited interchanging layers of designated source/drain (S/D) material 302 and designated channel material 304 layer in between. These layers could be processed by epitaxial steps with in-situ alternating doping of N/N+ type, N/P+ type, P/N+ type, or P/P+ type and/or alternating between silicon and SiGe layers, etc. Or using any of the techniques presented herein in reference to at least FIG. 1A to FIG. 2. The selection of the composition of these layers could include consideration of a choice of a high etch selectivity between adjacent layers to enable faster etching of the designated channel layers 304 than the (S/D) layers 302. The selection of the thickness of these layers could be based on a consideration of etch electivity, autodoping, dopant diffusion due to thermal budget, etch rate, and short-channel effect, memory interference, and so on. The thickness of each of these layers could be 10-20, 20-50, 50-100, 100-200 nm up to hundreds of nm. Suppression of dopant diffusion may be accomplished by use of low temperature epitaxial processes, for example the AMAT 450-500 deg C. epi process. Also, interlayer diffusion barriers may be employed, for example, such as thin single, double, or multiple atomic layers of a diffusion suppressor, such as carbon. These interlayer diffusion barriers may be incorporated within the multilayer epitaxial growth process. Particularly, the diffusion barrier layer may be incorporated near the transition region between channel layer and S/D layer. Also, the doping of each layer may not be uniform but rather vertically profiled to enhance or suppress physical processes such as hot carrier injection in accordance with the specific application requirements of the device.

For example the composition of the S/D layers 302 could be N+ silicon while the channel layers 304 could be P type silicon and the selective etch process would utilize anodic etching as detailed in U.S. Pat. No. 8,470,689 and as was described herein.

An alternative is to use P++ silicon for the S/D layers 302 and N silicon for channel layers 304 and the later selective etch would utilize the NH$_4$OH solution as taught by Golod et al.

Yet another alternative is to use N+ silicon for the (S/D) layers 302 and P type SiGe for channel layers 304 and the later selective etch would utilize the process taught by Se Hwan Park et al in a paper titled "Novel Three Dimensional (3D) NAND Flash Memory Array Having Tied Bit-line and Ground Select Transistor (TiGer)" published in TECHNICAL REPORT OF IEICE in 711 (APWF_PSH), a paper by FL W. Fathauer et al. titled "New class of Si-based superlattices: Alternating layers of crystalline Si and porous amorphous Si,-,Ge, alloys" published in Appl. Phys. Lett. 61 (19), 9 Nov. 1992, a paper by Jang-GnYun titled "Single-Crystalline Si Stacked Array (STAR) NAND Flash Memory" published in IEEE TRANSACTIONS ON ELECTRON DEVICES, VOL. 58, NO. 4, APRIL 2011 and U.S. Pat. No. 8,501,609, all of the forgoing incorporated herein by reference.

An interesting aspect of the multilayer structure that are epitaxially based rather than the layer transfer approach is that the whole structure in most cases would resemble one monolithic crystal, in which the crystal repeating element which could be a silicon atom or other molecules which are very well aligned across layers. No molecular level alignment would happen in a layer transfer process. So in an epitaxial process of multilayer formation the molecules forming the multilayer structure are all aligned forming lines that are parallel at better than 0.01 of degree on atomic scale, while in layer transfer based multilayer structure misalignment between layers almost always will be far greater than 0.1 degree. Accordingly the multilayer structure 122 formed by the methods presented herein has single crystal layers having atomic level alignment between the layers, unlike a multilayer structure formed by techniques such as successive layer transfer.

Such a multilayer structure could be constructed on top of a cut layer as illustrated in FIG. 1A to FIG. 2, to allow transferring of the full multilayer structure and accordingly processing both sides of the multilayer structure. If a cut layer has been used then the multilayer structure of the end device could have connection and circuits on its top and bottom surface without a thick bulk silicon of more than 40 micron. The use of cut layer or structure transfer techniques presented herein and in the incorporated by reference art could support forming support circuits and connections with thin isolation to the memory structure such as 5-20, 20-100, 100-200, 200-400 nm or 0.5-1, 1-2, 2-5, 5-10 microns thickness of isolation.

For simplicity we shall outline the flow for a vertical channel 3D memory structure including S/D layers 302 as N+ silicon and P type silicon for channel layers 304. A person skilled in the art would be able to modify the flow for other alternative embodiments.

On top of the alternating 302/304 multilayer a hard mask material 306 is deposited.

FIG. 3B illustrates the structure after 'valleys' etching forming multilayer ridges 309 and valleys 308 in between, resulting in repetitive ridge structure 307. Alternatively selectivity could leverage crystal orientation plan such as using warm KOH to selectively etch down/along the <100> crystallographic planes.

The width of the ridges and the valleys could be from about 10 nm to a few hundreds of nm. The width of the ridges and the valleys could be determined in consideration of the thickness of layers 302/304, the number of layers, the type of memory being build and other considerations. For example, the valleys and the ridges could have similar widths or other ratios such as 50 nm valleys with a 100 nm ridge, and may be engineered for the specific target structure.

Many of the drawings herein illustrate a section or sections of a 3D structure with either 2D drawings of a cut plane or perspective 3D drawings. In general, the direction along the ridge is referenced as the 'X' direction, orthogonal to the ridge is referenced as 'Y' direction, and along the epitaxial layers growth—the vertical direction is referenced as Z direction. To help understanding, many of the drawings include a Cartesian direction indicator (for example, direction indicator 300 in FIGS. 3A &3B) or indication along which plane the cut-view has been done, for example cut-view Y-Z plane 200 in FIG. 2).

FIG. 3C illustrates the high etch selectivity of SiGe vs. Silicon, which, in this example, could be made using the Applied Material Selectra etch system. Alternatively, the selective etch may be made using wet chemical etch. In these 3D structures the multilayer of, for example, FIG. 3A could be made with layers that could be selectively etched, for example, such as Silicon (single crystal or poly or amorphous), SiGe (mix of silicon and Germanium), P doped silicon, N doped silicon, etc.

Figure 3D:
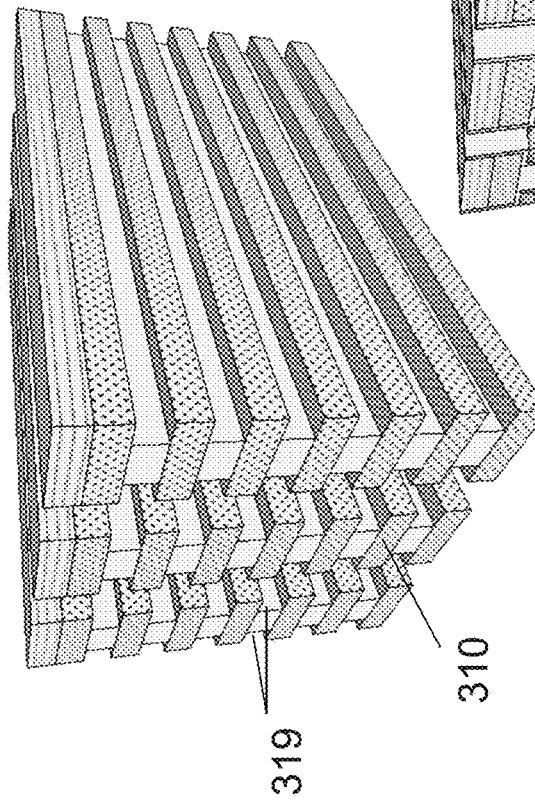

FIG. 3D illustrates the structure after a step of selective isotropic etch of the channel layers 304, forming horizontal notches 319 while keeping the S/D layers 310, 302 mostly un-etched. A selective plasma etch process may be used. Alternatively a two step process could be used by first forming pores in the desired regions of the channel layers by selective anodization processing, then use plasma etch of the porous regions.

Figure 3E:
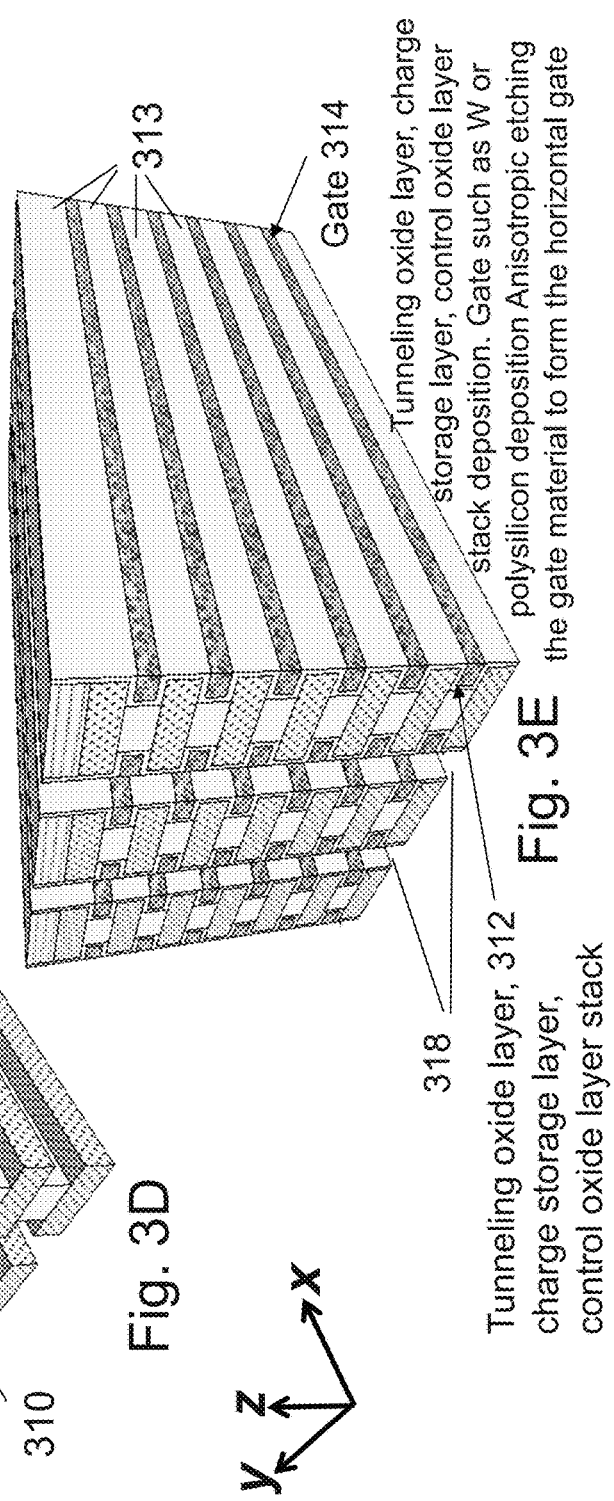

FIG. 3E illustrates the structure after depositing a stack of tunneling oxide layer/charge storage layer/control oxide layer 312 such as oxide/nitride/oxide—"O/N/O", and gate conductive material 314. In this embodiment the charge storage layer is made of a charge trapping material. Alternatively, the charge trap layer can be a defect rich high-k dielectric or silicon rich silicon nitride. Alternatively, the charge trap layer can be nanocrystal floating dots. Alternatively, the charge trap layer may be replaced by floating gate. This could be done by thermal oxidation, Atomic Layer Deposition (ALD) or alternative processes used for semiconductor device fabrication. A directional anisotropic etch step may be used to remove substantially all gate material from the side walls of the S/D layers 313. A slight touch-up isotropic etch may also be employed to remove residual stringers.

Figure 3F:
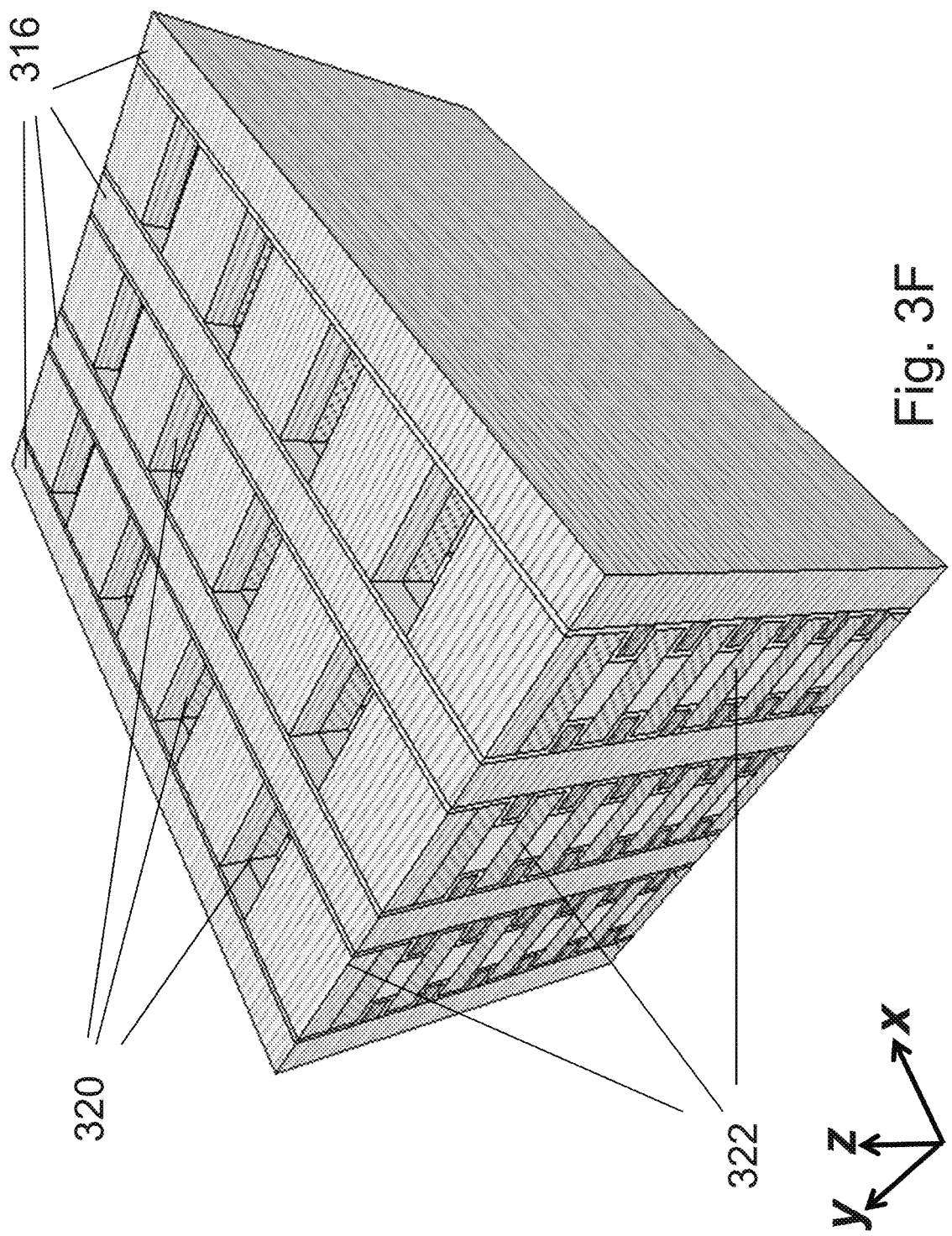

FIG. 3F illustrates the structure after filling the 'valleys' 318 with insulating material 316, followed by an etch step which forms holes 320 along the ridges 309 of FIG. 3B, effectively forming vertical strings 322 of alternating N+/P material. The etch step could be done in two steps. First apply anisotropic etch to the stack of alternating 302/304 multilayers to form the vertical individual strings 322, this anisotropic etch does not etch the gate stacks, and then apply isotropic selective etch to remove the source/drain 302 in-between the g gate stack 312, while leaving the horizontal oriented gate and oxide lines unattached. The etching may be stopped before the lowest N+ layer so it may serve as a common ground. Conductive etch stop layers may be employed.

FIG. 3G illustrates a vertical cross-sectional view along the metal gate word line of the structure of FIG. 3F. The empty spaces left after removal of the in-between channel material 334 (previously vertical gaps 320) may filled with oxide and then serve as part of the memory cell isolation. The remaining most bottom material 338 could serve as a common ground line. The lower gate line 340 could serve as ground select gate and the upper gate line string select gate 344 may serve as the string select. The S/D line on top of the vertical strings 332 would serve as the string drain region and could be connected later to the bit-lines (BL). The resultant structure forms a matrix of vertically oriented non-volatile NAND memory cells. The horizontal control gates 342 form the memory word lines controlling current through the vertical channels between successive source/drain layers, forming vertical NAND strings.

FIG. 3H illustrates a vertical cross section of one vertical NAND string 336 perpendicular to the word-line direction.

Figure 3I:
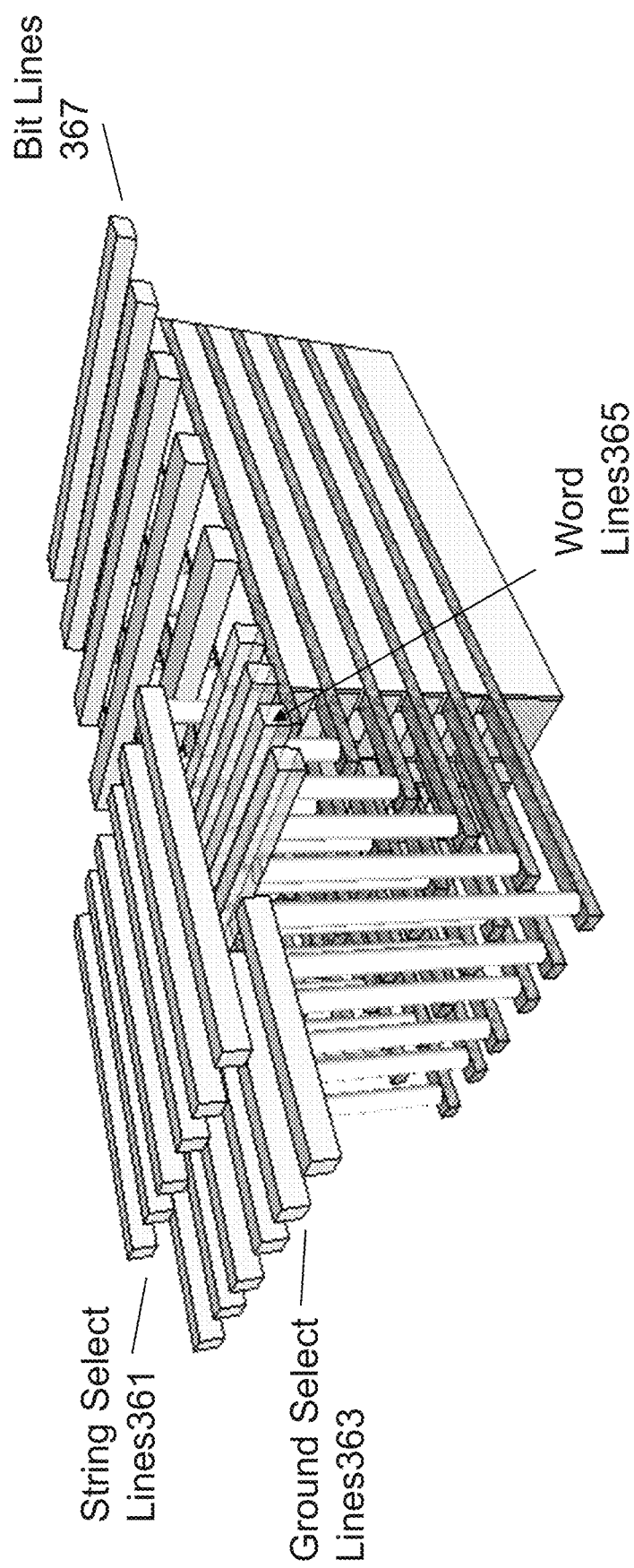

FIG. 3I illustrates the 3D NAND memory structure after adding the grid of memory control lines: word-lines 365, bit-lines 367, string select-lines 361 and ground select-lines 363.

Figure 4A:
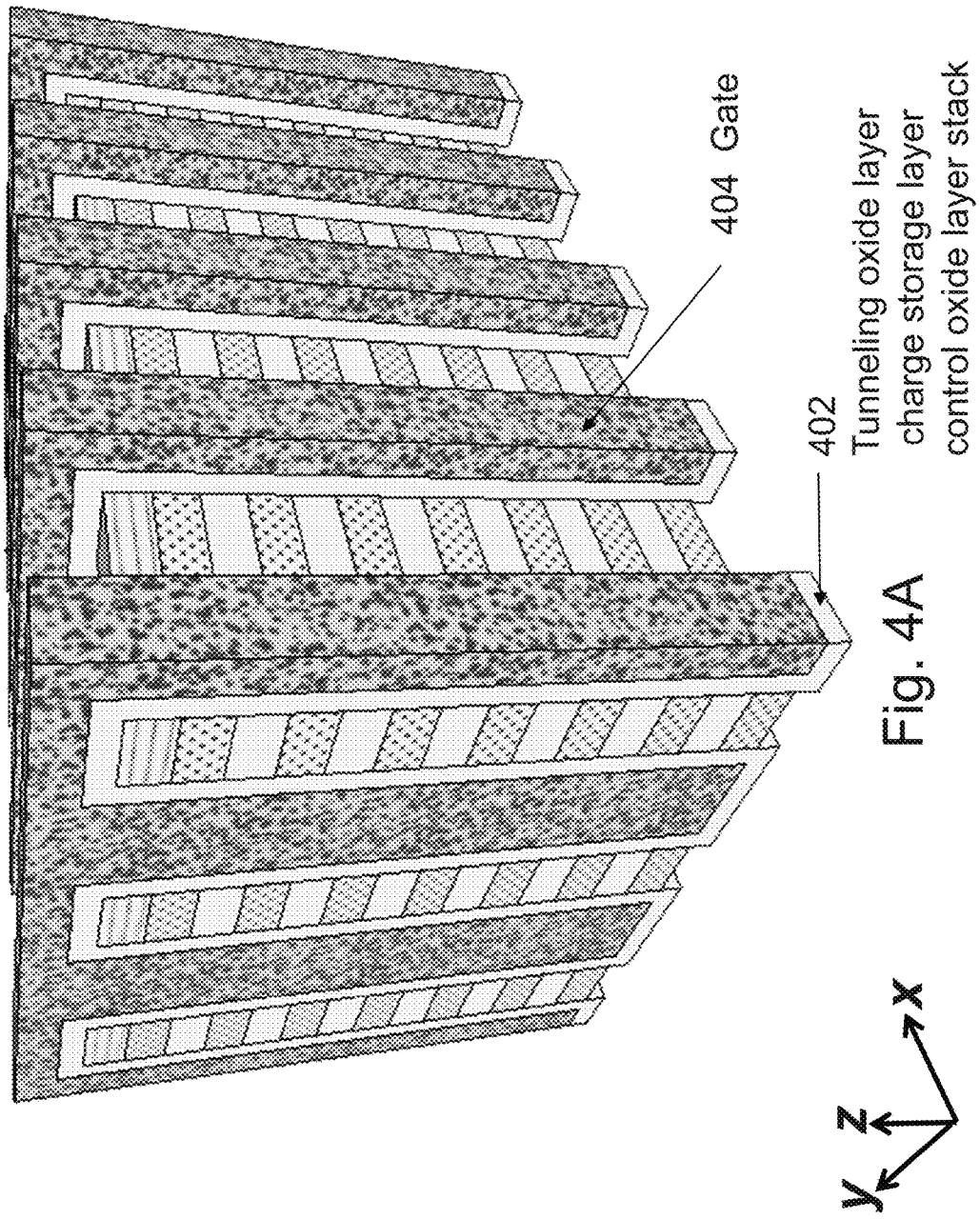
FIGS. 4A-4C are example illustrations of the formation and structure of a NOR type 3D memory.

FIG. 4A illustrates a structure for the formation of a NOR type 3D memory which we could refer to as the 3D-NOR. It starts from the structure 307 illustrated in FIG. 3B above. Masking and etching techniques are used to gate-stakes in 'y' direction. First by coating the ridge structure 307 with dielectric multilayer of tunneling-oxide layer, charge-trap layer such as silicon nitride, and blocking oxide layer, forming the charge storage stack 402. Charge storage stack 402 could also be called O/N/O (Oxide-Nitride-Oxide). A gate material 404 such as heavily doped polysilicon, metal such as tungsten, or other conductive material is subsequently deposited. Then, patterning by masking and etching techniques may be utilized to form elongated strips in 'y' direction perpendicular to the ridge direction. Alternatively, the gate stack can be formed by filling the pre-patterned space within oxide, which is called damascene process. Alternatively, the gate stack can be formed by replacing the dummy gate, which is called replacement gate process. The deposition step could use ALD techniques. Alternatively, combination of thermal oxide and other deposition techniques could be used.

Figure 4B:
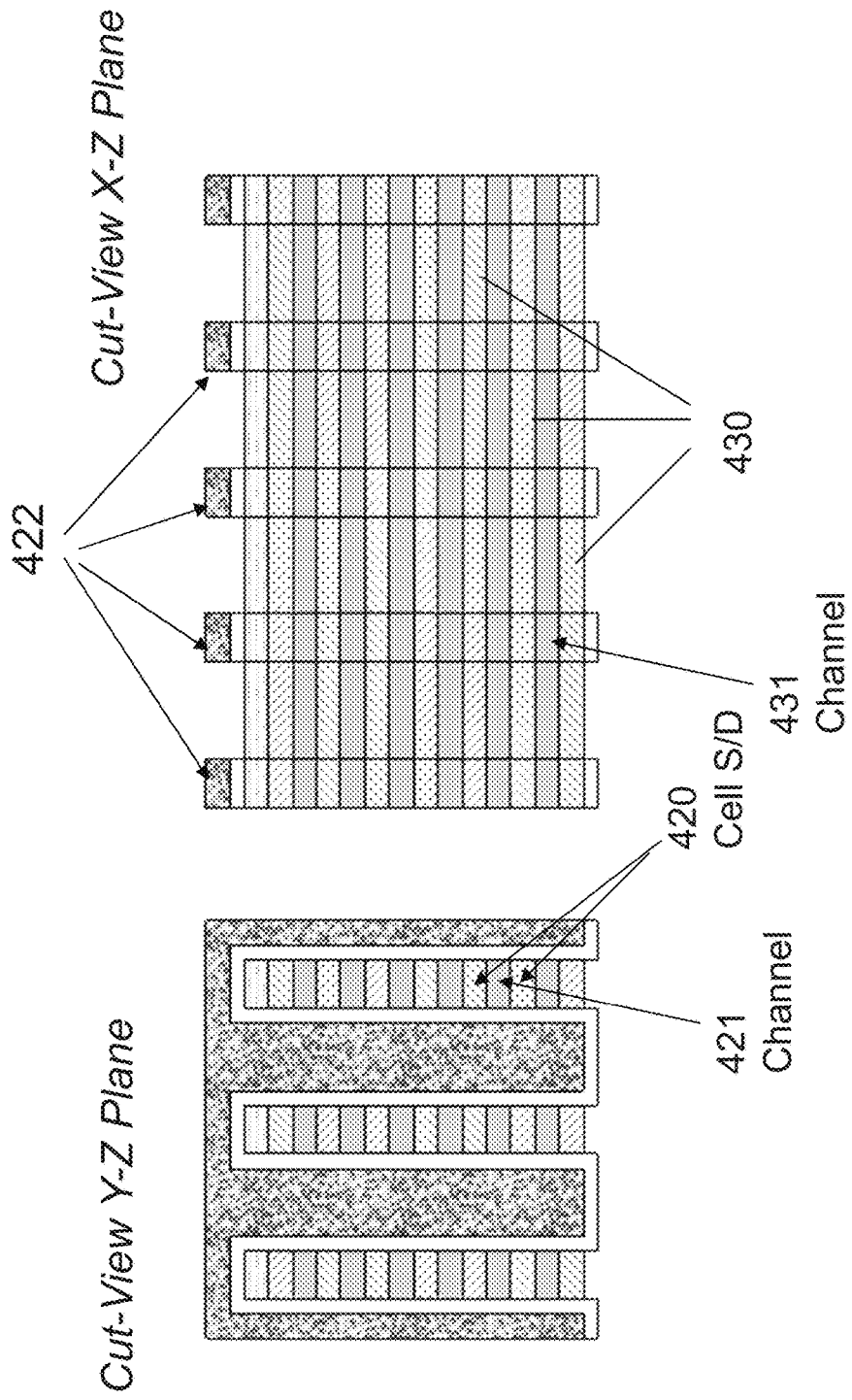

FIG. 4B illustrates a cross section of the structure of FIG. 4A. The gates 422 could be designed to control the conductivity between the source and the drain (S/D) 420, 430 through the channel 421, 431. When the S/D material is selected to be N+ silicon and the channel material is selected to be P type silicon, then each memory cell would include an NPN transistor with two side-gate stacks to form non-volatile memory cells. As the S/D lines are running along the ridge all the way to the edge of the block, proper design could enable selecting a pair of adjacent S/D lines to select a specific channel layer 421 within a ridge, and a specific word-line controlling the gate 422 could select the column of a specific memory cell. The memory could be arranged as a matrix of memory blocks. Each memory block could be a rectangular sized X in x direction and Y in y direction, each direction could be 1-2, 2-10, 10-50, 50-200, 200-1,000 microns. And the number of layers could be 2-8, 8-32, 32-96, 96-128. These are examples and bigger or smaller numbers could be designed too. At the ridge edge a staircase structure could be formed to allow per layer connection to the ridges S/D lines. Preferably at the staircase region the P layers may be etched and replaced with oxide or other isolation material. Similarly, the P layers between two adjacent word lines may be etched and replaced with oxide or other isolation material (not shown herein). Selective isotropic etching of the P-type layers could be used to etch in between the horizontal N-type strips as previously discussed herein.

Figure 4C:
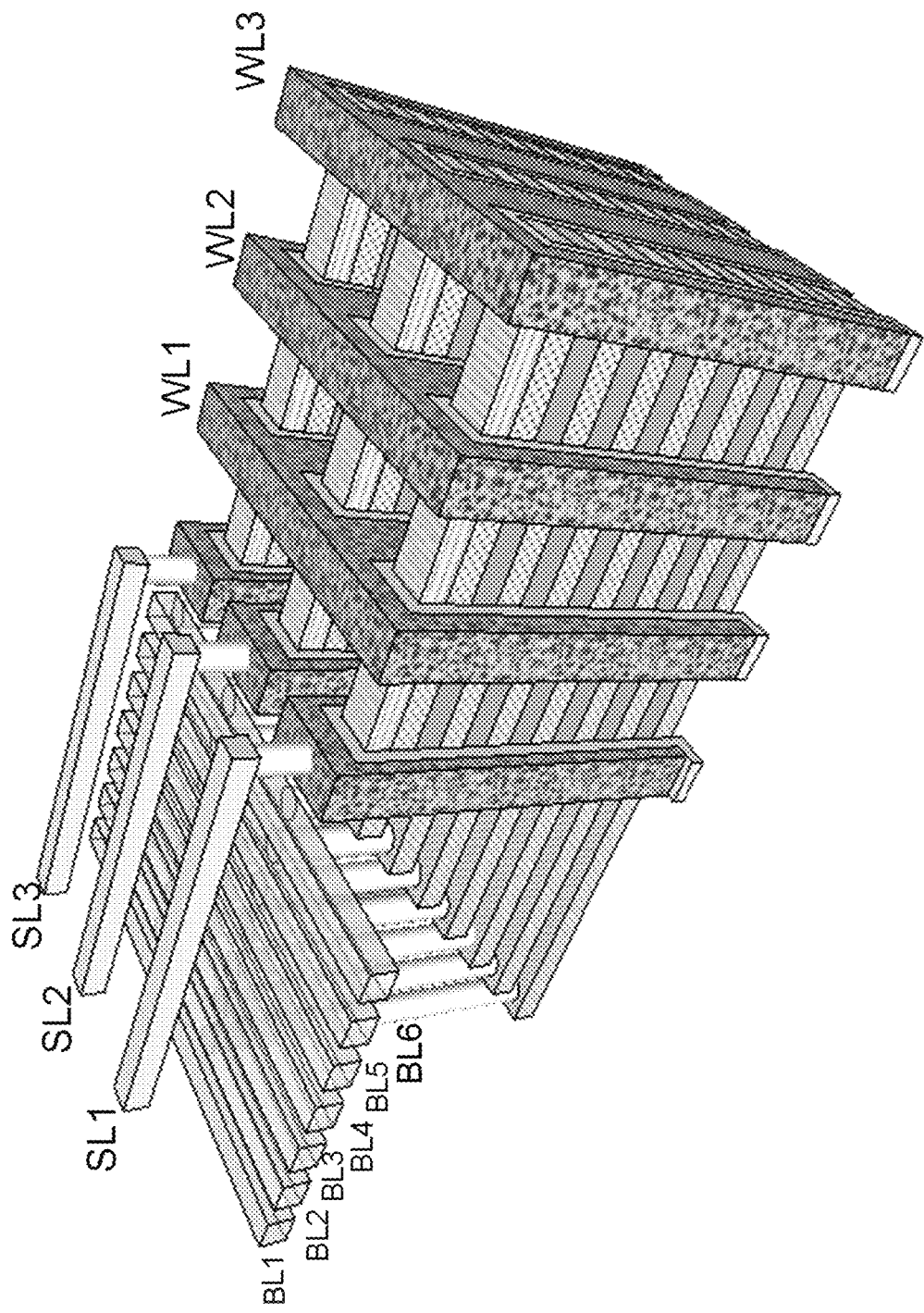

FIG. 4C illustrates the 3D NOR structure after forming a staircase for per layer connection at the ridge edge and adding control lines. Shared gates forming word-lines WL1, WL2, WL3 run in y direction, perpendicular the ridges direction. The interconnect line BL1 controls the S/D of the first layer of all the ridges in the memory block, BL2 controls the S/D of the second layer as well as the D/S of the first layer, BL3 controls the S/D of the third layer as well as the D/S of the second layer, and so forth. The select-lines provides per ridge control. SL1 control the access to the first ridge, SL2 to the second ridge SL3 control the third ridge and so forth.

In this 3D-NOR structure, and also in many other memory structures herein, the horizontal per layer line through the matrix the S/D lines 430 could be the limiting factor of the power and performance of the device with respect to how long it could be made. On the other hand, the overhead area required for the stair-case interconnects structure suggests longer lines to save device real-estate and reduce cost per bit. In such a structure, the P type layer may be relatively thick such as larger than about 100 nm to prevent leakage current between two N+ layers consisting of the S/D lines. Alternatively the P type channel in between the S/D lines could be selectively etched for the staircase zones and replaced with an electrically isolative material, as the leakage concern is more severe at zones which have no active gates; for example, active gates could be used to block leakage through the P type channel.

The ridge selection control device may be constructed by first removing the channel material 421 at the region designated for ridge selection control. Then the select gate transistors are formed along the N+ S/D lines as outlined in respect to FIG. 13A-13C herein. The select gate transistors may be designed to function as junction-less transistors ('JLT') also known as gate all around nano-wires. In some cases it might be desired to thin the S/D lines in the region designated as select gate transistors to achieve better gate control. Such thinning would narrow these regions to about 20 nm thickness or about 15 nm or about 10 nm. Alternatively, the select gate transistors are could be formed along the N+ S/D lines by having the channel formed from P-type silicon that is selectively regrown from the etched sidewall of N+ region.

The architecture referred to as '3D NOR' and illustrated herein in reference to FIGS. 4A to 4C as well as in similar illustrations herein, is also similar to a structure called in the art 'AND' nonvolatile memory architecture, for example as presented in a patent such as U.S. Pat. No. 7,414,889, and as 1T MONOS as in a paper by Hidenori Mitani et al. titled "A 90 nm Embedded 1T-MONOS Flash Macro for Automotive Applications . . ." presented at ISSCC 2016, and a 3D architecture as presented in U.S. Pat. No. 8,426,294, all the forgoing are incorporated herein by reference including their teaching of memory control, and the subsequent adaptation for control of the 3D NOR structure herein.

Figure 5A:
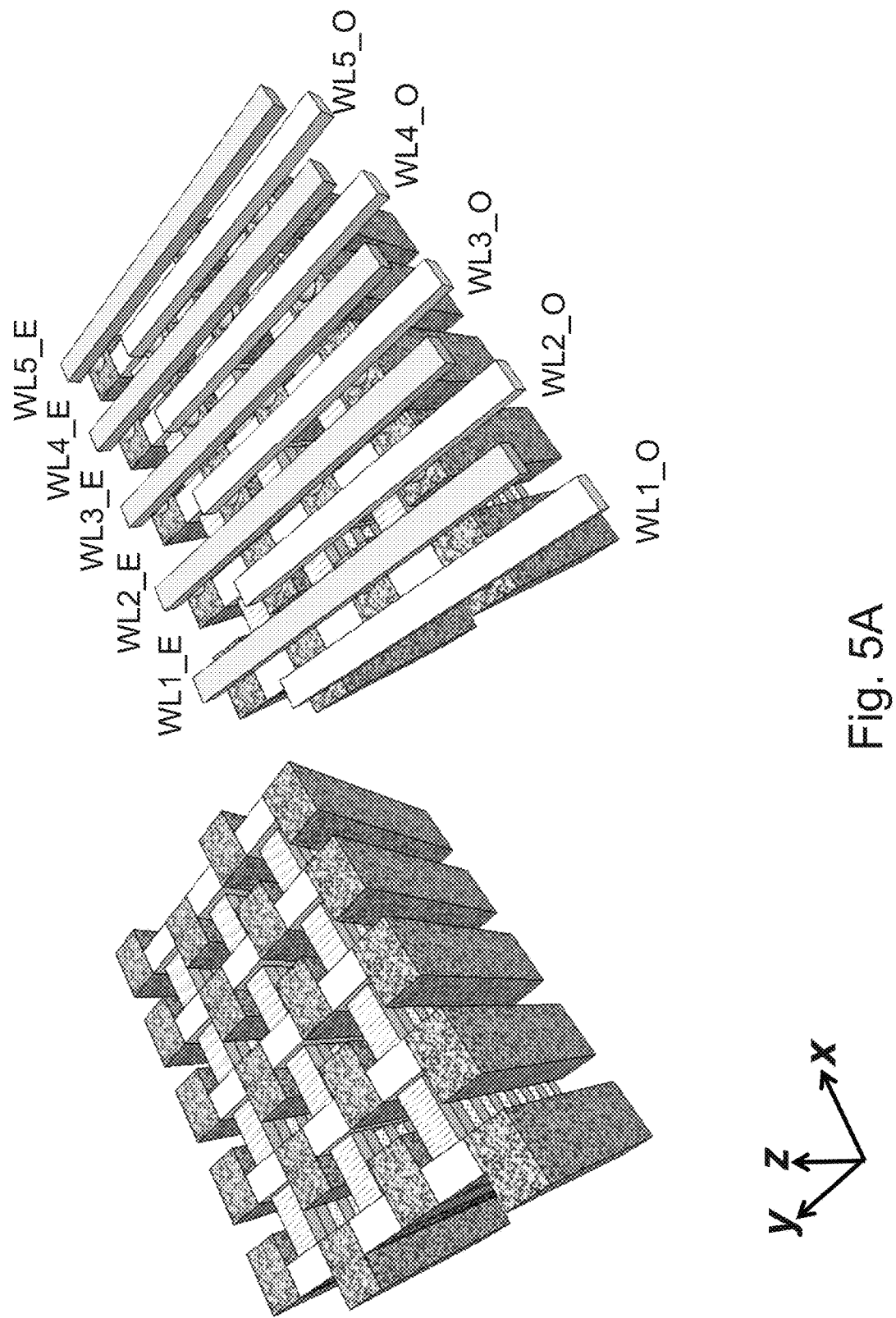

An additional enhancement to such 3D NOR is to break the gate control into two independent side gates—even gates, in the even valleys, and odd gates, in the odd valleys, controlling a ridge, as shown in FIG. 5A. For example, control line WL1_O will control all the odd side gates and WL1_E would control all the even side gates. Such a split could allow doubling the storage capacity. If the width of indented P-layer is too thin, such as less than 20-50 nm, WL odd can be primary gate(s) while WL even can be the support gate(s) that may be used to support write, read, or hold the memory states.

These two gate control lines can be placed on the top connection layer side by side as illustrated in FIG. 5A, or alternatively one on top and one under bottom as illustrated in FIG. 5B. When these two gate control lines are placed both on top, the technology node for the top connection may be more advanced than the technology node used for the 3D memory block.

Additional enhancement to such 3D NOR is to implement MirrorBit® technology as was produced commercially by Spansion for NOR products. The MirrorBit concept was presented in a paper by Boaz Eitan et al in a paper titled "NROM: A Novel Localized Trapping, 2-Bit Nonvolatile Memory Cell" published at IEEE ELECTRON DEVICE LETTERS, VOL. 21, NO. 11, November 2000, and patents such as U.S. Pat. Nos. 5,768,192, 6,204,529 and application US 2006/0007745, all incorporated herein by reference.

Figures 5C, 5D:
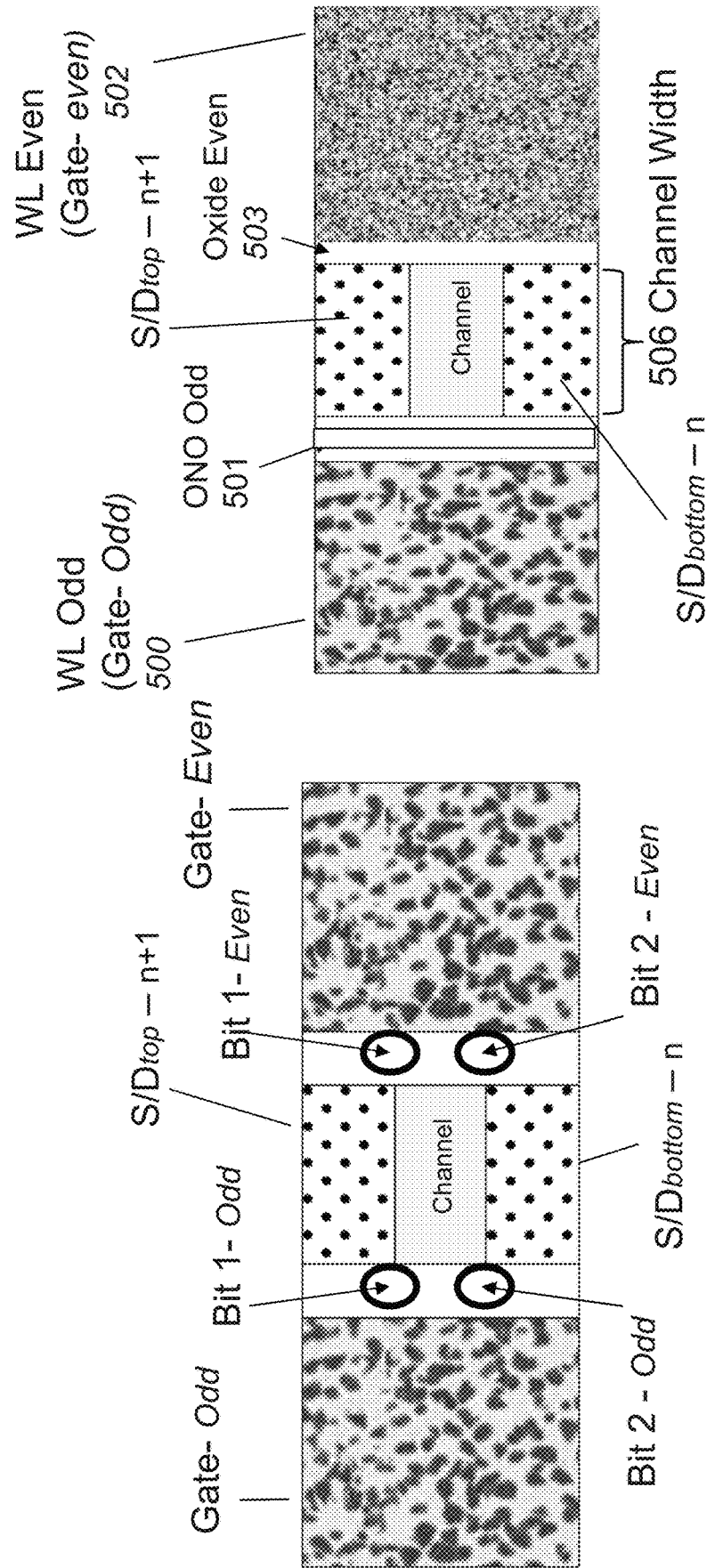

These two enhancements could be combined to allow '4 bit per cell' as is illustrated in FIG. 5C. Such technology is detailed in U.S. Pat. No. 7,091,551, incorporated herein by reference.

Leveraging this concept a technology detailed in U.S. Pat. No. 6,670,669 incorporated herein by reference, teaches how to add additional center bit for 3 bit locations per facet and total of 6 bit location per channel.

Another known enhancement is to control the amount of charge being stored in a given charge trap location to allow multi-level voltages per cell, hence coding more than 1 bit per storage site. These different enhancement techniques could be combined to achieve an even higher number of bits per cell. Accordingly if each site is designed to hold 4 levels then the cell could store 8 bits and with center site even 12 bits. If more levels are managed at each storage site than the storage capacity of a cell could be even higher.

An additional alternative to consider for the high density multi-bit per cell memory is a refreshable memory or volatile memory. In general, the conventional requirement for non-volatile memory devices is 10 years of data retention time. Some of the techniques described herein for increases of storage capacity might be challenged with holding those stored charges distinctive for the full 10 years, especially for devices that might be operated in high temperature environments, or with the motivation to scale down cell size and tunneling oxide layer thickness. An alternative solution is to periodically tune the device to the desired state at a fixed (or variable) time interval, such as days, weeks, month or few years. Alternatively, a memory controller could read and verify the degree of charge loss or spread and make adjustments. If the integrity of some memory sites has fallen below a set threshold, these memories could be refreshed to repair the memory sites to the full charge level. Such self-monitoring could be done with a minimal impact on the normal device operations or its overall power consumption.

Figure 5E:
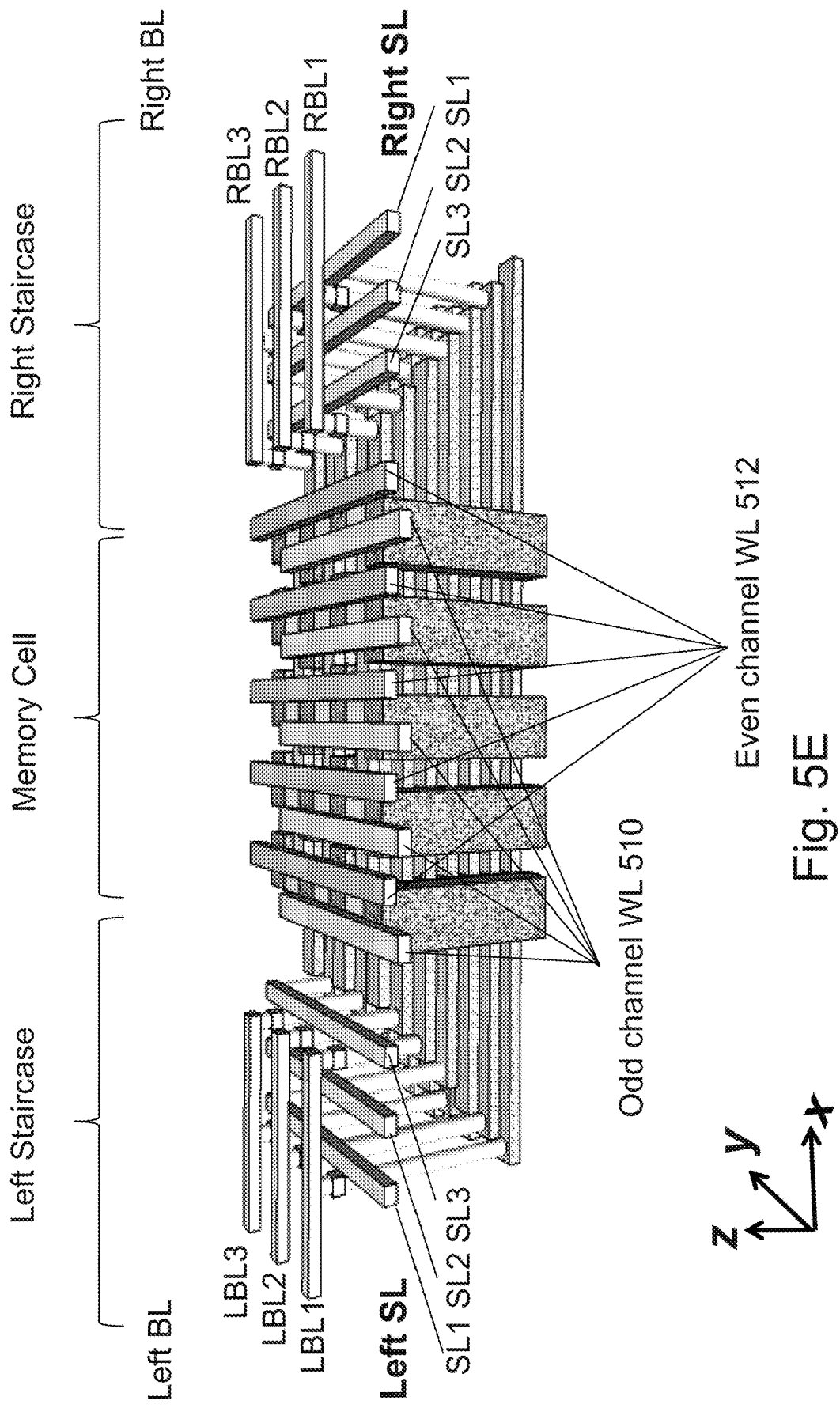

FIG. 5E illustrates an alternative 3D NOR memory block without using ridge select gates leveraging having staircases on both sides of the ridge—Left Staircase and Right Staircase. The specific channel selection could be done by proper allocation of connections along ridges and along levels. As an example, all even levels may be connected to Select Lines such as SL1 to level 2, SL2 to level 4, SL3 to level 6 and so forth. The select lines can also be considered source lines. This could be done for the Left Staircase and the Right Staircase. Then along the ridge for each ridge the Left Staircase could be used to connect Left Bit Line 1 (LBL1) to Ridge 1 levels 1 and 5 and 9 etc., Left Bit Line 2 (LBL2) to Ridge 2 levels 1 and 5 and 9 etc. and so forth; and for Right side-Right Bit Line 1 (RBL1) to Ridge 1 levels 3 and 7 and 11 etc., Right Bit Line 2 (RBL2) to Ridge 2 levels 3 and 7 and 11 etc. and so forth. As a result, the voltage applied to the left bit lines does not conflict with the voltage applied to the right bit lines. In addition, two levels of bit cells in a ridge can be accessed simultaneously. In a single operation cycle, two levels of bit cells can be read by left and right bit lines. In a single operation cycle, alternatively, one level of bit cells can be read by one side of the bit line while the other level of bit cells can be written by the opposite side of the bit line.

An example approach to select and access a specific bit could be as follows:
  Select a specific Ridge 1→RBL 1 or LBL 1
  Select a specific channel—between S/D 4 and S/D
    5→Use Right SL 2 (SL 2) and Left Bit Line 1 ('LBL1')

Odd side bit & Even side bit→Odd side WL 510 and Even side channel 512

In a similar approach any specific storage location could be selected by the choice of one select-line, one bit-line, and one word-line.

Forming staircases on both edges of the ridge, for example, as is illustrated in FIG. 5E, is advantageous even when using a per ridge select. This could be useful for redundancy and/or better access time and less access time variation between cells along the ridge. It could allow the chip designer to keep the S/D total resistance substantially equal for all channels in the ridge by accessing the source from one side and the drain from the other keeping the total conduction length about equal to the ridge length. For devices having multiple memory blocks real estate efficiency can be improved by sharing each staircase between both the right and the left sides of adjacent blocks.

The number of layers forming the 3D NOR fabric could increase over time to answer demands to increase the device capacity. For a large number of layers, the vertical access time through the staircase could become large enough to impact the effective access time between lower levels and upper levels. An optional solution to maintain the symmetry and equalization of the access length could be to use access from both sides of the device. Accordingly, one staircase access could be from the top while the other from the bottom, thus keeping the S/D access similar to all memory cells within the unit.

Figure 6:
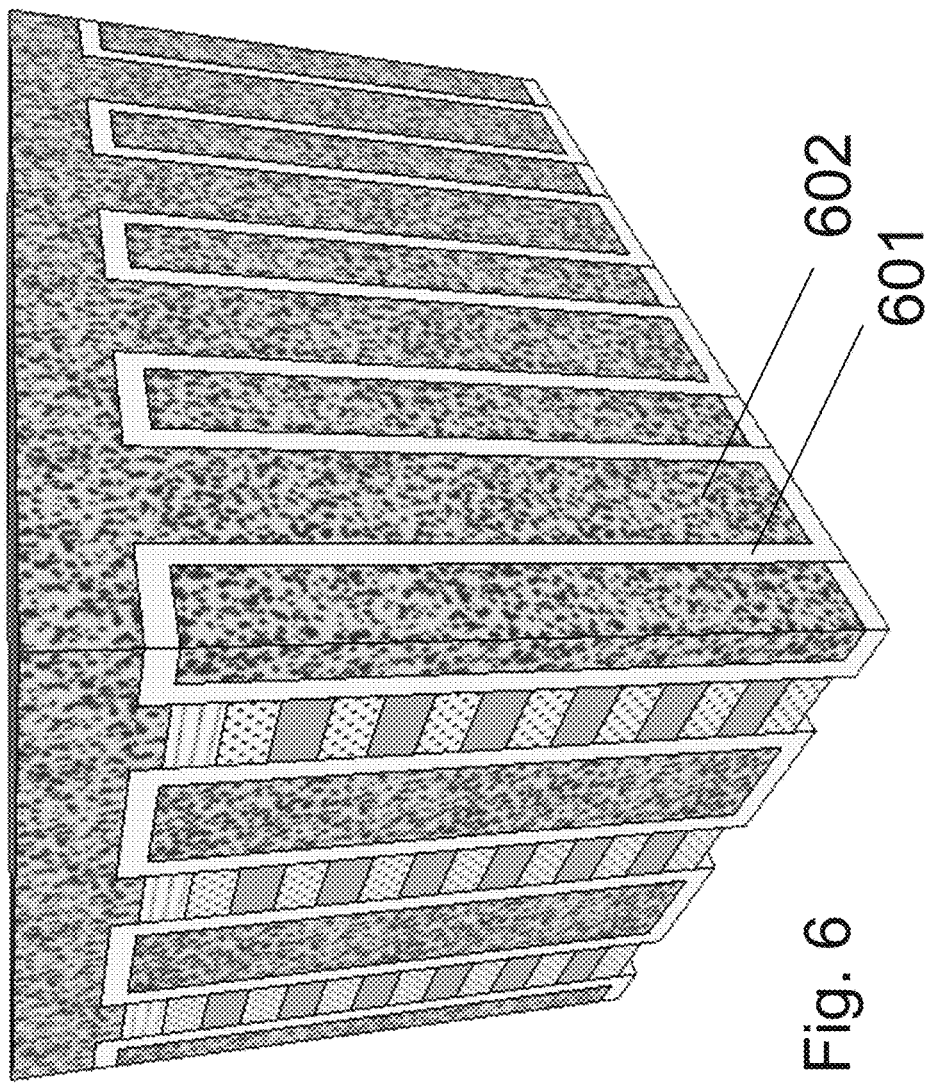
FIG. 6 is illustrations of the formation of $2^{nd}$ gate stack.

The O/N/O multilayer dielectric charge storage stack 402 in FIG. 4A could be called $1^{st}$ O/N/O dielectric gate stack and its metal gates 404 could be called $1^{st}$ gates. Increases in storage density could be achieved by adding a second multilayer dielectric charge storage stack on top of the structure $2^{nd}$ O/N/O 601 and depositing metal gate 602 over it as is illustrated in FIG. 6 with $2^{nd}$ dielectric gate stack 601 and $2^{nd}$ gates 602.

Figure 7A:
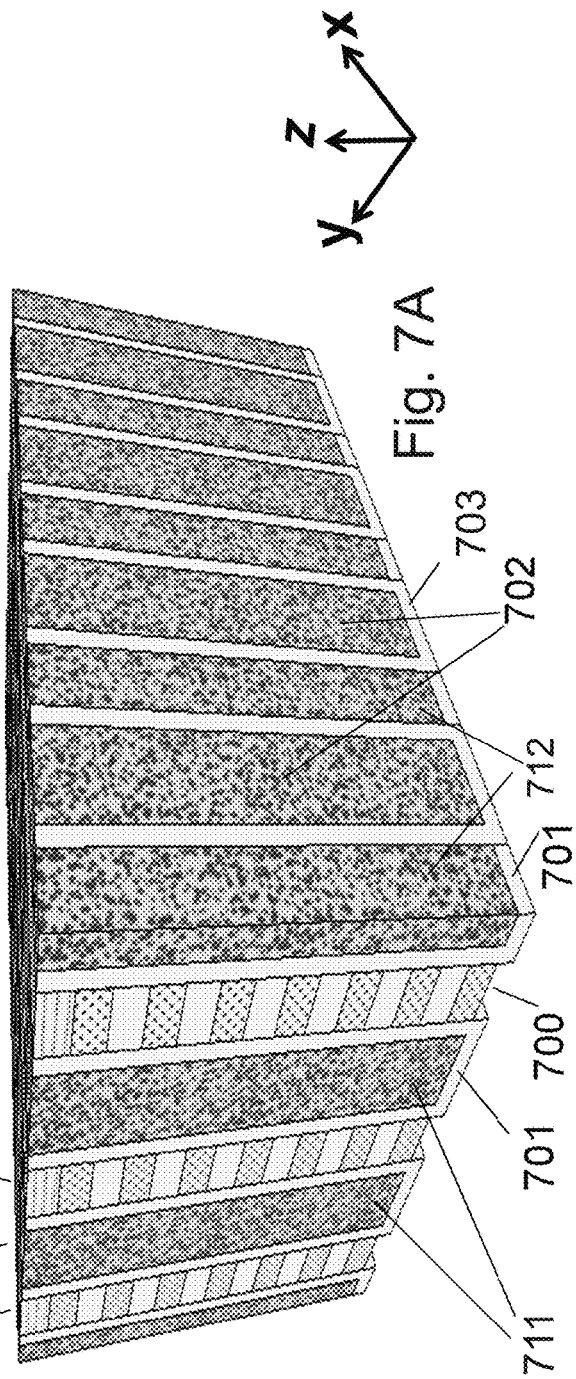
FIGS. 7A-7B are illustrations of the formation of $2^{nd}$ gate stack.
Figure 7B:
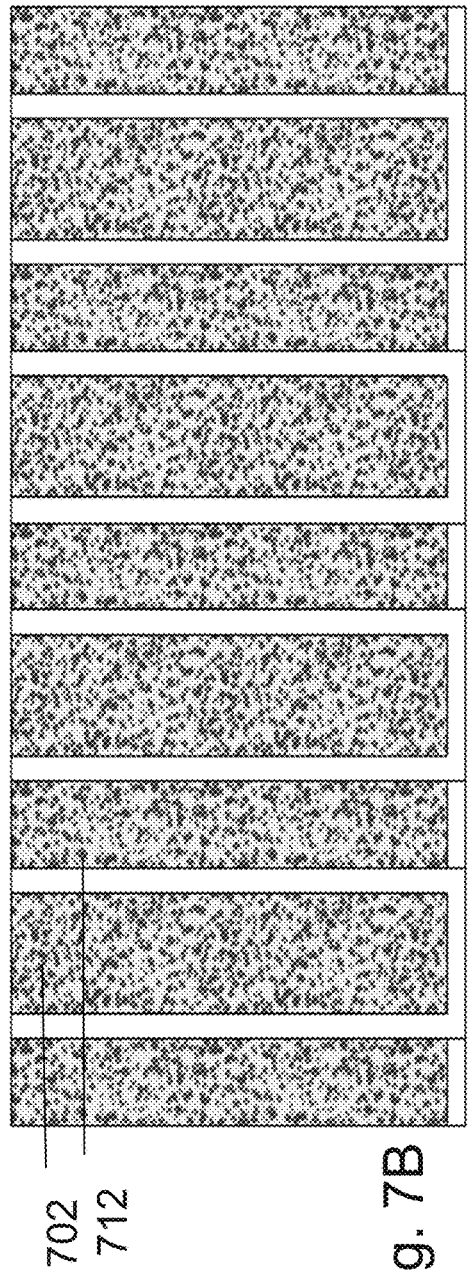

FIG. 7A illustrates the structure after a step of CMP which also forms isolated $2^{nd}$ gate lines 702 controlling charge trapping in the $2^{nd}$ O/N/O 703 while the $1^{st}$ gate lines 712 controls $1^{st}$ O/N/O 701. FIG. 7B is a 'cut' look in the valley 713 between adjacent ridges 712, 714 showing the $2^{nd}$ gates 702 and the $1^{st}$ gates 712.

The choice for gate material could be those common in the art, such as heavily doped n-type polysilicon, heavily doped p-type polysilicon, titanium nitride, tantalum nitride, tungsten, or stack of some of those. Alternatively, it could include more than one type of material such as first depositing a material that is optimized to the device functionality (for example work function) such as doped polysilicon and then additional material such tungsten to reduce the Word-Line resistivity.

Figure 8A:
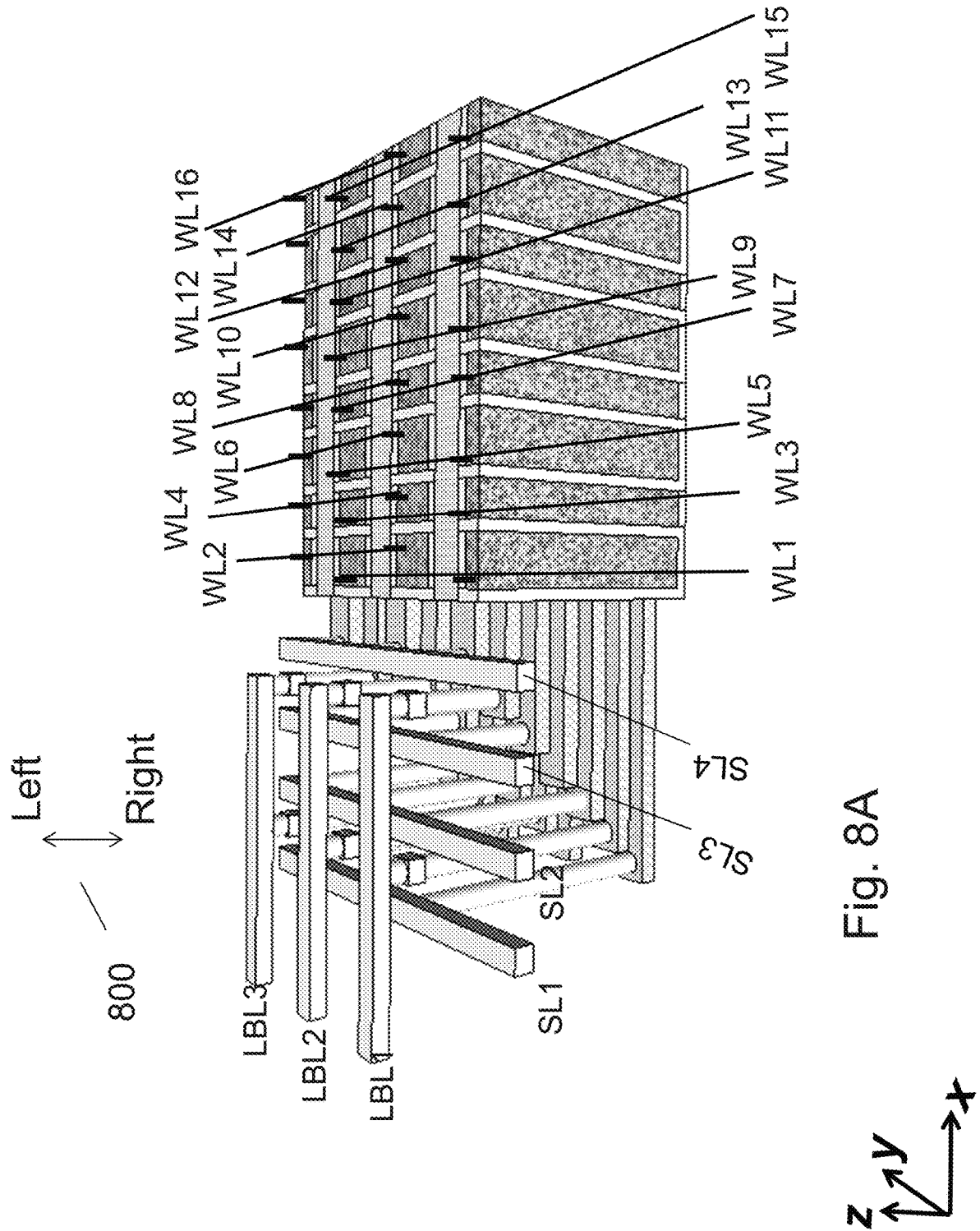

FIG. 8A illustrates subset of the structure of FIG. 5E. FIG. 8A illustrates word-lines WL1, WL3, WL5, WL7, WL9, WL11, WL13 connecting to the gates in the odd valleys which we call odd gates while word-lines WL2, WL4, WL6, WL8, WL10, WL12, WL14, WL16 are connected to those in the even valleys which we call even gates. Each gate is dual function and could affect the ridge to its right and the ridge to its left. The arrow indicator 800 indicates the right and left direction in the illustration.

FIG. 8B illustrates the structure of FIG. 4C after doubling the number of channels by adding 2nd dielectric gate stack and breaking the gates into odd gates and even gates. Not all the gates of the 3D NOR fabric need to have the same charge storage gate stack. In fact, for some applications it might be desired to have more than one type of gate stack on the same IC. Alternative dielectric gate stacks could include the same O/N/O materials with different thicknesses, or different materials. Some of such dielectric gate stack materials have been presented in paper by Xuguang Wang et al. titled A Novel MONOS-Type Nonvolatile Memory Using High-Dielectrics for Improved Data Retention and Programming Speed published in IEEE TRANSACTIONS ON ELECTRON DEVICES, VOL. 51, NO. 4, April 2004 597, and by Chun Zhao titled "Review on Non-Volatile Memory with High-k Dielectrics: Flash for Generation Beyond 32 nm" published at Materials 2014, 7, 5117-5145; doi:10.3390/ma7075117, both incorporated herein by reference. The charge storage dielectric gate stack could include band gap engineering for better performance. Herein the charge storage dielectric could be called O/N/O also when non nitride materials are used for charge trapping. Also each of tunnel oxide/nitride/control oxide can be a silicon-oxide-nitride composite with various stoichiometries. Additionally, the percent composition of nitride within the 'O/N/O' can be modulated either abruptly or gradually. Particularly, the band-gap engineering may be focused on the tunneling oxide to increase write speed without sacrificing retention time. Such band-gap engineering has been described in papers such as by Dong Hua Li et al. titled "Effects of Equivalent Oxide Thickness on Bandgap-Engineered SONOS Flash Memory" published at the 2009 IEEE Nanotechnology Materials and Devices Conference Jun. 2-5, 2009, and by Hang-Ting Lue et al. titled "BE-SONOS: A Bandgap Engineered SONOS with Excellent Performance and Reliability" published at IEDM 2005, by C. Sandhya et al. titled "Impact of SiN Composition Variation on SANOS Memory Performance and Reliability Under NAND (FN/FN) Operation" published in IEEE TRANSACTIONS ON ELECTRON DEVICES, VOL. 56, NO. 12, December 2009, and by C. Sandhya et al. titled "NITRIDE ENGINEERING AND THE EFFECT OF INTERFACES ON CHARGE TRAP FLASH PERFORMANCE AND RELIABILITY" published in IEEE CFP08RPS-CDR 46th Annual International Reliability Physics Symposium, Phoenix, 2008; and in U.S. patents such as U.S. Pat. Nos. 6,384,448, 6,456,535, 6,864,139, 6,888,749, 6,906,953, 6,958,937, 7,230,848, 7,414,889, 7,512,016, 7,525,147, 7,633,110 7,839,696, 7,759,715, and 7,848,148, all of the forgoing are incorporated herein by reference.

For example it could be advantageous to make the tunneling oxide of O/N/O-2 stack extra thin, which we could term 'thin O/N/O'. The tunneling oxide of the 2nd dielectric gate stack could be made substantially thinner than the thickness required to be a non-volatile memory or even not being formed. Therefore, the thin O/N/O hereinafter might be referred to as the stack without tunneling oxide and charge trap layer being directly contact with the channel. Such could result in shorter retention time but also with shorter write and erase times. Such ultra-thin tunneling oxide is sometimes considered a DRAM (Dynamic Random Access Memory) alternative. Accordingly, such 3D NOR memory could integrate multiple memory types in one device such as conventional NV (Non-Volatile) memory in the facets controlled by, for example, first gates while the faster memories with shorter retention time in the facets controlled by second gates. Such faster memories with shorter retention times are presented in papers such as by H. Clement Wann and Chenmming Hu titled "High-Endurance Ultra-Thin Tunnel Oxide in MONOS Device Structure for Dynamic Memory Application" published at IEEE ELECTRON DEVICE LETERS, VOL. 16, NO. 11, November 1995; by Dong-Il Moon et al. titled "A Novel FinFET with High-Speed and Prolonged Retention for Dynamic Memory" published at IEEE ELECTRON DEVICE LETTERS, VOL. 35, No. 12, December 2014; by Shih-Jye Shen et. al. titled "Ultra Fast Write Speed, Long Refresh Time, Low Power F-N Operated Volatile Memory Cell with Stacked Nanocrystalline Si Film" published at IEDM 96; by Ya-Chin King et. al. titled "A Long-Refresh Dynamic/Quasi-Nonvolatile Memory Device with 2-nm Tunneling Oxide" published at IEEE ELECTRON DEVICE LETTERS, VOL. 20, NO. 8, August 1999, and titled "Charge-Trap Memory Device Fabricated by Oxidation of Si11−x Gex" published at IEEE TRANSACTIONS ON ELECTRON DEVICES, VOL. 48, NO. 4, April 2001; by ZongLiang Huo et al. titled "Sub-6F2 Charge Trap Dynamic Random Access Memory Using a Novel Operation Scheme" published 2006 64th Device Research Conference; by M. Günhan Ertosun et. al. titled "Novel Capacitorless Single-Transistor Charge-Trap DRAM (1T CT DRAM) Utilizing Electrons" published at IEEE ELECTRON DEVICE LETTERS, VOL. 31, NO. 5, May 2010; by V. A. Gritsenko et al. titled "A new low voltage fast SONOS memory with high-k dielectric" published at Solid-State Electronics 47 (2003); by K. Tsunoda et al. titled "Ultra-High Speed Direct Tunneling Memory (DTM) for Embedded RAM Applications" published in 2004 Symposium an VLSI Technology; by Kooji TSUNODAV et al. titled "Improvement in Memory (DTM) Retention/Program Time Ratio of Direct Tunneling for Low Power SoC Applications" published at IEICE Trans. Electron. Vol E88-C No. April 2005; and in U.S. patent application Ser. Nos. 11/737,961, 12/030,485, 12/133,237, 12/007,012, and U.S. Pat. Nos. 5,608,250, 6,456,535, 6,888,749, 6,906,953, 6,909,138, 6,958,937, 7,288,813, 7,432,153, 7,462,539, 7,759,715, 7,848,148, 8,329,535, 8,426,906 and 9,025,386; all of the foregoing in this paragraph are incorporated herein by reference.

An alternative memory technology is known in the art as ferro-electric technology. This could be implemented by replacing the O/N/O stack with a ferro-electric stack. Ferro-Electric memory stack has been presented in paper by Jae Hyo Park et al. titled "A hybrid ferroelectric-flash memory cells" published in JOURNAL OF APPLIED PHYSICS 116, 124512 (2014); by Hang-Ting Lue et al. titled "Device Modeling of Ferroelectric Memory Field-Effect Transistor for the Application of Ferroelectric Random Access Memory" published in IEEE Transactions on ultrasonics, ferroelectrics, and frequency control, vol. 50, no. 1, January 2003; and in U.S. patent application Ser. No. 14/875,744, international application WO 2016/029189, and U.S. Pat. No. 6,067,244, all of the forgoing are incorporated herein by reference.

An additional optional enhancement is to combine two levels of memory forming structure in the gate stack such as presented by Daniel Schinke et al titled "Computing with Novel Floating-Gate Devices" published at IEEE Computer magazine February 2011; and also described by Daniel Johannes Schinke A dissertation submitted to the Graduate Faculty of North Carolina State University 2011, titled "Computing with Novel Floating Gate Devices"; by Biplab Sarkar titled "Dual Floating Gate Unified Memory MOSFET With Simultaneous Dynamic and Non-Volatile Operation" published at IEEE ELECTRON DEVICE LETTERS, VOL. 35, NO. 1, January 2014; and by Yu-Chien Chiu, titled "Low Power 1T DRAM/NVM Versatile Memory Featuring Steep Sub-60-mV/decade Operation, Fast 20-ns Speed, and Robust 85° C.—Extrapolated $10^{16}$ Endurance" published at IEEE 2015 Symposium on VLSI Technology, all of the foregoing in this paragraph are incorporated herein by reference.

The 3D NOR memory could include memory columns having thick tunnel oxide, which may support long term charge trapping and thus provide a long retention time. This long retention time may be more than about a year, more than about 3 years, and even more than about 10 years for tunneling oxide thicker than 2.5 nm. These memory cells would have longer write times, perhaps of more than 1 micro-second or even more the 10 micro-seconds. And for other memory columns having a thin tunneling oxide, the thickness may be less than about 1 nm or even less than about 0.5 nm, or even no tunneling oxide—provides only short retention time but with a faster write time. Other portions of the 3D NOR fabric could have a very different level of tunneling oxide such as 0-1, 1-2, 2-3, 3-4, 4-5, 5-8 nm. These tradeoffs allow engineering of devices with specific memory attributes to support the end system application.

The preference would have been long retention with fast write cycles. One embodiment to provide longer retention for a very thin tunneling oxide is to use the other side gate of the same channel as a charge retention support which could be described using illustration FIG. 5D. For the purpose of this description we could consider the word-lines being split to odd word-lines 500 controlling the ridge odd gate and even word-lines 502 controlling the ridge even gate. The oxide stack of the odd O/N/O 501 could be made with thin tunneling oxide while the even oxide 503 could be made with just thin gate oxide—without a charge trapping structure. The ridges could be made to have a relatively thin channel width 506 below about 20 nm or below about 10 nm so the even gate 502 could be biased with a negative voltage, particularly during a holding state such as −1 volt which would not disturb the channel electrons to be charged into the odd O/N/O 501 tunneling oxide, but will help to extend retention time by pushing trapped electrons away from the channel to extend retention time of electrons trapped at the odd trapping layer within the odd side O/N/O 501. The retention support signal of the even gate 502 could be disabled during read or write cycles of that memory cell. The retention support signal of the even gate 502 may be shaped with respect to at least time and voltage to maximize the overall retention time of the intended cells.

U.S. Pat. No. 6,864,139 titled "Static NVRAM with Ultra-Thin Tunnel Oxides", incorporated herein by reference, teaches the use of positive biasing the primary gate—the word line for holding the trapped charge by having the memory being built using N channel (PNP transistors) for which a positive gate charge disables the transistors. In most memory designs P channels are used for better performance and other considerations. An alternative option is to operate the word-line of a 'thin tunneling oxide' in a dual operating mode. For writing it could be charged to a high enough voltage to provide electron tunneling over the tunneling oxide barrier, for example to +4 volt. For retention it could be kept at a retention voltage such as +1 volt to keep holding the electrons in the trap layer. And for reading and other operations for channels related to that word-line it would be set to the proper signal as required for that specific operation. Such multiple functions of the word-line could suggest breaking the word-line to multiple independently controlled individual segments to allow keeping a retention voltage on more memory cells for a longer time without interfering with access to the cells for read and write operations. At high retention bias such as +1 volt many channels could get open. To reduce the potential high leakage of these open channels the related S/D lines could be kept in a floating state which could be achieved by disabling that ridge select transistor(s).

And prior to accessing the ridge all these retention biases could be first removed, and may be removed in a sequence to minimize leakage and charge loss. Another alternative is to use a low retention voltage, for example such as +0.34 volts, which could be set below the channel threshold voltage. The retention time could be lower but the ease of operation and the operating power could motivate use of such lower retention bias. The following table suggests exemplary conditions for the word-lines ('WL'):

|    | Not Selected Unite | Selected Unit Not selected Channel/side | Selected Unit Channel/side | | |
|----|----|----|----|----|----|
|    |    |    | Read | Write '1' | Erase |
| WL | 1 v | 0 v | +1 v | +4 v * | −4 v * |

Notes:
The values in the table are exemplary and could be adjusted base on the specific 3D NOR fabric.
* The write and erase voltage are relatively low as the tunnel oxide is ultra-low.

The 3D-NOR memory could be designed with more than two tunnel oxide thicknesses. It could have multiple variations of tunnel oxide thicknesses across units of memory, ridges and/or memory-column-side. These could include high speed memory-column-side with a low natural retention all the way to conventional charge O/N/O resulting in a slow write and erase time and 10 years retention. As system needs could be quite different, the fabric may allow targeting the amount of memory types with a wide range of options and ability to very effectively transfer of data from one type to another type within the device. This range of memory types could include sections within a chip with gate supported retention and sections with floating gate as an alternative to charge trap and many other variations or combination of them.

For better performance, the tunneling oxide could be engineered for improved write speed and retention at the same time such as presented by Hang-Ting Lue et al. in a paper titled "BE-SONOS: A Bandgap Engineered SONOS with Excellent Performance and Reliability" published at IEDM 2005, incorporated herein by reference.

Another variation is to avoid tunneling oxide all together as presented by Dong-Il Moon et al. titled "A Novel FinFET with High-Speed and Prolonged Retention for Dynamic Memory" published in IEEE ELECTRON DEVICE LETTERS, VOL. 35, NO. 12, December 2014, incorporated herein by reference.

An optional enhancement for these 'trap charge' memory operations is to monitor the level of the charge during a read operation. Such monitoring could guide the refresh operation to reduce overall device power usage. Such monitoring could drive refresh to the cell, the column, the ridge or the unit.

Other variations could be integrated with the described 3D NOR fabric such as been described in a paper by Hee-Dong Kim et al., titled "A New Class of Charge-Trap Flash Memory With Resistive Switching Mechanisms" published in IEEE Transactions on Electron Devices November 2010, incorporated herein by reference.

To reduce the thermal budget required to form a tunneling oxide and to form a uniform tunneling oxide in any convex and concave corners of the ridges, radical oxidation could be used for the formation of a high quality oxide such as for the formation of the tunneling oxide and/or for smoothing sharp corners and edges to mitigate unintended high e-field conditions. For example, by a TEL SPA (slot plane antenna) tool/machine, wherein oxygen radicals are generated and utilized to form thin thermal oxides (generally of single crystal silicon) at less than 400 deg C.

Figure 8D:
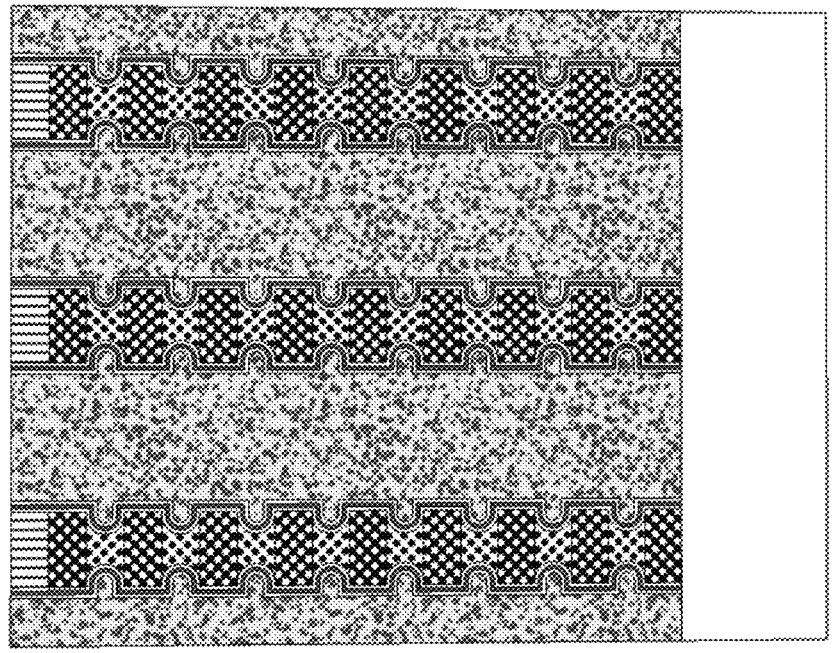
Figure 8C:
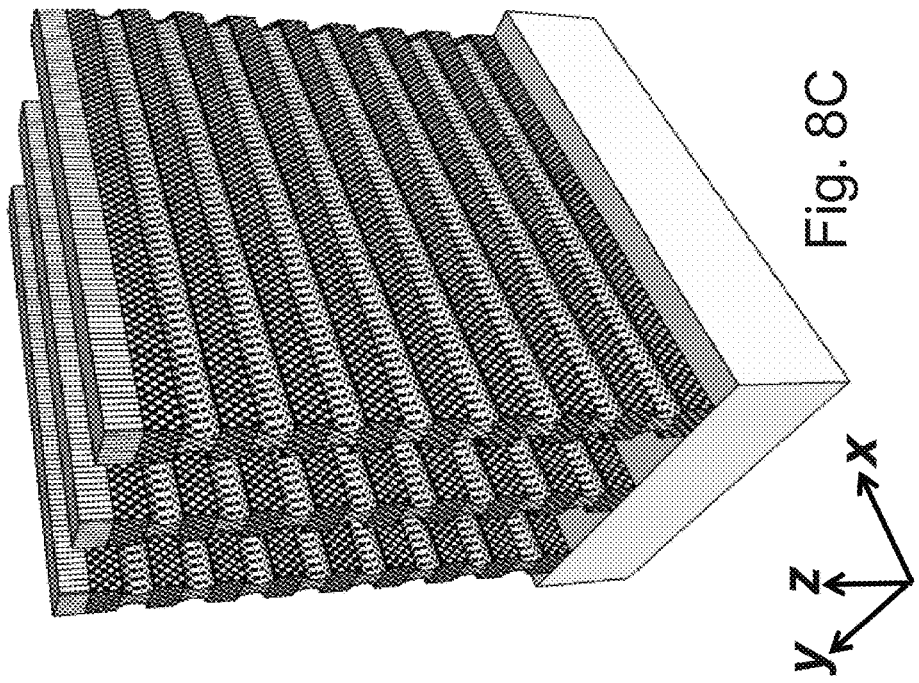

FIG. 8C illustrates an alternative for a curved channel formation. In this alternative the ridge formation illustrated in FIG. 3B may be followed by a selective partial etch of the channel regions similar to the one illustrated in FIG. 3C. Such an isotropic selective etch of the channel regions could form a curved channel. FIG. 8D illustrates forming a gate stack over the channels. Such curved channel in presented in U.S. patent application Ser. No. 11/379,723 incorporated herein by reference. An advantage of such a shaped channel is that for the same layer thickness the effective charge trap surface is longer (a geodesic rather than a direct line path) allowing better separation for charge storage, such as mirror bit storage sites, resulting in a potentially higher memory density. This could be done for the full ridge length as is illustrated or selectively to some of the memory channel columns.

Another alternative is to utilize an isotropic selective etch of the P regions to form floating gates for the first gate stack or the second gate stack or first for $1^{st}$ gate stack and then for the $2^{nd}$ gate stack. It should be noted that by adding the polysilicon as the floating gate in the indented channel of only 'first for $1^{st}$ gate stack', the floating gate is made local per channel and is not continuous along the ridge. FIG. 8E illustrates an undercut partial etch of the channel regions indentations 811 similar to the ones illustrated in FIG. 3C and FIG. 8C.

Throughout the patterning, etch (wet/dry) processing, such as cleaning and rinse, selective removal process, and so on herein, the resultant (after each step or after a combination of steps) ridge structure may contain sharp corners. If necessary, corner rounding processing to alleviate the corner effects may be added. The exemplary processes for corner smoothing may include, for example, radical oxidation and partial/full oxide removal, and surface atom migration by heat treatment.

FIG. 8F illustrates forming the tunnel oxide layer 802 following by isotropic deposition of the floating gate material such as poly silicon. And then anisotropic etch of the 'excess' polysilicon materials in the valleys leveraging the top nitride hard mask may be performed, thus leaving 'islands' of poly silicon material in the indented locations 804. FIG. 8G illustrates completing the formation of the floating gate structure by deposition of the control oxide 806 and control gate 808 completing the formation of the basic floating gate stack structure. Removing the tunneling oxide for the floating-gate is a bit more challenging due to the ability of the trapped charge to quickly leak back. The solution is to add a step of etch back after the floating gate polysilicon deposition such that the polysilicon is substantially fully captured within the curve of the P channel formed by the selective isotropic etching of the channel regions as was discussed in respect to at least FIG. 8C. And to reduce rate of the 'trapped' charge leaking back to the channel, the floating gate could comprise N+ doped polysilicon.

Another alternative is to etch some portion but not completely the second channel, such as a P-type region, before adding the $2^{nd}$ gate stack. These recesses in the channel regions could be made deep enough so that 2nd gates could be used to manipulate the bit locations horizontally in the 1st O/N/O charge storage layer. In U.S. application Ser. No. 14/874,366, incorporated herein by reference, in reference to at least FIGS. 5-13B, a technique to manipulate the location within a charge-trap layer is presented. The technique uses side gates to manipulate the charge storage location, increasing the bit capacity per facet. This technique could be implemented here with the $2^{nd}$ gates acting as a right side gate and left side gate while the $1^{st}$ gate acts as the top (main) gate. The amount of recess could be adjusted based on multiple engineering considerations and as well as the thickness of the $2^{nd}$ O/N/O or the dielectric gate stack, for optimizing such a 3D NOR structure.

Another alternative is to process the structure and to silicide the S/D (The N+ regions) which could be used to form a Schottky Barrier between the S/D and the channel, and strongly reduce the bit-line (S/D) resistivity. The silicide region may be directly in contact with the channel. Alternatively, the silicidation in the S/D N+ region may be formed to simply reduce series resistance when the silicide region is not substantially close to the channel. If desired, the silicidation region may be substantially close but not directly in contact with the channel where the channel and the silicide region are separated by a segregated n-type doped region. Some of techniques for these tunings are presented herein later.

The starting point could be similar to the one illustrated in FIG. 8E.

FIG. 8H illustrates the structure after depositing a protection oxide 821 to substantially fill the indentations 811 (FIG. 8E) of the channel region. Then anisotropic etching, using the ridges hard mask protections 822, to expose the side walls of the S/D regions 824 may be performed. Thus the channel regions 826 would be protected by the protection oxides 821 while the sidewall of S/D regions 824 are left exposed.

FIG. 8I illustrates the structure after deposition of the silicide material 830 such as Co, Ti, Ni or other metals as desired. The deposition could be done using ALD for precise control or by other techniques such as sputtering and evaporation. The use of ALD for the silicidation metal would fit well with the 3D NOR structure herein and could fit well in other advanced applications of 2D or 3D structures. ALD allows atomic level control of the deposited material for the following silicidation process to support lower device variations. A review of ALD fundamentals is provided by Richard W. Johnson et al in a paper titled "A brief review of atomic layer deposition: from fundamentals to applications" published at Materials Today Volume 17, Number 5, June 2014, incorporated herein by reference.

FIG. 8J illustrates the structure after performing the silicidation, of the exposed S/D regions, by annealing the structure using techniques such optical heating using spike, flash or laser processes or alternatively microwave or heating oven. It might be desired to tune the process so the silicidation 832 would not get into the channel regions known as junction spike.

FIG. 8K illustrates the structure after removal of unused silicidation metal and the protection oxide 821 exposing the channel regions 834.

FIG. 8L illustrates the structure after forming, by deposition techniques such as ALD, the full gate stack such as O/N/O and gate material as was presented herein for forming gate stacks.

An important note in respect to the silicidation process of the 3D NOR fabric is that any S/D regions that are designated to become horizontal transistor—JLT, such as the ridge select regions, should be protected from the silicidation process by proper masking and protection.

Some techniques for such silicidation and using silicidation for memory applications, has been presented by Chaochao Fu et al. in a paper titled "Schottky Barrier Height Tuning via the Dopant Segregation Technique through Low-Temperature Microwave Annealing" published at Materials 2016, 9, 315; and by Yu-Hsien Lin et al. in a paper titled "Microwave Annealing for NiSiGe Schottky Junction on SiGe P-Channel" published at Materials 2015, 8, 7519-7523; doi:10.3390/ma8115403; and by Chung-Chun Hsu et al. titled "High-Performance Schottky Contact Quantum-Well Germanium Channel pMOSFET With Low Thermal Budget Process" published at IEEE ELECTRON DEVICE LETTERS, VOL. 37, NO. 1, January 2016, all incorporated herein by reference. Use of a Schottky barrier to enhance charge trap memory device has been reported by Chun-Hsing Shih et al. in a paper titled "Multilevel Schottky Barrier Nanowire SONOS Memory With Ambipolar n- and p-Channel Cells" in IEEE TRANSACTIONS ON ELECTRON DEVICES, VOL. 59, NO. 6, June 2012, and another titled "Effects of Dopant-Segregated Profiles on Schottky Barrier Charge-Trapping Flash Memories" in IEEE TRANSACTIONS ON ELECTRON DEVICES, VOL. 61, NO. 5, May 2014; and another titled "Nonvolatile Schottky Barrier Multibit Cell With Source-Side Injected Programming and Reverse Drain-Side Hole Erasing in IEEE TRANSACTIONS ON ELECTRON DEVICES, VOL. 57, NO. 8, August 2010; and similar works reported by Wei Chang et al. titled "A Localized Two-Bit/Cell Nanowire SONOS Memory Using Schottky Barrier Source-Side Injected Programming" in IEEE TRANSACTIONS ON NANOTECHNOLOGY, VOL. 12, NO. 5, September 2013; another titled "Drain-induced Schottky barrier source-side hot carriers and its application to program local bits of nanowire charge-trapping memories" in Japanese Journal of Applied Physics 53, 094001 (2014), another "Sub-lOY 4-Bit/Cell Schottky Barrier Nanowire Nonvolatile Memory" at 2012 12th IEEE International Conference on Nanotechnology (IEEE-NANO); and by Ching-Yuan Ho et al. titled "Enhancement of programming speed on gate-all-around poly-silicon nanowire nonvolatile memory using self-aligned NiSi Schottky barrier source/drain" in URNAL OF APPLIED PHYSICS 114, 054503 (2013), all of the forgoing are incorporated herein by reference.

In a Schottky Barrier ('SB') transistor the source and the drain ('S/D') of the transistor are defined by the silicidation and not by the N+ doping. The use of a Schottky Barrier S/D results in a sharper electric field profile near the junction compared to the N+ S/D. Therefore, the trapped charge profile can be more tightly localized near the junction region which makes more distinctive state differences for mirror-bit applications. Additional advantage is in reading a mirror-bit set up, by allowing a read of both bits with a single cycle, which supports use of mirror-bit density doubling for high speed applications, such has been described in a paper by Zhou Fang et al. titled "A Study on Schottky Barrier NOR Flash Memory" published at Nanoelectronics Conference (INEC), 2011 IEEE 4th International and a paper by Yan-Xiang Luo et al. titled "Coupling of carriers injection and charges distribution in Schottky barrier charge trapping memories using source-side electrons programming" presented at Semicond. Sci. Technol. 29 (2014) 115006, and in U.S. Pat. No. 8,183,617 all of the forgoing are incorporated herein by reference. The desired Schottky Barrier S/D may be achieved with the appropriate device and operational engineering choices.

For the 3D NOR fabric processing and to enable selective etching of the channel region 811 at FIG. 8E, the multilayer structure of FIG. 3A could be made of Silicon over SiGe. Etching techniques that are very selective between SiGe and Silicon are well known. FIG. 3C and SiGe is an attractive channel material for its higher holes mobility. In addition, using SiGe as the channel material may facilitate hot-carrier programming and hot-hole erase due to its lower energy bandgap.

Alternatively the S/D layer could be first form N+ doped layers such that the silicidation process could form Dopant Segregated Schottky Barrier (DSSB). Such has been described by Sung-Jin Choi et al. in papers titled "High Speed Flash Memory and 1T-DRAM on Dopant Segregated Schottky Barrier (DSSB) FinFET SONOS Device for Multi-functional SoC Applications" published at 2008 IEEE International Electron Devices Meeting; "Enhancement of Program Speed in Dopant-Segregated Schottky-Barrier (DSSB) FinFET SONOS for NAND-Type Flash Memory" in IEEE ELECTRON DEVICE LETTERS, VOL. 30, NO. 1, January 2009, ; "High Injection Efficiency and Low-Voltage Programming in a Dopant-Segregated Schottky Barrier (DSSB) FinFET SONOS for NOR-type Flash Memory" in IEEE ELECTRON DEVICE LETTERS, VOL. 30, NO. 3, March 2009; "Performance Breakthrough in NOR Flash Memory with Dopant-Segregated Schottky-Barrier (DSSB) SONOS Devices" in IEEE 2009 Symposium on VLSI Technology; "Fin Width (Wfin) Dependence of Programming Characteristics on a Dopant-Segregated Schottky-Barrier (DSSB) FinFET SONOS Device for a NOR-Type Flash Memory Device" in IEEE ELECTRON DEVICE LETTERS, VOL. 31, NO. 1, January 2010; "P-Channel Nonvolatile Flash Memory With a Dopant-Segregated Schottky-Barrier Source/Drain" in IEEE TRANSACTIONS ON ELECTRON DEVICES, OL. 57, NO. 8, August 2010; and "Analysis of Trapped Charges in Dopant-Segregated Schottky Barrier-Embedded FinFET SONOS Devices" in IEEE ELECTRON DEVICE LETTERS, VOL. 30, NO. 10, October 2009, additional work by Yu-Hsuan Chen analyzes the effect of S/D doping as reported in a paper titled "Iterative Programming Analysis of Dopant Segregated Multibit/Cell Schottky Barrier Charge Trapping Memories" published at the 2015 15th Non-Volatile Memory Technology Symposium (NVMTS), all of the forgoing are incorporated herein by reference. More articulately, the overall S/D regions consist of the metal-silicide while the S/D to channel junction is formed with dopant-segregated Schottky barrier junction as explained by the references incorporated herein. An important advantage of a DSSB based structure is the reduction of ambipolarity which interferes with the 3D NOR memory functionality. Both SB and DSSB enable a very significant reduction of write time for the same tunneling oxide thickness and accordingly enable high retention time together with a high speed write time. This could make this memory fabric very attractive to replace DRAM type memory applications in which a fast memory access for read and write is very important. Combining silicidation according to these techniques with a thinner tunneling oxide could enable fast access with a still long enough retention thus reducing the device active power, operational overhead and complexities. Additional advantage is the added flexibility in engineering the 3D NOR fabric. SiGe could be used to define the channel and the S/D while doping could be used to optimize the transistor performance together with silicidation to engineer the Schottky barrier and segregation to further engineer the transistor and its related memory performance. If desired, the exposed surface of Ge or SiGe channel could be passivated by a capping layer, for example, comprised of Si, followed by gate oxide stack formation. This will reduce the interface states and relative noise and improve the channel mobility. Alternatively, the exposed surface of Ge or SiGe channel can be directly in contact with charge trapping layer. This embodiment increases the interface state, which can be positively utilized to increase charge trap density for DRAM application and trapping/detrapping efficiency.

An additional alternative could be forming an asymmetrical memory transistor, such as having different doping of the odd S/D layers and the even S/D layers such that the vertical transistor could be engineered for conventionally a doped source and a dopant segregated Schottky barrier or normal Schottky barrier drain. Alternatively, the vertical transistor can be formed with a dopant segregated Schottky barrier or normal Schottky barrier source and a conventionally doped drain. Such asymmetric memory structure could also exhibit less ambipolar transport characteristics. In addition, such asymmetrical memory transistor could be engineered for faster time or lower voltage erase conditions. Such as has been presented in a paper by Yu-Hsuan Chen et al. titled "Drain-Controlled Ambipolar Conduction and Hot-Hole Injection in Schottky Barrier Charge-Trapping Memory Cells" published at 15th International Workshop on Junction Technology (IWJT) and is incorporated herein by reference.

The silicidation process enables an alternative form of ridge select transistor formed in the S/D line. Such an alternative to JLT 1314, 2113, 4020, 4134 as a horizontal S/D line control device could be formed and utilized. For such the Source or the Drain or both could be left uncovered and accordingly forming an DSSB transistor or SB transistor. Another alternative is the asymmetric Schottky-barrier transistor ("ASSBT") such as presented in a paper by Zer-Ming Lin et al. titled "Characteristics of n-Type Asymmetric Schottky-Barrier Transistors with Silicided Schottky-Barrier Source and Heavily n-Type Doped Channel and Drain" published in the Japanese Journal of Applied Physics 51 (2012) 064301; and by Ru Huang et al. titled "High performance tunnel field-effect transistor by gate and source engineering" published in Nanotechnology 25 (2014) 505201; or an alternative structure using two control gates as presented by Sebastian Glassner et al. in a paper titled "Multimode Silicon Nanowire Transistors" published at Nano Lett. 2014, 14, 6699-6703; or by Jian Zhang et al. titled "A Schottky-Barrier Silicon FinFET with 6.0 mV/dec Subthreshold Slope over 5 Decades of Current" published at IEDM14; or a paper titled "Polarity-Controllable Silicon Nanowire Transistors With Dual Threshold Voltages" published at IEEE TRANSACTIONS ON ELECTRON DEVICES, VOL. 61, NO. 11, November 2014; or similar work by M. De Marchi et al. titled "Polarity Control in Double-Gate, Gate-All-Around Vertically Stacked Silicon Nanowire FETs" published at IEDM12; and a follow-on paper titled "Configurable Logic Gates Using Polarity-Controlled Silicon Nanowire Gate-All-Around FETs" published in IEEE ELECTRON DEVICE LETTERS, VOL. 35, NO. 8, August 2014; or a work by T. A. Krauss et al. titled "Favorable Combination of Schottky Barrier and Junctionless Properties in Field Effect Transistors for High Temperature Applications" to be published at PRiME 2016, all of the forgoing are incorporated herein by reference. Such a transistor could be formed horizontally by the silicidation process in which just the channel is protected from silicidation or the channel and the drain are protected from silicidation for the asymmetric ASSBT. The use of multiple gates with SB transistors as presented in these papers provide electronic control of SB transistors controlling its ambipolarity to get an N type or P type unipolar transistors. As previously presented the S/D layers doping could allow engineering of the vertical memory transistors in the range from SB transistors to DSSB transistors. With low doping the gate biasing could help increase transistor channel control thus enabling further engineering of the vertical transistors and the horizontal transistors within the 3D NOR fabric. These open up multiple device tuning options for better support of various targeted applications.

FIG. 9A illustrates a variation to the structure of FIG. 4A. On a substrate 900 the multilayer ridges 904 and valleys 906 are formed as is described with respect to FIG. 3B. Then hard mask stripes 902 may be formed perpendicular to the ridge direction for the subsequent damascene gate stack process.

FIG. 9B illustrates the structure after deposition (using ALD or compatible process) of 1st O/N/O multilayer and 1st metal gate forming 1st Gate Stack 910.

FIG. 9C illustrates the structure after removal of the hard mask used to form the damascene gate stack.

FIG. 9D illustrates the structure after optional channel indentation or recess as described previously herein.

FIG. 9E illustrates the structure after deposition of 2nd gate stack.

FIG. 9F illustrates the structure after CMP of both the 2nd gate stack and the 1st gate stack thus forming independent gates.

Figure 10A:
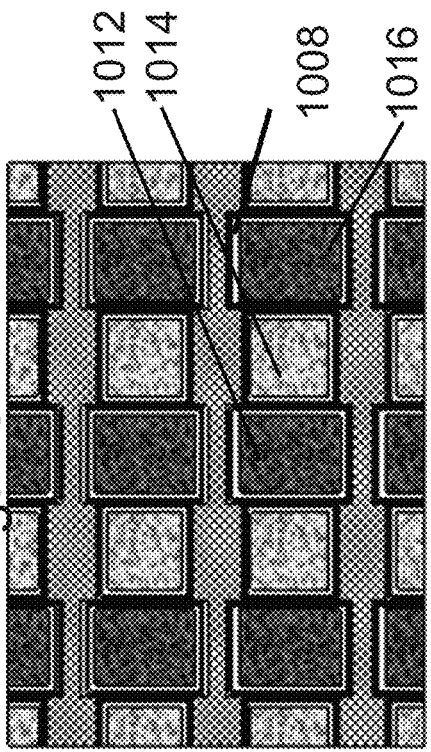
FIGS. 10A-10D are example illustrations of cut views of a NOR type 3D memory of FIG. 9F.

FIG. 10A illustrates a horizontal cut through the channel (P) layer 1002, illustrating a cut of the 1st gate stack 1004 and the second gate stack 1006.

Figure 10B:
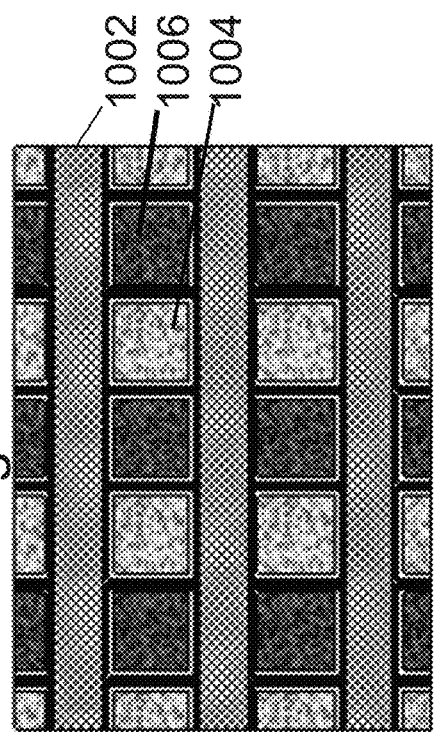

FIG. 10B illustrates a horizontal cut along the channel (P) layer, illustrating the recess into the channel 1008.

Figure 10C:
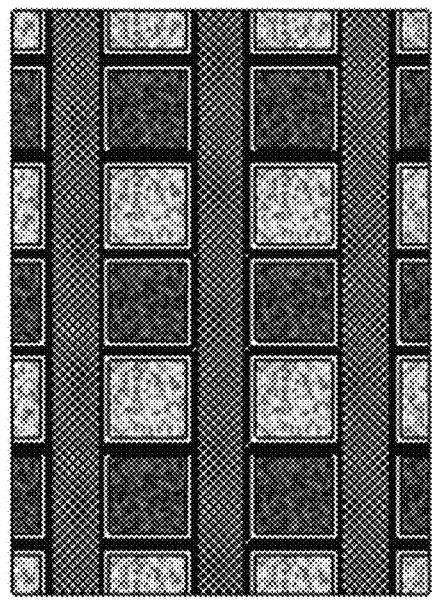

FIG. 10C illustrates a horizontal cut along N+ S/D layer 1003.

Figure 10D:
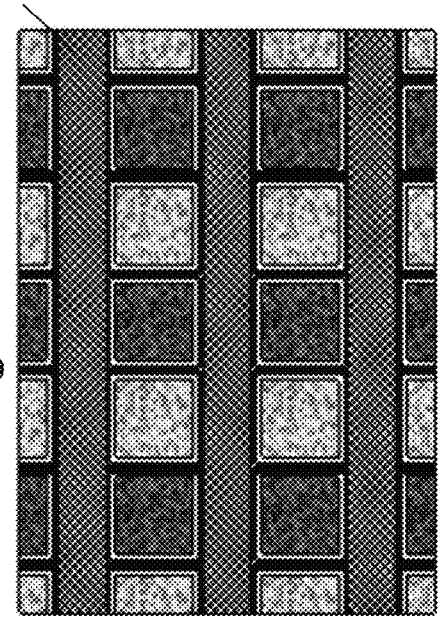

FIG. 10D illustrates a horizontal cut along N+ layer showing no recess of the S/D lines.

The 3D NOR engineering to a specific application could include any of the techniques presented herein and their combinations. One of such combinations could be the use of the non-indented memory column 1014 with a thinner tunneling oxide. Thinner tunneling is used for shorter retention, faster access, with higher rate of refresh. Using the side word lines 1012 and 1016 could allow doubling the number of storage locations by proper biasing of the side gates which are also indented to give them better control of the electric field of the memory cell(s) being accessed in the non-indented memory column 1014 and accordingly controlling the storage location laterally with respect to the channel area. Having that memory designated for shorter storage time makes it less impacted by (the stored) charge movement over time as it is often refreshed. The natural spread of a charge within the charge trap layer is highly related to time and temperature. Memory cells that are functioning as a DRAM could make use of multiple charge storage locations per facet thereby increasing the effective memory storage and density. Two or more locations could therefore be controlled by the side gates 1012, 1016. Such a density increase could be used with decreasing the memory access time.

Other storage density enhancements such as mirror bits and multilevel programmation/reads could be also be used, but these techniques do impact the access time or may require special sense amplifier techniques. The level of channel indentation could be engineered for the specific memory application, it could be made about 5%, about 10%, about 20% or even about 30% of the channel width. It could be made symmetrical on both the odd side the even side, simplifying the related processing, or asymmetrical.

Figure 10E:
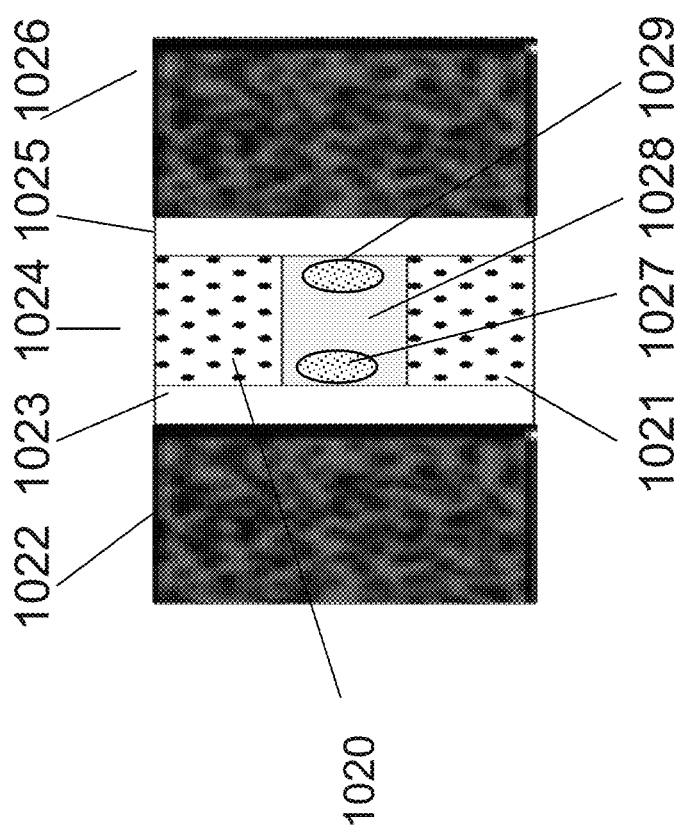
FIG. 10E is an example illustration of bit locations achievable with programming techniques.

FIG. 10E illustrates bit locations which may be achievable when utilizing the indented gates second gates 1012 and/or 1016. A programming voltage (+4v) could be applied to the non-indented gate, thru non-indented memory column 1014 for example. FIG. 10E is a vertical cut along the ridge side along the O/N/O of the non-indented memory column 1014, showing just one memory cell 1024. The illustration includes the left side indented gate 1022, in-between isolation/ONO 1023, the right side in-between isolation/ONO 1025, and the right side indented gate 1026; as well as the upper S/D 1020, the channel 1028, and the lower S/D 1021. A pulling voltage that is not enough to program, for example, (+2v), could be applied to the left side indented gate 1022 to pull the electrons to the left side 1027. Or a pushing field could be applied via a negative voltage, for example, (−2v) to the right indented gate 1026. Those could also be applied together or in various time and intensity shaped pulses. For reading, the side indented gates could be used in similar way while the control gate would provide a read voltage, for example (+1v). An inverse pull/push field could be applied by the indented gates to get the electrons written into the right side 1029. This technique could be extended to more locations based on the acceptable Vt shift and the O/N/O structure bit storage quality.

The right/left bit manipulation could work together with the mirror-bit and or multi-level to provide a higher storage density. Engineering of a memory product could include the trade-offs between the many parameters such as storage density, access time, sense amplifier complexity, retention time, and so forth.

An additional engineering alternative of the 3D NOR memory is to leverage the indent concept to reduce cell to cell interference. The charge trapped corresponding to the non-indent channels 1012, 1016 could provide a longer distance and thus less interference on the neighboring channels—the indented channels 1014, while the charge trapped corresponding to the indent channels 1014 could have a shorter distance and more interference on the neighbor channels—the non-indented channels 1012, 1016. The memory structure could be engineered to take advantage of this asymmetry by trapping more charge at the non-intended cells and less charge at the intended cells. This could correspond also in use of a thinner charge trapping layer for the indented cells than for the non-indented cells or other type of tuning the O/N/O trapping capacity to trap smaller charge in the indent cells. For example the trapping capacity of the indent cell could be engineered to be about 30%, about 50% or even about 70% lower than that of the non-indent cells 1014. Another alternative is to have the indent gate narrower and the non indent cell wider in respect to X direction (along the ridge). The wider cell would have both more charge being trapped and a higher average distance to the interference. An added advantage for such could be an increased storage room for more storage sites as was discussed in reference to FIG. 10E. The non-indent channel could be made about 10%, about 20%, about 40%, about 70% or even more than 100% wider (in x direction) than the indented channels. Engineering the memory device accordingly could provide a higher overall memory density and support different memory functionalities within the same device.

FIGS. 11A to 11C illustrate methods to isolate a bottom most S/D of a ridge from a neighboring ridge. The shallow trench isolation may be incorporated to isolate any adjacent bottom most S/Ds. Alternatively, as the presented 3D memory block may not use an oxide isolation scheme or so-called shallow-trench-isolation (STI), alternative methods could be used for field isolation.

FIG. 11A illustrates one alternative in which the 3D NOR fabric is constructed over an SOI substrate which includes buried oxide 1101.

FIG. 11B illustrates one alternative in which the 3D NOR fabric is constructed over a bulk substrate. To reduce through-substrate leakage between adjacent ridges the upper part of the substrate 1102 may be doped to a high P concentration and in operation this layer may be back-biased with a negative voltage, such as about −1v.

FIG. 11C illustrates another alternative for having the 3D NOR over bulk substrate. In this alternative the through-substrate leakage may be blocked by having the bottom most S/D line 1104 connected such to be used as a common source line.

Figure 12B:
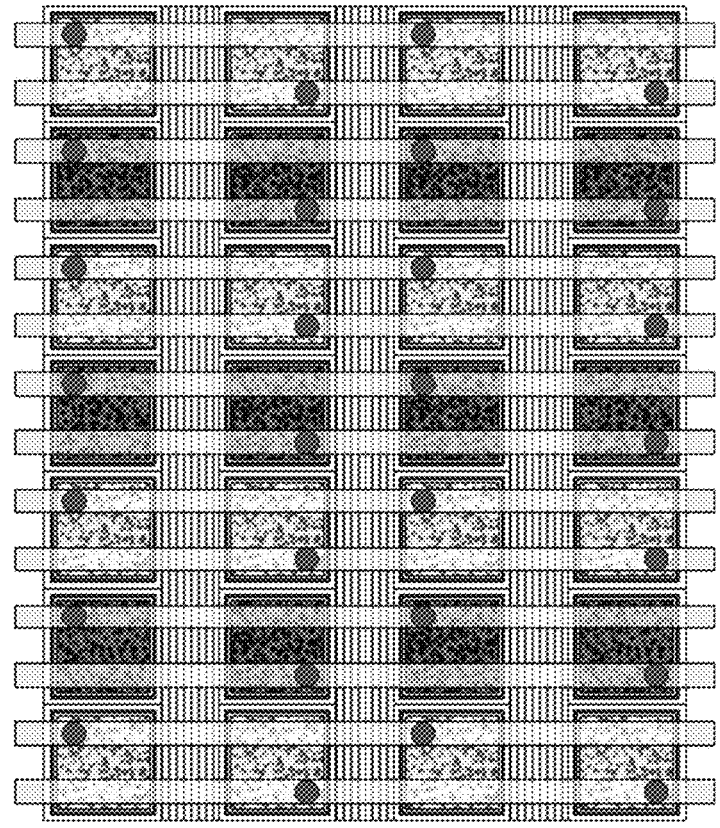
FIGS. 12A-12B is an additional example illustration of the word-lines of a NOR type 3D memory.
Figure 12A:
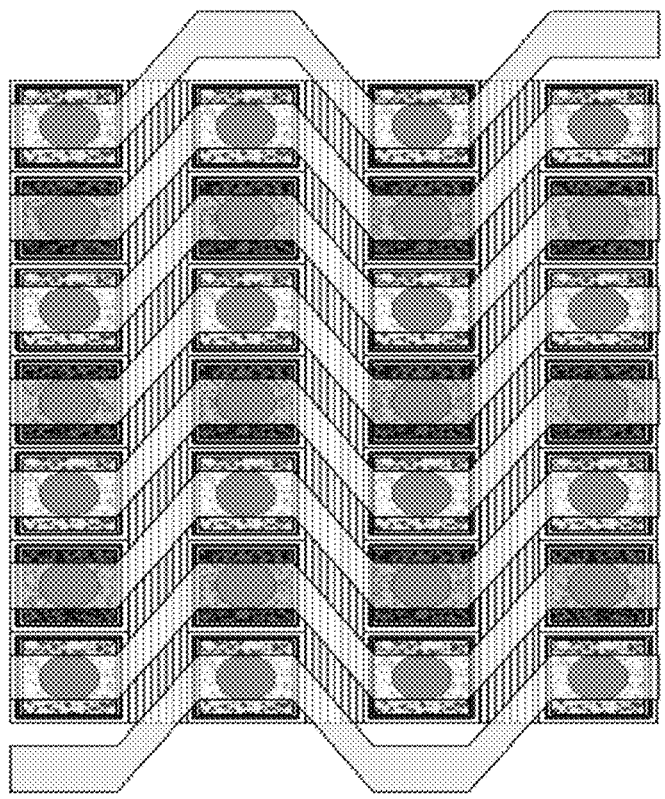

FIG. 12A illustrates a top-viewed 3D NOR structure. It illustrates an optional word-line connectivity in which two word lines are servicing one channel, to enable independent control of one channel from the gate on its right facet and from the gate on its left facet. This interconnect arrangement can be implemented by using a more advanced lithography step than that used for forming the 3D memory cells.

FIG. 12B illustrates an alternative 3D NOR structure in which two word lines are servicing one channel to enable independent control of the gate on its right facet from the gate on its left facet, yet without doubling the number of word lines but rather a substantially zig-zag shape of the word-lines, for example, as illustrated As explained previously, FIG. 4C illustrates a select line per ridge as part of forming the controlled access to the memory fabric. The following is a description of a process flow for forming per ridge select control.

Figure 13A:
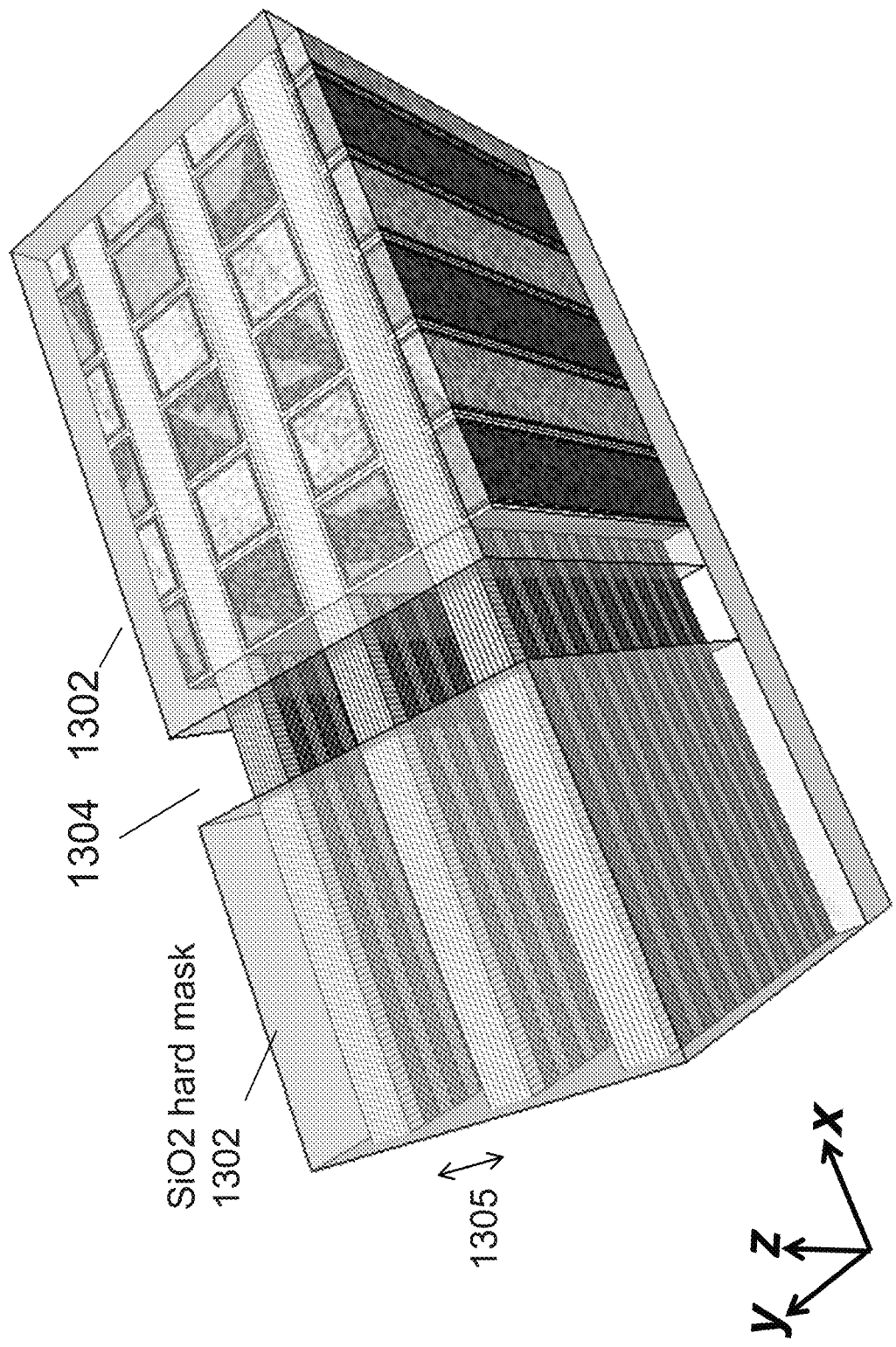

FIG. 13A illustrates the structure after forming hard mask 1302 to protect the structure other than in the region 1304 designated for forming per-ridge select control device.

FIG. 13B illustrates the structure after removal of the P regions in between the S/D lines in the designated ridge select region 1314 using a selective isotropic etch with any of the selective etching techniques described herein or compatible techniques. Then followed by trimming down the S/D lines reducing its diameter to less than about 50 nm, or less than about 20 nm, or less than abut 10 nm, to become effectively junctionless transistors (JLT).

FIG. 13C illustrates the structure after depositing the ridge select gate stack 1316 that may include gate dielectric and gate material. JLT for the horizontal transistor for ridge select as presented herein is one option. Other options for horizontal transistor for S/D control could utilize the Schottky Barrier transistor and the other variations previously discussed herein in respect to the silicidation process.

FIG. 13D illustrates the structure after patterning and etching, forming the per ridge gate control.

It is desirable to keep the ridge select 1322 of a ridge isolated from the ridge select of the adjacent ridge 1324. The objective could be leveraging the thinning of the S/D lines used in forming the JLT 1314 and the thinner gate oxide of the ridge select gate in which no charge trapping nor tunneling oxide is used. Accordingly, such ridge select isolation could have a very low impact valley width 1305.

FIG. 13E illustrates an alternative per ridge select from both sides of the ridges.

As explained previously, in FIG. 3H and other following illustrations, a per layer stair-case is illustrated as a continuation of the ridge along its direction.

The following illustrates an alternative stair-case oriented orthogonally to the ridge direction. For this type of staircase the ridge formation could be designed to leave in a connective vertical ridge 1404. The vertical ridge 1404 could be used to form connection bars in the Y direction to form a per layer connective bar for the S/D lines of the ridge within the unit 1402. This bar could be silicided to reduce the resistivity during the S/D silicidation process. This bars could be made wider such 50-100, 100-200, 200-400 nm or even wider to support a per layer low resistivity connection.

Figure 14A:
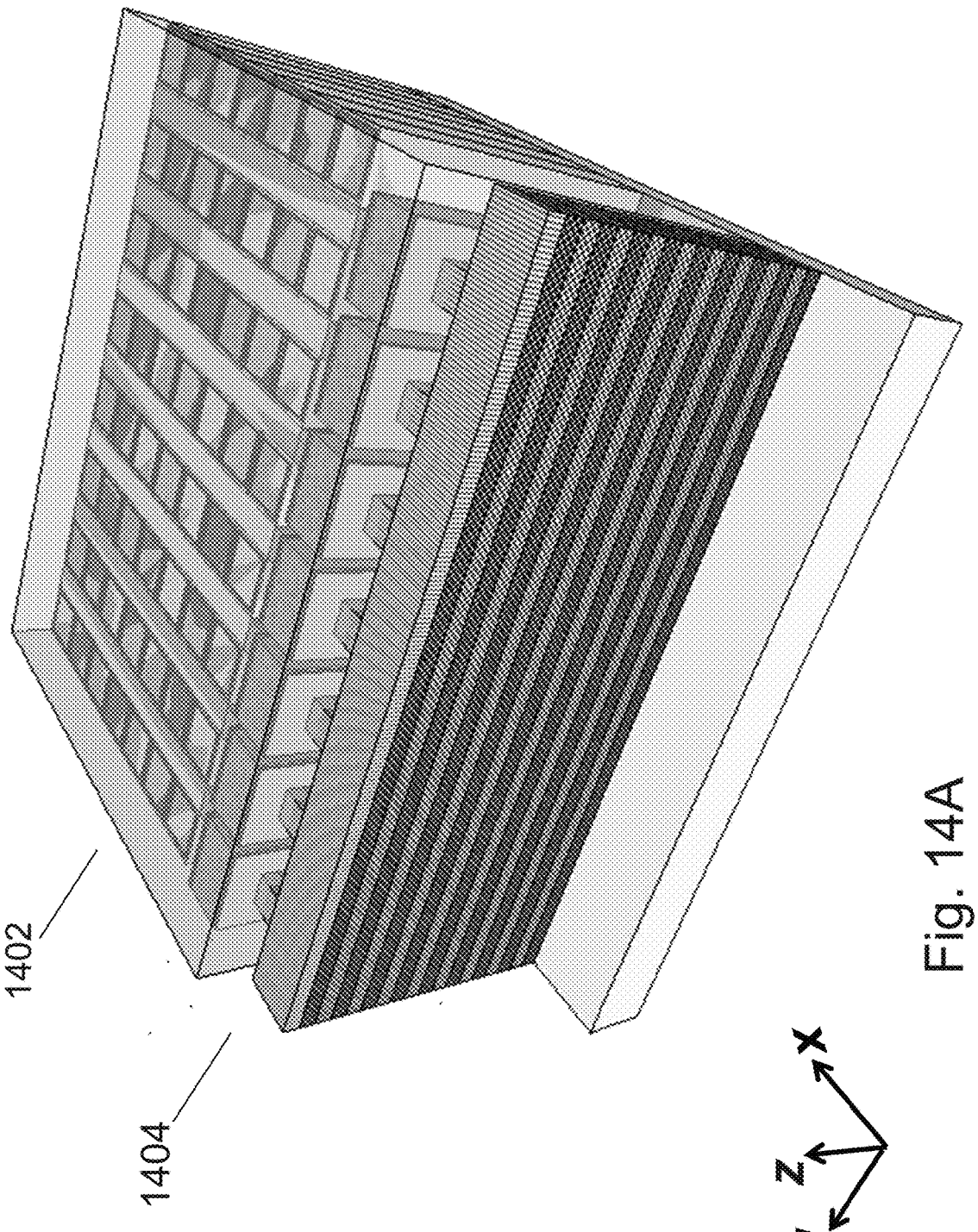

FIG. 14A illustrates the structure after forming hard mask 1402 to protect the structure other than in the region 1404 designated for forming per-layer access—the staircase.

FIG. 14B illustrates the structure after removal of the P regions in-between the S/D lines using selective isotropic etching with any of the selective etch techniques described herein or compatible techniques. This step could be planned to be done together with removal of P regions in various other regions such as in the per-ridge select region. An oxide could be deposited over and between the S/D lines to stabilize the remaining S/D (N+) lines.

FIG. 14C illustrates the structure after forming per-layer contact holes using the staircase methodology.

FIG. 14D illustrates the structure after depositing sidewall isolation oxide and add-in metal plugs.

FIG. 14E illustrates a side view of the formed staircase.

FIG. 15A illustrates a side view cross-section of a prior art 2D memory circuit The memory cells 2D matrix 1502 is surrounded by memory control circuits 1504 such as decoders, sense amplifiers and interfaces with external devices. Circuits 1504 are called accordingly memory peripherals. The memory control lines 1506 are running across the memory array columns and rows substantially all the way to the peripheral circuits.

FIG. 15B illustrates a side view cross-section of prior art 3D memory device. Recently 3D memory also known as 3D-NAND has been released to the market. In such 3D NAND the memory cell 3D matrix 1512 is still surrounded by the memory control circuits 1514 such as decoders, sense amplifiers and interfaces with external devices. These memory peripherals are being processed on the silicon wafer substrate in a very similar way to the 2D memory circuits. In these 3D memories the control lines 1516 are running through the memory array columns and rows all the way across the memory matrix, some of these control lines being built on top of the 3D matrix and some of those going through the bulk of the memory matrix but at the edges they are all brought down to the 2D peripheral circuits at the silicon substrate level.

FIG. 15C illustrates a side view cross-section of a 3D memory formed in accordance with the present invention using the techniques presented herein. The 3D memory matrix 1522 comprises columns and rows having the control circuits 1524 which could still be called peripheral circuits but they are formed on top of the memory matrix. According to this embodiment, control lines 1526 are built underneath the peripheral circuits, in-between the peripheral circuits 1524 and the memory matrix 1522.

FIG. 15D illustrates a side-view cross section of an alternative 3D memories formed using the techniques presented herein in which the control lines and the control circuits are also disposed underneath the memory cell matrix.

The new type of 3D memory described herewith could be constructed to achieve a significant advantage over prior art by utilizing the 3D architecture illustrated in FIGS. 15C and 15D, by breaking the control lines 1526 into smaller segments within blocks with the control circuits being repeated for each block. Shorter control lines allow reduction of memory access read, write and refresh time and could generate a faster memory. On the other hand, a stair-case for layer access might impact device cost if it is repeated too often, so optimized architecture and overall memory control strategy might use long per-layer control lines (not shown)

to save staircase overhead area. Accordingly, optimum memory architecture might use long control lines to the memory cells within the same layer, keeping other (vertical) control lines relatively short, thus achieving the benefits of low power and fast access at a reduced cost.

The 3D memory described herewith could be further enhanced to include dual functionality—high speed volatile memory and low power low speed non volatile memory.

There are many uses for such an enhanced memory including splitting the memory bank to volatile and non-volatile portions, power down with transferring the volatile information into the non-volatile portion, and reduce sleep power by moving the volatile information into the non volatile portion. For some of these use modes the 3D structures presented herein with control circuits on top and/or on the bottom—for example, FIG. 15B and FIG. 15C—could be constructed to enhance effectiveness. For these modes the time and the power required to move the data from the volatile portion into the nonvolatile portion could be reduced by an order of magnitude.

FIG. 16A illustrates top view example of a 3D memory 1600 for such enhanced operation. The side memory control circuits 1601 control the interface to external devices both for instruction and for data in and out. These circuits 1601 could include the per-layer decoders and controls to support all internal memory blocks so the staircase area overhead could be minimized. The 3D memory is then partitioned to many blocks 1602 each is a sub-memory structure with its own top peripheral circuits to control most of its control lines. In such design the operation of moving data from one portion to the other (for example, one block 1602 to another block 1602) could be done in parallel for many units reducing the time and power by orders of magnitude. The side memory control circuits 1601 could synchronize these operations so it could be done one layer at a time.

FIG. 16B illustrates a block diagram of the peripheral circuits of a typical block 1602. Each unit 1604 of peripheral control circuits of a block 1602 may include:

Central controller 1630 commanding and controlling operations of sleep mode, recovery mode, etc.

In-Out interface controller 1632 to interface with external data and with the device controller 1601.

Sense Amplifiers 1620 to sense the data of memory cells in the designated block 1602 and convert the resultant digital bit to the block memory cash 1634.

Signal generators 1618 to generate the required voltages and currents for read/write of the memory cells. Some of these circuitries, such as charge pumps, could be shared by many units and be placed inside memory control circuits 1601.

Blocks 1612, 1614, 1616 and 1617 comprise the various control lines such as bit-lines, word-lines, gate-lines, select lines etc. The layer decoders 1616 might be moved from the unit 1604 into the general per-layer circuits at side memory control circuits 1601.

An additional advantage for such memory architecture is the potential ability to move in and out very large blocks of data, as many blocks 1602 could be accessed in parallel. If only a single per-layer staircase is used for maximum array efficiency than the parallel action would be limited to single layer at a time For many applications this could be managed by proper system data structure and control.

Such 3D Memory could include redundancy circuitry to allow repair of control functions as well as replacement of faulty memory bits or memories in a faulty ridge, or memory in a faulty word line. The architecture of FIG. 15D could be used to allow access to substantially all of the memory control lines from both sides—top and bottom and to have duplication of the device control circuit 1524 at the bottom. Such redundancy scheme could be broken down to the memory block control unit 1602 level. So if one unit of block control circuitry is faulty then it is replaced by its compatible one on the other end/side. Alternatively each unit of block control circuitry could be built with two stratums, one being a back-up for the other as was detailed herein before. The memory control redundancy could be applied to any of the 3D memories herein.

FIG. 17 illustrates an exemplary architecture of a 3D-NOR array. It could be a standalone device structure or embedded within a larger SoC. It illustrates a modular memory structure of 64 memory blocks, for example, first memory block 1701 and second memory block 1702 with the peripheral circuits built in a corresponding modular structure with 8 top units Pt_i to control the word-lines and additional 8 bottom units Pb_i to control the word-lines, and 8 left side units Pl_i to control the bit-lines and 8 right side units Pr_i to control the bit-lines. These could be used to drive the control lines from both sides to improve performance and reduce variability. By accessing from both sides the S/D line resistivity could be neutralized as the overall resistivity of the Source line access plus the Drain line access would be the same and would not highly dependent on the specific memory cell location along the ridge. Accordingly the read and write to a specific cell within a ridge would be substantially similar for all cells of that ridge. In addition it could also be used as redundancy so that single control unit failures could be recovered.

This architecture could also support additional modes of operation. The structure could be designed to allow independent access to 8 blocks provided none of them share the Peripherals circuits. It could be designed to support synchronized access of up to 8 units sharing the same row or sharing the same column and or the same layer, reducing access power and still provides multiple bits.

It could be designed to support on-chip transfer of data from the slow non-volatile portion to the high-speed thin tunneling oxide, also referred as thin O/N/O, portion or the other way around. Such data transfer could be done to, for example, 8 blocks in parallel, thus reducing time and power requirements. Such capabilities could allow high speed access with a low power operating mode. So data is transferred to thin tunneling oxide designated block for fast access but could stored back into the NOR NV section for sleep or power down.

The corners Clt, Crt, Clb, Crb could be used for device top level control for the operating mode, to generate the special voltage source required for read and write, and for interface to external devices.

The allocation of different types of memory within the 3D Memory fabric could be done along layers—vertically or along units—horizontally. Having a 3D Memory fabric with more than one type of memory or even other functions such as logic could enable a very effective 3D heterogeneous device. The on-chip parallel interchange between the various elements using thousand or even millions of lines could not be matched by other form of integration. And added advantage is the use of many common processing steps reducing the manufacturing cost of the overall system in addition to improvements in speed and power.

In general memory design it is common to use partitioning which utilizes powers of 2 numbers such as: 2, 4, 8, 16, 32, 64 . . . . Such works well with decoding and addressing. Yet, in some cases the number of bits sited within a facet is 6, which will be challenging for the decoding function—as was described herein and in reference to U.S. Pat. No. 6,670,669. An optional solution is to find a memory allocation which would be close enough to bridge this challenge with minimal overhead. A simple look up table could be used for the circuit to support such a memory allocation.

For example 3 layers could be used to form the 18 memory sites of which 16 would be used. Or 11 layers to form 66 sites of which 64 could be used reducing further the unused memory sites, which could also be used as redundancy for repair of defective sites with proper look up table in the control circuits. This could also be used for other functions, for example, such as error correction codes, radiation mitigation schemes, and so on.

A bit different for many memory structure is this 3D NOR structure in which the S/D line—the bit line is a dual function line. It is the Source line for layer 'n+1' while it is the Drain line for layer 'n', and the source and the drain could be swapped. An optional architecture of peripheral circuits for driving the bit-lines—the S/D lines is presented in the following example.

For simplicity the following peripheral circuits support the bit-lines BL1, BL2, BL3 of the structure illustrated in FIG. 4C. This architecture could be modified to support the alternative structure illustrated in FIG. 4D, for example. The decoding for the select-lines—SL, SL2, SL3, . . . could be done with a wide fan-in NAND receiving the address lines $Ridge_{0-i}$ and their complementary signal lines to decode the active Ridge and enable the bit-lines signals of the selected Ridge activate that Ridge's S/D lines.

Figures 18, 19A:
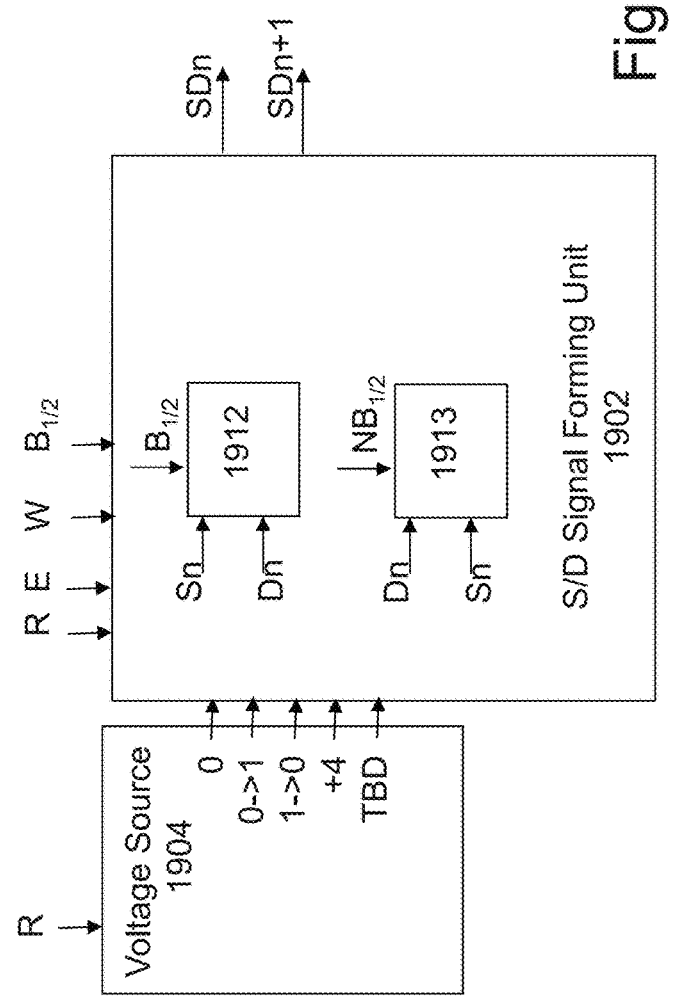

The FIG. 18 table illustrates an example of the operating conditions for that storage facet. The read is performed by measuring the current (Vth) between the S/Dtop (layer n+1) to S/Dbottom (layer n) when pulsing S/Dtop from low to high for reading Bit1, and swapping it for reading Bit2. These operating conditions are well known as this is the common NOR with MirrorBit. Other unselected S/D lines could be floating while all other unselected word-lines could be grounded.

FIG. 19A illustrates the first part of the bit-lines S/D lines related peripherals circuits. Voltage Source Circuits 1904 circuits may be the voltage generation circuits, those are centralized circuits including charge pumps and other power supply type circuits generating the various voltages require for the 3D-NOR memory operations as indicated in the table of FIG. 18. For reading bits, a pulse to the S/D lines could be used and accordingly the R signal indicating a read function is an input for Voltage Source Circuits 1904. Signal Forming Unit 1902 circuits may be signal forming and selectors which generate the two acting bit-line signals outputs: SDn for the S/Dbottom of FIG. 18, and SDn+1 for S/Dtop of FIG. 18. These signals would be connected to the selected S/D lines of the selected Ridge and accordingly the selected channel. The formation of these signals would be according to the memory operation with write indicted by W signal, R indicated by R signal or Erase indicated by E signal. The choice of the bit location—$B_{1/2}$ would affect the role of Source and Drain according to the bits location on the respective facet as indicated in FIG. 18.

FIG. 19A also illustrates the swapping between the S/D lines for the role of Source or Drain. While physically these lines are fixed the swapping is done electronically by enabling either buffers 1912 or the second buffers 1913.

FIG. 19B illustrates the circuits which may be used to drive these centralized signals SDn and SDn+1 to selected bit-lines while all other bit-lines are disabled-such as left floating. The two centralized signals (SDn, SDn+1) are forming bus-like signals for the bit-lines available to be selected for the selected level. Unit 1950 could include the buffers and drive electronics. These are designed according to system considerations such as access time, power and so forth. The layer Address lines $L_{0-j}$ and their complementary signals could be delivered as another bus-like signals. For each layer a large fan-in NAND gate could be used with decoding such as connection to the layer address so NAND 1930 is activated to "0" only once the layer address is addressing layer 'n' (respectively NAND 1929 is activated to "0" only once the layer address is addressing layer 'n−1', and NAND 1931 is activated for n+1). For each layer there is also a dedicated selector block—for 'n−1' selector block 1939, for 'n' selector block 1940, and for 'n+1' selector block 1941. Each selector block could have one-of-three selector M3. These selectors could use a full transmission gate or other switching type circuits.

For the case when column 'n' is addressed NAND 1930 may be activated and accordingly the selector M3 of 1940 would select SDn signal to drive bit-line to S/Dn at 1920 such as BL1, and selector M3 of 1941 would select SDn+1 signal to drive bit line related to S/Dn+1 such as BL2. All non-activated selectors (M3) will output "0", or may be left floating in some configurations, which will prevent their respective channel from being affected or affect the memory operations. Accordingly the proper signal is provided to perform the desired operation to the addressed bit within the addressed facet on the addressed channel.

In some configurations the M3 selector could be constructed to select between two active signals or leave the output floating which will render that line in-active.

Sense amplifiers for memory application are well known in the art. Tuning of the sense amplifier to the VT shift resulted from charge trapping could help the memory to be less sensitive to the ambipolarity associated with some of the options for the vertical memory transistor. The ambipolar current referred herein is the drain current flowing when the gate voltage is biased substantially low or even negative. When the memory is in programmed state, the drain current would be substantially small. However, for the memory device with ambipolarity, the Ambipolar current may flow even for the programmed cell. In order to sense the memory device with Ambipolarity, the slope of drain current over the gate voltage may be used, which can be enabled by a two-step read; read at low gate voltage and at elevated gate voltage followed by comparison of the two. When the memory is in the erased state, the drain current is increased with increasing gate voltage. When the memory is in the programmed state, the Ambipolar current is getting smaller with increases in gate voltage. Designing the sense amplifier accordingly could accommodate the 3D memory with ambipolar transistors. These types of slope tuned sense amplifiers are well known for STT-RAM as presented in a paper by Yiran Chen et al, titled "A Nondestructive Self-Reference Scheme for Spin-Transfer Torque Random Access Memory (STT-RAM)" published at Design, Automation & Test in Europe Conference & Exhibition (DATE), 2010, incorporated herein by reference.

Figure 20:
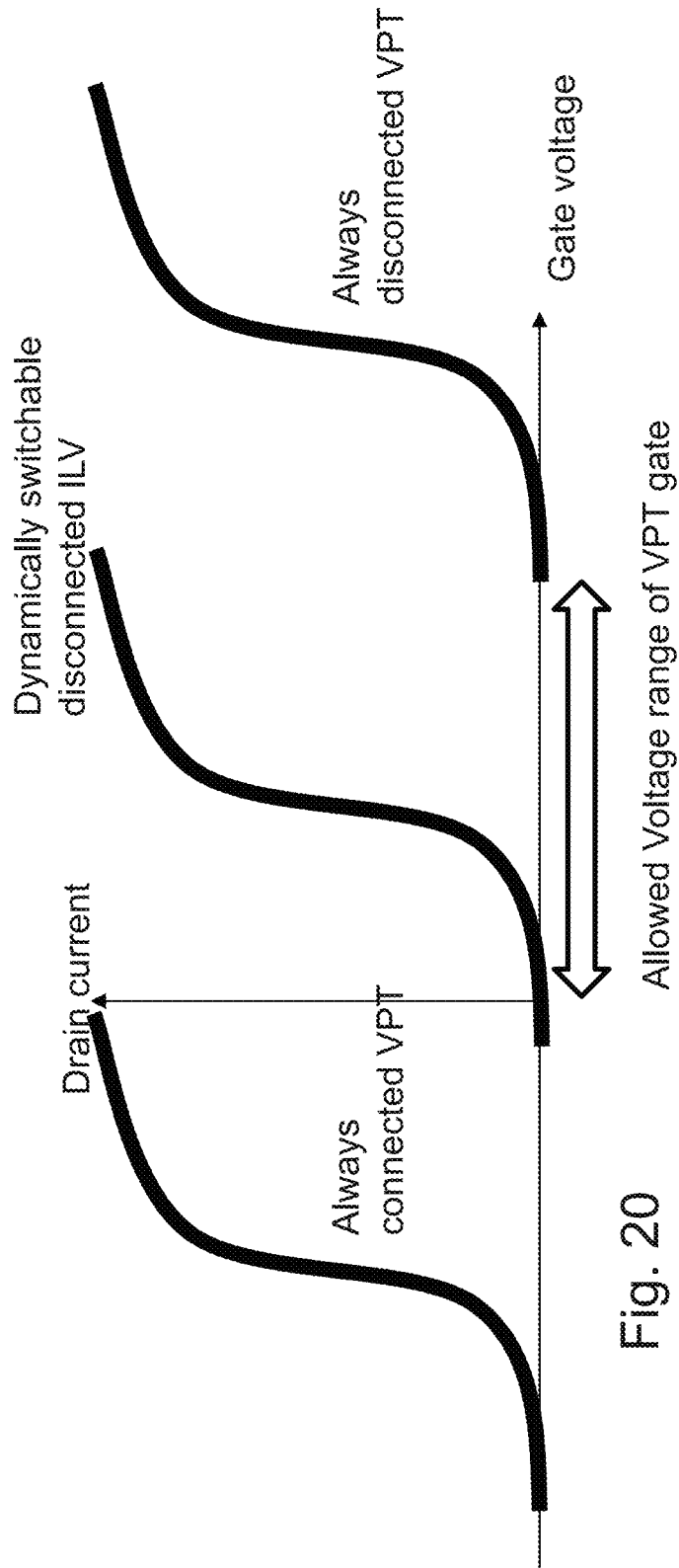
FIG. 20 is an example illustration of three operating states for which the VPT could be programmed.

FIG. 20 illustrates an embodiment using the charge trap programming to program the individual NPN transistors of the 3D NOR. These programming could allow use of the 3D NOR memory fabric as a programmable logic fabric as is outlined in the following. The vertical FET which is part of the basic 3D-NOR could be programmed as the electrons in the charge trap layer could shift the threshold voltage of the vertical NPN FET forming a vertical Programmable Transistor ("VPT"). The VPT could be programmed to three states within its given gate voltage swing: Always off, normal transistor, or always on.

Figure 21:
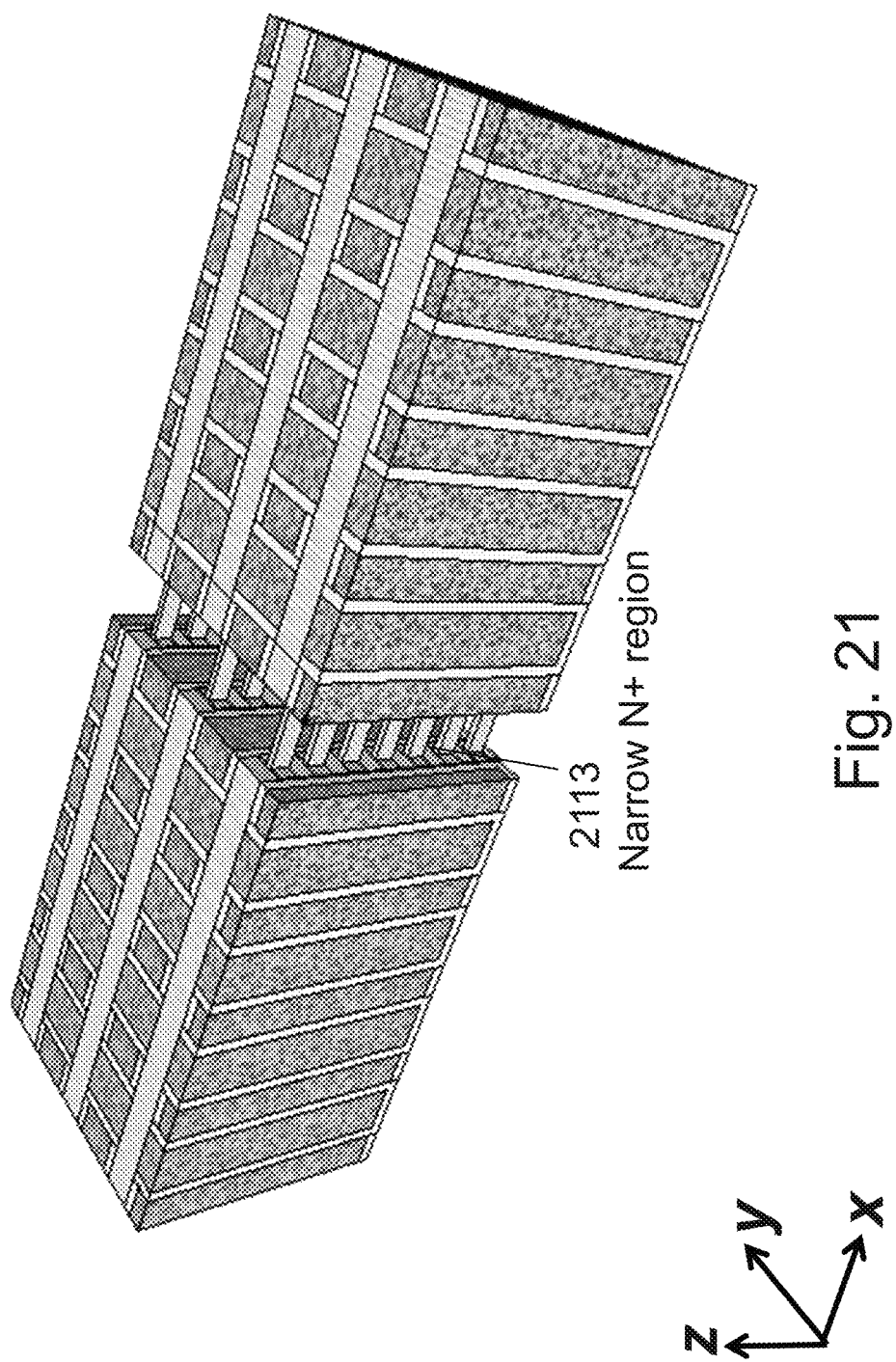
FIG. 21 is an example illustration of junctionless transistors ("JLT") in a region of the S/D lines.

For logic applications the process illustrated in respect to FIG. 13A-13C of forming horizontal transistors controlling the S/D line such as with junctionless transistor ("JLT") 2113 in region of the S/D lines could be applied to multiple locations across the fabric such as is illustrated in FIG. 21. Such JLTs could be preprocessed to have then a $3^{rd}$ O/N/O and a $3^{rd}$ Gate to have it also as a programmable JLT as part of the Programmable 3D NOR fabric. This horizontal JLT can be programmed to electrically always connect or disconnect each of the S/D lines between neighboring blocks of 3D NOR fabric. Alternatively, this horizontal JLT can dynamically connect or disconnect all of the S/D lines between neighboring blocks of 3D NOR fabric by its gate voltage. Therefore, the 3D-NOR fabric can be horizontally divided into many segmented sub-blocks through programing JLTs. Similarly, the 3D-NOR fabric can be vertically divided into many segmented sub-blocks by programming vertical NPN transistors. It should be noted that for most cases herein the reference to JLT is an example for horizontal controlled switch-transistor and accordingly other forms of horizontal transistors such as those leveraging Schottky barrier, as was presented herein, could be used as well and these terms are used herein as an conceptual example and specific implementation could use those or similar alternatives as could be engineered for that application.

Figure 22A:
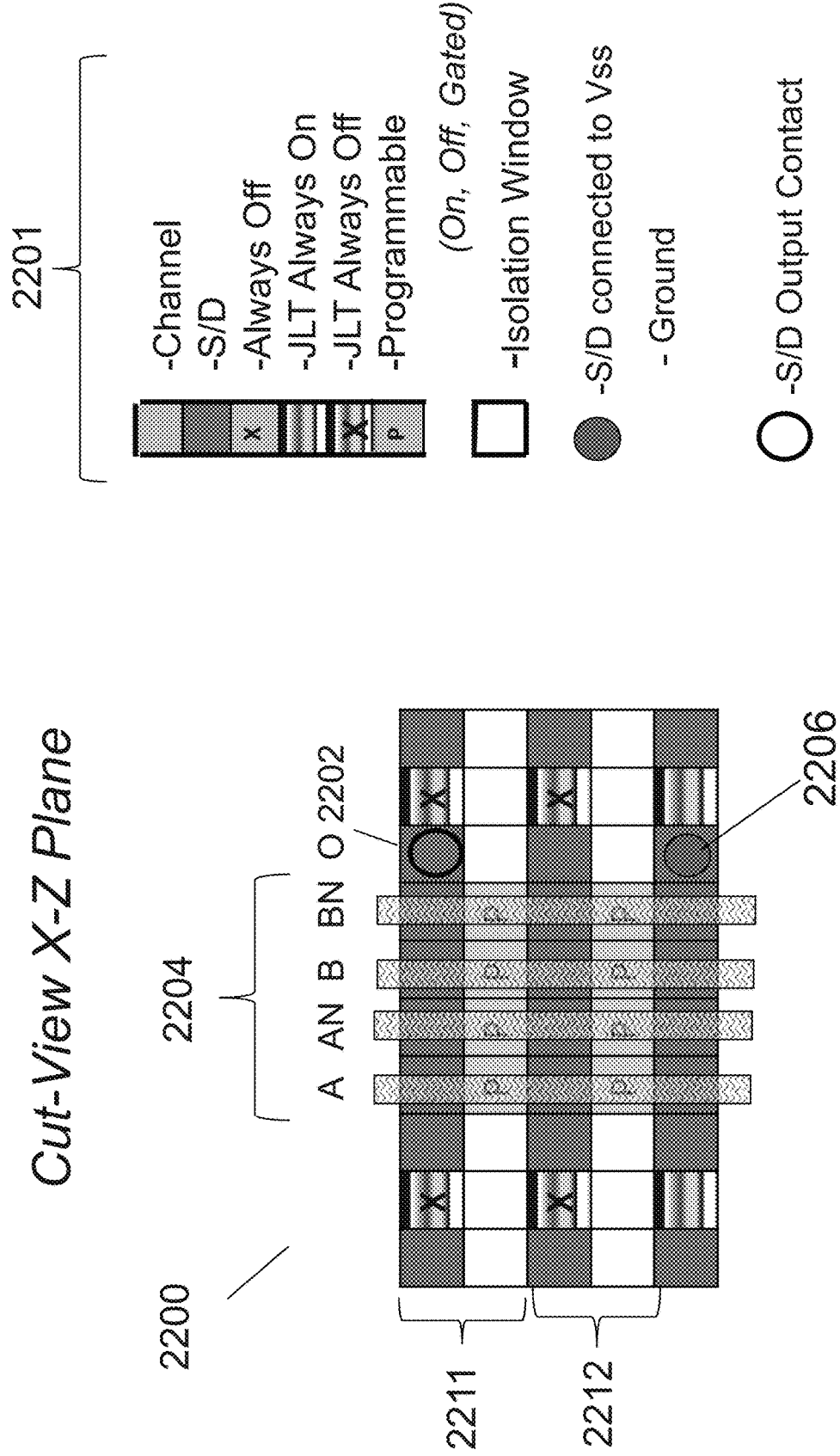
Figure 22B:
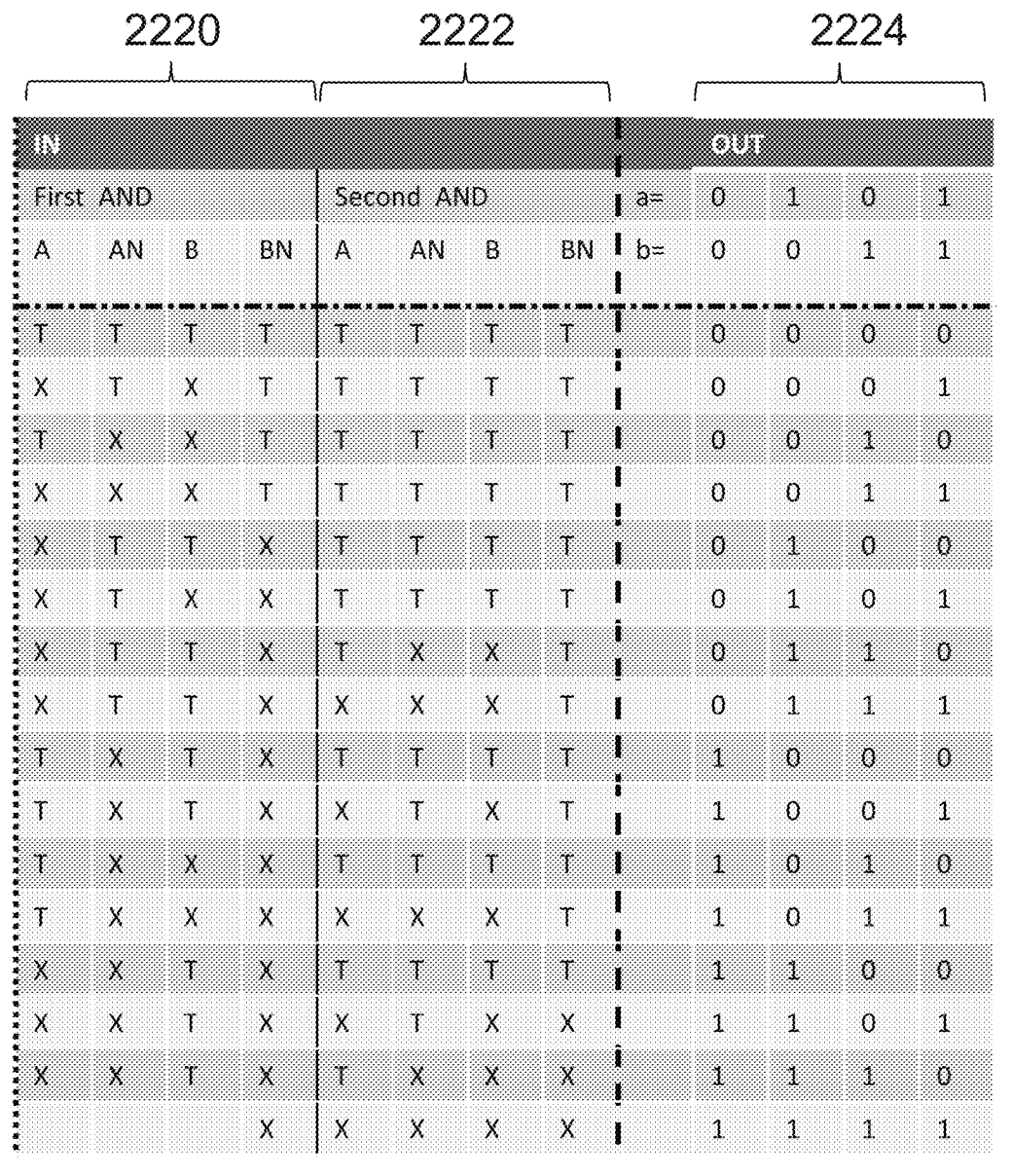

FIG. 22A illustrates a basic building block 2200 for programmable logic targeting the 3D NOR fabric. A symbol map 2201 presents the elements used in the structure 2200 which could be used to implement Look-Up-Table ("LUT") of two inputs—A,B. Such a structure could be called LUT-2. While the term Look-Up-Table ("LUT") is originated from a simple implementation of such function it is well known in the art, and would be used herein to describe any implementation which forms a programmable function able to be programmed to provide a complete logic table of its inputs. The number following the acronym LUT indicates the number of inputs as is common in the art. FIG. 22B provides an example of a programming map to implement any two input functions in the structure 2200 forming a LUT-2 function. The two inputs A, B and their complement AN, BN could be input to the four vertical gate lines 2204. The output O 2202 is at the upper most S/D line. The upper four vertical transistors could form the First AND' 2211, and they are fed from the Second AND' 2212 formed by 4 vertical transistors as illustrated.

A low voltage-'ground' also called Vss, is connected to the third S/D line 2206. An alternative for such connection using a Vertical strip of RRAM will be presented later herein.

The table in FIG. 22B presents an optional programming of First AND and Second AND rows to support the LUT-2 functionality. The right side of the table 2224 shows the output function according to the two inputs 'a' and 'b' which could be the function inputs (A, B). The table shows '1' for high impedance output 2202, as the high impedance output could be reconstructed to a high logic level—'1' as will be discussed in the following herein. The left side represents the programming of the respective transistors. The first part 2220 is for the First AND 2211 and the second part 2222 is for the respective transistors of the Second AND 2212. The table uses the following symbols:

X—Always Off
T—Gate control (no charge in the respective O/N/O)
No symbol—Don't care
In some applications, the only N type transistors LUT circuit uses a pull-up-inverter signal reconstruction circuit to convert an output signal of low or high-impendence states to a regular/conventional low ~Vss and high ~Vdd. Alternatively a technique common in domino logic is to use a clock based circuit in which nodes are first pre-charged to high and at the end of clock cycle sample if the node had been discharged to ground. An alternative approach is to use differential logic in which two LUT circuitry are used. Such is illustrated FIG. 23. It uses a half P MOS latch circuit 2314. The half P MOS latch 2314 would get as inputs, the output L-Out 2322 of the LUT 2302, which could be a connection path to ground—('0') or floating line—high resistivity ('1'), and the output L-OutN 2324 of LUT-N 2304, which, too, could be a connection path to ground—zero signal or floating line—high resistivity. The inputs to both LUT 2302 and LUT-N 2304 are the same input signals (A, B) and their inversion (AN, BN) 2312. The two LUTs are programmed to be complementing each other so if L-Out 2322 is low ('0') then L-OutN is high-impedance and the inverse when L-Out 2322 is high-impedance then L-OutN is low ('0'). Accordingly the half P MOS latch circuit 2314 converts these complementing signal to normal logic signal Output 2326 which would be low ('0' also called Vss) when L-Out 2322 is low and would be high (Vdd) when L-OutN is low ('0').

Figure 23:
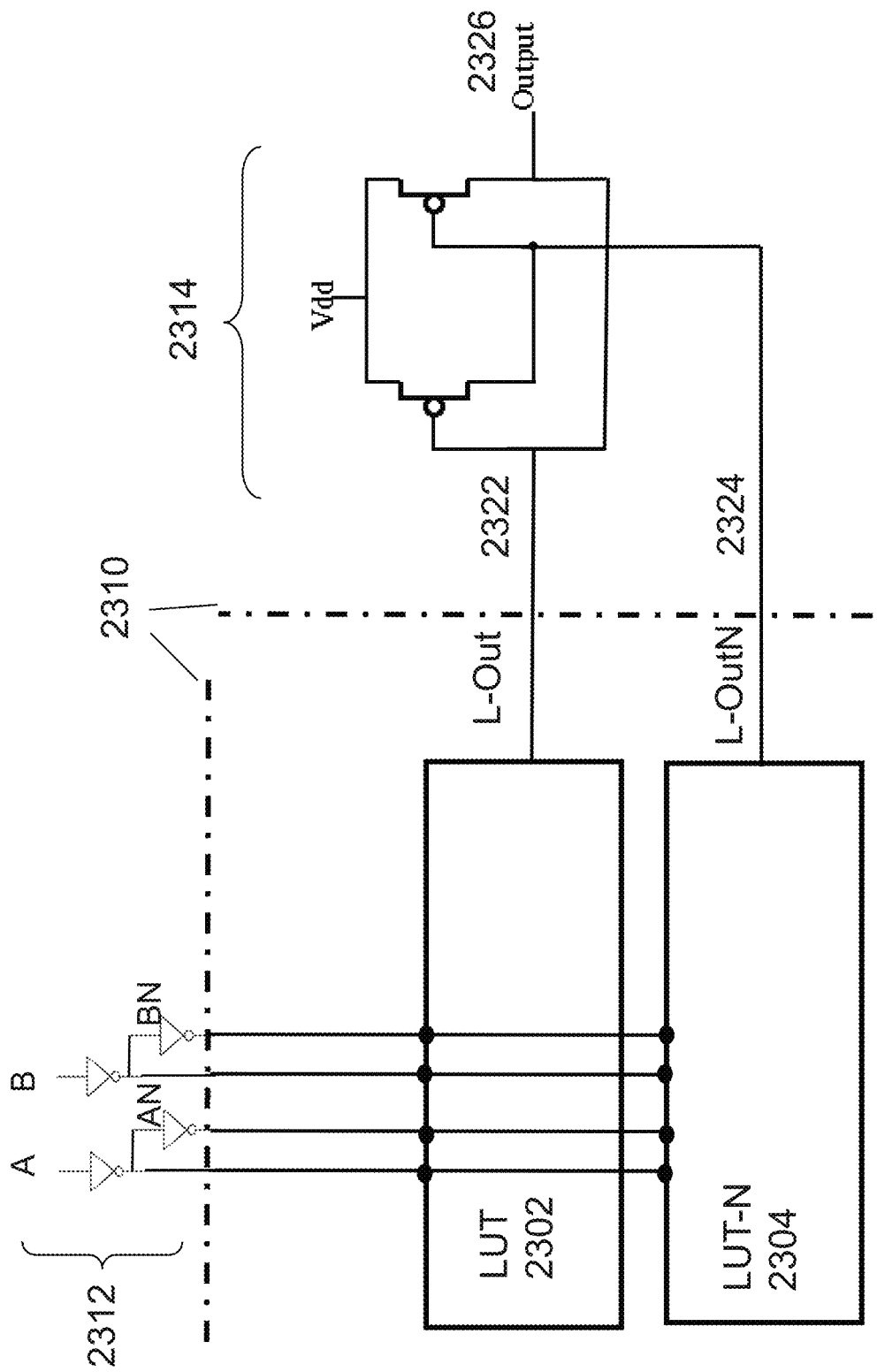
FIG. 23 is an example illustration of a circuit for a signal reconstruction in which two LUTs are used.

The broken line 2310 shown in FIG. 23 indicates the transitions of signals from the programmable 3D-NOR fabric to an overlaying upper layer of CMOS fabric which could carrying the CMOS circuits 2312 and 2314. The structure of FIG. 23 illustrates forming a true 0/1 output using LUTs of programmable N type transistor fabric. This structure indicates doubling the resources as it uses two LUTs which complement each other. Use of complementing circuits is known in the art as differential cascade voltage switch logic circuit ("DCVS"). It could also be used in combination with clocked circuits to further reduce power. D. Somasekhar et al. in a paper titled "Differential Current Switch Logic: A Low Power DCVS Logic Family" published in IEEE JOURNAL OF SOLID-STATE CIRCUITS, VOL. 31, NO. 7, July 1996; W. Chen paper titled "Mixed Multi-Threshold Differential Cascode Voltage Switch (MT-DCVS) Circuit Styles and Strategies for Low Power VLSI Design", published at ISLPED'01; and Dae Woon Kang et al in a paper titled "Design of Enhanced Differential Cascade Voltage Switch Logic (EDCVSL) Circuits for High Fan-In Gate" published at ASIC/SOC Conference, 2002, 15th Annual IEEE International, the entire contents of each are incorporated herein by reference. These references present additional variations and alternatives for improving power and or performance. Ho Joon Lee, in a paper titled "Low Power Null Convention Logic Circuit Design Based on DCVSL" publish at MWSCAS2013, incorporated herein by reference, suggests using such logic for asynchronous circuits. Such techniques and design approaches could be implemented in a 3D NOR fabric.

An alternative is to use Schottky barrier as described herein and utilize an ambipolar transistor with the complementing LUT-N thereby enabling complementary logic such as, for example, CMOS. For example, one LUT output that is either providing connection to ground ('0') or high resistivity while the complementing LUT-N output provides connection to high resistivity or to pull-up voltage ('1').

Figure 24:
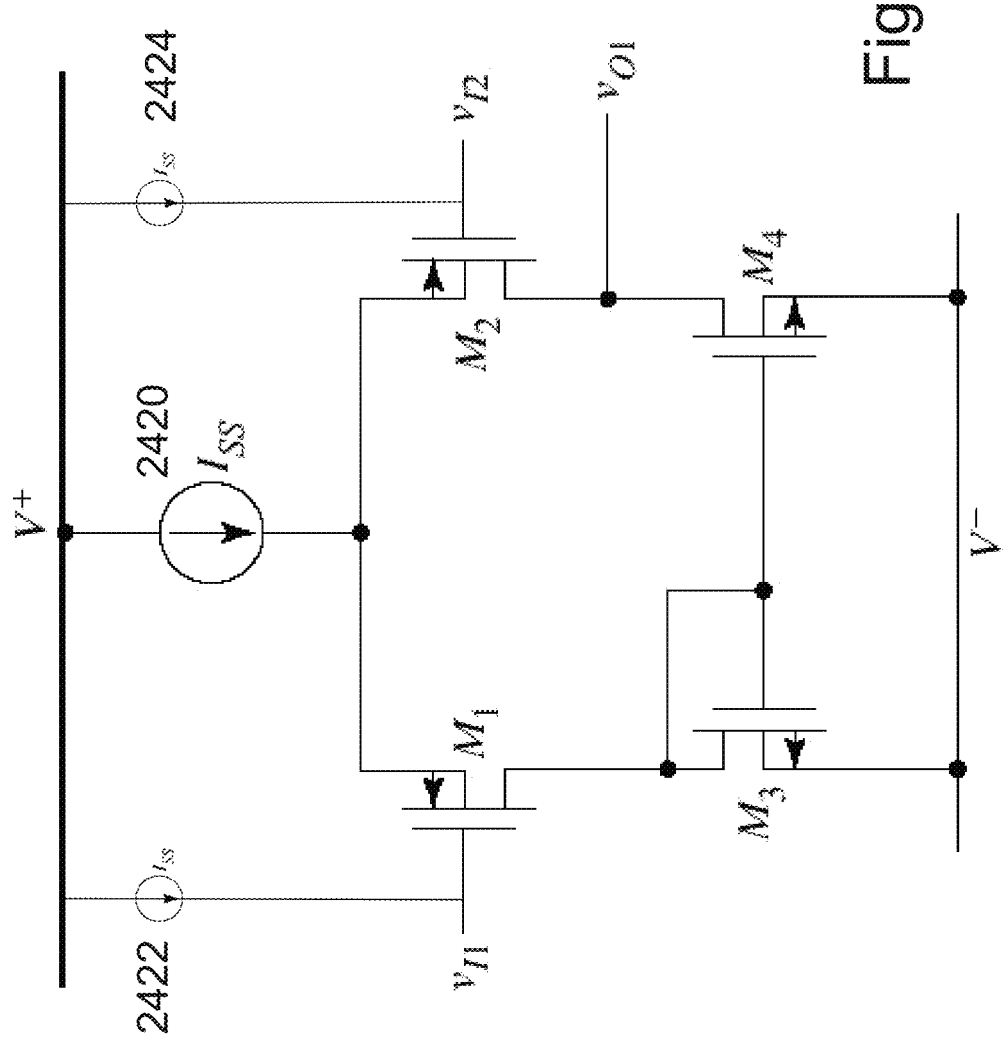
FIG. 24 is an example illustration of an alternative circuit for the signal reconstruction.

FIG. 24 illustrates an alternative circuit for the complementing signal reconstruction utilizing a differential amplifier circuit instead of a half-latch. Such a differential amplifier could provide faster signal reconstruction due to the high gain of such circuit. A differential amplifier could consume higher power as it operates in the active mode of the transistor while a half latch only uses active mode in transition phase. An approach to reduce this operating mode power is to activate the circuit by activating its main current source 2420 only when the signal needs to be detected using a clock signal. Optional tiny current sources first source 2422 and second source 2424 could be used to lightly pull up the input signal $V_{r1}$, $V_{r2}$, for the resistivity input signals. Such a differential amplifier could be used for signal reconstruction for logic output and routing output throughout this application and inventions herein and could help reduce the overall logic signal swing (Vdd-Vss) to reduce power and thermal loads or improve operating speed. An artisan in the art would know how to implement a differential amplifier herein throughout as an alternative to a half latch reconstruction circuit. The differential amplifier circuit illustrated in FIG. 24 could be used to enhance the performance of the 3D NOR logic fabric described herein. It could be used both for LUT output reconstruction and other logic function output reconstruction and also for routing signal reconstruction as it is suggested to route signals within the 3D-NOR fabric with two complementing wires, one with path to 'ground' and the other floating—high resistivity. An alternative for the CMOS transistors of FIG. 24 are SOI Lateral Bipolar transistors as been presented by Tak H. Ning in a paper titled "A Perspective on Future Nanoelectronic Devices" published at IEEE VLSI-TSA 13, incorporated herein by reference.

Figure 25:
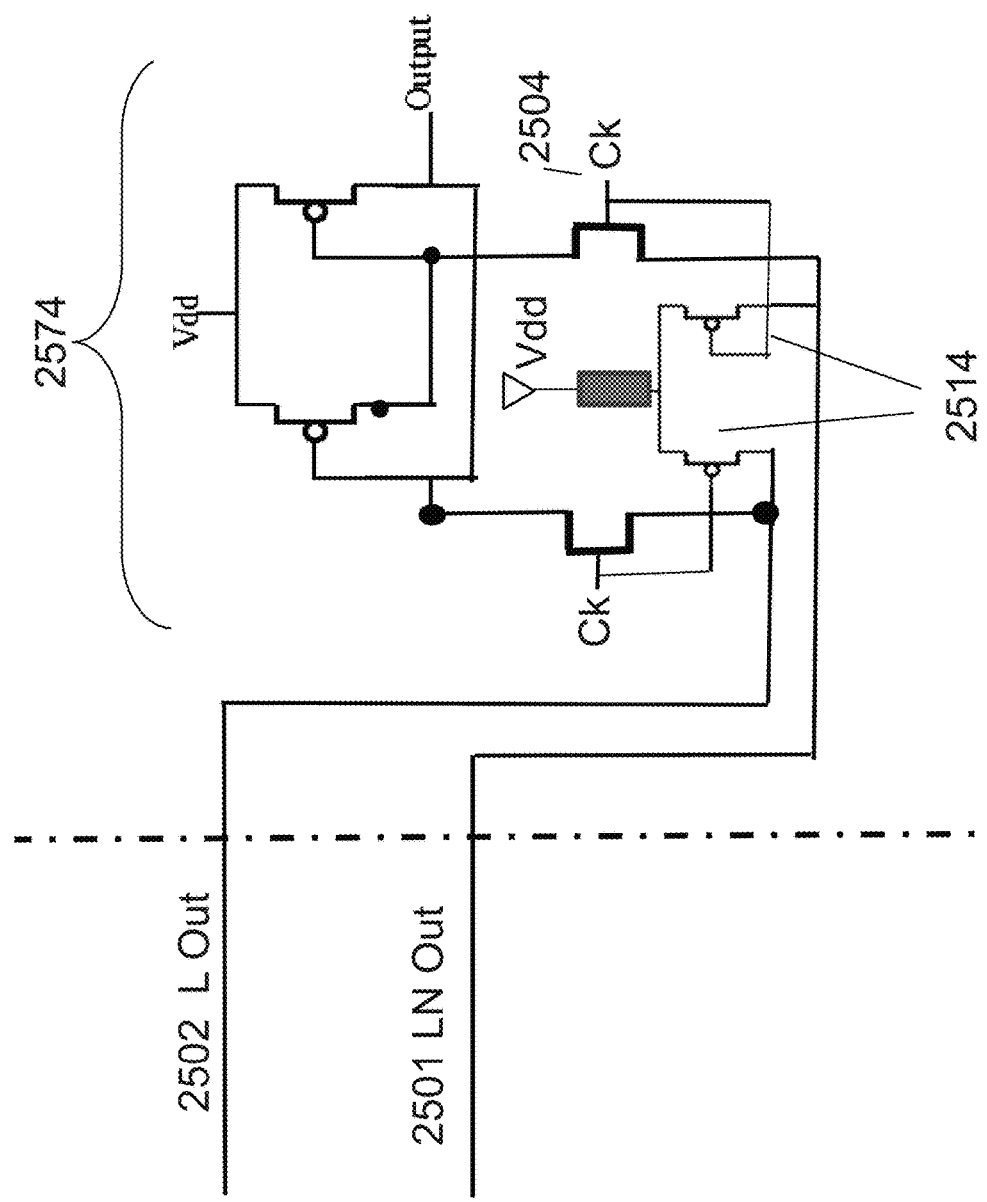
FIG. 25 is an example illustration of an additional alternative circuit for the signal reconstruction.

FIG. 25 illustrates a clocked half latch circuit 2574. The two complementing outputs 2502, 2501 could affect the half-latch only while the Ck signal 2504 is high. The output signal would be latched while the clock signal is low. A pull-up 2514 could be used to condition the line 2502, 2501 during the clock low periods.

The 3D NOR fabric used for logic may leverage differential logic and differential interconnect. Such differential circuits could provide many benefits including less sensitivity to circuit variations, reduced operating voltages, and accordingly reduced power, increased speed and cross-talk rejection. These benefits come with the cost of higher routing resources and other resources. The reconstruction circuits illustrated in FIG. 23-FIG. 25 are just a sample and many other circuits and variations of these circuits are known in the art including also in patents such as U.S. Pat. No. 6,037,808 and application Ser. No. 13/421,653 and papers by Daniël Schinkel titled 'A 3-Gb/s/ch Transceiver for 10-mm Uninterrupted RC-Limited Global On-Chip Interconnects,' published in IEEE JOURNAL OF SOLID-STATE CIRCUITS, VOL. 41, NO. 1, January 2006, and by Hui Zhang, titled 'Low-Swing On-Chip Signaling Techniques: Effectiveness and Robustness,' published at IEEE TRANSACTIONS ON VERY LARGE SCALE INTEGRATION (VLSI) SYSTEMS, VOL. 8, NO. 3, June 2000, all incorporated herein by reference.

Figure 26:
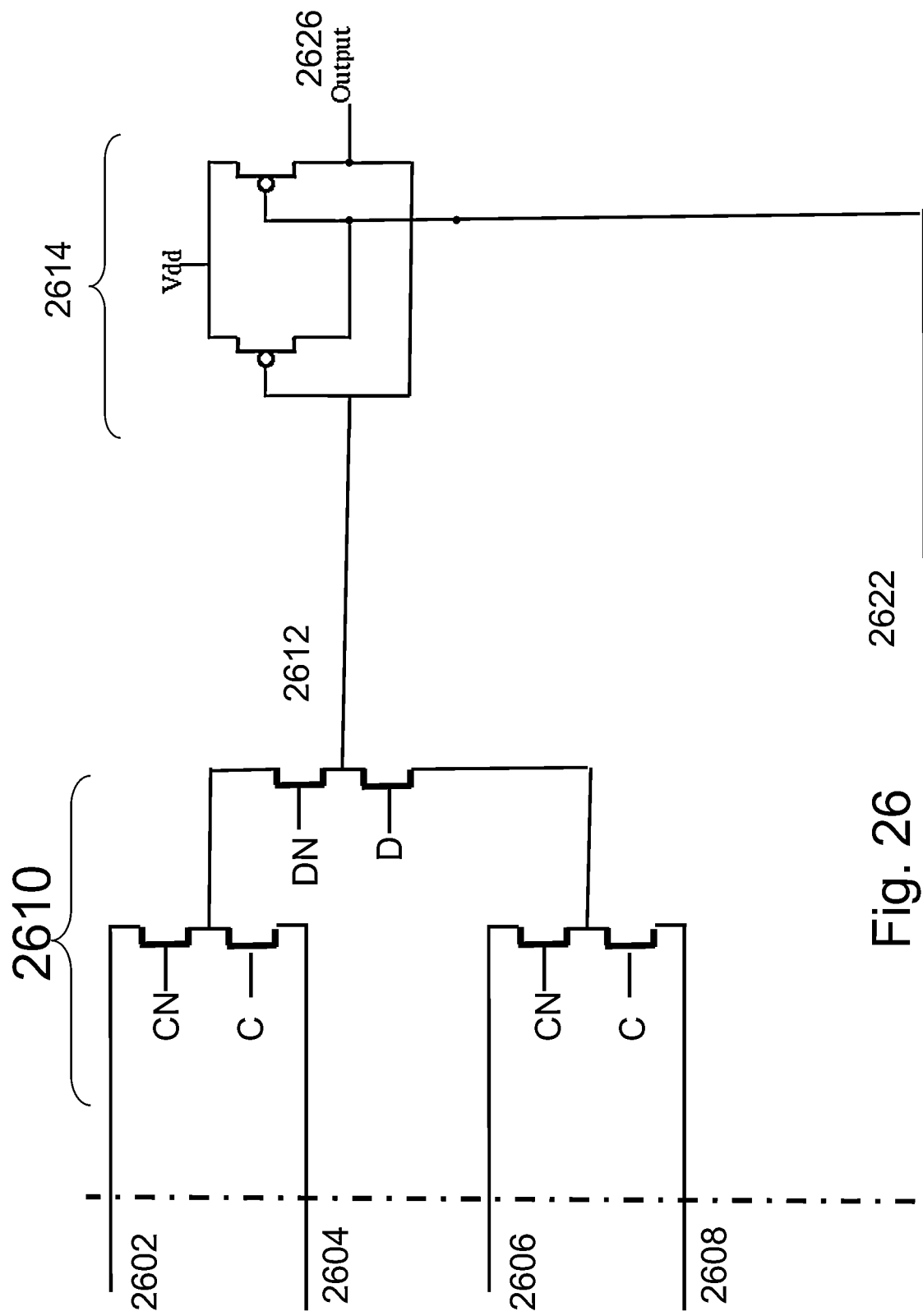
FIG. 26 is an example illustration of overlay circuits to form a LUT-4.

FIG. 26 illustrates an overlay circuit to form LUT-4, a 4 inputs look-up-table, using four LUT-2 circuits each feeding one of the four inputs 2602, 2604, 2606, 2608. The 4 to one selector 2610 will select one of the four LUT-2 signals according the input signal C, D and their complements CN, DN, thus creating a signal along selector output line 2612. Additional similar circuits could be used to drive the other input 2622 to the half-latch 2614. The output 2626 could be the LUT-4 output. LUT-4 is a very popular building block of programmable logic—FPGAs. Such alternatives increase the overhead circuit at the overlaying circuit but could increase the LUT-4 speed.

Forming a complement LUT could be done by using the adjacent Ridges such as 712 and 714 of FIG. 7A, and use the shared gates—in the valley 713 in-between the ridges. As each channel has potentially two gates (Gate-odd, Gate-even) it could be set that the in-between gates are without O/N/O. Alternatively these gates could be set for dual function gates. Programming the O/N/O at the device set-up phase and logic at the operating phase. In such case, the other facet gates could be used for vertical RRAM strips for vertical connectivity as presented later herein.

Another alternative is to use thinner tunneling oxide with high speed programming performance. This would require refreshing periodically which could be acceptable for many applications. Another alternative is to have one side of the ridge with regular O/N/O for channel programming and the other side with just oxide for fast gate control resembling the structure of FIG. 5D. In a case in which the two adjacent ridges are utilized in forming a complementing LUT, the valley in between could be used for the 'shared' LUT gate with just oxide (for the transistors) while the other side could have full O/N/O for programming. The ridge could be made thin enough, such as 20 nm, to provide the one side programming enough control to fully program its channel.

Figure 27C:
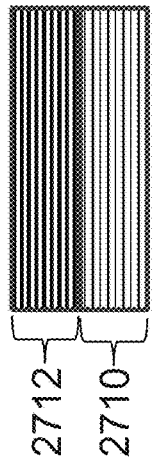
FIGS. 27A-27E are example illustrations of various stacks of 3D stacks.
Figure 27D:
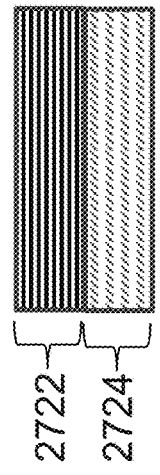
Figure 27E:
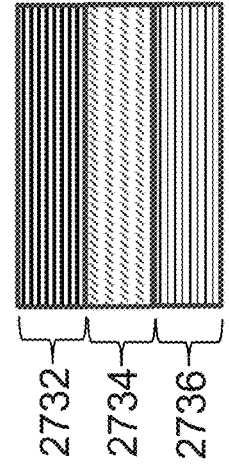
Figure 27A:
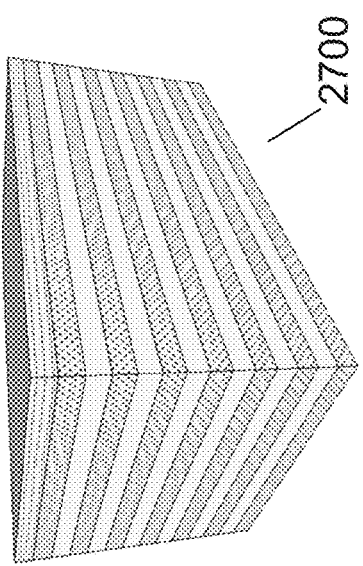
Figure 27B:
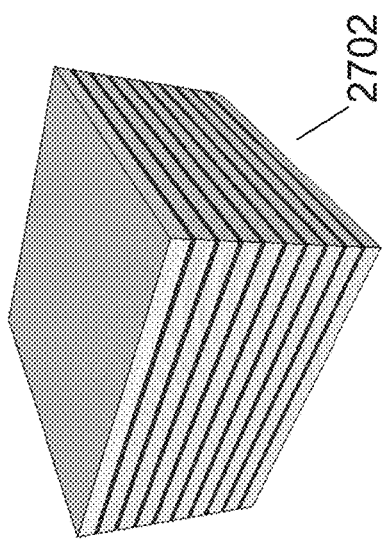

Some of the alternative structures presented herein are leveraging multilayers of 3D stacks, namely a stack of 3D stacks. The stack within 3D stacks can be arbitrarily selected based on its use. FIG. 27A illustrates a first stack 2700 design for a 3D NOR memory fabric and FIG. 27B illustrates a second stack 2702 design for a 3D NOR logic fabric. FIG. 27C illustrates a stack of logic 2712, such as 3D NOR logic, over a stack of memory 2710. FIG. 27D illustrates a stack of logic 2722 over a stack of routing 2724 and FIG. 27E illustrates a stack of logic 2732 over a stack of routing 2734 over a stack of memory 2736. The architectures, structures and process flows presented herein suggest processing multiple layers together will greatly reduce the fabrication cost per layer providing overall a device with many layers of functional transistors and routing providing density cost and performance advantages. An alternative of stack of 3D stacks is to add 2D layer(s) on a 3D stack. These process flows could use a 2D patterning which affects many layers simultaneously as was detailed herein. While creating patterns in 2D in the X and Y directions is a well-known technique in semiconductor device processing, it is far harder to form variation in the Z direction. Yet in some of the structures presented herein there are differences between the memory structure, logic structure and routing structure. Processing devices that integrate these slightly different structures might be harder. So one option is to process those individually and then bond them together. Yet there are techniques to effect changes in the Z direction.

One such Z direction change technique is forming subsets of layers with different thicknesses in the stack. As the stack could be formed by epitaxial growth, changing the gas or deposition time(s) or other process parameters could result in layers with various thickness in the Z direction, which could enable, for example, forming multilayer structures of about 50 nm per layer in thickness in a memory portion overlaid by multilayer structures of less than about 20 nm per layer for the logic portion.

Another alternative is to put a blocking hard pattern in-between the memory stack and the logic stack.

Processing fabrics for 3D NOR Memory while also forming 3D NOR Logic could reduce costs, while in other cases it might work better to process these fabrics mostly independently and then connect them together for a more efficient (cost and/or performance) overall 3D system. There are many options for mix and match between steps and fabrics presented herein and the choice of a specific flavor could also be affected by the target objective for the end 3D system.

Additional alternative embodiment could be used to further enhance the fabric routing capabilities. In this option some of the regions between ridges—the 'valleys' could be designated for vertical connectivity—Z direction (programmable posts-pillars), instead of gates. Such programmable Z connectivity could be achieved by Resistive Random Access Memory—"R-RAM" technology or One Time Programmable—"OTP" technology. In some cases, the R-RAM or OTP used herein may be designed to have a rectifying conduction property. In other cases, if desired, these technologies used herein for connectivity may be designed to behave with an Ohmic conduction property. Programmable posts could be processed to allow later programming to form bridges between adjacent ridges and between layers of the same ridge offering a rich connectivity fabric.

Figure 28:
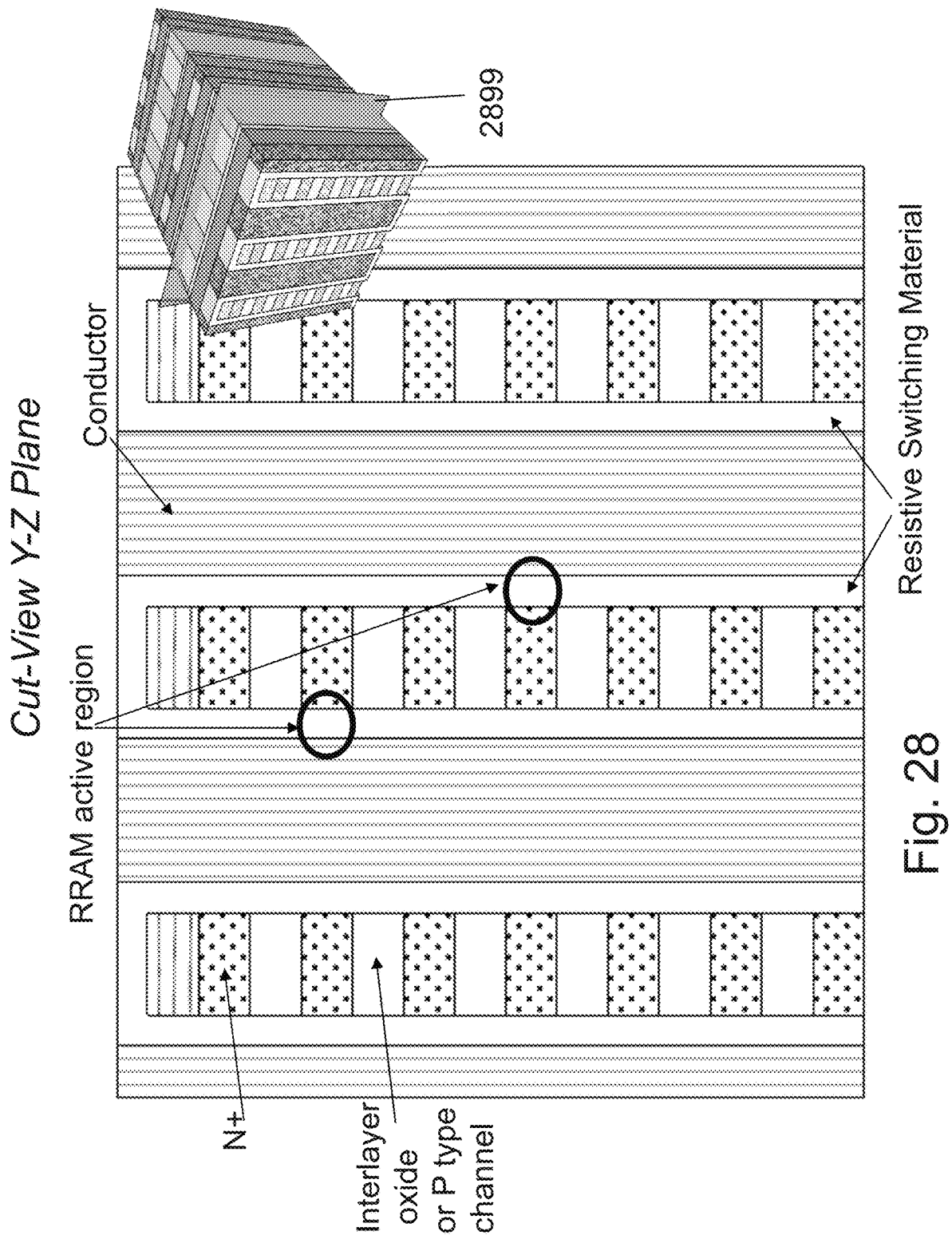
FIG. 28 is an example illustration of a side cut view of a 3D NOR structure with RRAM pillars.

The starting structure could be the 3D NOR as illustrated in FIG. 4A herein. The RRAM pillar structure is formed in between ridges where previously used to be ridge-to-ridge isolation. For the RRAM option, S/D lines become an electrode and vertically filled metal pillars in-between ridges comes another electrode, and a resistive switching film is sandwiched there between. The region designated to have R-RAM pillars are first filled RRAM or OTP pillar formations using deposition techniques and then the sequence of RRAM or OTP formation layers—thin oxide, and conductive electrodes. Then using CMP or similar layer removing processing, the top surface is substantially removed so these pillars are now isolated as is illustrated in FIG. 28. FIG. 28 illustrates the resulting structure of a cut view (plane 2899) perpendicular to the S/D lines.

An OTP technology has been presented U.S. Pat. Nos. 8,330,189 and 8,390,326, incorporated herein by reference. An RRAM compatible RRAM technology has been described in U.S. Pat. No. 8,581,349 such as in respect to at least FIG. 32A-J, FIG. 34A-L, FIG. 35A-F, its entirety incorporated herein by reference, in a paper by D. Sekar titled "3D Memory with Shared Lithography Steps: The Memory Industry's Plan to "Cram More Components onto Integrated Circuits", presented at IEEE S3S 2014; and by Daeseok Lee et. al., titled "BEOL compatible (300° C.) TiN/TiOx/Ta/TiN 3D nanoscale (~10 nm) IMT selector" published at IEDM 2013; and by Liang Zhao et. al., titled "Ultrathin (~2 nm) HfOx as the Fundamental Resistive Switching Element: Thickness Scaling Limit, Stack Engineering and 3D Integration" published at IEDM 2014; and by Ke-Jing Lee, titled "Effects of Electrodes on the Switching Behavior of Strontium Titanate Nickelate Resistive Random Access Memory" published at Materials 2015, 8, 7191-7198; and also in papers by Sung Hyun Jo et al. in a paper titled "Programmable Resistance Switching in Nanoscale Two-Terminal Devices" published by Nano Lett., Vol. 9, No. 1, 2009; by Adnan Mehonic et. al. titled "Resistive switching in silicon suboxide films" published by Journal of Applied Physics, Volume 111, Issue 7; and by Yuefei Wang et al. titled "Resistive switching mechanism in silicon highly rich SiOx (x<0.75) films based on silicon dangling bonds percolation model" published by Applied Physics Letters, Volume 102 Number 4; Volume 102 Number; and by Sungjun Kim et al. titled "Fully Si compatible SiN resistive switching memory with large self-rectification ratio" published at AIP ADVANCES 6, 015021 (2016), and titled "Gradual bipolar resistive switching in Ni/Si3N4/n+-Si resistive-switching memory device for high-density integration and low-power applications", published at Solid-State Electronics 114 (2015) 94-97; and by Shuang Gao et al. titled "Forming-free and self-rectifying resistive switching of the simple Pt/TaOx/n-Si structure for access device-free high-density memory application" published at Nanoscale, 2015, 7, 6031-6038; and by Umesh Chand, titled "Metal induced crystallized poly-Si-based conductive bridge resistive switching memory device with one transistor and one resistor architecture" published at APPLIED PHYSICS LETTERS 107, 203502 (2015); and by Adnan Mehonic titled "Resistive switching in silicon suboxide films" published by JOURNAL OF APPLIED PHYSICS 111, 074507 (2012); all of the foregoing are incorporated herein by reference.

It should be noted the 'OTP RRAM' technology described above herein may also be utilized as a multi-stage programmed technology, partially forming/programming to an intermediate resistance value and un-programming for emulation, and then a final full programming to low resistance value. As discussed in U.S. Pat. Nos. 7,973,559 and 8,390,326, both incorporated herein by reference.

For proper operation a select device should be added to each of the individual pillars. These per-pillar select devices, for example, could be an active transistor or a diode. The select device could use the vertical transistor or diode embedded within the pillar or may be added in as polysilicon TFT devices atop of a vertical pillar. Such could start by first etching the very top portion of these pillars and presented herein in respect to FIGS. 29A-29D.

Figures 29A, 29B:
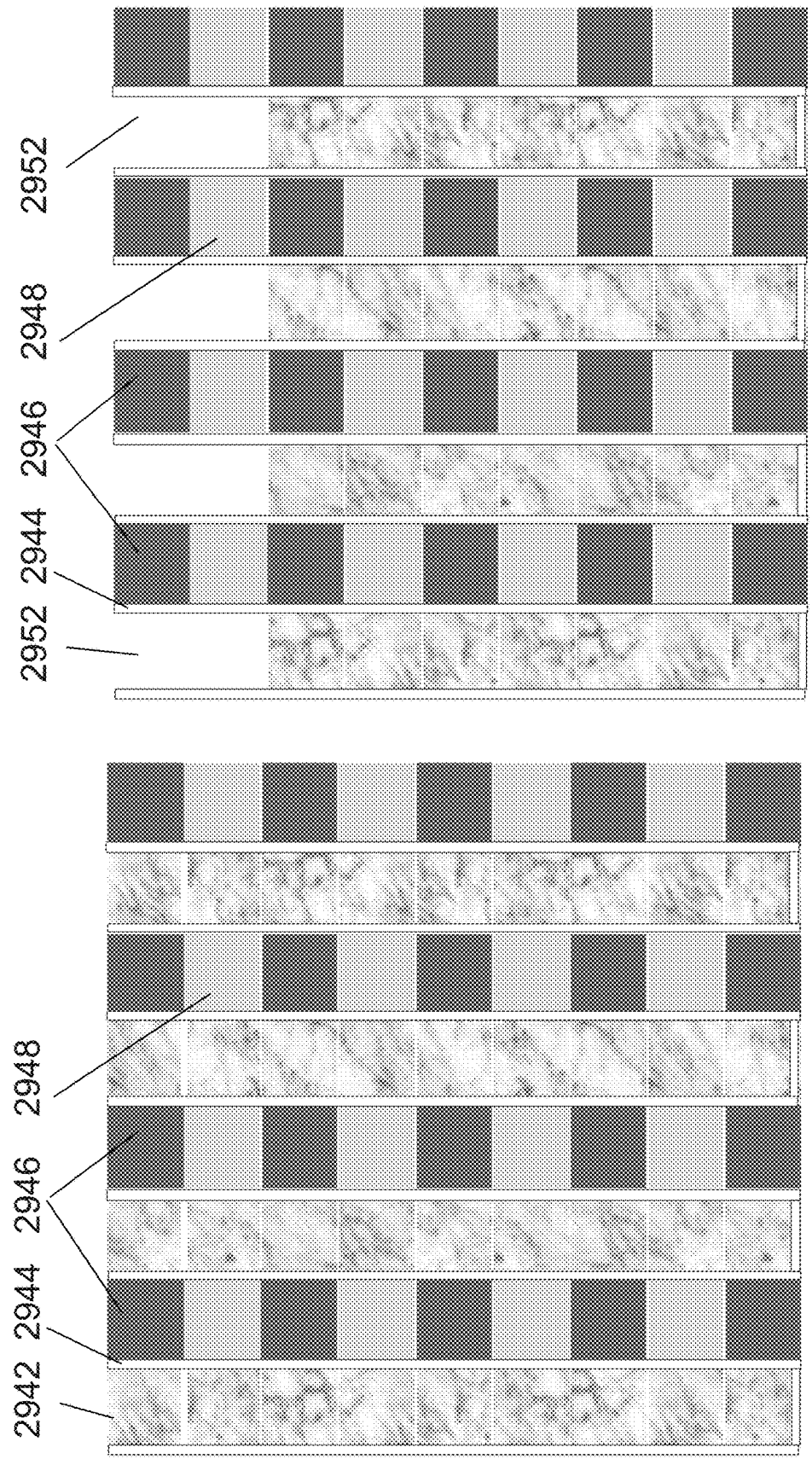
FIGS. 29A-29D are example illustrations of the formation of pillar select devices.

FIG. 29A illustrates a side cut view similar to the structure of FIG. 28. It illustrates the RRAM/OTP electrodes 2942, thin oxide barriers 2944, the S/D lines 2946, and the filled oxide or P channel 2948 between the S/D lines.

FIG. 29B illustrates the structure after removing the top portion of the RRAM/OTP electrode thus forming voids 2952.

Figure 29D:
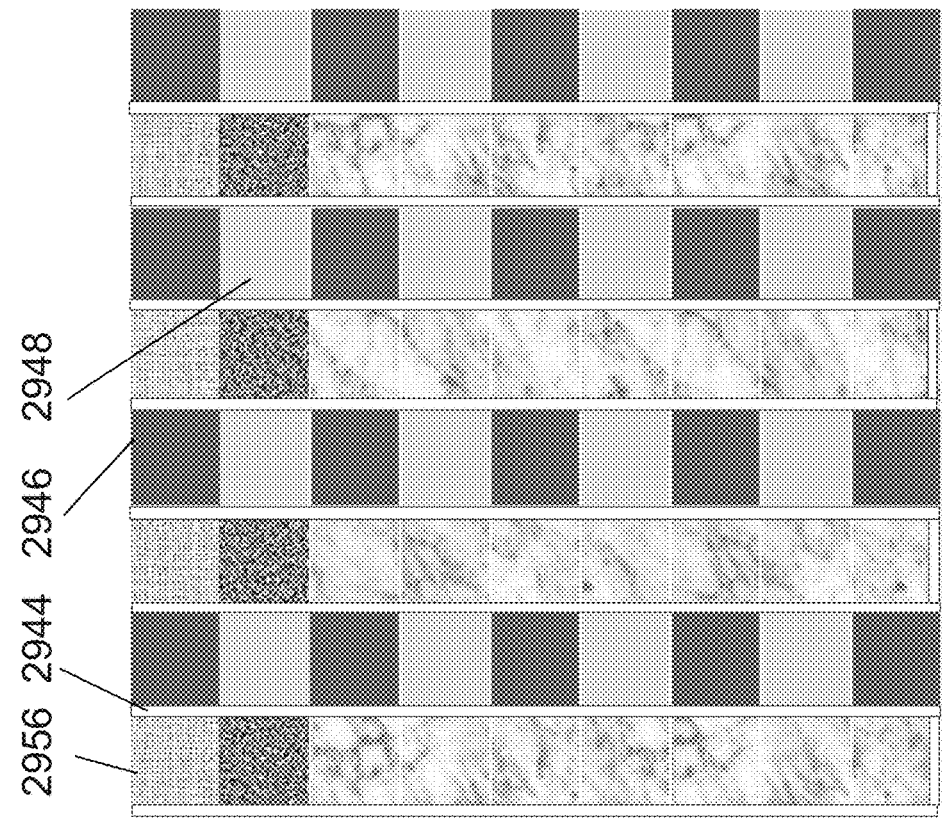
Figure 29C:
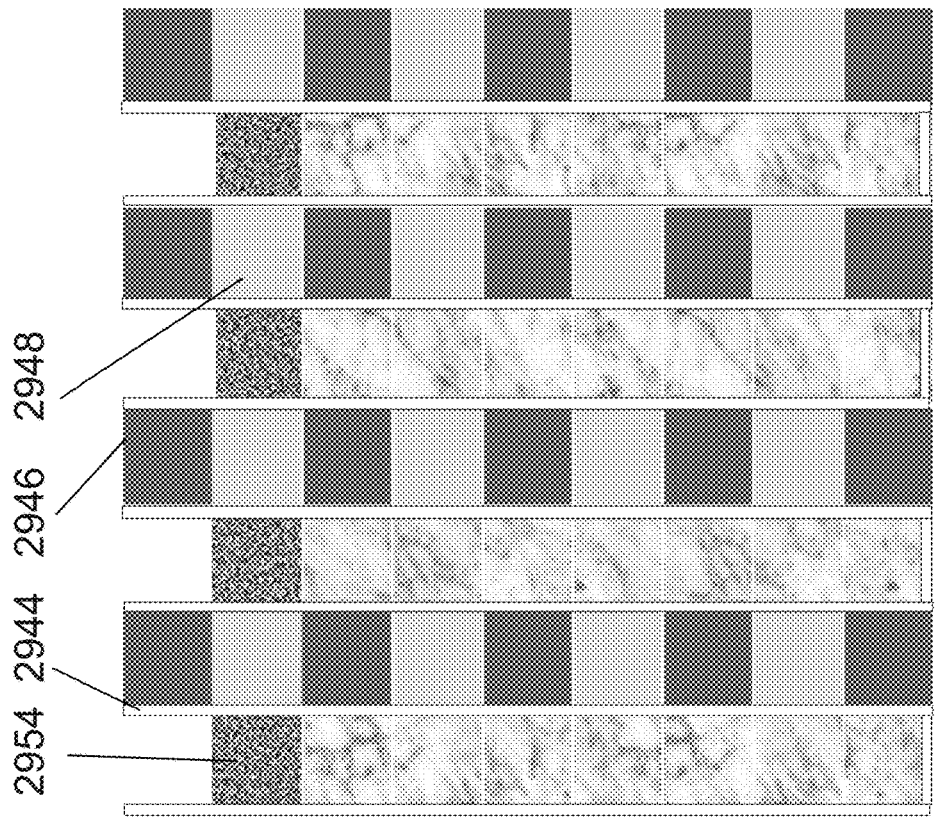

FIG. 29C illustrates the structure after filling of an N in-situ doped poly silicon 2954.

FIG. 29D illustrates the structure after follow-on filling of an P in-situ doped poly silicon 2956, thus completing the select device. In some alternatives (not shown) the electrode itself could be part of the diode and the filling step could utilize one material type to complete the Schottky type diode.

In some alternatives, the structure could include both type of pillars, RRAM and OTP. The OTP could function well for routing which might not need to be altered, for example, such as providing permanent ground "0" to the lower S/D bar of the LUT-2; while the RRAM could function well for connections that would be desired to be reprogrammable. These pillars could also be used for signal input or output by adding additional select elements such as diodes or transistors to protect interference with the pillar programming operation. It is important to note that the RRAM and OTP represented herein are desired to be Ohmic rather than self-rectifying.

The pillar could now be connected to RRAM/OTP word-lines.

OTP pillars are easier to construct, and could offer easier programming and perform well for most routing applications.

RRAM offers re-programmability and could also be used as an embedded non-volatile memory. RRAM pillars could also be used to reduce the need for a JLT process. For such the S/D lines for the logic ridges could be made with built-in disconnection gaps. RRAM pillars could be used to bridge the gaps with the help of the adjacent ridge S/D lines for the programming phase.

An additional alternative is to form the diode access device to the RRAM/OTP pillars electrode 3002 twice. First form NP diodes for the odd pillars 3056 and then PN diodes for the even pillars 3046 as is illustrated in FIG. 30A. In such case these pillars could be connected to the word-line 3060 as illustrated in FIG. 30B. The programming of the RRAM/OTP will use positive voltage for the even pillars programming and negative voltage for the odd pillars programming.

FIG. 30C illustrates formation of reverse diodes (RD) $1^{st}$ RD 3072 and $2^{nd}$ RD 3074 on the other side/end of the RRAM/OTP pillars 3002.

FIG. 30D illustrates the structure flipped so the word-line for the RRAM/OTP pillar programming is now at the bottom while the top side of the pillar could be used for signal Input 3072 or Output 3074.

FIG. 31A illustrates an alternative for the access to the RRAM/OTP pillars 3102. Using, for example, poly silicon deposition into the top pillars, NPN TFT transistors 3112 could be formed. Directional deposition may also be utilized.

FIG. 31B illustrates the structure after a step of timed directional etch of the RRAM/OTP electrodes following with a non-directional etch of the resistive switching material.

Figure 31C:
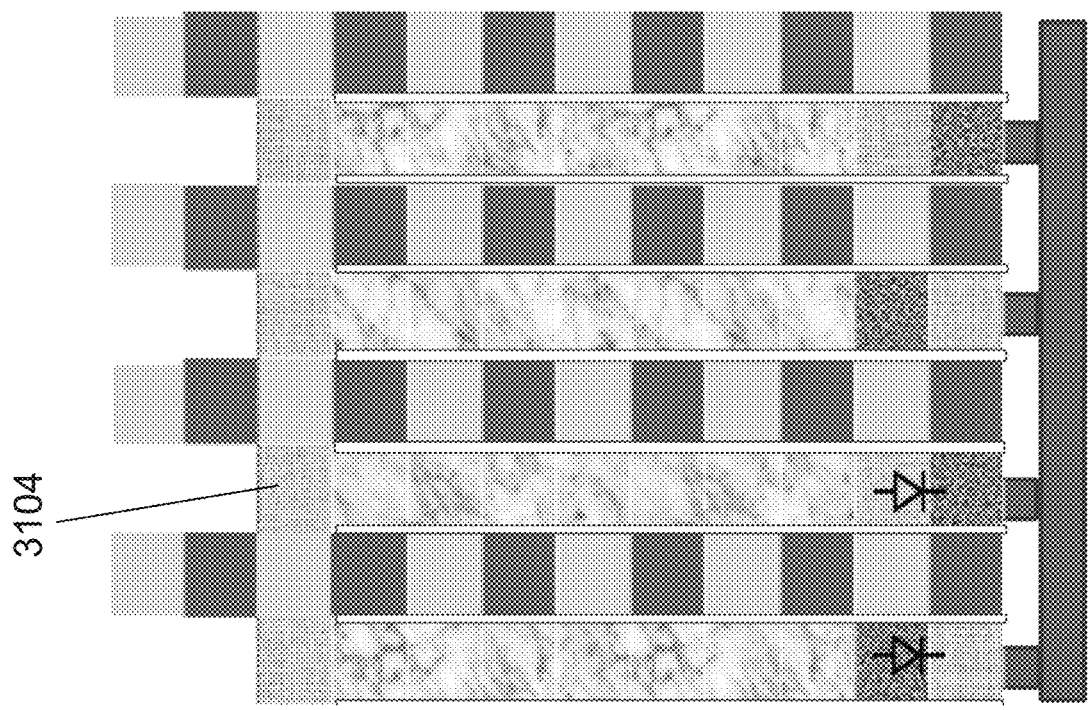

FIG. 31C illustrates the structure after directional deposition of N type polysilicon 3104.

FIG. 31D illustrates the structure after formation of $3^{rd}$ O/N/O 3106, followed by directional etch (or potentially a light CMP) to remove it from the top surface of the N type polysilicon 3104.

FIG. 31E illustrates the structure after directional deposition of P type polysilicon 3108.

Figure 31F:
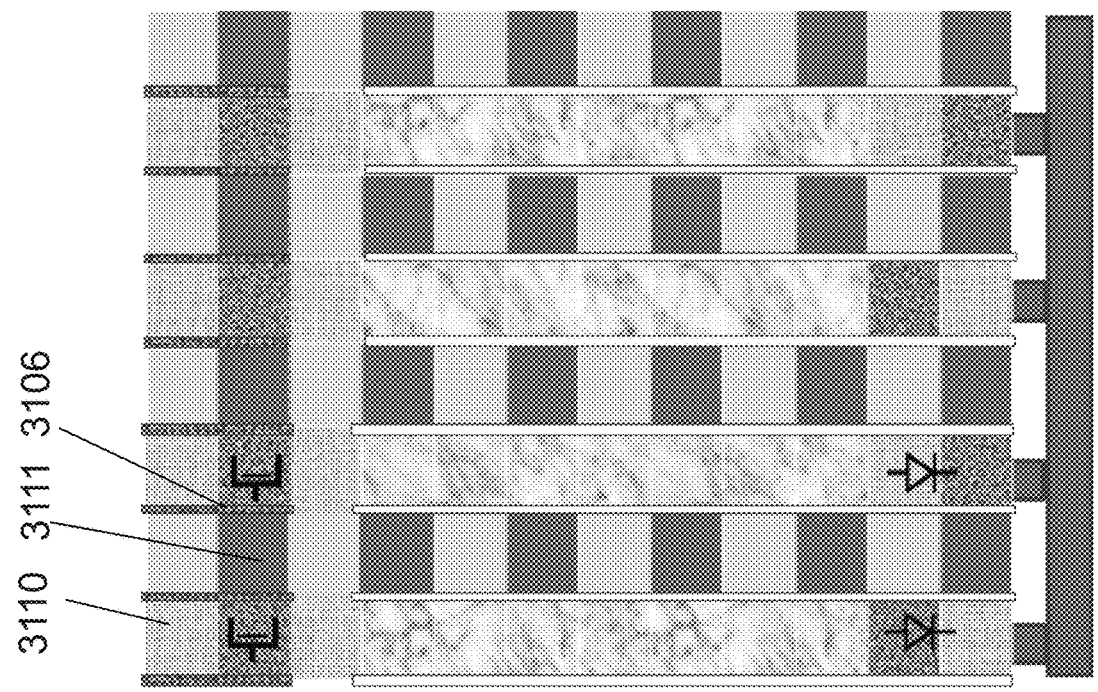
Figure 31E:
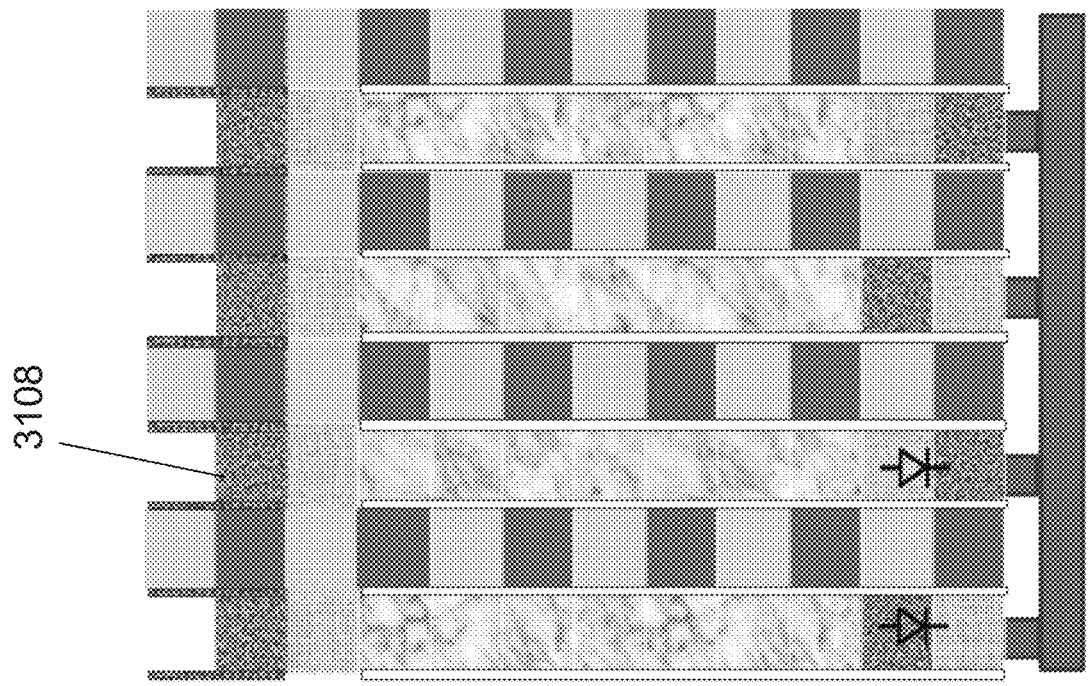

FIG. 31F illustrates the structure after an additional direction deposition of N type polysilicon 3110. An annealing such as laser annealing could be used to improve the performance of the newly formed top select device NPN transistor at the top region of RRAM/OTP pillars.

The top S/D lines 3111 would act as the gate for the programming of the $3^{rd}$ O/N/O 3106 to program these select transistors.

The resistive switching materials incorporated herein can be materials such as conductive bridge material, or phase change materials where its crystallographic phase can be changed from amorphous-to-crystalline or crystalline-to-amorphous such as by Joule heating, or a thin oxide layer where its oxygen vacancies form charge traps or by conductive filaments. The resistance across the resistive switching materials is substantially changed from before to after the programming. The resistive changing material is normally insulating, but it is made to be conductive through the conductive path, which is called programming. The programming can be carried out by applying a high voltage, depending on material and design considerations for example such as 5 V, between a pillar and a S/D segment crossing a node to be programming. If the multi-time programmability is available, the programmed state can be erased. For example, if the erase mechanism involves the movement of oxygen vacancies, a high negative voltage such as −5 V may be applied between a pillar and an S/D segment crossing a node to be erased. Alternatively, if the erase mechanism involves Joule heating, a high positive voltage but less than the programming voltage such as 3 V may be applied between a pillar and an S/D segment crossing a node to be erased.

Figure 32A:
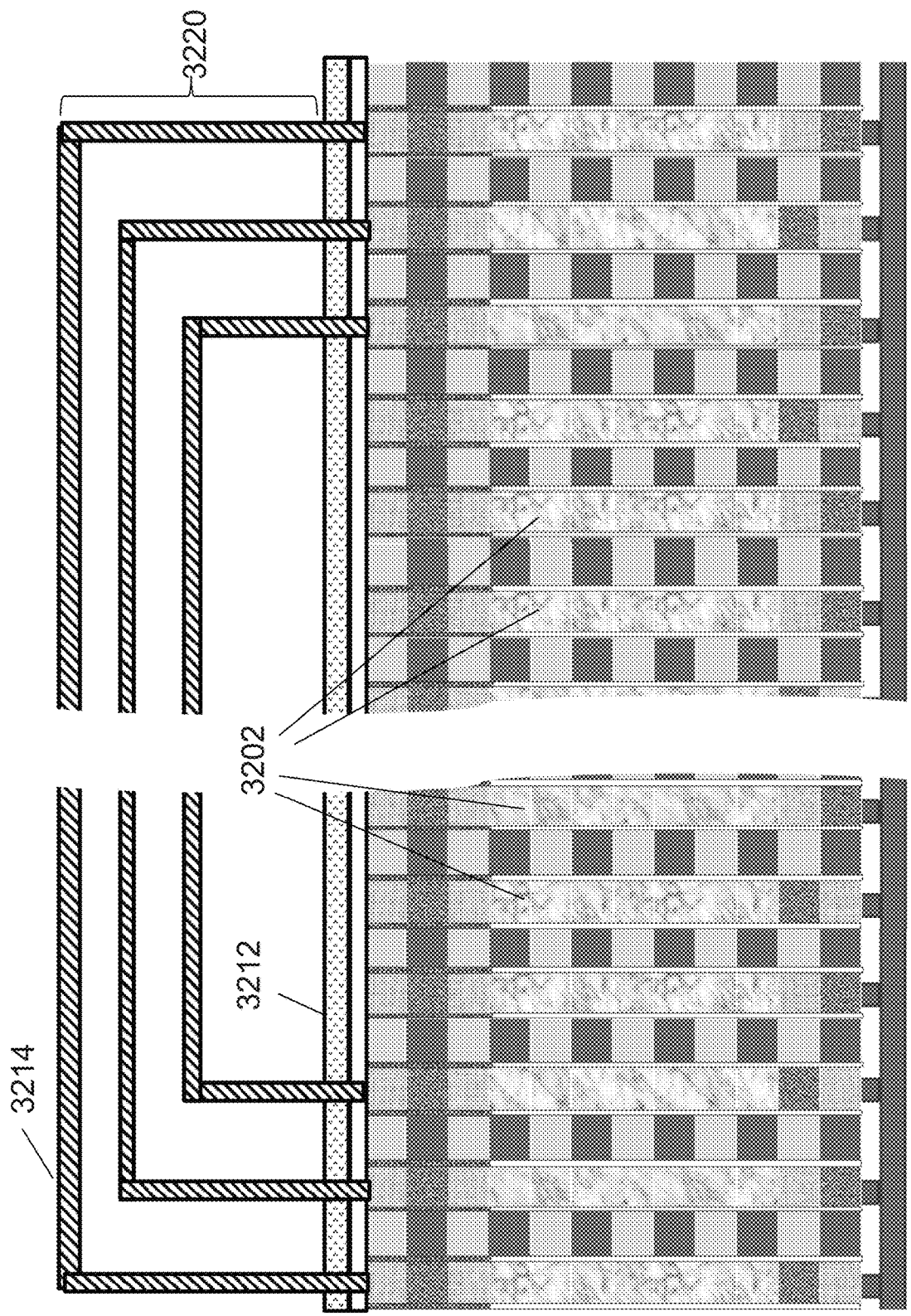
FIGS. 32A-32B are example illustrations of RRAM/OTP pillars connecting to a connectivity structure.

FIG. 32A illustrates the RRAM/OTP pillars 3202 usage to connect to a connectivity structure. The control circuits 3212 which overlays the 3D NOR fabric could be processed to provide metal connection grid 3220 to support long track connectivity, for example, long track 3214. Such could be architected to add long tracks to the programmable fabric. Metal connection grid 3220 may be integrated within the metallization of control circuit 3212 layer, or may be constructed as a separate layer or layers.

Figure 32B:
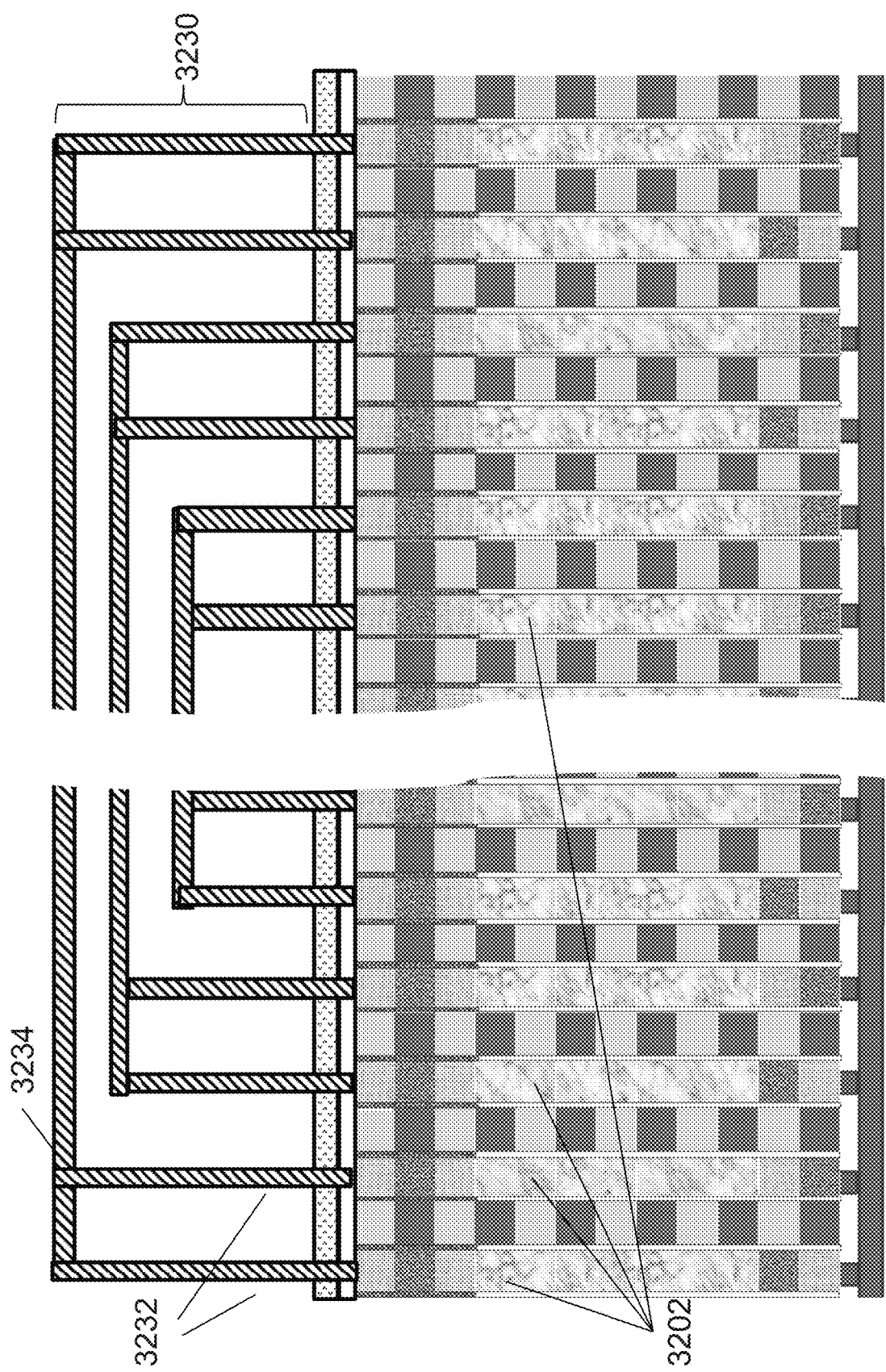

FIG. 32B illustrates an alternative in which multiple RRAM/OTP pillars 3202 may have programmable connection 3232 to a shared Y direction strip 3234 as part of the Y direction connection fabric 3230 constructed as part of the overlaying control circuits.

Differential routing is an option that has some advantages but does consume about twice the routing resources. In some applications mixing differential routing with conventional single ended routing could provide better overall optimization. Having mixed types of routing resources such as conventional metal routing over the control circuits 3230 and combination of S/D segments and RRAM/OTP pillars interconnection within the 3D NOR fabric could serve as effective routing techniques.

Another alternative for the RRAM/OTP select device could be achieved by depositing or transferring an NPN layer and then etch it thus forming a select device on top of the RRAM/OTP pillars.

Figure 33A:
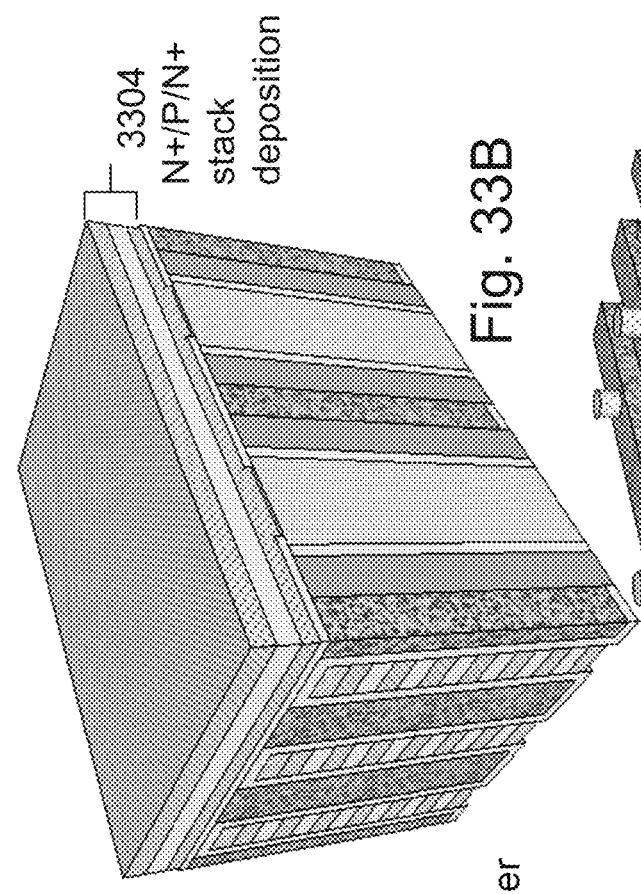
FIGS. 33A-33D are example illustrations of an alternative for forming an NPN select device for the RRAM/OTP pillars.

FIG. 33A illustrates a step of depositing oxide isolation and patterning it to expose the pillars 3302.

Figure 33B:
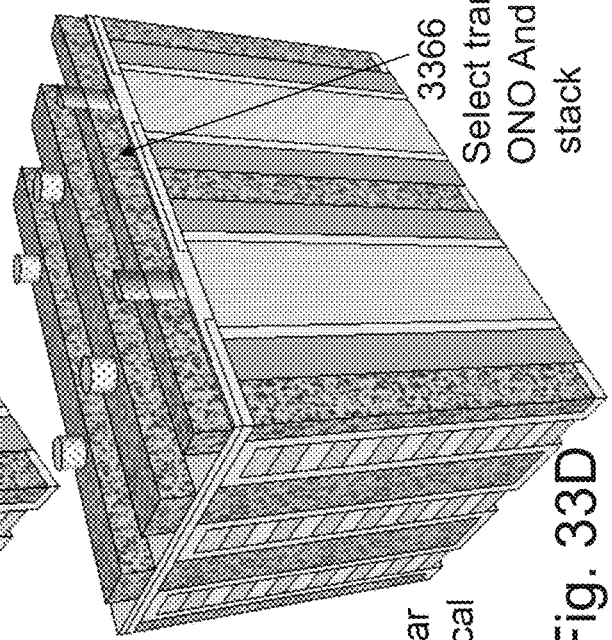

FIG. 33B illustrates the structure after sequentially depositing N+/P/N+ polysilicon layers 3304 or alternatively layer transferring N+/P/N+ mono-crystal layers.

Figure 33C:
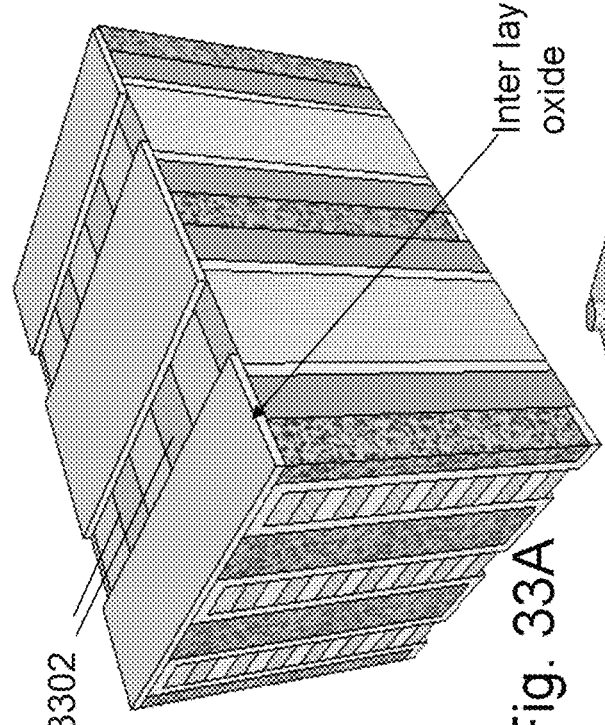

FIG. 33C illustrates the structure after patterning and etching away leaving vertical NPN 3306 devices on top of the RRAM/OTP pillars. The process for the select transistor may use a more advanced node than that used in the 3D fabric core process. Thus, the vertical NPN select transistor and select gate can be accommodated within the pitch of the ridge. An isolation oxide may be formed/deposited and etched back, and then an O/N/O deposition over the vertical NPN 3306 devices may be performed. A directional etch back may optionally be performed.

Figure 33D:
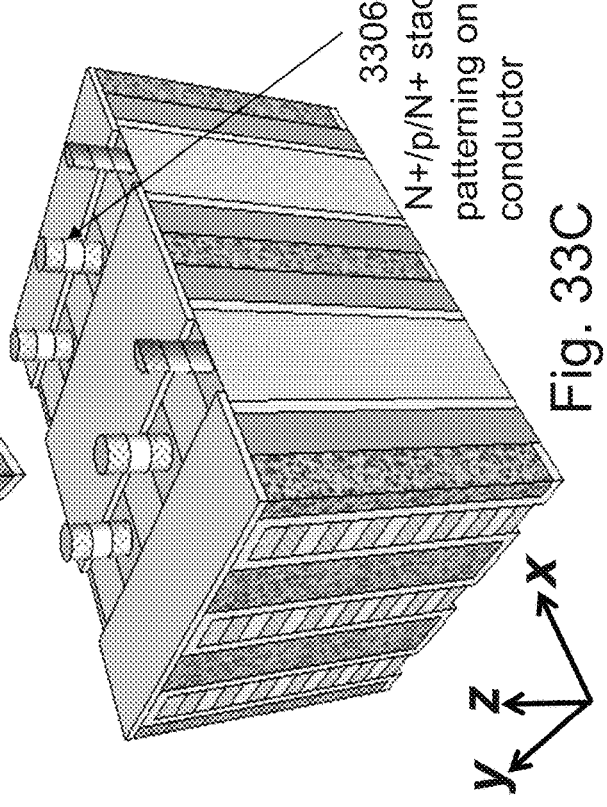

FIG. 33D illustrates the structure after forming $3^{rd}$ gate 3366 along the S/D line direction. Additional isolation oxide may be deposited and planarized.

Let's review the system process flow. It starts as was discussed in respect to FIG. 1A-1B. FIG. 34A illustrates such starting step having a multilayer (such as N+, P, N+, P, . . . ) structure 3420 over a cut layers 3413 over a carrier 3410.

FIG. 34B illustrates the processing of the multilayer structure 3420 to build in it a 3D NOR fabric 3430 and adding on it the word-lines 3432.

FIG. 34C illustrates flipping the structure on top of a new carrier 3440.

FIG. 34D illustrates processing the back of the 3D-NOR fabric to add the connection of logic gates (LUT, . . . ) 3434. This could include adding also all transistors circuits needed to support the logic gates within the 3D NOR fabric and the memory peripherals circuits. Yet, another alternative is to do those additional circuits on another side wafer 3454 illustrated in FIG. 34E having cut layers 3443 over substrate 3450. This side wafer may be cut then flipped and precisely bonded to the 'already flipped' 3D NOR fabric as illustrated in FIG. 34F.

The substrate 3450 could then be removed as illustrated in FIG. 34G. Then the circuits on 3454 could be connected using the smart alignment technique—"smart alignment"- such as presented in U.S. Pat. No. 7,986,042, incorporated herein by reference, as related to at least its FIGS. 73, 74, 75, 77, 79. In addition since the memory fabric may be constructed as an array of repeating patterns of memory cells and repeating patterns of memory control lines (such as bit-lines and word-lines), the alignment and top layer 3454 connections to the underlying memory structure could be done using the techniques similar to those described in respect to at least FIG. 30 to FIG. 35G and FIG. 69 to FIG. 78B of U.S. Pat. No. 7,986,042. The alignment techniques leveraging repeating patterns are useful when the alignment error is larger than the size of the repeating element. These techniques could be used for any of the 3D integration involving layer transfer presented herein.

This side wafer approach allows the decoupling of the 3D NOR fabrication process from the fabrication of the support circuits. It could allow using a relatively less dense process for generic 3D NOR and an advanced high density process for the support circuits.

In some applications it might be desired to add on the peripheral circuits on top of the word-lines level 3432 using a similar concept of layer transfer and "smart-alignment". FIG. 35A illustrates peripheral circuits 3554 built over cut structure 3543 over carrier 3550. FIG. 35B illustrates the 3D NOR fabric of FIG. 34B. FIG. 35C illustrates flipping and bonding the wafer of the peripherals circuits of FIG. 35A on top of the 3D NOR fabric of FIG. 34B. FIG. 35D illustrates the structure after removal of the carrier 3550 and cleaning the cut structure 3543 residues, and then utilizing the "smart-alignment" adding connections 3556 to connect the peripheral circuits 3554 to the word-lines and the bit-lines of the underlying 3D NOR fabric. The circuits integrated into the transferred layer 3554 could include processing circuits to support what is presently called Processing-in-Memory ("PIM"). Alternatively an additional structure 3556 could be integrated on top using a similar flow and thus support a higher level Processing-in-Memory.

An optional partition of the 3D-NOR fabric, to a multiplicity of units, was previously presented in relation to FIG. 15A-FIG. 17. In such alternative it could be desired to process staircase connections to the bit-lines first. It could also be preferred to form through the 3D-NOR fabric a multiplicity of through-fabric vias which could be used later to connect between the logic circuits 3454 and the peripheral circuits 3554. Then layer transfer the peripheral circuits on top of the logic circuits and form connections between the two structures. This unit's formation could be done so each unit has its own stair-case, and accordingly, its own word-lines and bit-lines so it is completely independent and accordingly each unit would be able to read write or erase the portion of memory cells under its control independent from other units. The through fabric vias could enable the logic fabric to control independently each unit to provide a multi-core type programmable fabric. Buses could be established on both sides to allow data to be transferred between cores and to external devices. Other layers could be added in to form even more complex systems with the option of adding in a range of communication circuits such as SER-DES and/or wireless communication with external devices. In this way this additional layer could be tested before integrating them with the 3D-NOR could fabric, and various redundancy techniques could be used with such 3D systems to provide better yield and field repair of the 3D programmable system as is presented in prior patents, incorporated by reference herein.

The formation of the 3D NOR logic fabric as an array of semi-independent units fits well with the ideas of continuous array and 3D configurable FPGAs as presented in U.S. Pat. Nos. 8,384,426 and 8,115,511 incorporated herein by reference, as related to at least its FIGS. 7-13, FIGS. 36-38, and FIG. 41.

Figure 36A:
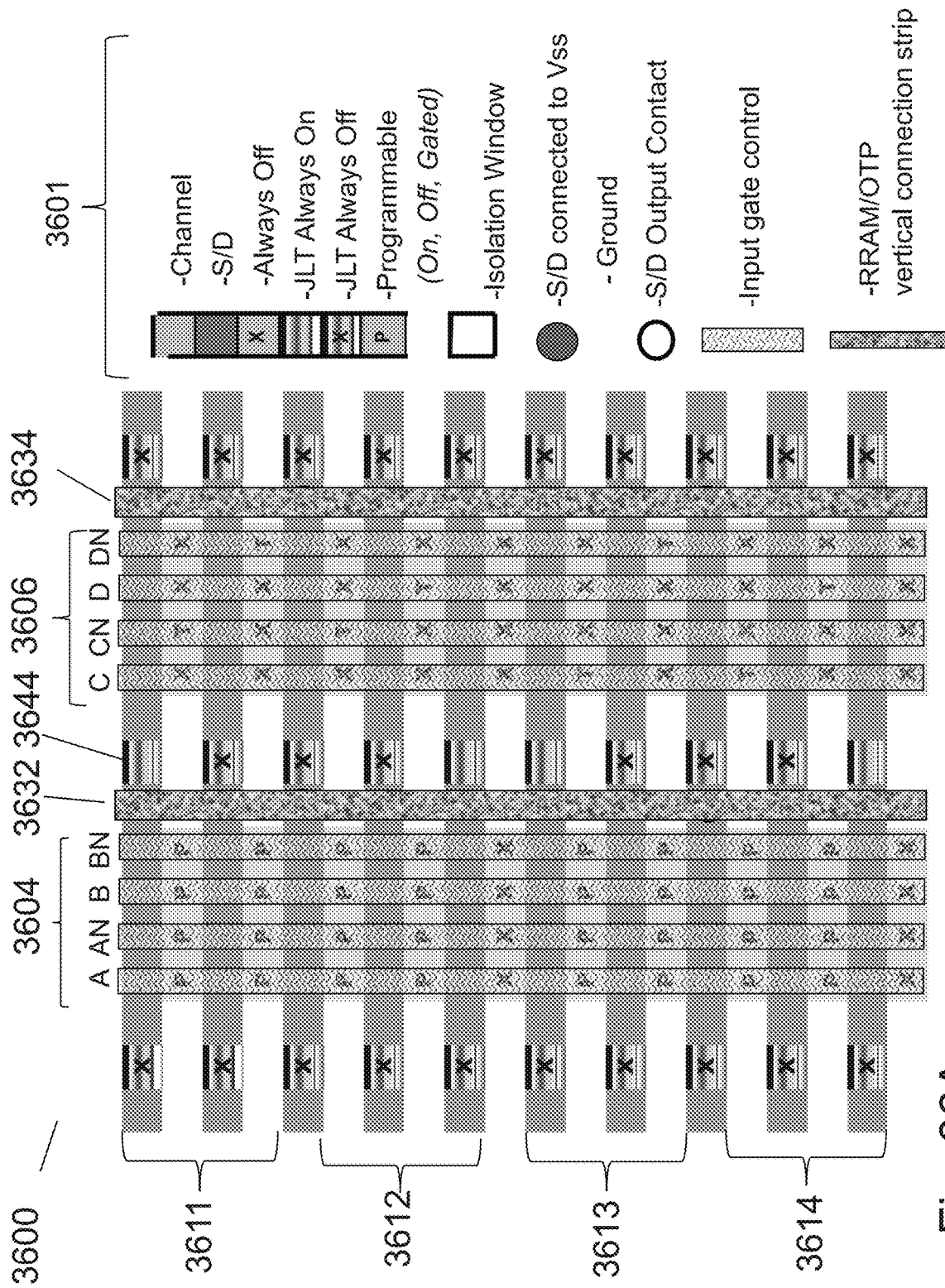

FIG. 36A illustrates use of the 3D NOR fabric for implementing a LUT-4 3600 including the 4 to 1 selector, unlike the implementation 2610 by the upper support circuit. FIG. 36A's right side provides a symbol map 3601. Four LUT-2s similar to those in FIG. 22A could be implemented one on top of the other sharing the same inputs 3604 (A, AN, B, BN). The four LUTs may include the first LUT-2 3611, second LUT-2 3612, third LUT-2 3614, and fourth LUT-2 3614. A ground "0" could be brought in the middle lateral S/D by an RRAM/OTP pillar 3632. In the 4 to 1 selector 3606 portion the programming is indicated as "X" for always Off and "T" as active transistor. The 4 to 1 selector 3606 may be implemented by sets of 4-NPN transistors sharing the same inputs (C, CN, D, DN) one of these LUT-2s would be selected by the input C, D (and their complements CN, DN). At the top it illustrates the selection for C=0, D=0, by having the output of the first LUT-2 3611 directly connected through the top segment of the S/D, for which the center 3644 lateral JLT is kept "On". Accordingly, if inputs C and D are both low "0" than the output of the first LUT-2 3611 could be connected through the S/D segment and then could be outputted by a lateral RRAM/OTP pillar 3634. In a similar circuit the output of the second LUT-2 3612 could be connected to the lateral RRAM/OTP pillar 3634 when C=0 and D=1. In a similar circuit the output of the third LUT-2 3613 could be connected to the lateral RRAM/OTP pillar 3634 when C=1 and D=0 and the output of the fourth LUT-2 3614 could be connected to the lateral RRAM/OTP pillar 3634 when C=1 and D=1. Accordingly a LUT-4 could be programmed into the structure of FIG. 36A.

FIG. 36B illustrates the programming table of the selector 3606 for the example of FIG. 36A.

Another alternative enhancement for the 3D NOR logic fabric is adding Lateral RRAM for Y direction connectivity, to complete full connectivity as the X direction connectivity could utilize the S/D lines, and the Z direction could use the vertical RRAM/OTP. FIG. 32A-32B illustrates some off-fabric Y direction connectivity, yet there is an advantage to in-fabric Y direction connectivity.

Figure 37A:
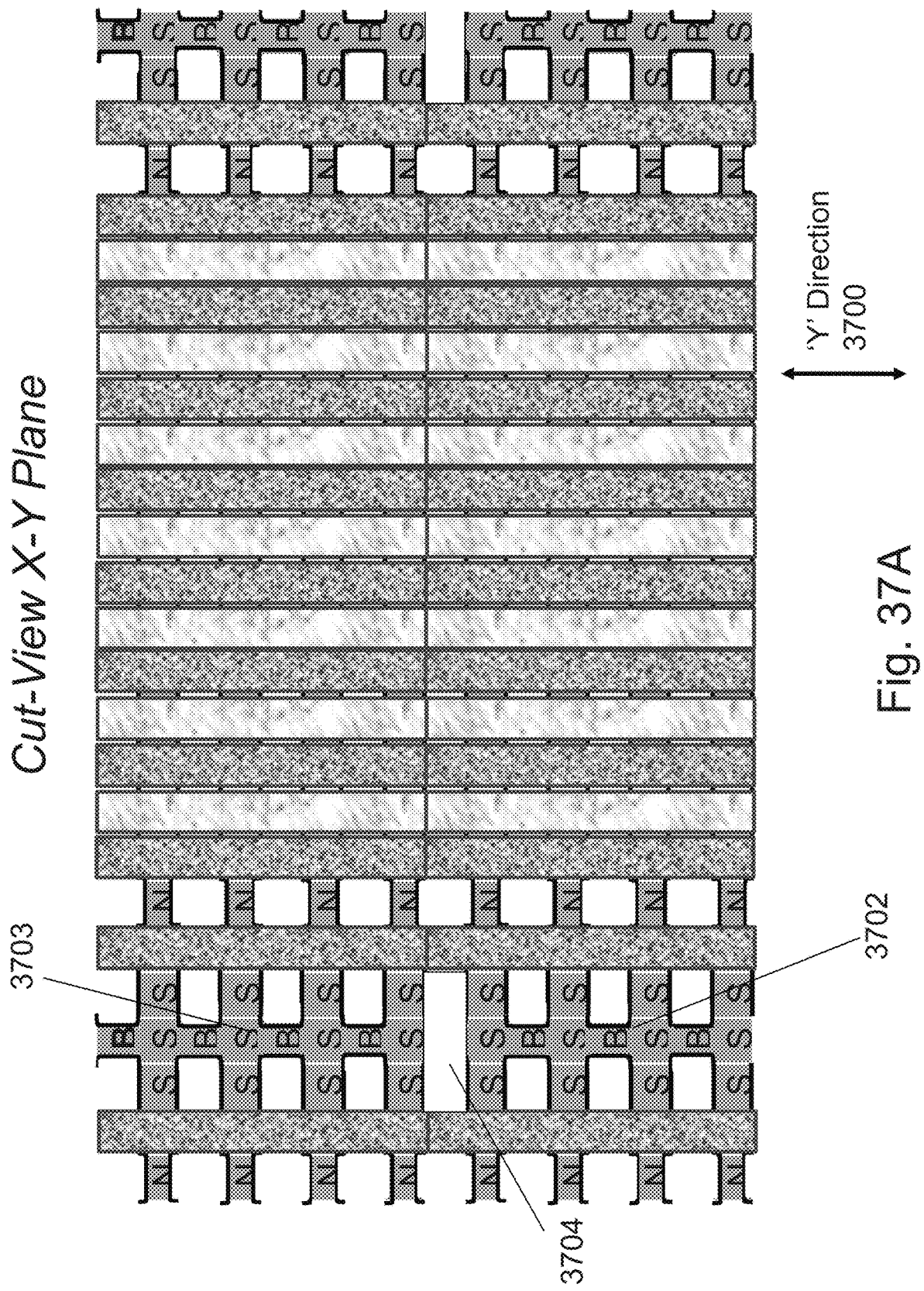
FIGS. 37A-37B are example illustrations of a 3D NOR fabric flow to add-in Y direction RRAM/OTP programmable connectivity.

The starting point is illustrated in FIG. 37A which is a top view of a 3D-NOR structure, illustrating a first bridge segment 3702 formation that is an extension of S/D lines along the Y direction and extends across a group of ridges and then interrupt 3704 and then continues again as second bridge segment 3703. The bridge segments are marked with B. In FIG. 37A, the region marked with A and C could indicate regions of gates such as $1^{st}$ and $2^{nd}$ gates and vertical RRAM/OTP, respectively. The regions marked with N are designated horizontal JLT. The regions marked with S are the access area for the bridges marked with B. The B regions could be regions that are protected by the hard mask at the initial step of ridge formation (FIG. 3B) so they are not etched while the valleys are etched. These bridges also provide mechanical structure stability; particularly, Y direction support which can prevent the stiction issue of a ridge during wet processing and dry processing. In order to further mitigate the stiction, a critical point dry process may be used. FIG. 3B illustrates a small window of a ridge oriented in X direction. Having periodically a Y direction bar 3801 such as could be used to form the Y direction OTP could provide mechanical support to the ridge structures.

In the next step, the bridge locations marked as 'B' and their access marked as 'S' could be processed for the removal of the channel regions ('P') in between the S/D segments by selectively etching out. This step could be shared with the etching out of P regions at the locations designated for JLT and/or staircases locations.

The lateral RRAM formation could be started by first depositing thin oxide isolation using ALD or similar technique. Then the RRAM electrode could be deposited using ALD or similar technique, followed by a directional etch step leaving the conductive electrodes only in between the 'bridges' and the S/D region (Under S and B). Effectively forming strips of lateral RRAM which stop at interrupt regions 3704. This in-between the S/D lines RRAM could help the routing of signal in the 'Y' direction 3700.

The necking step could be followed with its O/N/O and gate formation for lateral JLT.

Figure 37B:
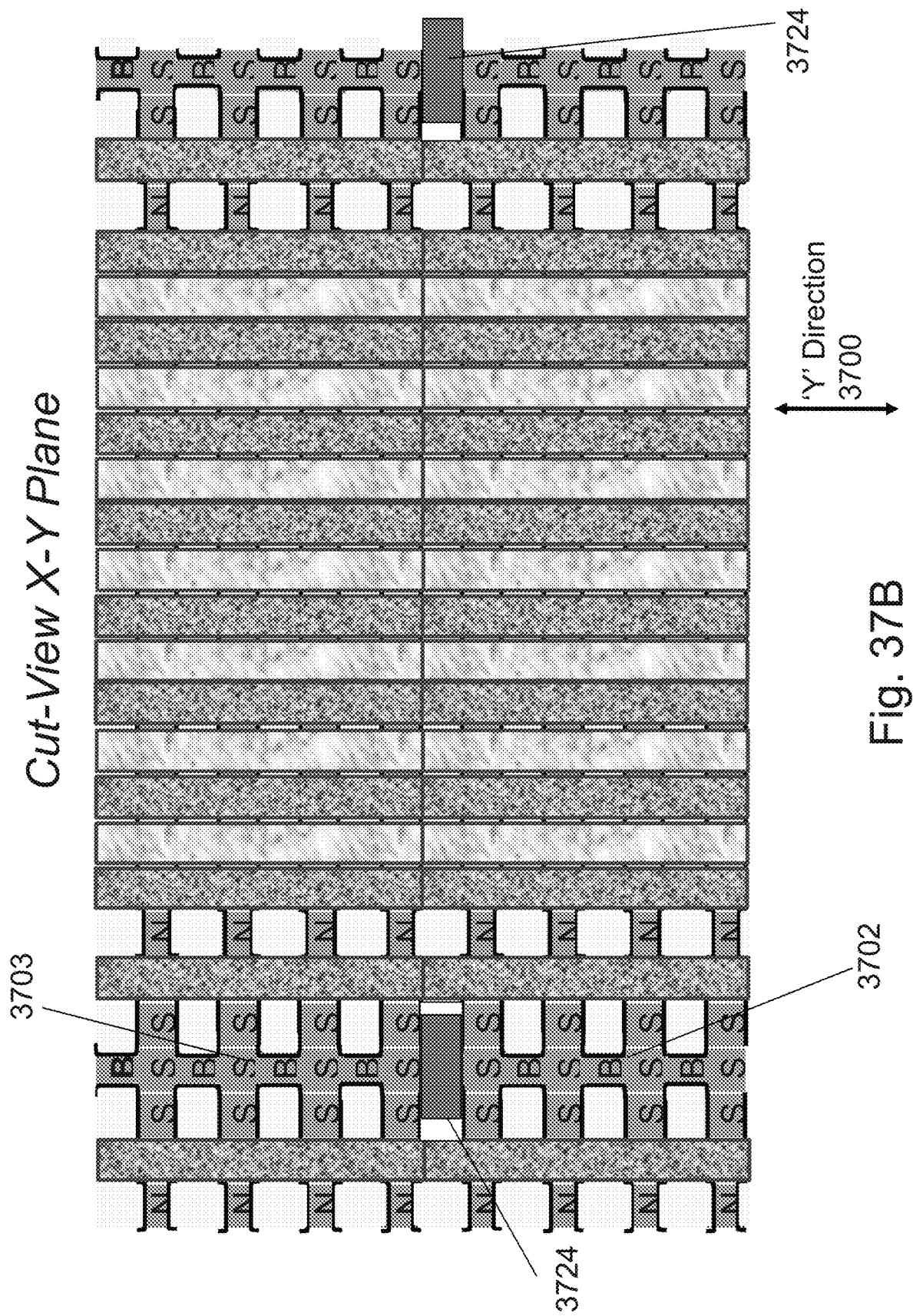

FIG. 37B illustrates programming support pillars 3724 constructed to support the lateral RRAM programming. Using a lithographic step, a window (where pillars 3724 are desired) is defined in the 'interrupt' space 3704 between lateral RRAM. Then first a non directional/isotropic etch step is performed to etch the RRAM electrodes region in contact with the window (where pillars 3724 are planned). Then the whole window is filled with N+ type poly silicon. Then using directional/anisotropic etching the N+ poly is removed from all uncovered area, so the N+ poly is left only in the region in which the electrode was etched away. Then the window may be filled with P+ poly forming a conductive pillar 3724 with a diode feeding each of the lateral RRAMs.

Now these pillars 3724 could be connected forming a fourth gate to be used to start the lateral RRAM programming by feeding positive voltage through the P+ poly pillars to the lateral RRAMs. Then the lateral RRAM connection to the selected regions of the selected S/D lines could be programmed by selecting the specific S/D segment to be connected to the corresponding lateral RRAM.

FIG. 38A illustrates a 3D perspective view similar to the structure illustrated in FIG. 37A. It illustrates the protective mask 3804 protecting the regions of first gates and the vertical RRAM/OTP pillars. The exposed regions marked as "S", "B" in FIG. 37A may be covered with resistive switching material 3802 deposited using ALD or similar technique as was described in respect to FIG. 37A. The lateral RRAM could alternatively be constructed as One Time Programmable ('OTP') and accordingly instead of resistive switching material 3802 it could be breakable isolative material such as thin silicon oxide or, for example, a combination of amorphous silicon, silicon oxide and silicon nitride. In general in this discussion the use of the terms RRAM, OTP, or RRAM/OTP may be interchangeable as those technologies may be employed in similar circumstances, subject to engineering and design choices.

FIG. 38B is a 3D illustration of the structure after the conductive electrode material 3808 has been deposited.

FIG. 38C is a 3D illustration of the structure after a directional etch-RIE process removing the conductive electrode material from all regions other than in between the S/D region, leaving the lateral electrodes of the RRAM materials 3810 in between the S/D segments marked as "S", "B" in FIG. 37A.

FIG. 38D is a 3D illustration of the structure after a lithographic step exposing all the regions 3812 marked as "B", which are the S/D segments bridging the 'ridges' in the 'valleys', in FIG. 37A. Then using an isotropic/non directional etch, the 'B' locations could be etched. In this step, the 'interrupt' N+ regions 3813 are etched and discontinued/disconnected in the Y direction, but the lateral electrode 3810 remains and is continuous along the Y-direction by utilizing the appropriate etch selectivity. FIG. 38E is a 3D illustration of the structure after the N+ regions 3813 removal.

FIG. 38F is a 3D illustration of the structure after an additional lithographic step of forming protection with designated windows 3820 for forming lateral RRAM activation pillars as was discussed in reference to conductive pillar 3724 of FIG. 37B.

FIG. 38G is a 3D illustration of the structure after formation of pillars 3822. As an alternative to P+, N+ poly these pillars could be made with a conductive material which would form a 'Schottky diode' once contacting the RRAM lateral electrode. So substantially every contact between the pillars 3822 and the lateral RRAM electrodes 3810 would be a rectifying contact 3824.

Figure 38H:
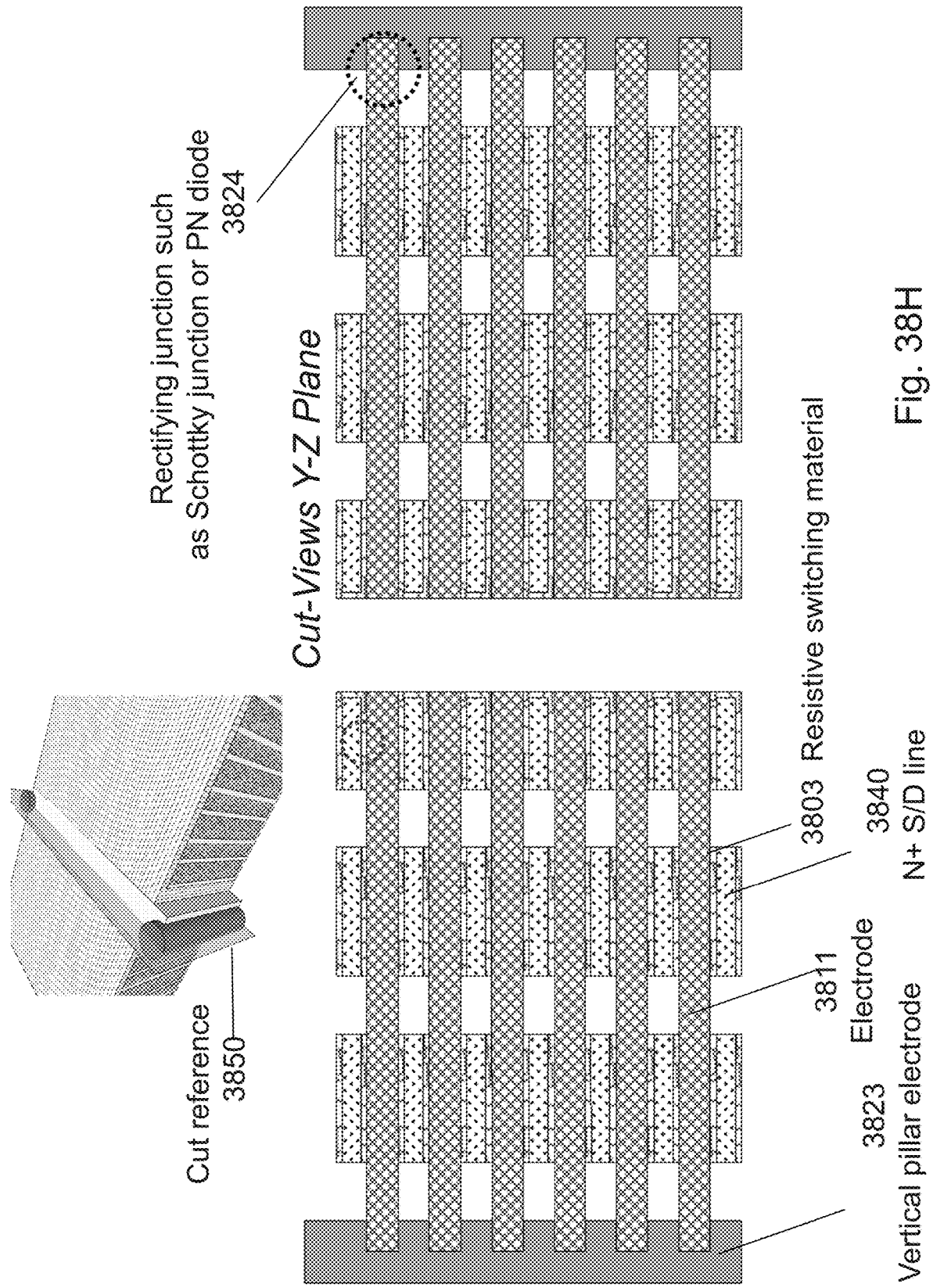

FIG. 38H is a vertical cut (Y-Z plan) illustration of the structure. The vertical cut is along the lateral RRAM direction 3850 as is illustrated in the upper left side. It illustrates the rectifying contact 3824 between the pillars 3823 and the lateral RRAM electrodes 3811. The lateral RRAM electrodes 3811 and the S/D (N+) 3840 segment having the resistive switching material 3803 (or the thin oxide for the OTP case) for forming programmable connection with the lateral RRAM.

Figure 38I:
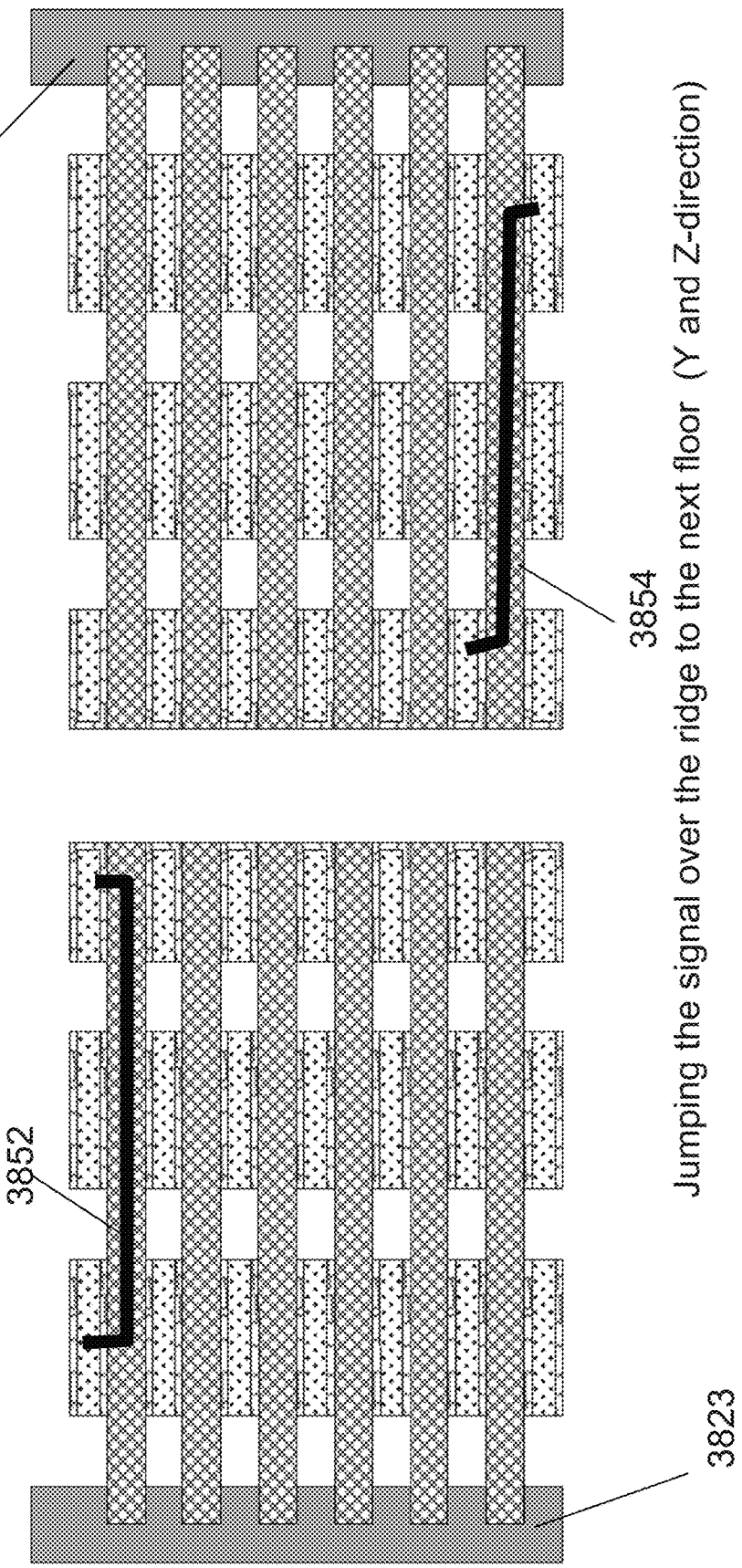

FIG. 38I is a vertical cut of illustration of an exemplary structure marked with the optional Y direction connections first path 3852 and second path 3854 being programmed using the lateral RRAMs. For the programming a specific S/D segment might be set to be conductive to ground or negative programming voltage and then the pillars 3822 may be connected to the positive programming voltage thus forming connection between the S/D segment and the lateral RRAM, and so forth to all the desired connections between S/D segments and the designated RRAM electrodes. The pillars 3823 main function is to enable the lateral RRAM programming. The diode type connection provides the select device to protect against an undesired conductive path.

Embedded memories are common in logic and programmable application. The 3D NOR fabric being a memory fabric could provide such embedded memory provided the upper support circuitry is designed to support it. For embedded applications the access to the bit lines—the S/D lines could utilize the vertical RRAM/OTP strips. Such can effectively form a dual port memory as the staircase provides global access and vertical RRAM/OTP strips provide local access. This embedded memory could be used as embedded non-volatile memory and with thin tunneling oxide as was described before, it could also support high speed memory applications, as an alternative to the common embedded SRAM and DRAM. The upper circuitry could be designed to support write read and multiple port access for the embedded 3D-NOR memory section.

Figure 39A:
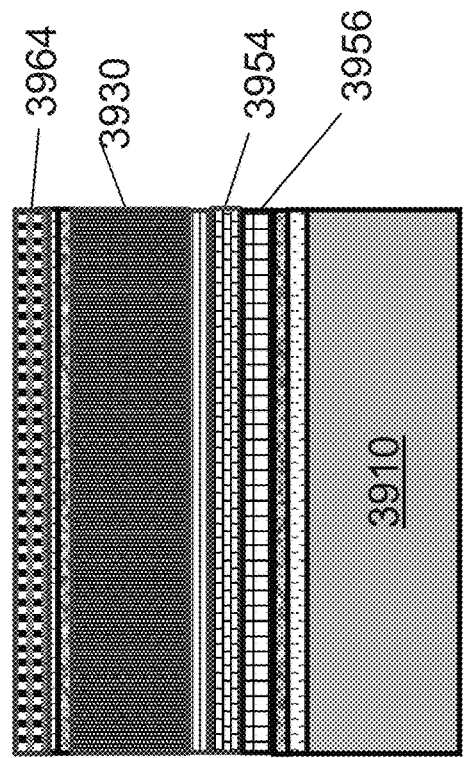
FIGS. 39A-39B are example illustrations of stack structure variations for a 3D programmable system.

Another alternative to increase the 3D NOR logic density is to use the bottom side for logic, as well other sides. A layer transfer flow for forming a 3D programmable system, leveraging the 3D NOR fabric, was described in respect to FIG. 34A to FIG. 35D herein. FIG. 39A illustrated a 3D programmable system including a carrying substrate 3910, a smart connection layer 3956 connecting the peripherals programming circuit 3954 to the 3D-NOR fabric 3930 with overlaying logic control circuit 3964.

Figure 39B:
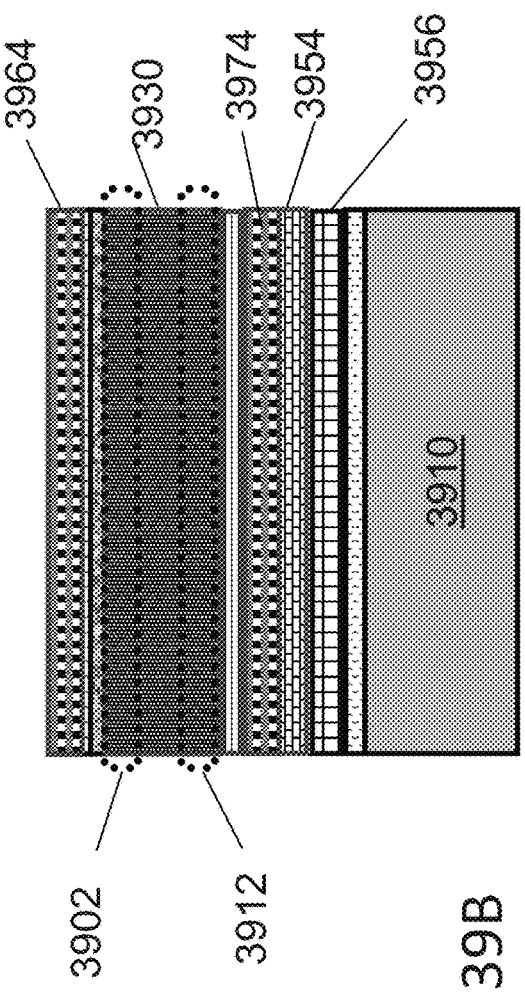

FIG. 39B illustrates the structure adapted to support logic on both sides, the bottom of the 3D-NOR fabric 3912 with its bottom control circuits 3974, and the top 3D-NOR fabric 3902 with its top control circuits 3964.

The gate access could be multiplexed between the programming peripherals circuits 3954 and the bottom logic control circuits 3974.

Figure 40A:
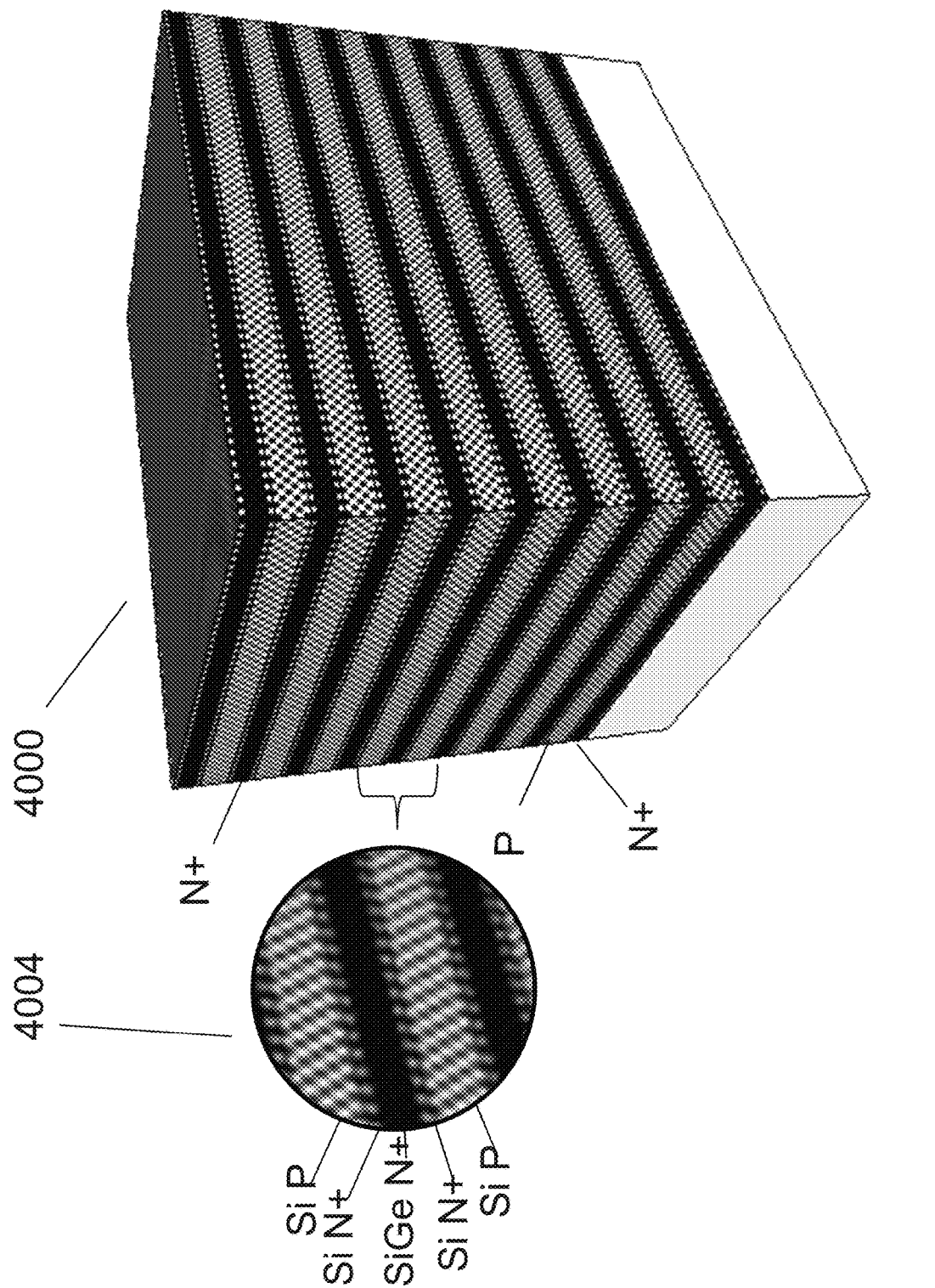
FIGS. 40A-40G are example illustrations of an alternative formation and structure of vertically oriented 3D memories.

An additional alternative is to add SiGe within an N+ S/D layer during the multilayer epitaxial process. Such addition could be designed to be different from the channel material to allow selective etching. FIG. 40A illustrates the multilayer structure 4000 which is similar to the one illustrated in FIG. 3A but with a SiGe layer within N+ S/D layers as illustrated in the bubble magnification 4004. SiGe epitaxial over silicon has been adopted recently as an attractive technique for formation of gate all around horizontal transistors. In forming the 3D NOR fabric described herein it might be desired in some applications to increase the Ge content such to achieve better channel mobility or for better etch selectivity. Particularly, adding SiGe within N+ S/D layers herein can be used as sacrificial layer for subsequent metal S/D silicidation process, or to divide an N+ layer into two very thin N+ layers for a better JLT.

A relatively high proportion of Ge could increase the stress associated with such a multilayer structure. An alternative technique to release the stress is incorporating carbon atoms during the epitaxial growth process. The smaller size of a carbon atom would compensate for the stress due to the large Ge atom. Such a technique has been presented in the Doctoral Thesis by Julius Hållstedt, KTH Information and Communication Technology, Stockholm Sweden, 2007 and in a paper by Hiroto Oomae et al. titled "Influence of Carbon in in-situ Carbon-Doped SiGe (SiGe:C) Films on Si (001) Substrates on Epitaxial Growth Characteristics" published in the Japanese Journal of Applied Physics, Volume 49, Number 4S, all of the forgoing are incorporated herein by reference. This processing could be used to form transistors which may include, for example, at least 0.1% carbon atoms in the transistor channel of transistors described herein, at least 0.2%, and at least 0.3%.

An alternative technique to release the stress in order to reduce the risk of wafer bowing could be considered. One such stress release alternative is the pre-etching of trenches in the designated dicing streets. Such trenches could be made with a depth similar to the height of the multilayer structure and with a width of about double of that height. These trenches will limit the overall wafer level stress. Other variations of such trench release structures could be deployed and designed to support the target use of the wafer and the architecture of the designated 3D NOR fabric to be built over it.

Figure 40C:
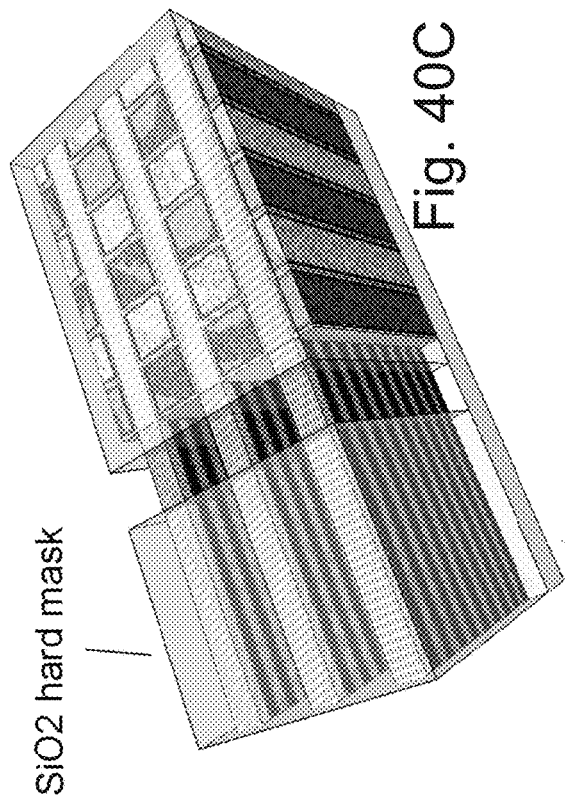
Figure 40E:
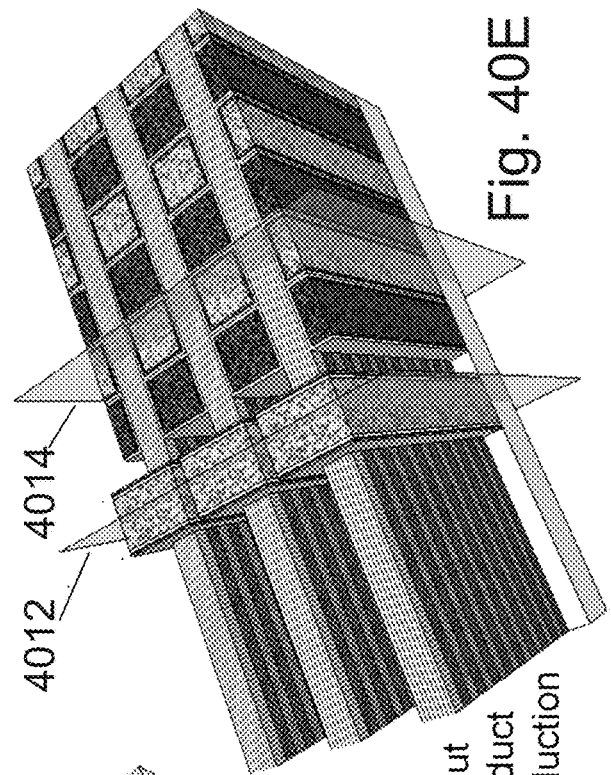
Figure 40B:
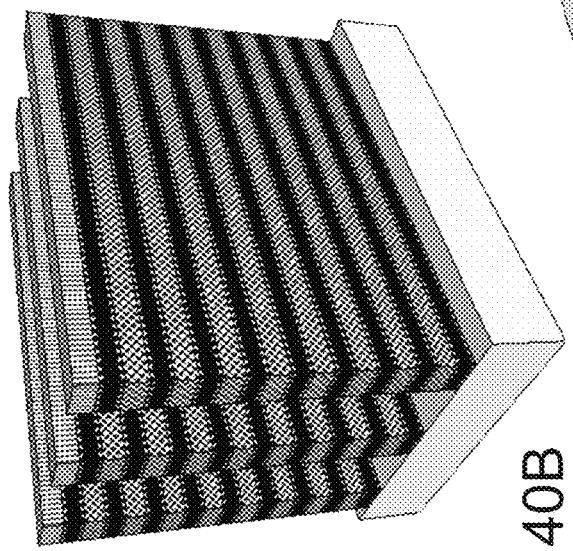

FIG. 40B illustrates the structure of FIG. 40A etched to form ridges.

This extra layer in between the S/D layer, could be later selectively etched to help forming the horizontal JLT and also allow improving the S/D line conductivity by replacing the SiGe with a refractory metal or other conductive material.

FIG. 40C illustrates the structure prepared for JLT formation such as was presented in reference to FIG. 13A herein.

Figure 40D:
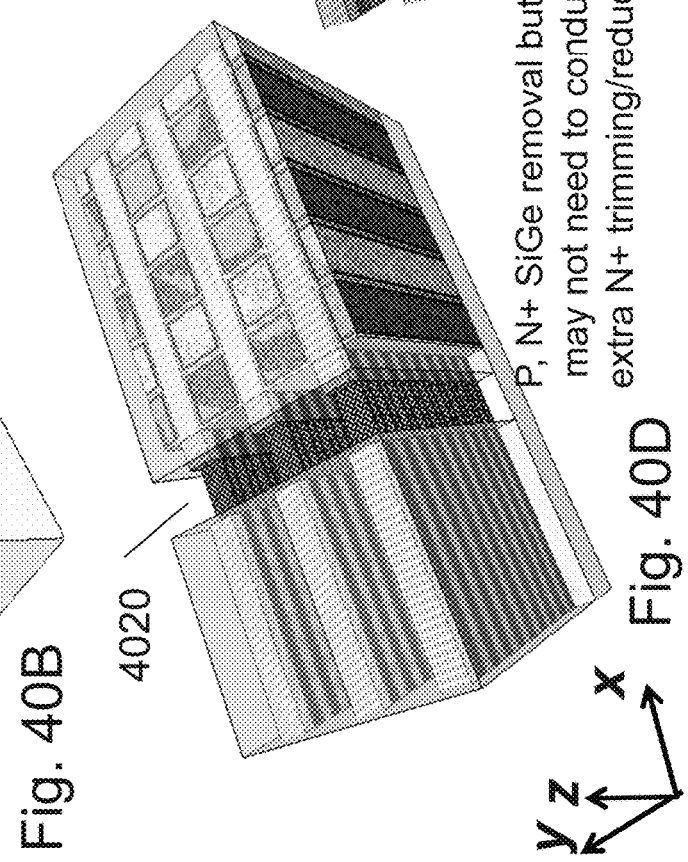

FIG. 40D illustrates the after selective isotropic etch of the layer in-between (SiGe) in the exposed regions 4020. Proper construction of the multilayer structure 4000 could result in each S/D segment ready to become a JLT in the exposed regions 4020 as an alternative in addition to the S/D trimming.

Figures 40F, 40G:
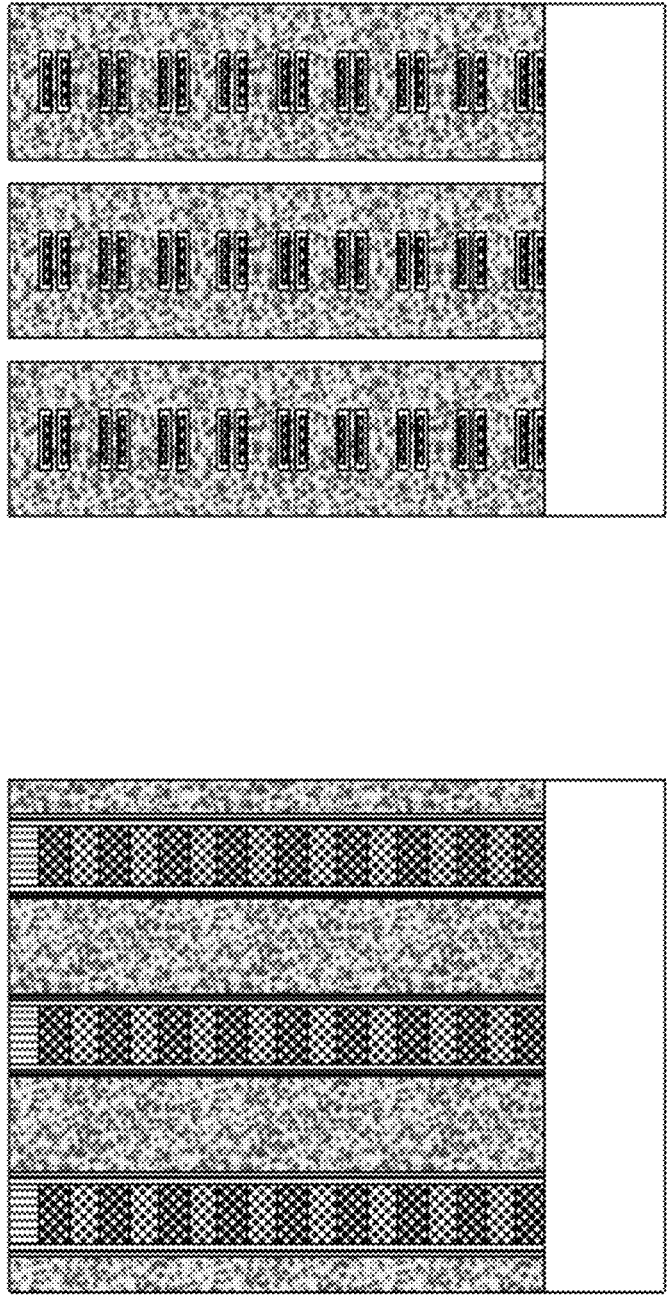

FIG. 40E illustrates the structure after forming the gate stack in the exposed regions. The following FIG. 40F and FIG. 40G illustrates cut view one 4012 and cut view two 4014 respectively.

This type of JLT formation could be done in all other regions designated to become JLTs. These steps could be formed together or by group based on process and design considerations.

In the regions other than designated JLT regions, the in-between material (SiGe) could be replaced with a refractory metal such as tungsten ('W'), following procedures similar to the one presented in reference to FIG. 3C-3D herein.

FIG. 41A illustrates a similar structure to the one illustrated in FIG. 9F herein having ridges that are wider than the valleys.

FIG. 41B illustrates the structure after 'ridge splitting' forming $2^{nd}$ 'valleys' 4102. Then the exposed in-between material (SiGe) could be selectively etched away using an isotropic etch.

FIG. 41C illustrates the structure after filling in the $2^{nd}$ valleys 4106 a filled in metal, for example, a refractory metal.

FIG. 41D illustrates the structure after directional etch reforming the $2^{nd}$ valleys 4112 and accordingly removing the side wall connection between the S/D lines of the various layers, completing the in-between material replacement process.

The process flow illustrated in FIG. 41A-41D could be adapted for S/D line silicidation.

Figure 41E:
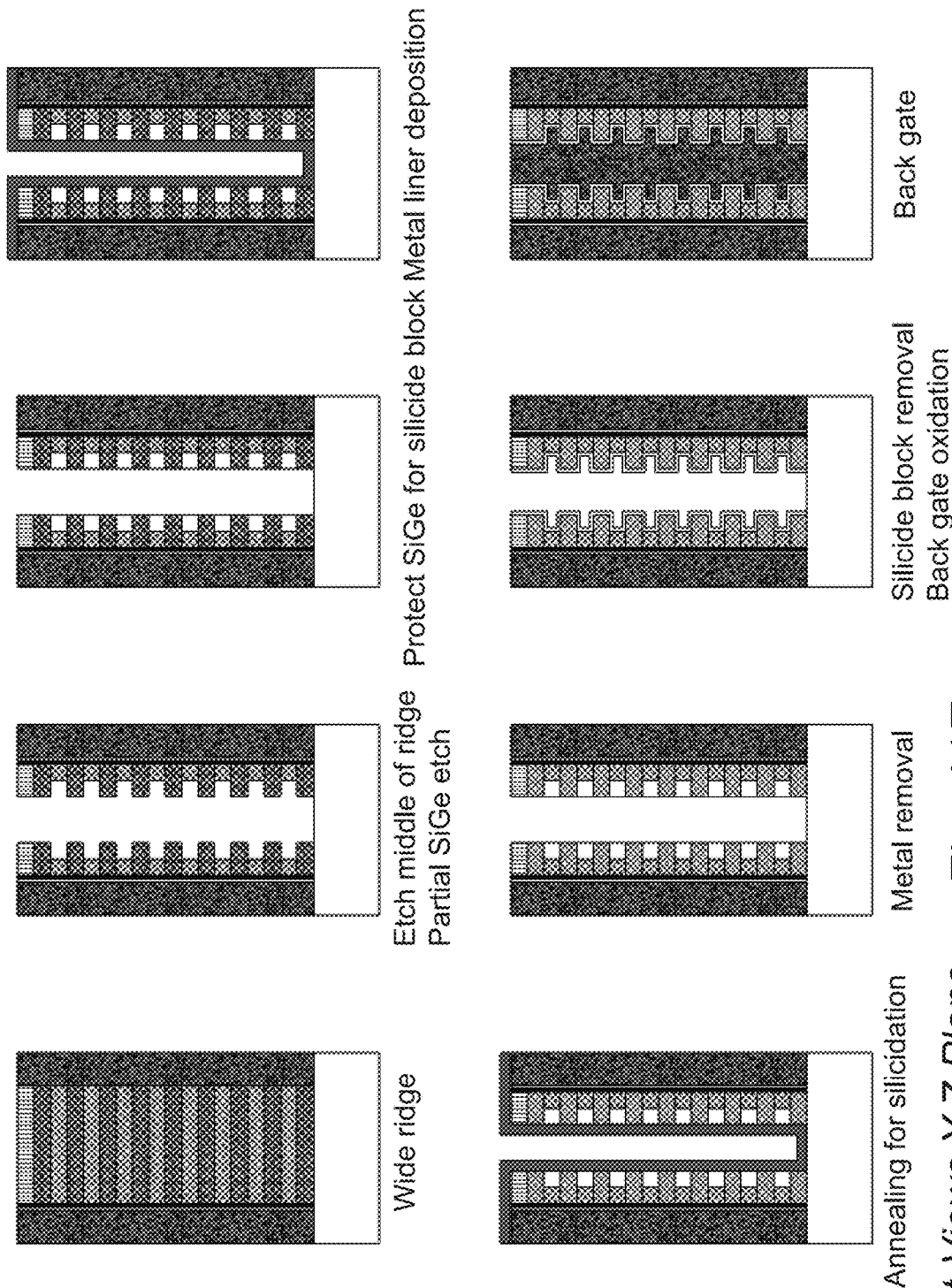
FIGS. 41A-41O are example illustrations of an alternative formation and structure of a NOR type 3D memory.

FIG. 41E illustrates an alternative for such a flow which could be referred to as 'ridge slicing'. The flow of FIG. 41E illustrates the protection of the channel region from being silicided by selective partial etch forming indentations in the channel regions which is then covered by the protection layer. The silicidation could reduce the S/D lines resistivity and/or modification the vertical transistors of the 3D-NOR fabric to become Schottky Barrier ("SB") transistors or Dopant-Segregated Schottky Barrier ("DSSB") transistors or other variations such as asymmetric transistors. The S/D layer doping could be engineered to support the formation of vertical transistor accordingly.

Such ridge slicing could be used as an alternative technique to support the mechanical integrity of the ridge structure. So it could be used to first etch the 'odd' valleys 151 then add gate stack and then etch even valleys 152 and fill in the other gate stacks.

Another use of ridge slicing could be for the formation of the horizontal JLT. Similar techniques has been presented in the art named Multi-Channel Field-Effect Transistor ("MCFET") such as in a paper by Emilie Bernard et al. titled (MCFET)—Part I: Electrical Performance and Current Gain Analysis" published in IEEE TRANSACTIONS ON ELECTRON DEVICES, VOL. 56, NO. 6, June 2009, incorporated herein by reference. Accordingly slicing the ridges could be an alternative to narrowing the ridge for the JLT location. To form a JLT it is desired to reduce the size of the 'nano-wire' to 20 nm or below and more easily form the gate around. So slicing the ridge could be an alternative to forming a 'neck' by forming two side by side nano-wires. These techniques could act as an alternative or together with other techniques presented herein such as forming to nano-wires one on top of the other as presented in respect to FIG. 40A-40G.

The engineering of the 3D NOR based device needs to be a balance between manufacturing/processing aspects and device aspects and could factor cost, speed and power as is common in the industry. The composition of the epitaxial structure including doping level and use of SiGe could be applied for the engineering of the end device. Alternatives presented herein are examples and other combinations of the techniques presented herein could be applied by a person skilled in the art to tune the device per specific needs and objectives. The S/D layer could be lightly doped 1E15 to 1E17 or moderately doped 1E17 to 1E19 for Schottky Barrier (SB) transistors formation or with higher doping 1E19 for light Dopant Segregation (DS) or with heavy doping of 1E20-1E21 for strong Dopant Segregation (DS). For the vertical memory transistors the doping level near the channel region is important. This opens the option to have the S/D layer with higher doping at the lower and upper parts while having lower doping at the center. This variation could be at 10-20%, 20-60% or even 80-200%. Such could allow etching part of the higher doped region in the region designated for horizontal transistor (JLT).

Techniques to enhance the conductivity of the S/D lines and to ease the formation of the S/D lines horizontal transistor (JLT) could be combined with previous techniques disclosed herein, for example, such as S/D silicidation. In the engineering of the 3D-NOR fabric, it might be desired to use two types of layer etch selectivity control: materials (Si/SiGe) and doping differences. An alternative example could be to form the channel layer with SiGe and the S/D silicon layer with three doped layers: N+, P 4128, N+ as is illustrated in the bubble 4127 of FIG. 41F. For silicidation the SiGe selectivity could be used to protect the channel from being silicided. For the JLT formation the P doped silicon of the S/D lines could be selectively etched as is illustrated in FIG. 41G by structure 4134. Using lithography and protective layers, the memory regions 4136 could be processed while the staircase regions 4122 and the ridge select JLTs and other JLTs regions 4124 are being protected. The memory region could then be protected and other regions could be processed. The channel region could be removed and replaced with oxide for the staircase regions 4132. And then in the JLT designated regions the P region, within the S/D lines, could be removed, thus structure 4134.

An alternative is to use two types of SiGe. SiGe-A could be used for the designated channel zone and designed accordingly while the material in-between the S/D layer could be made with SiGe-B having a different enough mix of silicon vs. germanium to allow selectivity between etching first SiGe-A so to enable forming the silicidation and etching SiGe—B to support the JLT formation.

Figure 41F:
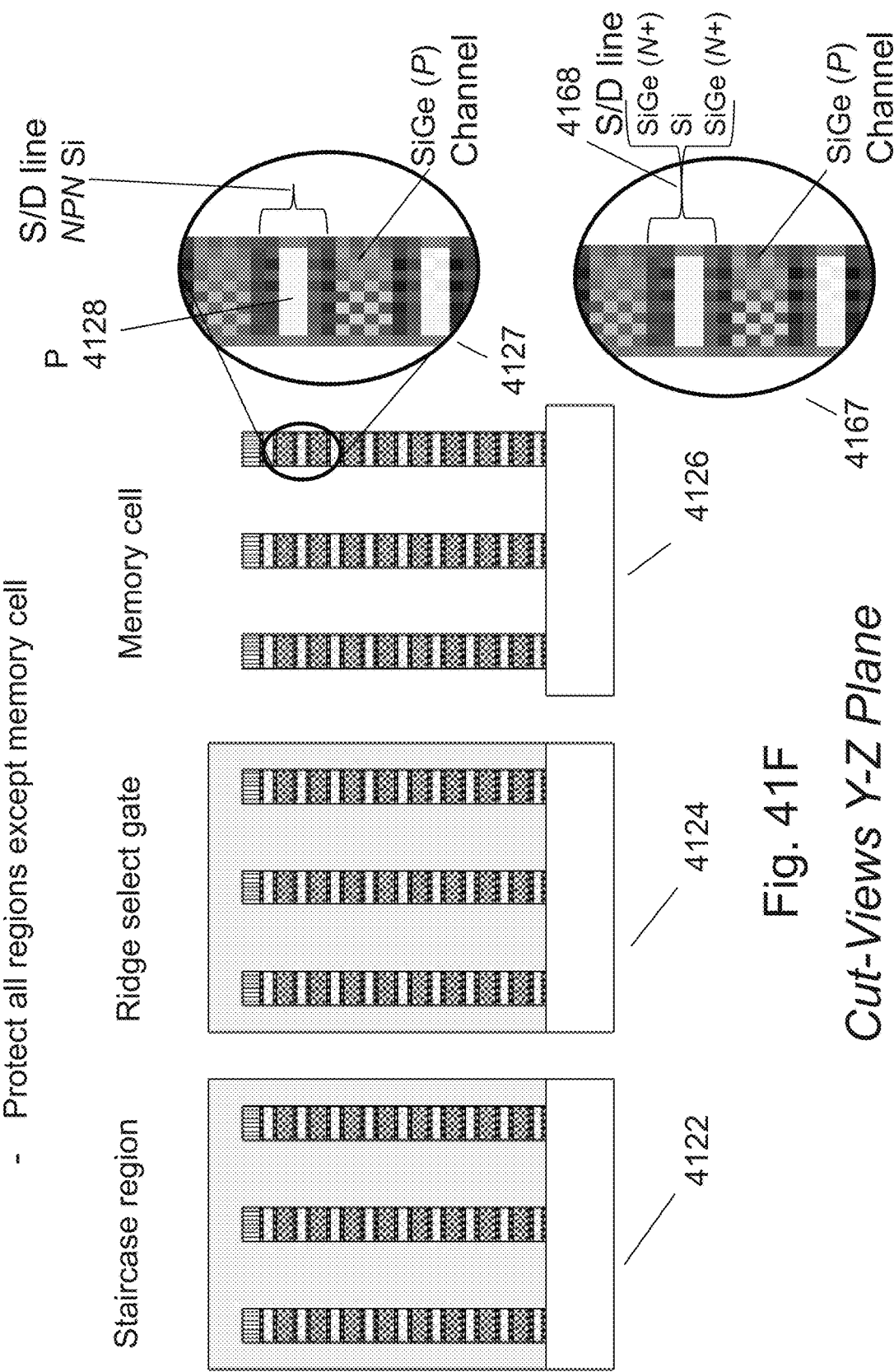
Figure 41G:
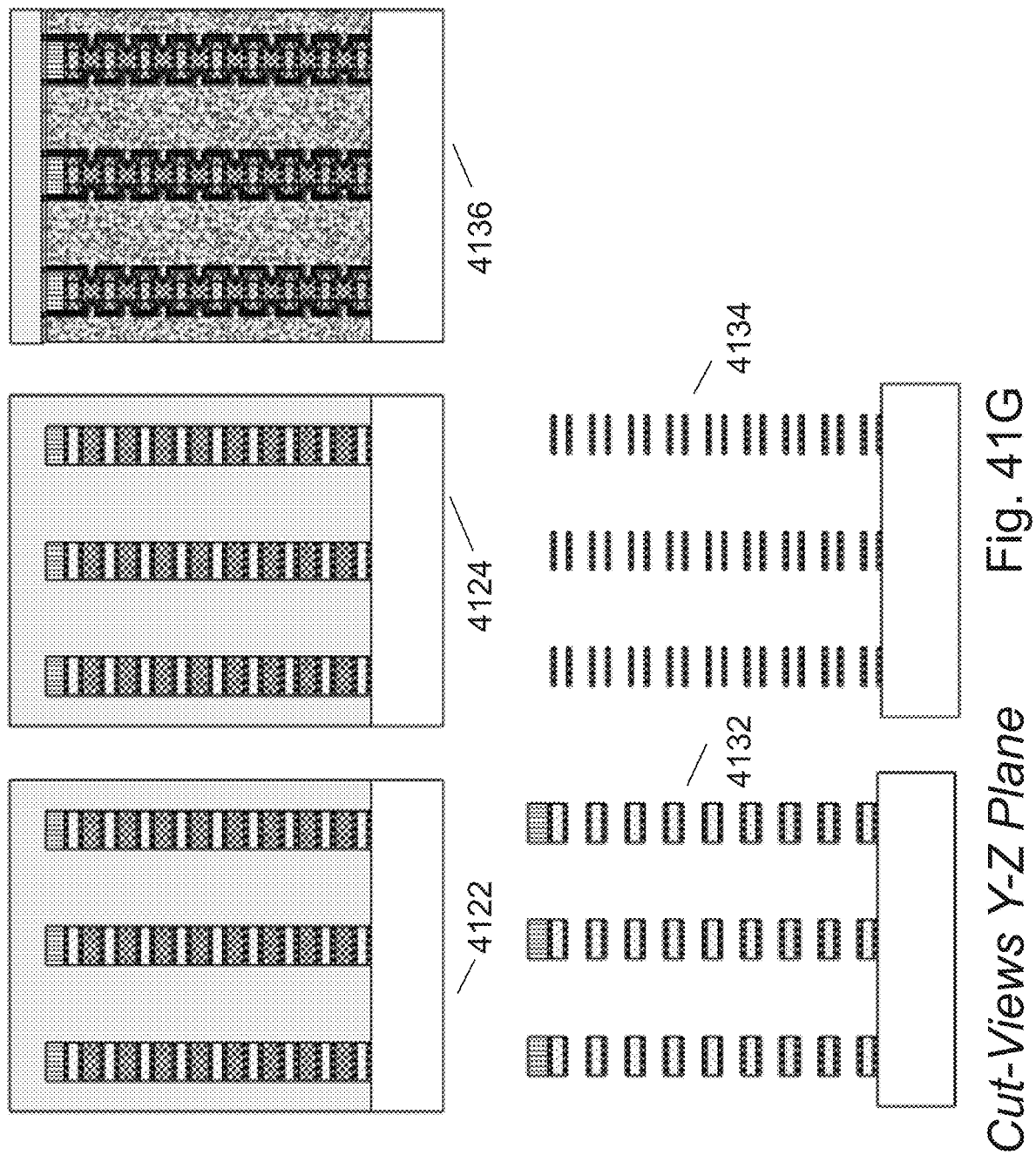

Another alternative is to form the structure designated the S/D to have three Si/SiGe layers as is indicated in the alternative bubble 4167 of FIG. 41F. The three layers 4168 could be: SiGe(N+)—Si(N+ or N)—SiGe(N+). The channel is as before—SiGe(P). The objective is to use the selective etch of the SiGe to protect a portion of the S/D from the silicidation process. The thickness of the N+ SiGe could be 1-2, 2-4, 4-7 or 7-15 nm. Accordingly the device could be engineered for the distance between the silicide region and the channel. The level of doping in the center Si could be designed to support the level of segregation and other considerations such as could be desired for the horizontal transistors of the fabric (JLT). The SiGe N+ and the Si each could be doped at different level as part of the device engineering. These could be lightly doped 1E15 to 1E17 or moderately doped 1E17 to 1E19, higher doping 1E19 or higher. The three levels S/D design could also support the formation of the horizontal transistors—JLT. Thinning the S/D for JLT could leverage the good etch selectivity for etching away the SiGe portion leaving only the Si portion of the S/D as alternative to other techniques being presented elsewhere here.

These $2^{nd}$ valleys could be then filled with isolation material (for example a silicon oxide) or used for adding in vertical RRAM/OTP pillars, or even add in additional O/N/O and gates for additional memory facets. Using the $2^{nd}$ valleys for memory could be challenging as the directional etch of the refractory metal while re-opening the $2^{nd}$ valleys might damage the side walls. Alternatively, these $2^{nd}$ valleys 4112 could be used for forming DRAM retention support gate stacks such as was described in respect to FIG. 5D 502 and 503. Alternatively these $2^{nd}$ valleys could be used to form a DRAM alternative device with thin or no tunneling oxide, for which the non perfect surface could help increase the trapping capacity of the trapping layer.

FIG. 41H illustrating the necking for JLT as one of the proposed techniques for the formation of a horizontal S/D control transistor. FIG. 41I illustrates an alternative technique to JLT, a horizontal SB-Transistors or DSSB-Transistors. FIG. 41J illustrates SB-Transistors or DSSB-Transistors with an additional polarity gate, such as been described in the paper by T. A. Krauss blending JLT transistors with SB transistors. This could be achieved by controlling the silicidation, keeping a portion of the S/D region non-silicided and functions as a JLT, and splitting the gate to two gates: one controlling the On/Off of the transistor and one controlling the charge carrier electrons/holes (N type or P type). These transistors could also be adapted for vertical transistor function of the 3D NOR fabric. A few of these embodiments are presented in the following.

FIG. 41K illustrates a 3D NOR section with no silicidation of the ridge structure with S/D of n+ silicon and SiGe very low p doped channel. The level of Ge in the SiGe could range from about 5% Ge atoms to about 100% and could be engineered to be pure Ge. FIG. 41L illustrates a ridge section that has been silicided. The doping level of the n+ could shift the device from SB to DSSB type. For some applications an asymmetric vertical transistors could be useful. Such as described in a relatively early paper by Kyeong-Rok Kim et al. titled "Design of NOR flash memory cells with high speed programming by utilizing an asymmetric Silicide (TiSi2) Drain" presented at the 7th International Conference on ASIC (2007), and incorporated herein by reference. The multilayer structure illustrated in FIG. 3A could be alternatively formed so that the S/D layers 302 are split to odd layers and even layers, the odd layers could be SiGe n+ layers and the even layers could be silicon n+, as is illustrated in FIG. 41M. The following step of the SiGe indent-etch and protect would protect both the SiGe channel and the SiGe odd S/D regions, resulting with an asymmetric vertical transistor in which one S/D may be n+ while the other may be silicided to either SB or DSSB. An alternative is forming an asymmetric vertical transistor using both odd and even silicon S/D but having a different doping for the odd than the even, thus forming vertical transistors in which one S/D is SB while the other is DSSB, as is illustrated in FIG. 41N.

It should be noted that by using lithography and other techniques presented herein the horizontal transistors could be engineered differently than the vertical transistor. FIG. 41O illustrates the alternative vertical transistor described in the paper by T. A. Krauss. By controlling the silicidation to leave vertical un-silicide regions 4152, 4154, vertical blend JLT transistor with SB transistors could be formed. The main gate 5146 could control the On/Off of the transistor and the polarity gate 5148 could control the major mobile carrier charge carriers to be electrons or/holes (N type or P type transistor).

These alternative transistor types provide optional integration of effectively P type transistor in the N type NOR fabric. These transistors could be integrated into the programmable logic fabric to support CMOS equivalent function adding more flexibility than N type only as presented herein in respect to FIG. 21 to FIG. 39B. These equivalent P type transistor or ambipolar transistor or ambipolar transistor controlled to operate as P type transistor could also be engineered to support a fast random access single cell erase. Block base erase are more commonly used and for many application are effective as many cells are being erase together reducing the per-cell time and power. This is commonly done using Fowler-Nordheim ("FN") charge trap removal by having high negative differential voltage between word-lines and bit-lines. FN could also be used to provide single cell erase for the 3D NOR fabric by splitting the negative erase voltage between two successive S/D lines (S/Dn and S/Dn+1) so only the cell in-between these S/D lines get erase for the selected word-line.

Additional alternative is to enhance the RRAM/OTP conductivity by adding an additional layer of better conductivity than the RRAM/OTP electrode material. In general the construction of an RRAM/OTP includes three elements. The first electrode which in the case of the 3D NOR fabric is the S/D lines, then the resistive changing material which in many cases is a form of oxide, and third the second electrode. The choice of these materials is optimized to meet the programming and device operational requirements while still meeting the ability to properly deposit these materials in the 3D NOR fabric. In some applications it might be desired to add a fourth element such as a refractory metal or other good conductor, following the second electrode deposition to enhance the second electrode function as a routing resource.

An additional alternative for implementing high speed RAM within the 3D NOR fabric is to utilize a memory technology known as floating-body memory. As illustrated in FIG. 22A a group of four P channels are actually forming a floating body of P type silicon isolated by gate oxide on two side facets and isolation oxide on the other two side facets and the N+ type S/D on its bottom and top facets. The floating-body could have multiple gates on two of its side facets. This could be used for embedded memory within the logic fabric with a read and write access time of less than 10 ns, or less than 5 ns or even less than 2 ns and could support multiple ports. A volatile 3D memory using floating body charge is described in U.S. Pat. No. 8,114,757, incorporated herein by reference, as related to at least FIGS. 30A-30M and FIGS. 31A-31K. In some cases these dynamic RAMs (DRAM) could be operated with 'self-refresh'. In a common DRAM refresh, a refresh cycle means that each cell is being read and re-written individually. In 'self-refresh' many or even all cells could be refreshed together by driving current through them. The cell holding 'zero' will keep its zero state and the cell holding 'one' will get recharged to recover their loss of floating body charge due to leakage. This technique had been detailed in a paper by Takashi Ohsawa et. al. in paper titled: "Autonomous Refresh of Floating Body Cell (FBC)" published in IEDM 2008, and in follow-up paper titled: "Autonomous Refresh of Floating-Body Cell due to Current Anomaly of Impact Ionization" published by IEEE TRANSACTIONS ON ELECTRON DEVICES, VOL. 56, NO. 10, October 2009, and U.S. Pat. Nos. 8,194,487 and 8,446,794, all of the foregoing are incorporated herein by reference.

Having gates on two sides could enable some advanced use of these floating body memories as described in U.S. Pat. No. 8,686,497, incorporated herein by reference, with reference to one side as front gate—FB and the other as BG. Another variation is named MSDRAM with is described in addition to other variations in a paper by Francisco Gamiz titled "Capacitor-less memory: advances and challenges" published at EUROSOI-ULIS 2016, and by Hyungjin Kim et al titled "Asymmetric dual-gate-structured one-transistor dynamic random access memory cells for retention characteristics improvement" published in Applied Physics Express 9, 084201 (2016), all are incorporated herein by reference. For the MSDRAM alternative the side O/N/O of the 3D NOR fabric could be used instead of the ONO embedded underneath as in the Gamiz reference. Some of these memories could be operated with 'self-refresh':'Autonomous Refresh' previously presented herein. Additional option is to use a 'two-transistors'("2T") cell to enhance performance of floating body memories. Such has been detailed in a U.S. application Ser. No. 14/380,779 and U.S. Pat. Nos. 9,275,732 and 8,902,663 and in paper by Jin-Woo Han et. al. titled "A Novel Bi-stable 1-Transistor SRAM for High Density Embedded Applications" published at IEDM 2015, all of the foregoing incorporated herein by reference. These 2T concepts provide a select transistor to buffer between the floating body memory cell and the bit-line, thus improving read margin and access time. These concepts could be deployed for floating body memory implementation within the 3D NOR fabric. These could be one Select Transistor for one Floating Body cell ("FBC") leveraging common S/D line connection, or two Floating Body cells using one Select Transistor in-between. These could be arranged in a vertical relation, in which case either a common gate could be used or a different gate could be used for the select transistor. It also could be arranged in the horizontal direction using the S/D connection through the JLT and enjoying different gates for the Select Transistor and the FBCs. It could be also used with one Select Transistor for more than two FBCs. The vertical RRAM/OTP could be used in some of these structures to connect the proper S/D segments.

An additional alternative is to support the FBC with back-bias to form two stable states and remove the need for refresh as is been presented in U.S. Pat. No. 8,902,663, incorporated herein by reference. This alternative approach is particularly important if the width of ridge becomes narrower than 50 nm. The back-bias could be made with a vertical N+ type poly formed instead of a gate or a vertical RRAM/OTP. Yet the process flow needs to allow the back-bias to contact the P channel without contacting the S/D segment above or below. Again a combination of selective non-directional etching of the S/D segment followed by a non-directional isolation deposition followed by directional isolation etching could prepare the ridge for proper back-bias formation. This flow is illustrated in FIGS. 42A-42E. FIG. 42A illustrates a vertical cut view across 4 ridges similar to that of FIG. 29A with two valley regions first valley region 4204 and second valley region 4208 designated for back-bias. The other valleys could include RRAM/OTP region 4202, 4206. These valleys could be created by ridge slicing.

FIG. 42B illustrates the structure after isotropic selective etching of the N+ S/D regions 4214 which leaves the P+ channel regions 4218 extending out with respect to the N+ S/D regions.

FIG. 42C illustrates the structure after isotropic deposition/filling of isolation material first fill regions 4224,4228 in the designated valley regions in respect to the N+/P+ regions 4216.

FIG. 42D illustrates the structure after anisotropic etch of most of the isolation material in first fill regions 4224,4228 thus forming valleys with oxide remaining 4238 on the previously exposed N+ regions.

FIG. 42E illustrates the structure after anisotropic deposition/filling the designated valley regions valleys with oxide remaining 4238 with N+ poly thus forming the back-bias regions 4248 connecting to the P channel regions 4218 and not to N+ S/D regions 4124.

An alternative use of the process flow illustrated in FIG. 42A to 42E is to form a vertical connection to the P region within a ridge to form the equivalent of a body contact. This alternative body contact 4248 could be highly doped P type poly or other conductive material forming the body connection. For the blocks to be used as non-volatile memory, charge trap DRAM, or other logic application, the body contact can mitigate parasitic floating body effects such as history effects and kink effects. Zero or slightly negative voltages such as −0.2 V can be applied to the body contact to absorb the generated majority carriers. For the use of non-volatile memory and charge trap DRAM applications, the body contact could allow a full ridge erase by connecting a relatively high positive voltage such as 8 volt which could remove all electrons trapped in the charge trap layer of that ridge. Use of such full ridge erase with positive voltage is common in non-volatile memories.

An alternative technique for a full ridge block erase could be achieved by controlling all the S/D lines of the ridge to a high positive voltage which would move the channel regions of the ridge to a high positive voltage as-well causing a full ridge charge trap erase.

An additional embodiment for the 3D NOR fabric is to use ripple programming 'RP' to form the per-level connections instead of the common staircase 3D connection process. FIGS. 14C-14E illustrate a 3D staircase 1408 per-layer connection process flow and structure. The process of opening connection holes 1406 as one hole set for each layer is lengthy and challenging. The ripple programming 'RP' concept leverages the availability of horizontal S/D transistor (JLT) at the edge of the ridges. It also uses contact 1410 to the first layer 1412, and the slow process of programming transistors using FN type programming. The slow programming using FN could allow control rippling from one transistor then to the one underneath him, using the one already programmed, into the depth of the device from the top layer all the way to the bottom layer. The vertical per layer contact could be made using OTP or RRAM technology. Accordingly the flow could be used to program per-layer connection in which an S/D line is one of the vertical electrodes 4312, 4314, 4316, 4318.

Figure 43:
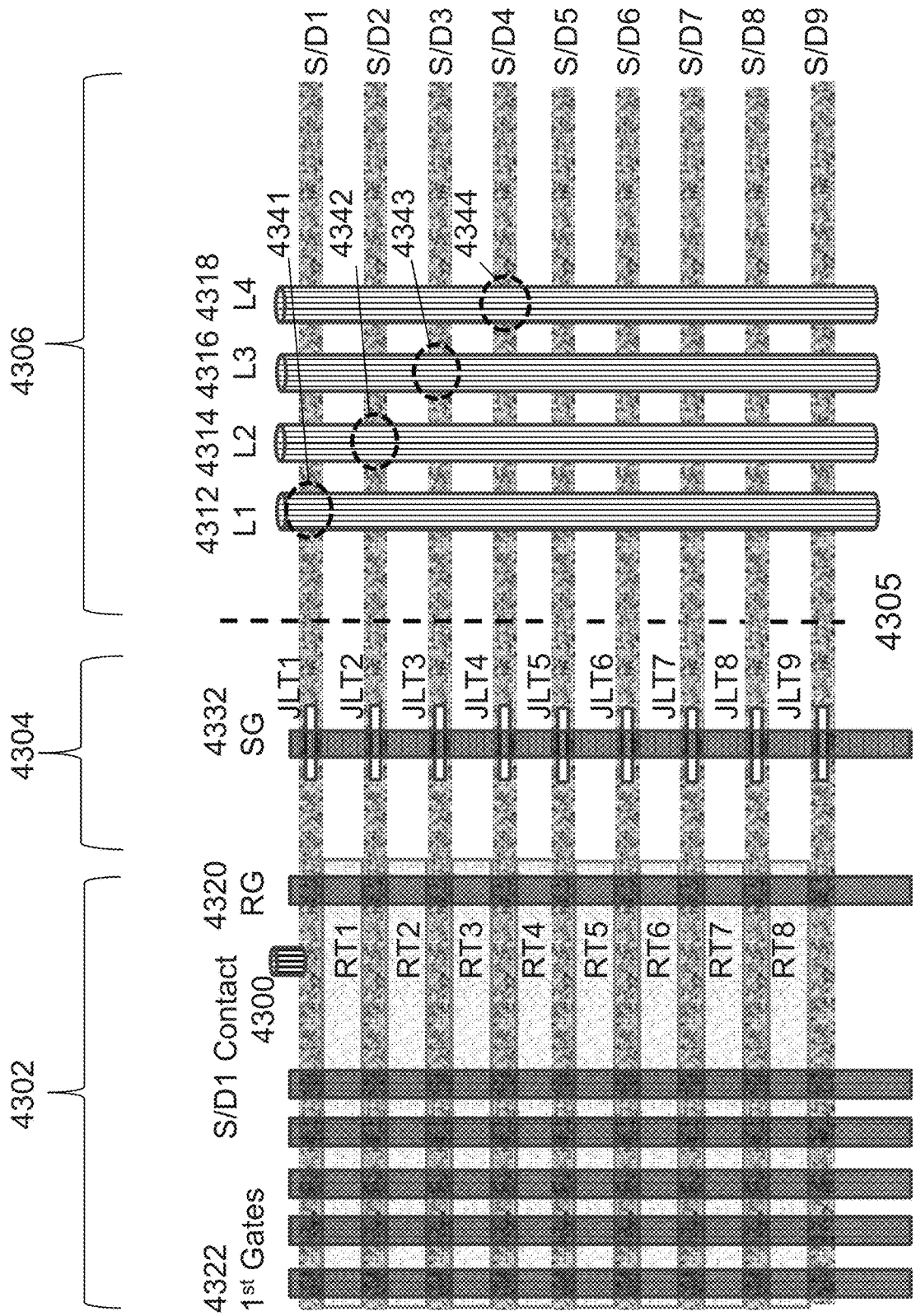
FIG. 43 is an example illustration of elements for ripple programming.

FIG. 43 is illustrating diagrammatically the elements for such ripple programming 'RP'. RP may include a ridge 4302 with a portion of $1^{st}$ gates 4322 and ripple gate (RG) 4320 to control a column of vertical transistors the programmable ripple transistors RT1-RT8. The edge 4304 of the ridge may include the ridge select transistors which could be programmable JLT1-JLT9 which may be controlled by the common select gate (SG) 4332. The dashed line 4305 indicates the beginning of the per layer connection section 4306. This could be oriented to y direction vertically 1404 to the ridge direction and may be shared with neighboring ridges, and may be common to multiple S/D lines in ridges as illustrated in FIG. 14A-14E. The per-level S/D lines are named S/D1-S/D9. The top layer S/D1 line has direct contact 4300. There are 4 vertical electrodes illustrating first vertical electrode L1 4312, second vertical electrode L2 4314, third vertical electrode L3 4316, and fourth vertical electrode L4 4318.

The connection from an S/D line to a vertical electrodes can be made as desired. As one embodiment of the ripple programming, a single metal contact with a single S/D line may be utilized. For example, L1 contacts with S/D1, L2 contacts with S/D2 and so forth through ripple programming. The sequence of ripple programming is described using the symbols of FIG. 43 and status table as follows:

1. Prior to start, all programmable transistors are un-programmed and accordingly function as gate controlled transistors. Use $1^{st}$ gates 4322 to set the ridge vertical transistor to an ON state. Thus the same voltage is applied to all S/D lines (within this ridge of course) with the voltage applied to S/D1 by S/D1 contact. Using gate 4320, all the Ripple Transistors (RT1-RT8) are programmed to an always OFF state ('X'). $1^{st}$ Gates could now be set to OFF.

2. Use the S/D1 contact 4300 through JLT1, and the metal vertical electrode 4312 L1 to activate the OTP 4341 of L1 to S/D1.

The status table is now—

| Ripple Transistors | | | Junction Less Transistors | | | | OTP/RRAM | | | |
|---|---|---|---|---|---|---|---|---|---|---|
| RT1 | RT2R | RT3 | JLT1 | JLT2 | JLT3 | JLT4 | S/D1-L1 | S/D2-L2 | S/D3-L3 | S/D4-L4 |
| X | X | X | | | | | ON | | | |

3. Use L1 and SG to program JLT1 to always OFF. The status table is now—

| Ripple Transistors | | | Junction Less Transistors | | | | OTP/RRAM | | | |
|---|---|---|---|---|---|---|---|---|---|---|
| RT1 | RT2R | RT3 | JLT1 | JLT2 | JLT3 | JLT4 | S/D1-L1 | S/D2-L2 | S/D3-L3 | S/D4-L4 |
| X | X | X | OFF | | | | ON | | | |

4. Use S/D1 contact and RG to program RT1 to always ON. The status table is now—

| Ripple Transistors | | | Junction Less Transistors | | | | OTP/RRAM | | | |
|---|---|---|---|---|---|---|---|---|---|---|
| RT1 | RT2R | RT3 | JLT1 | JLT2 | JLT3 | JLT4 | S/D1-L1 | S/D2-L2 | S/D3-L3 | S/D4-L4 |
| ON | X | X | OFF | | | | ON | | | |

5. Use S/D1 contact through RT1 and JLT2, and L2 to activate the OTP 4342 of S/D2 to L2.
The status table is now—

| Ripple Transistors | | | Junction Less Transistors | | | | OTP/RRAM | | | |
|---|---|---|---|---|---|---|---|---|---|---|
| RT1 | RT2R | RT3 | JLT1 | JLT2 | JLT3 | JLT4 | S/D1-L1 | S/D2-L2 | S/D3-L3 | S/D4-L4 |
| ON | X | X | OFF | | | | ON | ON | | |

6. Use L2 and SG to program JLT2 to always OFF. The status table is now—

| Ripple Transistors | | | Junction Less Transistors | | | | OTP/RRAM | | | |
|---|---|---|---|---|---|---|---|---|---|---|
| RT1 | RT2R | RT3 | JLT1 | JLT2 | JLT3 | JLT4 | S/D1-L1 | S/D2-L2 | S/D3-L3 | S/D4-L4 |
| ON | X | X | OFF | OFF | | | ON | ON | | |

7. Use S/D1 contact and RG to program RT2 to always ON.
The status table is now—

| Ripple Transistors | | | Junction Less Transistors | | | | OTP/RRAM | | | |
|---|---|---|---|---|---|---|---|---|---|---|
| RT1 | RT2R | RT3 | JLT1 | JLT2 | JLT3 | JLT4 | S/D1-L1 | S/D2-L2 | S/D3-L3 | S/D4-L4 |
| ON | ON | X | OFF | OFF | | | ON | ON | | |

8. Use S/D1 contact through RT1, RT2 and JLT3, and L3 to activate the OTP 4343 of S/D3 to L3.
The status table is now—

| Ripple Transistors | | | Junction Less Transistors | | | | OTP/RRAM | | | |
|---|---|---|---|---|---|---|---|---|---|---|
| RT1 | RT2R | RT3 | JLT1 | JLT2 | JLT3 | JLT4 | S/D1-L1 | S/D2-L2 | S/D3-L3 | S/D4-L4 |
| ON | ON | X | OFF | OFF | | | ON | ON | ON | |

6. Use L3 and SG to program JLT3 to always OFF.
The status table is now—

| Ripple Transistors | | | Junction Less Transistors | | | | OTP/RRAM | | | |
|---|---|---|---|---|---|---|---|---|---|---|
| RT1 | RT2R | RT3 | JLT1 | JLT2 | JLT3 | JLT4 | S/D1-L1 | S/D2-L2 | S/D3-L3 | S/D4-L4 |
| ON | ON | X | OFF | OFF | OFF | | ON | ON | ON | |

And the ripple flow could be continued to form the per-layer connection, activating the OTP 4344 of S/D4 to L4 and so forth.

Techniques known with OTP could be used to reduce the OTP connection resistance. These may include use of multiple vertical electrodes programmed independently and used in parallel to provide good per layer connection using such ripple programming. Various programming techniques may also be utilized; for example, bipolar programming with soak cycles, mono-polar with soak cycles, etc. And again RRAM could be used instead of OTP.

Such programmable techniques for forming memory control line connections could also be used as part of yield improvement redundancy and repair techniques generally used for memory products.

An alternative application of the technology is to use part of the 3D NOR logic fabric for operations resembling a brain Synapse. A paper by Lixue Xia titled "Technological Exploration of RRAM Crossbar Array for Matrix-Vector Multiplication" published at JOURNAL OF COMPUTER SCIENCE AND TECHNOLOGY 31(1): 3-19 Jan. 2016, incorporated herein by reference, teaches the use of a crossbar RRAM array for matrix-vector multiplication.

Accordingly the RRAM pillars and the corresponding S/D segments could be used for such functions. Papers by Sangsu Park et al titled "Electronic system with memristive synapses for pattern recognition" published by Scientific Reports |5:10123| DOI:10.1038/srep10123, by Yu Wang et al, titled "Energy Efficient RRAM Spiking Neural Network for Real Time Classification", published at the 25th Symposium on VLSI, by Manan Suri, titled "Exploiting Intrinsic Variability of Filamentary Resistive Memory for Extreme Learning Machine Architectures" published by IEEE Transactions on Nanotechnology 15 Jun. 2015 and Sangsu Park, titled "Nanoscale RRAM-based synaptic electronics: toward a neuromorphic computing device" published by Nanotechnology 24 (2013), all the forgoing incorporated herein by reference. These teachings use of an RRAM cross-bar for brain type processing could be implemented in the 3D NOR fabric RRAM pillars and the corresponding S/D segments.

Another alternative is to utilize the 3D NOR fabric floating-body memory structure for a Synapse type circuit as is presented in paper such as one by Min-Woo Kwon et. al. titled "Integrate-and-Fire Neuron Circuit and Synaptic Device using Floating Body MOSFET with Spike Timing-Dependent Plasticity" published in the JOURNAL OF SEMICONDUCTOR TECHNOLOGY AND SCIENCE, VOL. 15, NO. 6, December 2015, incorporated herein by reference.

The 3D NOR fabric could also be adapted to an associative memory function. For an associative memory function, a unit could be programmed and operated to provide a quick and parallel operation to identify a match. For simplicity the description would be for a single ridge. Let use the following terms:

A1 to Ak: A binary vector to be searched having bits 1 to k, Ai: bit i in the vector.

$WL_{odd}i$: Odd word-line i (In reference to FIG. 8A, WL1 is $WL_{odd}1$, WL3 is $WL_{odd}2$, and so forth).

$WL_{even}i$: Even word-line i (In reference to FIG. 8A, WL2 is $WL_{even}1$, WL4 is $WL_{even}2$, and so forth).

S/Dn: The Source line of level n.

$M_{odd}in$: The memory bit stored on the odd side of the channel between S/Dn and S/Dn+1 and controlled by $WL_{odd}i$.

$M_{even}in$: The memory bit stored on the even side of the channel between S/Dn and S/Dn+1 and controlled by $WL_{even}i$.

For associative memory application data could be stored in one bit per channel with the odd facet store the data bit and the even facet stores it inversion.

The word-line would be set so that $WL_{odd}i$=Ai and $WL_{even}i$=The inversion of Ai (AiN).

Then S/Dn line could be set to '1' (Vdd) and the S/Dn+1 would be sensed. Since a stored bit negates the effect of a high word-line '1', a read zero on S/Dn+1 indicates a perfect match of the stored bits negating all the high word-lines, hence an associative memory.

The above concept could be used to provide more operations in parallel by having the S/D line sensed individually per each ridge in the associative memory units. Other variations could be used to achieve a higher memory efficiency, such as, for example, mirror bits The associative memory concept could be adapted to form an analog correlator in which the signal on S/Dn+1 is the 'sum-of-product' between the stored data on the 'n' layer cells ($M_{odd}in$, $M_{even}in$) and the signal on the word-lines. Such a correlation function could very useful for many signal processing functions. Alternatively, the associative memory can be a content-addressable memory. The content addressable memory can be useful for network applications, big data applications such as voice recognition, video processing, and etc.

As a general note we described herein 3D memory structure and variations. There are many ways to form other variations of these structures that would be obvious to an artisan in the semiconductor memory domain to form by the presented elements described herein. These may include exchanging n type with p type and vice versa, increase density by sharing control lines, silicidation of some in silicon control lines, providing staircase on both sides of memory blocks to improve speed and reduce variation including sharing staircase in between two blocks and other presented variations herein. Many of these options have been presented here for some memory options and it would be obvious to artisan in the semiconductor memory domain to apply those to the other memory structures.

The structures and flow presented herein are utilizing NPN transistors. Other types of transistors with the corresponding modification of process and materials could be used as an alternative such as junction-less transistors, or non-silicon transistors (for example SiGe, CNT, and so on). Those alternatives could be implemented leveraging the special benefits of the architecture disclosed herein.

The 3D NOR fabric as described herein could be used to form functional blocks such as volatile and non-volatile memories and programmable logic. These could leverage similar process flows and structure, and function with added layers on top and below, such as peripheral circuits 3554, 3454. These could be used to form system devices by mixing these functions one on top of the other and/or one side by side as could be engineered using the principles and flows described herein as an engineer in the art will use to form 3D systems and devices for the required application.

A 3D system could be made by custom design or by use of generic structure, for example, the 3D NOR fabric described herein, which could be combined with structure on top or below forming dedicated 3D systems. In U.S. Pat. No. 9,136,153, incorporated herein by reference, several techniques are presented using generic structure(s), also called continuous array, to form dedicated systems. Such as been described referencing at least FIGS. 11A-11F, 12A-12E, 19A-19J, 84A-84G, 215A-215C, 234A-234B of U.S. Pat. No. 9,136,153. Accordingly the same 3D-NOR fabric could provide fabric to two different products who could have the same size but a different mix of upper structure 3432 or bottom structure 3454. Or have different product sizes so one 3D-NOR fabric of one product could be the same of a subset of the 3D NOR fabric of another device. In general, use of the same fabric for different products reduces both the set up—NRE costs and the volume production costs. Arrays that have a regular structure and being programmable together with 3D construction are a very good fit for these sharing techniques.

The use of layer transfer in construction of a 3D NOR based system could be enable heterogeneous integration. The memory control circuits, also known as peripheral circuits, may include high voltages and negative voltages for write and erase operations. The circuits may include the charge pumps and high voltage transistors, which could be made on a strata using silicon transistors or other transistor types (such as SiGe, Ge, CNT, etc.) using a manufacturing process line that is different than the low voltage control circuit manufacturing process line. The analog circuits, such as for the sense amplifiers, and other sensitive linear circuits could also be processed independently and be transferred over to the 3D fabric. Such 3D system construction could be similar to the one illustrated in at least FIGS. 34A-34G herein. Such 3D construction could be used to provide proper bias voltages to some of the word lines to extend retention time while shutting power to most other circuits to reduce power consumption. "Smart Alignment" techniques could be used with these layer transfers to overcome the wafer bonder misalignments.

Another alternative is to leverage the very high etch selectivity of SiGe vs. Silicon for layer transfer. Instead of using the porous silicon 3443 which has been referred to as modified ELTRAN flow, use sacrificial SiGe. The substrate could have sacrificial SiGe over silicon epitaxial and then epitaxy of silicon over the SiGe. Recently it become a very attractive concept for processing gate all around horizontal transistors and has become the target flow for next generation devices such as the 5 nm technology node. Some of the work in respect to selective etching of SiGe vs. silicon has been presented in a paper by Jang-Gn Yun et al. titled: "Single-Crystalline Si Stacked Array (STAR) NAND Flash Memory" published in IEEE TRANSACTIONS ON ELECTRON DEVICES, VOL. 58, NO. 4, April 2011, and more recent work by K. Wostyn et al. titled "Selective Etch of Si and SiGe for Gate All-Around Device Architecture" published in ECS Transactions, 69 (8) 147-152 (2015), and by V. Destefanis et al. titled: "HCl Selective Etching of Si1−xGex versus Si for Silicon On Nothing and Multi Gate Devices" published in ECS Transactions, 16 (10) 427-438 (2008), all incorporated herein by reference.

The process could include the following steps as illustrated in FIG. 44A-44I and FIG. 45A-45D:

A. As illustrated in FIGS. 44A and 44B, on a reusable donor wafer-base substrate 4402 epitaxially grow epi layer 4404, which may include a layer of about 100 nm, or about 200 nm, or about 500 nm, or about 1000 nm or about 2000 nm thick SiGe. The content of Ge is designed per the selectivity desired and in consideration of the stress. Predefined trenches in the designated dicing streets could be used to release the potential stress. These trenches could have a width and a depth corresponding to the thickness of the SiGe layer.

B. As illustrated in FIG. 44C, epitaxially grow silicon layer 4406 on top of the SiGe epi layer 4404, silicon layer 4406 may have a thickness of about 10 nm, or about 20 nm, or about 50 nm, or about 100 nm, or about 200 nm, or about 500 nm, or about 1000 nm or about 2000 nm, as desired for the electronic circuits.

C. As illustrated in FIG. 44D, process the desired circuits 4412 including contact layer. This could be done using conventional processing including the appropriate high temperature processes.

D. As illustrated in FIG. 44E, form first set of holes 4414 through the top silicon layer 4406 and the SiGe epi layer 4404. This holes could be filled with oxide or other material that would be selective to future silicon and SiGe etches. The holes filling would serve as a posts to hold the to be transferred top layer in place. Those could be done in the dicing streets area and may be designed weak enough to be torn out.

E. As illustrated in FIG. 44F, add one or more interconnection layers 4416 and cover with isolation layer 4422 (FIG. 44G) such as $SiO_2$ and CMP or other form of top surface planarization for future wafer to wafer bonding.

F. As illustrated in FIG. 44H, form many second set holes 4424 to allow a full etch of the sacrificial SiGe layer (remainder of SiGe epi layer 4404). These holes could be made at un-used locations and in locations designated for future Through-Layer-Via (TLVs). The holes need to be open through the top layer all the way into the SiGe epi layer 4404.

G. As illustrated in FIG. 44I, selectively etch the sacrificial SiGe layer creating void 4426.

H. As illustrated in FIG. 45C, flip and bond the structure such as illustrated in FIG. 45A (the structure from FIG. 44I) onto the target wafer 4502 illustrated in FIG. 45B, which could be similar to the one illustrated in FIG. 35B. Resulting with bonded structure 4590 such as illustrated in FIG. 45C. The bonding could be oxide to oxide bonding which could be followed with top wafer interconnection through a TLV (Thru Layer Via) process or metal to metal bonding or hybrid bonding (oxide to oxide and metal to metal bonding).

I. Tear off the donor wafer as is illustrated in FIG. 45D, the donor wafer could be sent for reuse.

J. Clean the top surface and prepare for interconnections. Optionally cover with isolation.

K. Open TLVs for interconnection add in.

The donor wafer 'tearing off' could be assisted by known techniques such as, for example, water-jet, wedge, laser cutting, etched assisted tearing off and mechanical twist and pull.

Alternatively additional interconnection layers and other processing could be added in between step 'G' and 'H' above. So the structure illustrated in FIG. 44I could be further processed before being flipped and bonded to the target wafer. This add-on process could include adding additional metal layers or any other structure including addition transistor layers using similar techniques such as layer transfer.

The use of SiGe for epitaxial base 'cut' layer instead of porous 'cut' layer could be adapted to many of the flows presented in U.S. application Ser. Nos. 14/642,724, 15/095,187, and 15/173,686, all the forgoing are incorporated herein by reference. It does add some complexity related to the holding posts formation and the holes to etch the SiGe through prior to performing the layer transfer. For applications in which two layer of acting silicon, and isolation layer in between, is desired, the in-between SiGe could be removed after the transfer and replaced with isolation material.

Another alternative is to skip steps related to FIG. 44D-44I and use the SiGe layer 4404 as an etch stop. For example, a 3D technique of flip bond and etch back of an SOI donor such as presented in at least U.S. Pat. Nos. 6,821,826, 7,723,207 and 7,312,487, all the forgoing are incorporated herein by reference. The techniques leverage the oxide as an etch stop layer for the full base substrate grind and etch back.

Alternatively the SiGe layer 4404 could be used as an etch stop. In this approach the base substrate 4402 would not be reused but rather be ground and etched away. The back grind and etch back could use wet etching and the SiGe layer 4404 could be designed to be very resistive to the silicon wet etching. The SiGe could be designed to have few layers including one that might have high Ge content, for example, such as over about 20% or over about 40% or over about 80%, followed by other layers with low Ge content such as less than about 20% or even less than about 10% to reduce stress so to support the silicon layer 4406.

Alternatively the 'cut' process could be integrated with could be integrated with Siltectra's 'Cold Split' technology as has been detailed in at least U.S. Pat. Nos. 8,440,129 and 8,877,077, applications 20160064283, 20160086839, all of which are incorporated herein by reference. These techniques would allow recycling, for example, of base substrate 4402. The SiGe could be used to provide the "Pre-Defined Break Initiation Point" as an alternative to the Siltectra use of laser or in addition to it. The Siltectra's 'Cold Split' could reduce the need for the undercut etch and posts formation process while providing reuse of the base substrate 4402 (for example). For this technique a multilevel SiGe could be designed to support the 'cut' on the one hand but also to reduce damage to the device layer on the other. This could be accomplished by increasing the Ge content in the interface with the base substrate 4402 to have high Ge content such as over about 20% or over about 40% or even over about 80% and then on the side interfacing with device layer 4406 forming a low Ge content such as less than about 20% or even less than about 10% to reduce stress so to support the silicon layer 4406.

Once the base substrate 4402 is removed a selective etch could be used to remove the SiGe residues and thinning processes such as etch and/or CMP could be used to further thin the back side of the device layer 4406. Connection layers could be added included vias aligned to the target wafer 4502 using "Smart Alignment" and similar 3D integration techniques discussed here and the incorporated by reference art.

Formation of multiple levels of arrays of transistors or other transistor formations in the structures described herein may be described at least by the terms 'multilevel device' or 'multilevel semiconductor device.' Memory within the fabric herein may have a read and write access time of less than 100 ns, or less than 10 ns, or less than 5 ns or even less than 2 ns and could support multiple ports.

It will also be appreciated by persons of ordinary skill in the art that the invention is not limited to what has been particularly shown and described hereinabove. For example, drawings or illustrations may not show n or p wells for clarity in illustration. Moreover, transistor channels illustrated or discussed herein may include doped semiconductors, but may instead include undoped semiconductor material. Further, any transferred layer or donor substrate or wafer preparation illustrated or discussed herein may include one or more undoped regions or layers of semiconductor material. Further, transferred layer or layers may have regions of STI or other transistor elements within it or on it when transferred. Rather, the scope of the invention includes combinations and sub-combinations of the various features described hereinabove as well as modifications and variations which would occur to such skilled persons upon reading the foregoing description. Thus the invention is to be limited only by appended claims.

We claim:

1. A method of making a 3D multilayer semiconductor device, the method comprising:
    providing a first substrate comprising a first level, said first level comprising a first single crystal silicon layer;
    providing a second substrate comprising a second level, said second level comprising a second single crystal silicon layer;
    performing an epitaxial growth of a SiGe layer on top of said second single crystal silicon layer;
    performing an epitaxial growth of a third single crystal silicon layer on top of said SiGe layer,
        wherein said third single crystal silicon layer has an average thickness of less than 2,000 nm;
    forming a plurality of second transistors each comprising a single crystal channel;
    forming a plurality of metal layers interconnecting said plurality of second transistors; and then
    performing a bonding of said second level onto said first level,
        wherein performing said bonding comprises making oxide-to-oxide bond zones; and
    performing removal of a majority of said second single crystal silicon layer.

2. The method according to claim 1, further comprising:
    forming differential signaling circuits,
        wherein said differential signaling circuits comprise said plurality of second transistors.

3. The method according to claim 1, further comprising:
    prior to said bonding, etching at least a portion of said SiGe layer.

4. The method according to claim 1, further comprising:
    forming memory array circuits,
        wherein said memory array circuits comprise said plurality of second transistors.

5. The method according to claim 1, further comprising:
    forming memory control circuits,
        wherein said memory control circuits comprise said plurality of second transistors.

6. The method according to claim 1,
    wherein said bonding is a compression type bonding.

7. The method according to claim 1, further comprising:
    processing a through layer via substantially through said third single crystal silicon layer.

8. A method of making a 3D multilayer semiconductor device, the method comprising:
    providing a first substrate comprising a first level, said first level comprising a first single crystal silicon layer;
    providing a second substrate comprising a second level, said second level comprising a second single crystal silicon layer;
    performing an epitaxial growth of a SiGe layer on top of said second single crystal silicon layer;
    performing an epitaxial growth of a third single crystal silicon layer on top of said SiGe layer;
    forming a plurality of second transistors each comprising a single crystal channel;
    forming a plurality of metal layers interconnecting said plurality of second transistors; and then
    performing a bonding of said second level onto said first level,
        wherein performing said bonding comprises making oxide-to-oxide bond zones;
    performing removal of a majority of said second single crystal silicon layer; and
    processing a through layer via substantially through said third single crystal silicon layer.

9. The method according to claim 8, further comprising:
    forming differential signaling circuits,
        wherein said differential signaling circuits comprise said plurality of second transistors.

10. The method according to claim 8, further comprising:
    prior to said bonding, etching at least a portion of said SiGe layer.

11. The method according to claim 8, further comprising:
    forming memory array circuits,
        wherein said memory array circuits comprise said plurality of second transistors.

12. The method according to claim 8, further comprising:
    forming memory control circuits,
        wherein said memory control circuits comprise said plurality of second transistors.

13. The method according to claim 8,
    wherein said bonding is a compression type bonding.

14. The method according to claim 8, further comprising:
    wherein said third single crystal silicon layer has an average thickness of less than 2,000 nm.

15. A method of making a 3D multilayer semiconductor device, the method comprising:
    providing a first substrate comprising a first level, said first level comprising a first single crystal silicon layer;
    providing a second substrate comprising a second level, said second level comprising a second single crystal silicon layer;
    performing an epitaxial growth of a SiGe layer on top of said second single crystal silicon layer;
    performing an epitaxial growth of a third single crystal silicon layer on top of said SiGe layer;
    performing etching of at least a portion of said SiGe layer;
    forming a plurality of second transistors each comprising a single crystal channel;
    forming a plurality of metal layers interconnecting said plurality of second transistors; and then performing a bonding of said second level onto said first level,
   wherein performing said bonding comprises making oxide-to-oxide bond zones; and
performing removal of a majority of said second single crystal silicon layer.

16. The method according to claim 15, further comprising:
   forming differential signaling circuits,
      wherein said differential signaling circuits comprise said plurality of second transistors.

17. The method according to claim 15, further comprising:
   forming memory array circuits,
      wherein said memory array circuits comprise said plurality of second transistors.

18. The method according to claim 15, further comprising:
   forming memory control circuits,
      wherein said memory control circuits comprise said plurality of second transistors.

19. The method according to claim 15,
   wherein said bonding is a compression type bonding.

20. The method according to claim 15, further comprising:
   processing a through layer via substantially through said third single crystal silicon layer.

\* \* \* \* \*